United States Patent
Ray et al.

(10) Patent No.: US 11,899,614 B2
(45) Date of Patent: Feb. 13, 2024

(54) INSTRUCTION BASED CONTROL OF MEMORY ATTRIBUTES

(71) Applicant: Intel Corporation, Santa Clara, CA (US)

(72) Inventors: Joydeep Ray, Folsom, CA (US); Altug Koker, El Dorado Hills, CA (US); Varghese George, Folsom, CA (US); Mike Macpherson, Portland, OR (US); Aravindh Anantaraman, Folsom, CA (US); Abhishek R. Appu, El Dorado Hills, CA (US); Elmoustapha Ould-Ahmed-Vall, Chandler, AZ (US); Nicolas Galoppo von Borries, Portland, OR (US); Ben J. Ashbaugh, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/849,201

(22) Filed: Jun. 24, 2022

(65) Prior Publication Data

US 2023/0014565 A1   Jan. 19, 2023

Related U.S. Application Data

(63) Continuation of application No. 17/428,530, filed on Aug. 4, 2021.
(Continued)

(51) Int. Cl.
*G06F 15/78* (2006.01)
*G06F 9/30* (2018.01)
(Continued)

(52) U.S. Cl.
CPC ........ *G06F 15/7839* (2013.01); *G06F 7/5443* (2013.01); *G06F 7/575* (2013.01);
(Continued)

(58) Field of Classification Search
CPC ............. G06F 12/0238; G06F 12/0246; G06F 12/0607; G06F 12/0888; G06F 12/0866
See application file for complete search history.

(56) References Cited

U.S. PATENT DOCUMENTS

| 4,823,252 A | 4/1989 | Horst et al. |
| 5,182,801 A | 1/1993 | Asfour |

(Continued)

FOREIGN PATENT DOCUMENTS

| CN | 106683036 A | 5/2017 |
| CN | 111666066 B | 11/2021 |

(Continued)

OTHER PUBLICATIONS

Office Action for U.S. Appl. No. 17/428,539, dated Jan. 5, 2023, 14 pages.

(Continued)

*Primary Examiner* — Gurtej Bansal
(74) *Attorney, Agent, or Firm* — Jaffery Watson Mendonsa & Hamilton LLP

(57) ABSTRACT

Embodiments described herein provide techniques to facilitate instruction-based control of memory attributes. One embodiment provides a graphics processor comprising a processing resource, a memory device, a cache coupled with the processing resources and the memory, and circuitry to process a memory access message received from the processing resource. The memory access message enables access to data of the memory device. To process the memory access message, the circuitry is configured to determine one or more cache attributes that indicate whether the data (Continued)

should be read from or stored the cache. The cache attributes may be provided by the memory access message or stored in state data associated with the data to be accessed by the access message.

20 Claims, 59 Drawing Sheets

Related U.S. Application Data

(60) Provisional application No. 62/819,361, filed on Mar. 15, 2019, provisional application No. 62/819,337, filed on Mar. 15, 2019, provisional application No. 62/819,435, filed on Mar. 15, 2019.

(51) Int. Cl.
| | | |
|---|---|---|
| *G06F 9/38* | (2018.01) | |
| *G06F 17/18* | (2006.01) | |
| *G06F 12/0802* | (2016.01) | |
| *G06F 7/544* | (2006.01) | |
| *G06F 7/575* | (2006.01) | |
| *G06F 12/02* | (2006.01) | |
| *G06F 12/0866* | (2016.01) | |
| *G06F 12/0875* | (2016.01) | |
| *G06F 12/0895* | (2016.01) | |
| *G06F 12/128* | (2016.01) | |
| *G06F 12/06* | (2006.01) | |
| *G06F 12/1009* | (2016.01) | |
| *G06T 1/20* | (2006.01) | |
| *G06T 1/60* | (2006.01) | |
| *H03M 7/46* | (2006.01) | |
| *G06F 12/0811* | (2016.01) | |
| *G06F 15/80* | (2006.01) | |
| *G06F 17/16* | (2006.01) | |
| *G06F 7/58* | (2006.01) | |
| *G06F 12/0871* | (2016.01) | |
| *G06F 12/0862* | (2016.01) | |
| *G06F 12/0897* | (2016.01) | |
| *G06F 9/50* | (2006.01) | |
| *G06F 12/0804* | (2016.01) | |
| *G06F 12/0882* | (2016.01) | |
| *G06F 12/0891* | (2016.01) | |
| *G06F 12/0893* | (2016.01) | |
| *G06F 12/0888* | (2016.01) | |
| *G06T 15/06* | (2011.01) | |
| *G06N 3/08* | (2023.01) | |

(52) U.S. Cl.
CPC ............ *G06F 7/588* (2013.01); *G06F 9/3001* (2013.01); *G06F 9/3004* (2013.01); *G06F 9/30014* (2013.01); *G06F 9/30036* (2013.01); *G06F 9/30043* (2013.01); *G06F 9/30047* (2013.01); *G06F 9/30065* (2013.01); *G06F 9/30079* (2013.01); *G06F 9/3887* (2013.01); *G06F 9/5011* (2013.01); *G06F 9/5077* (2013.01); *G06F 12/0215* (2013.01); *G06F 12/0238* (2013.01); *G06F 12/0246* (2013.01); *G06F 12/0607* (2013.01); *G06F 12/0802* (2013.01); *G06F 12/0804* (2013.01); *G06F 12/0811* (2013.01); *G06F 12/0862* (2013.01); *G06F 12/0866* (2013.01); *G06F 12/0871* (2013.01); *G06F 12/0875* (2013.01); *G06F 12/0882* (2013.01); *G06F 12/0888* (2013.01); *G06F 12/0891* (2013.01); *G06F 12/0893* (2013.01); *G06F 12/0895* (2013.01); *G06F 12/0897* (2013.01); *G06F 12/1009* (2013.01); *G06F 12/128* (2013.01); *G06F 15/8046* (2013.01); *G06F 17/16* (2013.01); *G06F 17/18* (2013.01); *G06T 1/20* (2013.01); *G06T 1/60* (2013.01); *H03M 7/46* (2013.01); *G06F 9/3802* (2013.01); *G06F 9/3818* (2013.01); *G06F 9/3867* (2013.01); *G06F 2212/1008* (2013.01); *G06F 2212/1021* (2013.01); *G06F 2212/1044* (2013.01); *G06F 2212/302* (2013.01); *G06F 2212/401* (2013.01); *G06F 2212/455* (2013.01); *G06F 2212/60* (2013.01); *G06N 3/08* (2013.01); *G06T 15/06* (2013.01)

(56) References Cited

U.S. PATENT DOCUMENTS

| | | |
|---|---|---|
| 5,381,539 A | 1/1995 | Yanai et al. |
| 5,450,607 A | 9/1995 | Kowalczyk et al. |
| 5,469,552 A | 11/1995 | Suzuki et al. |
| 5,502,827 A | 3/1996 | Yoshida |
| 5,574,928 A | 11/1996 | White et al. |
| 5,627,985 A | 5/1997 | Fetterman et al. |
| 5,737,752 A | 4/1998 | Hilditch |
| 5,805,475 A | 9/1998 | Putrino et al. |
| 5,822,767 A | 10/1998 | MacWilliams et al. |
| 5,890,211 A | 3/1999 | Sokolov et al. |
| 5,917,741 A | 6/1999 | Ng |
| 5,926,406 A | 7/1999 | Tucker et al. |
| 5,940,311 A | 8/1999 | Dao et al. |
| 5,943,687 A | 8/1999 | Liedberg |
| 6,049,865 A | 4/2000 | Smith |
| 6,078,940 A | 6/2000 | Scales |
| 6,260,008 B1 | 7/2001 | Sanfilippo |
| 6,412,046 B1 | 6/2002 | Sharma et al. |
| 6,480,872 B1 | 11/2002 | Choquette |
| 6,529,928 B1 | 3/2003 | Resnick et al. |
| 6,578,102 B1 | 6/2003 | Batchelor et al. |
| 6,598,120 B1 | 7/2003 | Berg et al. |
| 6,678,806 B1 | 1/2004 | Redford |
| 6,788,738 B1 | 9/2004 | New |
| 6,856,320 B1 | 2/2005 | Rubinstein et al. |
| 6,947,049 B2 | 9/2005 | Spitzer et al. |
| 6,963,954 B1 | 11/2005 | Trehus et al. |
| 7,102,646 B1 | 9/2006 | Rubinstein et al. |
| 7,127,482 B2 | 10/2006 | Hou et al. |
| 7,197,605 B2 * | 3/2007 | Schmisseur ........... G06F 12/127 |
| | | 711/E12.04 |
| 7,327,289 B1 | 2/2008 | Lippincott |
| 7,346,741 B1 | 3/2008 | Keish et al. |
| 7,373,369 B2 | 5/2008 | Gerwig et al. |
| 7,483,031 B2 | 1/2009 | Williams et al. |
| 7,616,206 B1 | 11/2009 | Danilak |
| 7,620,793 B1 | 11/2009 | Edmondson et al. |
| 7,873,812 B1 | 1/2011 | Mimar |
| 7,913,041 B2 | 3/2011 | Shen et al. |
| 8,253,750 B1 | 8/2012 | Huang et al. |
| 8,340,280 B2 | 12/2012 | Gueron et al. |
| 8,429,351 B1 | 4/2013 | Yu et al. |
| 8,488,055 B2 | 7/2013 | Côté et al. |
| 8,645,634 B1 | 2/2014 | Cox et al. |
| 8,669,990 B2 | 3/2014 | Sprangle et al. |
| 8,847,965 B2 | 9/2014 | Chandak et al. |
| 8,990,505 B1 | 3/2015 | Jamil et al. |
| 9,304,835 B1 | 4/2016 | Ekanadham et al. |
| 9,317,251 B2 | 4/2016 | Tsen et al. |
| 9,461,667 B2 | 10/2016 | Quinnell |
| 9,501,392 B1 | 11/2016 | Weingarten |
| 9,558,156 B1 | 1/2017 | Bekas et al. |
| 9,727,337 B2 | 8/2017 | Gschwind et al. |
| 9,804,666 B2 | 10/2017 | Jiao |
| 9,811,468 B2 | 11/2017 | Hooker et al. |
| 9,960,917 B2 | 5/2018 | Gopal et al. |
| 10,002,045 B2 | 6/2018 | Chung et al. |
| 10,102,015 B1 | 10/2018 | Gordon et al. |
| 10,353,706 B2 | 7/2019 | Kaul et al. |
| 10,409,614 B2 | 9/2019 | Ould-Ahmed-Vall et al. |
| 10,409,887 B1 | 9/2019 | Gauria et al. |

(56) References Cited

U.S. PATENT DOCUMENTS

| | | |
|---|---|---|
| 10,474,458 B2 | 11/2019 | Kaul et al. |
| 10,528,864 B2 | 1/2020 | Dally et al. |
| 10,572,409 B1 | 2/2020 | Zejda et al. |
| 10,678,508 B2 | 6/2020 | Vantrease et al. |
| 10,755,201 B2 | 8/2020 | Sika |
| 10,762,137 B1 | 9/2020 | Volpe et al. |
| 10,762,164 B2 | 9/2020 | Chen et al. |
| 10,860,316 B2 | 12/2020 | Zhi et al. |
| 10,860,922 B2 | 12/2020 | Dally et al. |
| 10,891,538 B2 | 1/2021 | Dally et al. |
| 10,896,045 B2 | 1/2021 | Sodani et al. |
| 11,080,046 B2 | 8/2021 | Kaul et al. |
| 11,113,784 B2 | 9/2021 | Ray et al. |
| 11,169,799 B2 | 11/2021 | Kaul et al. |
| 11,250,108 B2 | 2/2022 | Dong et al. |
| 11,360,767 B2 | 6/2022 | Kaul et al. |
| 11,361,496 B2 | 6/2022 | Maiyuran et al. |
| 11,409,537 B2 | 8/2022 | Ould-Ahmed-Vall et al. |
| 11,461,107 B2 | 10/2022 | Ould-Ahmed-Vall et al. |
| 11,620,256 B2 | 4/2023 | Koker et al. |
| 2001/0042194 A1 | 11/2001 | Elliott et al. |
| 2002/0156979 A1 | 10/2002 | Rodriguez |
| 2002/0188808 A1 | 12/2002 | Rowlands et al. |
| 2003/0204840 A1 | 10/2003 | Wu |
| 2004/0054841 A1 | 3/2004 | Callison et al. |
| 2005/0080834 A1 | 4/2005 | Belluomini et al. |
| 2005/0125631 A1 | 6/2005 | Symes et al. |
| 2005/0169463 A1 | 8/2005 | Ahn et al. |
| 2006/0083489 A1 | 4/2006 | Aridome et al. |
| 2006/0101244 A1 | 5/2006 | Siu et al. |
| 2006/0149803 A1 | 7/2006 | Siu et al. |
| 2006/0179092 A1 | 8/2006 | Schmookler |
| 2006/0248279 A1 | 11/2006 | Al-Sukhni et al. |
| 2006/0265576 A1 | 11/2006 | Davis et al. |
| 2006/0277365 A1 | 12/2006 | Pong |
| 2007/0030277 A1 | 2/2007 | Prokopenko et al. |
| 2007/0030279 A1 | 2/2007 | Paltashev et al. |
| 2007/0074008 A1 | 3/2007 | Donofrio |
| 2007/0115291 A1 | 5/2007 | Chen et al. |
| 2007/0211064 A1 | 9/2007 | Buck et al. |
| 2007/0294682 A1 | 12/2007 | Demetriou et al. |
| 2008/0030510 A1 | 2/2008 | Wan et al. |
| 2008/0071851 A1 | 3/2008 | Zohar et al. |
| 2008/0086598 A1 | 4/2008 | Maron et al. |
| 2008/0189487 A1 | 8/2008 | Craske |
| 2008/0307207 A1 | 12/2008 | Khailany et al. |
| 2009/0003593 A1 | 1/2009 | Gopal et al. |
| 2009/0019253 A1 | 1/2009 | Stecher et al. |
| 2009/0030960 A1 | 1/2009 | Geraghty et al. |
| 2009/0150654 A1 | 6/2009 | Oberman et al. |
| 2009/0157972 A1 | 6/2009 | Byers et al. |
| 2009/0182942 A1 | 7/2009 | Greiner et al. |
| 2009/0189898 A1 | 7/2009 | Dammertz et al. |
| 2009/0190432 A1 | 7/2009 | Bilger et al. |
| 2009/0254733 A1 | 10/2009 | Chen et al. |
| 2009/0307472 A1 | 12/2009 | Essick, IV et al. |
| 2010/0053162 A1 | 3/2010 | Dammertz et al. |
| 2010/0082906 A1 | 4/2010 | Hinton et al. |
| 2010/0082910 A1 | 4/2010 | Raikar et al. |
| 2010/0162247 A1 | 6/2010 | Welc et al. |
| 2010/0185816 A1 | 7/2010 | Sauber et al. |
| 2010/0228941 A1 | 9/2010 | Koob et al. |
| 2010/0281235 A1 | 11/2010 | Vorbach et al. |
| 2010/0293334 A1 | 11/2010 | Xun et al. |
| 2010/0299656 A1 | 11/2010 | Shah et al. |
| 2010/0332775 A1 | 12/2010 | Kapil et al. |
| 2011/0040744 A1 | 2/2011 | Haas et al. |
| 2011/0060879 A1 | 3/2011 | Rogers et al. |
| 2011/0078226 A1 | 3/2011 | Baskaran et al. |
| 2011/0119446 A1 | 5/2011 | Blumrich et al. |
| 2011/0157195 A1 | 6/2011 | Sprangle et al. |
| 2012/0011182 A1 | 1/2012 | Raafat et al. |
| 2012/0075319 A1 | 3/2012 | Dally |
| 2012/0124115 A1 | 5/2012 | Ollmann |
| 2012/0233444 A1 | 9/2012 | Stephens et al. |
| 2012/0268909 A1 | 10/2012 | Emma et al. |
| 2012/0278376 A1 | 11/2012 | Bakos |
| 2013/0013864 A1 | 1/2013 | Chung et al. |
| 2013/0031328 A1 | 1/2013 | Kelleher et al. |
| 2013/0099946 A1 | 4/2013 | Dickie et al. |
| 2013/0111136 A1 | 5/2013 | Bell, Jr. et al. |
| 2013/0141442 A1 | 6/2013 | Brothers et al. |
| 2013/0148947 A1 | 6/2013 | Glen et al. |
| 2013/0185515 A1 | 7/2013 | Sassone et al. |
| 2013/0218938 A1 | 8/2013 | Dockser et al. |
| 2013/0235925 A1 | 9/2013 | Nguyen et al. |
| 2013/0297906 A1 | 11/2013 | Loh et al. |
| 2014/0006753 A1 | 1/2014 | Gopal et al. |
| 2014/0032818 A1 | 1/2014 | Chang et al. |
| 2014/0052928 A1 | 2/2014 | Shimoi |
| 2014/0059328 A1 | 2/2014 | Gonion |
| 2014/0068197 A1 | 3/2014 | Joshi et al. |
| 2014/0075060 A1 | 3/2014 | Sharp et al. |
| 2014/0075163 A1 | 3/2014 | Loewenstein et al. |
| 2014/0082322 A1 | 3/2014 | Loh et al. |
| 2014/0089371 A1 | 3/2014 | Dinechin et al. |
| 2014/0095796 A1 | 4/2014 | Bell, Jr. et al. |
| 2014/0108481 A1 | 4/2014 | Davis et al. |
| 2014/0122555 A1 | 5/2014 | Hickmann et al. |
| 2014/0129807 A1 | 5/2014 | Tannenbaum et al. |
| 2014/0146607 A1 | 5/2014 | Nagai et al. |
| 2014/0173203 A1 | 6/2014 | Forsyth |
| 2014/0173207 A1 | 6/2014 | Wang et al. |
| 2014/0188963 A1 | 7/2014 | Tsen et al. |
| 2014/0188966 A1 | 7/2014 | Galal et al. |
| 2014/0223131 A1 | 8/2014 | Agarwal et al. |
| 2014/0258622 A1 | 9/2014 | Lacourba et al. |
| 2014/0267232 A1 | 9/2014 | Lum et al. |
| 2014/0281008 A1 | 9/2014 | Muthiah et al. |
| 2014/0281110 A1 | 9/2014 | Duluk, Jr. et al. |
| 2014/0281299 A1 | 9/2014 | Duluk, Jr. et al. |
| 2014/0348431 A1 | 11/2014 | Brick et al. |
| 2014/0379987 A1 | 12/2014 | Aggarwal et al. |
| 2015/0039661 A1 | 2/2015 | Blomgren et al. |
| 2015/0046655 A1 | 2/2015 | Nystad et al. |
| 2015/0046662 A1 | 2/2015 | Heinrich et al. |
| 2015/0067259 A1 | 3/2015 | Wang et al. |
| 2015/0160872 A1 | 6/2015 | Chen |
| 2015/0193358 A1 | 7/2015 | Dyke et al. |
| 2015/0205615 A1 | 7/2015 | Cunningham et al. |
| 2015/0205724 A1 | 7/2015 | Hancock et al. |
| 2015/0221063 A1 | 8/2015 | Kim et al. |
| 2015/0235338 A1 | 8/2015 | Alla et al. |
| 2015/0261683 A1* | 9/2015 | Hong ............... G06F 12/0895 711/144 |
| 2015/0268963 A1 | 9/2015 | Etsion et al. |
| 2015/0278984 A1 | 10/2015 | Koker et al. |
| 2015/0334043 A1 | 11/2015 | Li et al. |
| 2015/0339229 A1 | 11/2015 | Zhang et al. |
| 2015/0349953 A1 | 12/2015 | Kruglick |
| 2015/0371407 A1 | 12/2015 | Kim et al. |
| 2015/0378741 A1 | 12/2015 | Lukyanov et al. |
| 2015/0378920 A1 | 12/2015 | Gierach et al. |
| 2015/0380088 A1 | 12/2015 | Naeimi et al. |
| 2016/0062947 A1 | 3/2016 | Chetlur et al. |
| 2016/0086303 A1 | 3/2016 | Bae et al. |
| 2016/0092118 A1* | 3/2016 | Kumar ............... G06F 11/2097 711/154 |
| 2016/0092239 A1 | 3/2016 | Maiyuran et al. |
| 2016/0124713 A1 | 5/2016 | Bekas et al. |
| 2016/0124861 A1 | 5/2016 | Fujii et al. |
| 2016/0140686 A1 | 5/2016 | Lueh et al. |
| 2016/0255169 A1 | 9/2016 | Kovvuri et al. |
| 2016/0307362 A1 | 10/2016 | Farrell et al. |
| 2016/0321187 A1 | 11/2016 | Bernat et al. |
| 2016/0350227 A1 | 12/2016 | Hooker et al. |
| 2016/0357680 A1 | 12/2016 | Hooker et al. |
| 2016/0378465 A1 | 12/2016 | Venkatesh et al. |
| 2017/0024327 A1 | 1/2017 | Saidi et al. |
| 2017/0039144 A1 | 2/2017 | Wang et al. |
| 2017/0061279 A1 | 3/2017 | Yang et al. |
| 2017/0083240 A1 | 3/2017 | Rogers et al. |
| 2017/0090924 A1 | 3/2017 | Mishra et al. |
| 2017/0109282 A1 | 4/2017 | Frank et al. |

(56) References Cited

U.S. PATENT DOCUMENTS

| | | |
|---|---|---|
| 2017/0132134 A1 | 5/2017 | Gschwind et al. |
| 2017/0177336 A1 | 6/2017 | Astafev et al. |
| 2017/0185379 A1 | 6/2017 | Anderson et al. |
| 2017/0200303 A1 | 7/2017 | Havran et al. |
| 2017/0214930 A1 | 7/2017 | Loughry |
| 2017/0277460 A1 | 9/2017 | Li et al. |
| 2017/0308800 A1 | 10/2017 | Cichon et al. |
| 2017/0315921 A1 | 11/2017 | Hooker et al. |
| 2017/0315932 A1 | 11/2017 | Moyer |
| 2017/0323042 A1 | 11/2017 | Zhang |
| 2017/0344822 A1 | 11/2017 | Popescu et al. |
| 2017/0357506 A1 | 12/2017 | Wang et al. |
| 2018/0011790 A1 | 1/2018 | Gaur et al. |
| 2018/0018153 A1 | 1/2018 | Mukai |
| 2018/0018266 A1 | 1/2018 | Jones, III |
| 2018/0026651 A1 | 1/2018 | Gopal et al. |
| 2018/0046898 A1 | 2/2018 | Lo |
| 2018/0046906 A1 | 2/2018 | Dally et al. |
| 2018/0067869 A1 | 3/2018 | Yang et al. |
| 2018/0107602 A1 | 4/2018 | Dasgupta et al. |
| 2018/0114114 A1 | 4/2018 | Molchanov et al. |
| 2018/0129608 A9 | 5/2018 | Damodaran et al. |
| 2018/0157464 A1 | 6/2018 | Lutz et al. |
| 2018/0165204 A1 | 6/2018 | Venkatesh et al. |
| 2018/0173623 A1 | 6/2018 | Koob et al. |
| 2018/0174353 A1 | 6/2018 | Shin et al. |
| 2018/0183577 A1 | 6/2018 | Suresh et al. |
| 2018/0189231 A1 | 7/2018 | Fleming, Jr. et al. |
| 2018/0210836 A1 | 7/2018 | Lai et al. |
| 2018/0232846 A1 | 8/2018 | Gruber et al. |
| 2018/0253635 A1 | 9/2018 | Park |
| 2018/0284994 A1 | 10/2018 | Haller et al. |
| 2018/0285261 A1 | 10/2018 | Mandal et al. |
| 2018/0285264 A1 | 10/2018 | Kayiran et al. |
| 2018/0285278 A1 | 10/2018 | Appu et al. |
| 2018/0293784 A1 | 10/2018 | Benthin et al. |
| 2018/0293965 A1 | 10/2018 | Vembu et al. |
| 2018/0300258 A1 | 10/2018 | Wokhlu et al. |
| 2018/0307494 A1 | 10/2018 | Ould-Ahmed-Vall et al. |
| 2018/0307498 A1 | 10/2018 | Yang et al. |
| 2018/0315159 A1 | 11/2018 | Ould-Ahmed-Vall et al. |
| 2018/0315398 A1 | 11/2018 | Kaul et al. |
| 2018/0315399 A1 | 11/2018 | Kaul et al. |
| 2018/0321938 A1 | 11/2018 | Boswell et al. |
| 2018/0322387 A1 | 11/2018 | Sridharan et al. |
| 2018/0336136 A1 | 11/2018 | Hijaz et al. |
| 2018/0373200 A1 | 12/2018 | Shi et al. |
| 2018/0373635 A1 | 12/2018 | Mukherjee et al. |
| 2018/0373809 A1 | 12/2018 | Ylitie et al. |
| 2019/0042193 A1 | 2/2019 | Pasca et al. |
| 2019/0042237 A1 | 2/2019 | Azizi et al. |
| 2019/0042244 A1 | 2/2019 | Henry et al. |
| 2019/0042457 A1 | 2/2019 | Doshi et al. |
| 2019/0042534 A1 | 2/2019 | Butera et al. |
| 2019/0042542 A1 | 2/2019 | Narayanamoorthy et al. |
| 2019/0042923 A1 | 2/2019 | Janedula et al. |
| 2019/0065051 A1 | 2/2019 | Mills et al. |
| 2019/0065150 A1 | 2/2019 | Heddes et al. |
| 2019/0065195 A1 | 2/2019 | Pool et al. |
| 2019/0065338 A1 | 2/2019 | Bramley et al. |
| 2019/0066255 A1 | 2/2019 | Nalluri et al. |
| 2019/0073590 A1 | 3/2019 | Wu et al. |
| 2019/0079767 A1 | 3/2019 | Heinecke et al. |
| 2019/0079768 A1 | 3/2019 | Heinecke et al. |
| 2019/0095223 A1 | 3/2019 | Dubel et al. |
| 2019/0095336 A1 | 3/2019 | Barczak |
| 2019/0108651 A1 | 4/2019 | Gu et al. |
| 2019/0114534 A1 | 4/2019 | Teng et al. |
| 2019/0121638 A1 | 4/2019 | Knowles |
| 2019/0121679 A1 | 4/2019 | Wilkinson et al. |
| 2019/0121680 A1 | 4/2019 | Wilkinson et al. |
| 2019/0129847 A1 | 5/2019 | Roh |
| 2019/0130271 A1 | 5/2019 | Narang et al. |
| 2019/0146800 A1 | 5/2019 | Ould-Ahmed-Vall et al. |
| 2019/0155768 A1 | 5/2019 | Wilkinson et al. |
| 2019/0164050 A1 | 5/2019 | Chen et al. |
| 2019/0164268 A1 | 5/2019 | Gallo et al. |
| 2019/0188142 A1 | 6/2019 | Rappoport et al. |
| 2019/0205358 A1 | 7/2019 | Diril et al. |
| 2019/0227936 A1 | 7/2019 | Jang |
| 2019/0251034 A1 | 8/2019 | Bernat et al. |
| 2019/0266217 A1 | 8/2019 | Arakawa et al. |
| 2019/0278593 A1 | 9/2019 | Elango et al. |
| 2019/0278600 A1 | 9/2019 | Frumkin et al. |
| 2019/0294413 A1 | 9/2019 | Vantrease et al. |
| 2019/0327124 A1 | 10/2019 | Lai et al. |
| 2019/0347043 A1 | 11/2019 | Hasbun et al. |
| 2019/0361954 A1 | 11/2019 | Page et al. |
| 2019/0369988 A1 | 12/2019 | Kaul et al. |
| 2019/0370173 A1 | 12/2019 | Boyer et al. |
| 2019/0392287 A1 | 12/2019 | Ovsiannikov et al. |
| 2020/0050830 A1 | 2/2020 | Krueger et al. |
| 2020/0058155 A1 | 2/2020 | Bakalash et al. |
| 2020/0061811 A1 | 2/2020 | Iqbal et al. |
| 2020/0065241 A1 | 2/2020 | Cho et al. |
| 2020/0073825 A1 | 3/2020 | Zaydman |
| 2020/0081714 A1 | 3/2020 | Britto et al. |
| 2020/0117463 A1 | 4/2020 | Nassi et al. |
| 2020/0150926 A1 | 5/2020 | Connor et al. |
| 2020/0175074 A1 | 6/2020 | Li et al. |
| 2020/0184309 A1 | 6/2020 | Patel |
| 2020/0201810 A1 | 6/2020 | Felix et al. |
| 2020/0202195 A1 | 6/2020 | Patel |
| 2020/0211147 A1 | 7/2020 | Doyle et al. |
| 2020/0211253 A1 | 7/2020 | Liktor et al. |
| 2020/0218538 A1 | 7/2020 | Mansell |
| 2020/0234124 A1 | 7/2020 | Park |
| 2020/0242049 A1 | 7/2020 | Loh et al. |
| 2020/0250098 A1 | 8/2020 | Ma et al. |
| 2020/0097411 A1 | 9/2020 | Pusdesris et al. |
| 2020/0285592 A1 | 9/2020 | Ambroladze et al. |
| 2020/0097409 A1 | 10/2020 | Nathella et al. |
| 2020/0311531 A1 | 10/2020 | Liu et al. |
| 2021/0012197 A1 | 1/2021 | Simonyan et al. |
| 2021/0019591 A1 | 1/2021 | Venkatesh et al. |
| 2021/0034979 A1 | 2/2021 | Robinson et al. |
| 2021/0035258 A1 | 2/2021 | Ray et al. |
| 2021/0103550 A1 | 4/2021 | Appu et al. |
| 2021/0124579 A1 | 4/2021 | Kaul et al. |
| 2021/0150663 A1 | 5/2021 | Maiyuran et al. |
| 2021/0150770 A1 | 5/2021 | Appu et al. |
| 2021/0182024 A1 | 6/2021 | Mueller et al. |
| 2021/0182058 A1 | 6/2021 | Kaul et al. |
| 2021/0182140 A1 | 6/2021 | Gruber |
| 2021/0211643 A1 | 7/2021 | Gabriel et al. |
| 2021/0248085 A1 | 8/2021 | Bian et al. |
| 2021/0312697 A1 | 10/2021 | Maiyuran et al. |
| 2021/0374897 A1 | 12/2021 | Ray et al. |
| 2022/0019431 A1 | 1/2022 | Kaul et al. |
| 2022/0066931 A1 | 3/2022 | Ray et al. |
| 2022/0100518 A1 | 3/2022 | Tomei et al. |
| 2022/0107914 A1 | 4/2022 | Koker et al. |
| 2022/0114096 A1 | 4/2022 | Striramassarma et al. |
| 2022/0114108 A1 | 4/2022 | Koker et al. |
| 2022/0121421 A1 | 4/2022 | Appu et al. |
| 2022/0122215 A1 | 4/2022 | Ray et al. |
| 2022/0129265 A1 | 4/2022 | Appu et al. |
| 2022/0129266 A1 | 4/2022 | Maiyuran et al. |
| 2022/0129271 A1 | 4/2022 | Appu et al. |
| 2022/0129521 A1 | 4/2022 | Surti et al. |
| 2022/0137967 A1 | 5/2022 | Koker et al. |
| 2022/0138101 A1 | 5/2022 | Appu et al. |
| 2022/0138104 A1 | 5/2022 | Koker et al. |
| 2022/0138895 A1 | 5/2022 | Raganathan et al. |
| 2022/0156202 A1 | 5/2022 | Koker et al. |
| 2022/0171710 A1 | 6/2022 | Koker et al. |
| 2022/0179787 A1 | 6/2022 | Koker et al. |
| 2022/0180467 A1 | 6/2022 | Koker et al. |
| 2022/0197800 A1 | 6/2022 | Appu et al. |
| 2022/0197975 A1 | 6/2022 | Adelman et al. |
| 2022/0335563 A1 | 10/2022 | Elzur |
| 2022/0350751 A1 | 11/2022 | Koker et al. |
| 2022/0357945 A1 | 11/2022 | Kaul et al. |

(56) References Cited

U.S. PATENT DOCUMENTS

| | | | |
|---|---|---|---|
| 2022/0365901 | A1 | 11/2022 | Maiyuran et al. |
| 2022/0382555 | A1 | 12/2022 | Ould-Ahmed-Vall et al. |
| 2023/0046506 | A1 | 2/2023 | Kaul et al. |

FOREIGN PATENT DOCUMENTS

| | | | |
|---|---|---|---|
| EP | 0656592 | A1 | 6/1995 |
| EP | 2937794 | A1 | 10/2015 |
| EP | 2849410 | B1 | 2/2018 |
| EP | 3382533 | A1 | 10/2018 |
| EP | 3396533 | A2 | 10/2018 |
| EP | 3407183 | A2 | 11/2018 |
| EP | 4270201 | A2 | 11/2023 |
| GB | 2296155 | A | 6/1996 |
| JP | 2019029023 | B | 3/2020 |
| KR | 20170052432 | A | 5/2017 |
| TW | 200949691 | A | 12/2009 |
| TW | 201344564 | A | 11/2013 |
| TW | 201614997 | A | 4/2016 |
| WO | 2013095619 | A1 | 6/2013 |
| WO | 2013101018 | A1 | 7/2013 |
| WO | 2013119226 | A1 | 8/2013 |
| WO | 2016097813 | A1 | 6/2016 |
| WO | 2018125250 | A1 | 7/2018 |
| WO | 2018213636 | A1 | 11/2018 |
| WO | 2020190796 | A1 | 9/2020 |
| WO | 2020190797 | A1 | 9/2020 |
| WO | 2020190798 | A1 | 9/2020 |
| WO | 2020190799 | A2 | 9/2020 |
| WO | 2020190800 | A1 | 9/2020 |
| WO | 2020190801 | A1 | 9/2020 |
| WO | 2020190802 | A1 | 9/2020 |
| WO | 2020190803 | A1 | 9/2020 |
| WO | 2020190805 | A1 | 9/2020 |
| WO | 2020190806 | A1 | 9/2020 |
| WO | 2020190807 | A1 | 9/2020 |
| WO | 2020190808 | A1 | 9/2020 |
| WO | 2020190809 | A1 | 9/2020 |
| WO | 2020190810 | A1 | 9/2020 |
| WO | 2020190811 | A1 | 9/2020 |
| WO | 2020190812 | A1 | 9/2020 |
| WO | 2020190813 | A1 | 9/2020 |
| WO | 2020190814 | A1 | 9/2020 |

OTHER PUBLICATIONS

Non-Final Office Action for U.S. Appl. No. 17/827,067 dated Nov. 25, 2022, 25 pages.
Non-Final Office Action for U.S. Appl. No. 17/303,654 dated Oct. 31, 2022, 15 pages.
Decision on Allowance for Taiwan Application No. 110127153, 1 pages dated Oct. 27, 2022.
U.S. Appl. No. 17/304,092 "Notice of Allowability" dated Apr. 20, 2022, 3 pages.
U.S. Appl. No. 17/304,092 "Notice of Allowability" dated Feb. 28, 2022, 2 pages.
U.S. Appl. No. 17/304,092 "Notice of Allowance" dated Feb. 11, 2022, 9 pages.
U.S. Appl. No. 17/305,355 "Non-Final Office Action" dated Nov. 5, 2021, 28 pages.
U.S. Appl. No. 17/305,355 "Notice of Allowability" dated May 4, 2022, 2 pages.
U.S. Appl. No. 17/305,355 "Notice of Allowance" dated Feb. 23, 2022, 7 pages.
U.S. Appl. No. 17/429,873 "Non-Final Office Action" dated Jan. 9, 2023, 13 pages.
U.S. Appl. No. 17/430,574 "Non-Final Office Action" dated Jan. 23, 2023, 8 pages.
U.S. Appl. No. 17/732,308 "Non-Final Office Action" dated Jul. 27, 2022, 10 pages.
U.S. Appl. No. 17/732,308 "Notice of Allowability" dated Mar. 3, 2023, 2 pages.
U.S. Appl. No. 17/732,308 "Notice of Allowance" dated Dec. 6, 2022, 5 pages.
U.S. Appl. No. 17/827,067 "Notice of Allowance" dated Mar. 2, 2023, 8 pages.
U.S. Appl. No. 17/834,482 "Notice of Allowance" dated Mar. 8, 2023, 7 pages.
U.S. Appl. No. 17/839,856 "Non-Final Office Action" dated Feb. 10, 2023, 15 pages.
Yin Jieming, et al., "Modular Routing Design for Chiplet-Based Systems", 2018 ACM/IEEE 45th Annual International Symposium on Computer Architecture (ISCA), IEEE, Jun. 1, 2018, pp. 726-738, XP033375532.
Young Vinson et al: "Combining HW/SW Mechanisms to Improve NUMA Performance of Multi-GPU Systems", 2018 51ST Annual IEEE/ACM International Symposium on Microarchitecture (MICRO), IEEE, Oct. 20, 2018 (Oct. 20, 2018), pp. 339-351, XP033473308.
U.S. Appl. No. 15/494,773 "Final Office Action" dated Oct. 12, 2018, 18 pages.
U.S. Appl. No. 15/494,773 "Non-Final Office Action" dated Apr. 18, 2018, 14 pages.
U.S. Appl. No. 15/494,773 "Notice of Allowability" dated Jul. 31, 2019, 2 pages.
U.S. Appl. No. 15/494,773 "Notice of Allowance" dated Jun. 19, 2019, 8 pages.
U.S. Appl. No. 15/787,129 "Non-Final Office Action" dated Aug. 27, 2018, 9 pages.
U.S. Appl. No. 15/787,129 "Non-Final Office Action" dated Mar. 7, 2019, 10 pages.
U.S. Appl. No. 15/787,129 "Notice of Allowance" dated Jul. 10, 2019, 8 pages.
U.S. Appl. No. 15/819,152 "Final Office Action" dated Nov. 19, 2018, 9 pages.
U.S. Appl. No. 15/819,152 "Non-Final Office Action" dated Feb. 28, 2018, 7 pages.
U.S. Appl. No. 15/819,152 "Notice of Allowability" dated Apr. 11, 2019, 2 pages.
U.S. Appl. No. 15/819,152 "Notice of Allowance" dated Mar. 19, 2019, 5 pages.
U.S. Appl. No. 15/819,167 "Final Office Action" dated Aug. 19, 2020, 22 pages.
U.S. Appl. No. 15/819,167 "Final Office Action" dated Jun. 2, 2021, 20 pages.
U.S. Appl. No. 15/819,167 "Final Office Action" dated Oct. 1, 2018, 17 pages.
U.S. Appl. No. 15/819,167 "Final Office Action" dated Oct. 18, 2019, 17 pages.
U.S. Appl. No. 15/819,167 "Non-Final Office Action" dated Dec. 14, 2021, 20 pages.
U.S. Appl. No. 15/819,167 "Non-Final Office Action" dated Jan. 26, 2021, 19 pages.
U.S. Appl. No. 15/819,167 "Non-Final Office Action" dated Mar. 1, 2018, 12 pages.
U.S. Appl. No. 15/819,167 "Non-Final Office Action" dated Mar. 31, 2020, 19 pages.
U.S. Appl. No. 15/819,167 "Non-Final Office Action" dated May 2, 2019, 15 pages.
U.S. Appl. No. 15/819,167 "Notice of Allowability" dated Jul. 7, 2022, 4 pages.
U.S. Appl. No. 15/819,167 "Notice of Allowance" dated Apr. 12, 2022, 7 pages.
U.S. Appl. No. 16/227,645 "Final Office Action" dated Jul. 9, 2021, 23 pages.
U.S. Appl. No. 16/227,645 "Final Office Action" dated Sep. 8, 2020, 20 pages.
U.S. Appl. No. 16/227,645 "Non-Final Office Action" dated Apr. 8, 2020, 19 pages.
U.S. Appl. No. 16/227,645 "Non-Final Office Action" dated Dec. 17, 2021, 23 pages.
U.S. Appl. No. 16/227,645 "Non-Final Office Action" dated Feb. 22, 2021, 23 pages.
U.S. Appl. No. 16/227,645 "Notice of Allowability" dated Aug. 4, 2022, 2 pages.

(56) References Cited

OTHER PUBLICATIONS

U.S. Appl. No. 16/227,645 "Notice of Allowance" dated May 25, 2022, 7 pages.
U.S. Appl. No. 16/432,402 "Final Office Action" dated Feb. 19, 2021, 9 pages.
U.S. Appl. No. 16/432,402 "Non-Final Office Action" dated Jul. 10, 2020, 17 pages.
U.S. Appl. No. 16/432,402 "Notice of Allowance" dated Jun. 23, 2021, 5 pages.
U.S. Appl. No. 17/064,427 "Final Office Action" dated Jan. 21, 2021, 13 pages.
U.S. Appl. No. 17/064,427 "Non-Final Office Action" dated Dec. 7, 2020, 11 pages.
U.S. Appl. No. 17/064,427 "Notice of Allowability" dated Jun. 10, 2021, 2 pages.
U.S. Appl. No. 17/064,427 "Notice of Allowance" dated May 12, 2021, 7 pages.
U.S. Appl. No. 17/095,544 "Notice of Allowability" dated Feb. 10, 2023, 2 pages.
U.S. Appl. No. 17/095,544 "Notice of Allowance" dated Jan. 31, 2023, 10 pages.
U.S. Appl. No. 17/095,590 "Restriction Requirement" dated Feb. 9, 2023, 5 pages.
U.S. Appl. No. 17/122,905 "Final Office Action" dated Apr. 1, 2022, 29 pages.
U.S. Appl. No. 17/122,905 "Final Office Action" dated Dec. 27, 2022, 23 pages.
U.S. Appl. No. 17/122,905 "Final Office Action" dated May 11, 2021, 23 pages.
U.S. Appl. No. 17/122,905 "Non-Final Office Action" dated Aug. 30, 2022, 26 pages.
U.S. Appl. No. 17/122,905 "Non-Final Office Action" dated Feb. 17, 2021, 20 pages.
U.S. Appl. No. 17/122,905 "Non-Final Office Action" dated Nov. 16, 2021, 23 pages.
U.S. Appl. No. 17/169,232 "Notice of Allowability" dated Jun. 14, 2021, 3 pages.
U.S. Appl. No. 17/169,232 "Notice of Allowance" dated Apr. 7, 2021, 8 pages.
U.S. Appl. No. 17/303,654 "Notice of Allowability" dated Feb. 27, 2023, 2 pages.
U.S. Appl. No. 17/303,654 "Notice of Allowance" dated Feb. 14, 2023, 8 pages.
U.S. Appl. No. 17/304,092 "Non-Final Office Action" dated Oct. 28, 2021, 17 pages.
Cano, Alberto: A survey on graphic processing unit computing for large-scale data mining. In: WIREs Data Mining and Knowledge Discovery, 8, Dec. 14, 2017, (Online), 1, S. e1232:1-e1232:24. ISSN 1942-4795.
Goodfellow, et al. "Adaptive Computation and Machine Learning Series", Book, Nov. 18, 2016, pp. 98-165, Chapter 5, The MIT Press, Cambridge, MA.
International Patent Application No. PCT/US20/22841 "International Preliminary Report on Patentability" dated Sep. 16, 2021, 7 pages.
International Patent Application No. PCT/US20/22841 "International Search Report and Written Opinion" dated Jun. 7, 2020, 10 pages.
International Patent Application No. PCT/US20/22851 "International Preliminary Report on Patentability" dated Sep. 16, 2021, 7 pages.
International Patent Application No. PCT/US20/22851 "International Search Report and Written Opinion" dated Jun. 29, 2020, 10 pages.
Kaseridis Dimitris, et al., "Minimalist open-page: A DRAM page-mode scheduling polidy for the many-core era", 2011 44th Annual IEEE/ACM International Symposium on Michoarechtecture ACM, Dec. 3, 2011, p. 24-35, XP033064864.
Li Bingchao et al: "Elastic-Cache: GPU Cache Architecture for Efficient Fine- and Coarse-Grained Cache-Line Management", 2017 IEEE International Parallel and Distributed Processing Symposium (IPDPS), IEEE, May 29, 2017 (May 27, 2017), pp. 82-91, XP033113921.
Nicholas Wilt, "The CUDA Handbook; A Comprehensive Guide to GPU Programming", Book, Jun. 22, 2013, pp. 41-57, Addison-Wesley Professional, Boston, MA.
Non-Final Office Action in U.S. Appl. No. 17/429,291, dated May 22, 2023, 20 pages.
Office Action for U.S. Appl. No. 17/122,905, dated Apr. 25, 2023, 24 pages.
Office Action from DE Application No. 112020003700.2, dated Mar. 16, 23, 18 pages (no translation included).
Office Action, "Translation of Notice" for TW Application No. 111130374, dated Mar. 9, 2023, 5 pages.
Ross, et al. "Intel Processor Graphics: Architecture & Programming", Power Point Presentation, Aug. 2015, 78 pages, Intel Corporation, Santa Clara, CA.
Shane Cook, "CUDA Programming", Book, 2013, pp. 37-52, Chapter 3, Elsevier Inc., Amsterdam Netherlands.
Tawain IPO Search Report for TW Application No. 111130374 dated Mar. 9, 2023 1 page.
U.S. Appl. No. 17/428,527"Non-Final Office Action" dated Mar. 30, 2023, 20 pages.
U.S. Appl. No. 17/429,873 "Final Office Action" dated Apr. 26, 2023, 14 pages.
Alfredo Buttari et al. "Using Mixed Precision for Sparse Matrix Computations to Enhance the Performance while Achieving 64-bit Accuracy" University of Tennessee Knoxville, Oak Ridge National Laboratory (Year: 2006).
AMD, "Graphics Core Next Architecture, Generation 3", Aug. 2016. (Year: 2016).
Anonymous: "bfloat16 floating-point format", retrieved from wikipedia on May 26, 2020, Aug. 24, 2018, 5 pages.
Cui Xuewen et al: Directive-Based Partitioning and Pipelining for Graphics Processing Units11 , 2017 IEEE International Parallel and Distributed Processing Symposium (IPDPS), IEEE, May 29, 2017 (May 29, 2017), pp. 575-584, XP033113969.
Eriko Nurvitadhi et al: "Can FPGAs Beat GPUs in Accelerating Next-Generation Deep Neural Networks?" Proceedings of the 2017 ACM/SIGDA International Symposium on 1Field-Programmable Gate Arrays, FPGA 17, Feb. 22, 2017, pp. 5-14, XP055542383.
International Patent Application No. PCT/US20/022840 "International Preliminary Report on Patentability" dated Sep. 16, 2021, 9 pages.
International Patent Application No. PCT/US20/22833 "International Preliminary Report on Patentability" dated Sep. 16, 2021, 6 pages.
International Patent Application No. PCT/US20/22833 "International Search Report and Written Opinion" dated Jul. 8, 2020, 8 pages.
International Patent Application No. PCT/US20/22835 "International Preliminary Report on Patentability" dated Sep. 16, 2021, 7 pages.
International Patent Application No. PCT/US20/22835 "International Search Report and Written Opinion" dated Jun. 10, 2020, 10 pages.
International Patent Application No. PCT/US20/22836 "International Preliminary Report on Patentability" dated Sep. 16, 2021, 8 pages.
International Patent Application No. PCT/US20/22836 "International Search Report and Written Opinion" dated Jun. 26, 2020, 11 pages.
International Patent Application No. PCT/US20/22837 "International Preliminary Report on Patentability" dated Sep. 16, 2021, 9 pages.
International Patent Application No. PCT/US20/22837 "International Search Report and Written Opinion" dated Sep. 15, 2020, 14 pages.
International Patent Application No. PCT/US20/22838 "International Preliminary Report on Patentability" dated Sep. 16, 2021, 8 pages.

(56) References Cited

OTHER PUBLICATIONS

International Patent Application No. PCT/US20/22838 "International Search Report and Written Opinion" dated Jul. 6, 2020, 11 pages.
International Patent Application No. PCT/US20/22839 "International Preliminary Report on Patentability" dated Sep. 16, 2021, 6 pages.
International Patent Application No. PCT/US20/22839 "International Search Report and Written Opinion" dated Jul. 8, 2020, 8 pages.
International Patent Application No. PCT/US20/22840 "International Search Report and Written Opinion" dated Jul. 3, 2020, 11 pages.
International Patent Application No. PCT/US20/22843 "International Preliminary Report on Patentability" dated Sep. 16, 2021, 7 pages.
International Patent Application No. PCT/US20/22843 "International Search Report and Written Opinion" dated Jul. 28, 2020, 13 pages.
International Patent Application No. PCT/US20/22844 "International Preliminary Report on Patentability" dated Sep. 16, 2021, 10 pages.
International Patent Application No. PCT/US20/22844 "International Search Report and Written Opinion" dated Jul. 2, 2020, 13 pages.
International Patent Application No. PCT/US20/22845 "International Preliminary Report on Patentability" dated Sep. 16, 2021, 10 pages.
International Patent Application No. PCT/US20/22845 "International Search Report and Written Opinion" dated Jun. 30, 2020, 13 pages.
International Patent Application No. PCT/US20/22846 "International Preliminary Report on Patentability" dated Sep. 16, 2021, 12 pages.
International Patent Application No. PCT/US20/22846 "International Search Report and Written Opinion" dated Aug. 31, 2020, 16 pages.
International Patent Application No. PCT/US20/22847 "International Preliminary Report on Patentability" dated Sep. 16, 2021, 6 pages.
International Patent Application No. PCT/US20/22847 "International Search Report and Written Opinion" dated Jul. 6, 2020, 8 pages.
International Patent Application No. PCT/US20/22848 "International Preliminary Report on Patentability" dated Sep. 16, 2021, 9 pages.
International Patent Application No. PCT/US20/22848 "International Search Report and Written Opinion" dated Jul. 3, 2020, 12 pages.
International Patent Application No. PCT/US20/22849 "International Preliminary Report on Patentability" dated Sep. 16, 2021, 6 pages.
International Patent Application No. PCT/US20/22849 "International Search Report and Written Opinion" dated Jul. 8, 2020, 9 pages.
International Patent Application No. PCT/US20/22850 "International Preliminary Report on Patentability" dated Sep. 16, 2021, 7 pages.
International Patent Application No. PCT/US20/22850 "International Search Report and Written Opinion" dated Jul. 21, 2020, 9 pages.
International Patent Application No. PCT/US20/22852 "International Preliminary Report on Patentability" dated Sep. 16, 2021, 6 pages.
International Patent Application No. PCT/US20/22852 "International Search Report and Written Opinion" dated Jul. 21, 2020, 9 pages.
Janzen Johan et al: "Partitioning GPUs for Improved Scalability", 2016 28th International Symposium on Computer Architecture and High Performance Computing (SBAC-PAD), IEEE, Oct. 26, 2016 (Oct. 26, 2016), pp. 42-49, XP033028008.
Luo Cheng et al, "An Efficient Task Partitioning and Scheduling Method for Symmetric Multiple GPU Architecture", 2013 12th IEEE International Conference on Trust, Security and Privacy in Computing and Communications, IEEE, Jul. 16, 2013 (Jul. 16, 2013), p. 1133-1142, XP032529503.
Mark Harris: "Mixed-Precision Programming 1-5 with CUDA 8", Oct. 19, 2016, XP055509917, 11 pages.
Meng, J. et al. Dynamic wrap subdivision for integrated branch and memory divergence tolerance. ACM SIGARCH Computer Architecture News, Jun. 2010 [online], [retrieved on Feb. 16, 2021]. Retrieved from the internet.
Notification of Grant of Taiwan Patent Application No. 107105949 dated Apr. 14, 2022, 43 pages.
Nvidia: "NVIDIA Tesla P100 NVIDIA Tesla P100 Whitepaper", Jun. 21, 2016, pp. 1-45, downloaded from https://images.nvidia.com/content/pdf/tesla/whitepaper/pascal-architecture-white paper.pdf.
NVIDIA's Next Generation CUDA Compute Architecture: Fermi. Datasheet [online]. NVIDIA, 2009 [retrieved on Oct. 3, 2019]. Retrieved from the internet.
Office Action and Search Report for Taiwan Patent Application No. 108141986 dated Mar. 4, 2022, 24 pages (including translation).
Ogg, et al., "Improved Data Compression for Serial Interconnected Network on Chip through Unused Significant Bit Removal", VLSO Design, 2006. Held jointly with 5th International Conference on Embedded Systems and Design. 19th International Conference on, Piscataway, NJ, USA, IEEE Jan. 3, 2006, pp. 525-529, XP010883136. ISBN: 978-0-7695-2502-0.
Pearson Carl et al: "NUMA-Aware Data-Transfer Measurements for Power/NVLink Multi-GPU Systems", Jan. 25, 2019 (Jan. 25, 2019), ROBOCUP 2008: Robot Soccer World Cup XII; pp. 448-454, XP047501461, ISBN: 978-3-319-10403-4 [retrieved on Jan. 25, 2019] p. 452, line 14—p. 453, line 6.
Stephen Junkins, "The Compute Architecture of Intel Processor Graphics Gen9", paper, Aug. 14, 2015, 22 pages, Version 1.0, Intel Corporation, Santa Clara, CA.
Temam O et al: "Software assistance for data caches", High-Performance Computer Architecture, 1995. Proceedings., First IEEE Symposium on Raleigh, NC, USA Jan. 22-25, 1995, Los Alamitos, CA, USA.IEEE Comput. Soc, Jan. 22, 1995 (Jan. 22, 1995), pp. 154-163, XP010130123.
Tong Chen et al: "Prefetching irregular references for software cache on cell", Sixth Annual IEEE/ACM International Symposium on Code Generation and 1Optimization (CGO 08). Boston, MA, USA, Apr. 5-9, 2008, New York, NY: ACM, 2 Penn Plaza, Suite 701 New York NY 10121-0701 USA, Apr. 6, 2008 (Apr. 6, 2008), pp. 155-164, XP058192632.
Bruintjes, T., "Sabrewing: A lightweight architecture for combined floating-point and integer arithmetic." ACM Transactions on Architecture and Code Optimization (TACO) 8.4(12): 1-22, 2012.
Herrera, A., "NVIDIA GRID: Graphics Accelerated VDI with the Visual Performance of a Workstation", 18 pages, May 2014.
Macri, J., "AMD's Next Generation GPU and High Bandwidth Memory Architecture: FURY", 26 pages, Aug. 2015.
Office Action for TW Application No. 112124508, dated Aug. 22, 2023, 4 pages.
Office Action for U.S. Appl. No. 17/428,523, dated Aug. 3, 2023, 12 pages.
Sze, V. et al., "Efficient Processing of Deep Neural Networks: A Tutorial and Survey", 31 pages, Mar. 27, 2017.
U.S. Appl. No. 17/590,362 "Non-Final Office Action" dated Jul. 10, 2023, 29 pages.
Yuan, et al., "Complexity Effective Memory Access Scheduling for Many-Core Accelerator Architectures", 11 pages, Dec. 2009.
Communication pursuant to Article 94(3) for EP 22 198 615.1, 5 pages.
Non-Final OA Issued in U.S. Appl. No. 17/429,277 dated Jul. 7, 2023, 9 pages.
Office Action for U.S. Appl. No. 17/430,611 dated Jun. 2, 2023, 10 pages.
Office Action for JP 2021-547450, dated Jun. 6, 2023, 15 pages.

(56) References Cited

OTHER PUBLICATIONS

Office Action for U.S. Appl. No. 17/095,590, dated Jul. 28, 23, 2023 pages.
Office Action for U.S. Appl. No. 17/428,216, dated Jul. 7, 2023, 21 pages.
Office Action for U.S. Appl. No. 17/428,534, dated Jul. 17, 2023, 20 pages.
Office Action for U.S. Appl. No. 17/428,529, dated Jun. 7, 2023, 18 pages.
U.S. Appl. No. 17/674,703 Non-Final Office Action dated Jul. 14, 2023, 23 pages.
U.S. Appl. No. 17/430,574 "Final Office Action" dated May 24, 2023, 9 pages.
U.S. Appl. No. 17/430,611 "Non-Final Office Action" dated Jun. 2, 2023, 11 pages.
Communication pursuant to Article 94(3) for EP22210195, dated Oct. 4, 2023, 7 pages.
Final OA for U.S. Appl. No. 17/590,362, dated Dec. 4, 2023, 30 pages.
Final Office Action for U.S. Appl. No. 17/428,529, dated Oct. 20, 2023, 20 pages.
Final Office Action for U.S. Appl. No. 17/430,611 dated Oct. 26, 2023, 11 pages.
Final Office Action for U.S. Appl. No. 17/674,703, dated Dec. 13, 2023, 26 pages.
Hong, et al., "Attache: Towards Ideal Memory Compression by Mitigating Metadata Bandwidth Overheads.", 2018 (Year: 2018).
Notice of Allowance for U.S. Appl. No. 17/310,540, dated Nov. 21, 2023, 8 pages.
Notice of Reasons for Refusal in JP Application No. 2021-544544, dated Oct. 31, 2023, 4 pages.
Office Action for CN202110906984, 6 pages, dated Nov. 21, 2023.
Office Action for U.S. Appl. No. 17/428,530, dated Nov. 14, 2023, 7 pages.
U.S. Appl. No. 17/429,277 "Notice of Allowance" dated Oct. 31, 2023, 11 pages.
U.S. Appl. No. 17/430,963 Non-Final OA dated Sep. 28, 2023, 18 pages.
Office Action for U.S. Appl. No. 17/862,739 dated Sep. 21, 2023, 19 pages.
U.S. Appl. No. 17/429,873 "Notice of Allowance" dated Sep. 7, 2023, 8 pages.
U.S. Appl. No. 17/967,283 "Non-Final Office Action" dated Aug. 18, 2023, 23 pages.
U.S. Appl. No. 17/429,291, Final Office Action, dated Sep. 28, 2023.

* cited by examiner

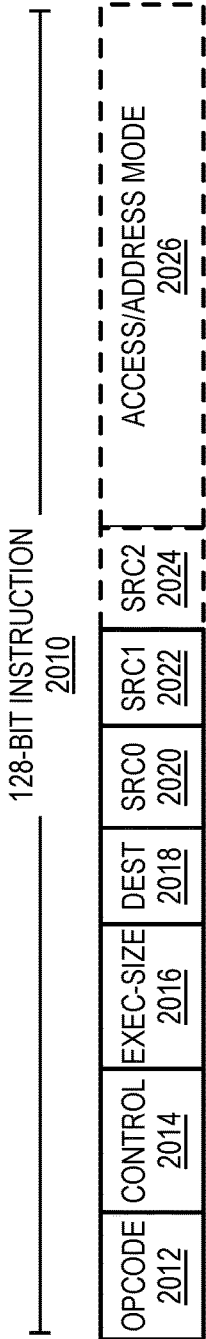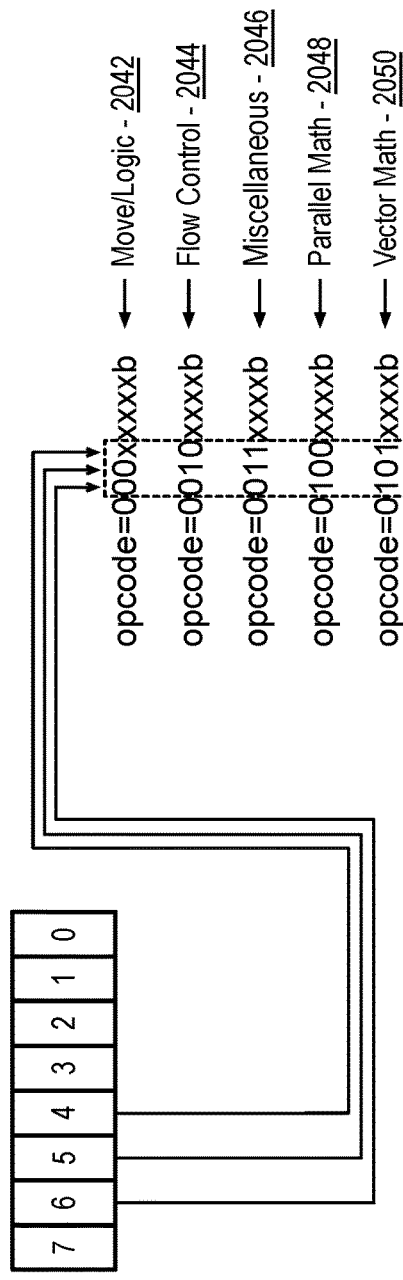
FIG. 20

FIG. 22A GRAPHICS PROCESSOR COMMAND FORMAT
2200
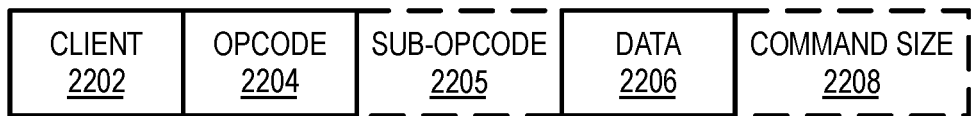
FIG. 22B GRAPHICS PROCESSOR COMMAND SEQUENCE
2210
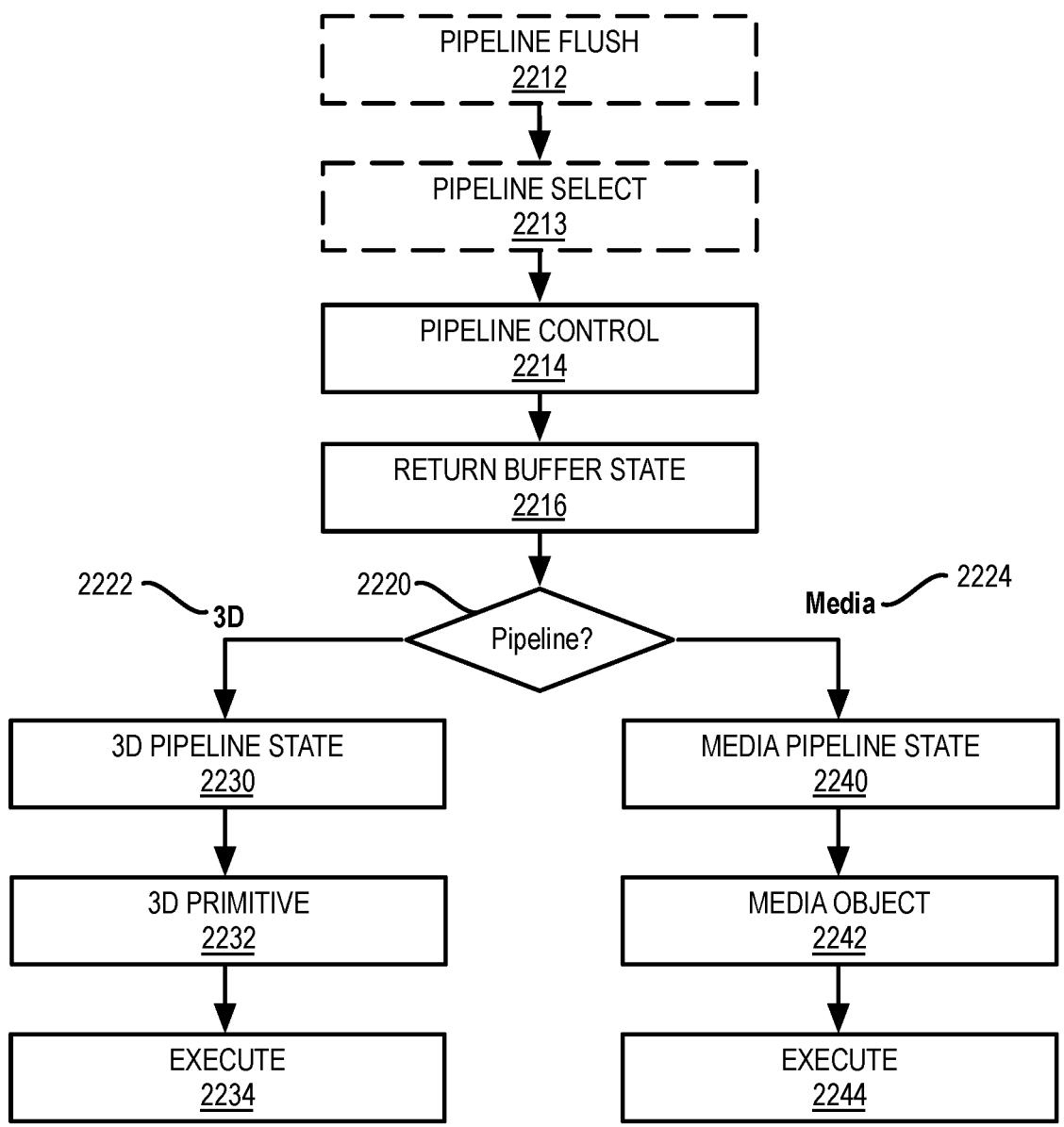

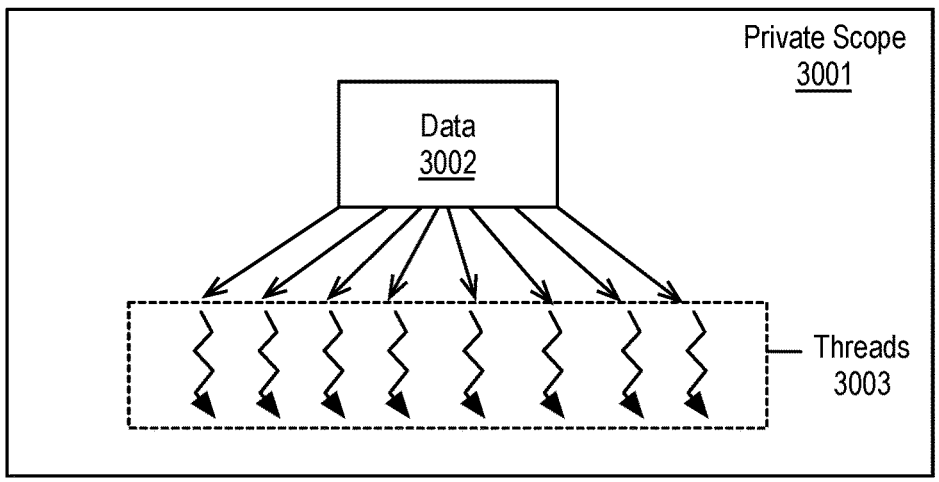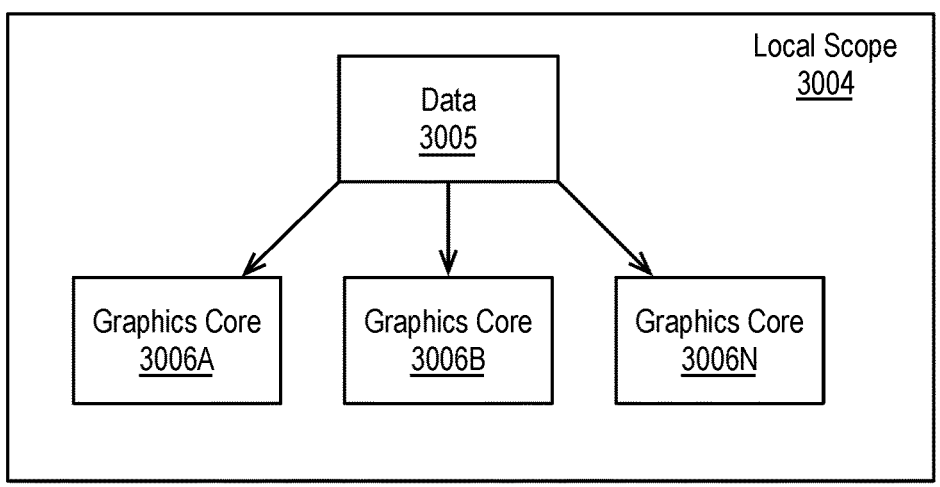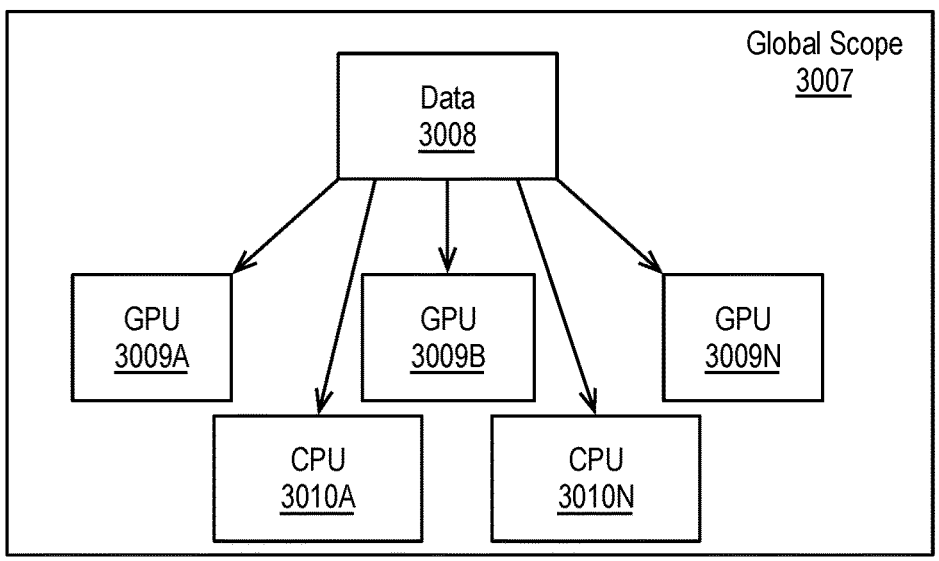
FIG. 30

INSTRUCTION BASED CONTROL OF MEMORY ATTRIBUTES

FIELD

This disclosure relates generally to cache control for a graphics processing unit and more particularly to instruction based cache control for a graphics processing unit.

BACKGROUND OF THE DISCLOSURE

A GPU can include an L1 cache that is a virtually indexed cache. A virtually indexed cache can begin a cache lookup before virtual to physical translation is performed, which reduces the latency to access the cache. However, as a virtual address is used to index into the cache, page table entry-based caching control cannot be used, as the cache index process is performed before the page table entry for the access is read during virtual to physical memory translation.

BRIEF DESCRIPTION OF THE DRAWINGS

The present invention is illustrated by way of example and not limitation in the figures of the accompanying drawings in which like references indicate similar elements, and in which:

FIG. 20 is a block diagram illustrating graphics processor instruction formats;

FIG. 22A-22B illustrate a graphics processor command format and command sequence;

FIG. 30 illustrates impact of the memory scope attribute for a surface on cache flush and coherency behavior;

DETAILED DESCRIPTION

A graphics processing unit (GPU) is communicatively coupled to host/processor cores to accelerate, for example, graphics operations, machine-learning operations, pattern analysis operations, and/or various general-purpose GPU (GPGPU) functions. The GPU may be communicatively coupled to the host processor/cores over a bus or another interconnect (e.g., a high-speed interconnect such as PCIe or NVLink). Alternatively, the GPU may be integrated on the same package or chip as the cores and communicatively coupled to the cores over an internal processor bus/interconnect (i.e., internal to the package or chip). Regardless of the manner in which the GPU is connected, the processor cores may allocate work to the GPU in the form of sequences of commands/instructions contained in a work descriptor. The GPU then uses dedicated circuitry/logic for efficiently processing these commands/instructions.

Current parallel graphics data processing includes systems and methods developed to perform specific operations on graphics data such as, for example, linear interpolation, tessellation, rasterization, texture mapping, depth testing, etc. Traditionally, graphics processors used fixed function computational units to process graphics data. However, more recently, portions of graphics processors have been made programmable, enabling such processors to support a wider variety of operations for processing vertex and fragment data.

To further increase performance, graphics processors typically implement processing techniques such as pipelining that attempt to process, in parallel, as much graphics data as possible throughout the different parts of the graphics pipeline. Parallel graphics processors with single instruction, multiple thread (SIMT) architectures are designed to maximize the amount of parallel processing in the graphics pipeline. In a SIMT architecture, groups of parallel threads attempt to execute program instructions synchronously together as often as possible to increase processing efficiency. A general overview of software and hardware for SIMT architectures can be found in Shane Cook, *CUDA Programming* Chapter 3, pages 37-51 (2013).

In the following description, numerous specific details are set forth to provide a more thorough understanding. However, it will be apparent to one of skill in the art that the embodiments described herein may be practiced without one or more of these specific details. In other instances, well-known features have not been described to avoid obscuring the details of the present embodiments.

System Overview

Figure 1:
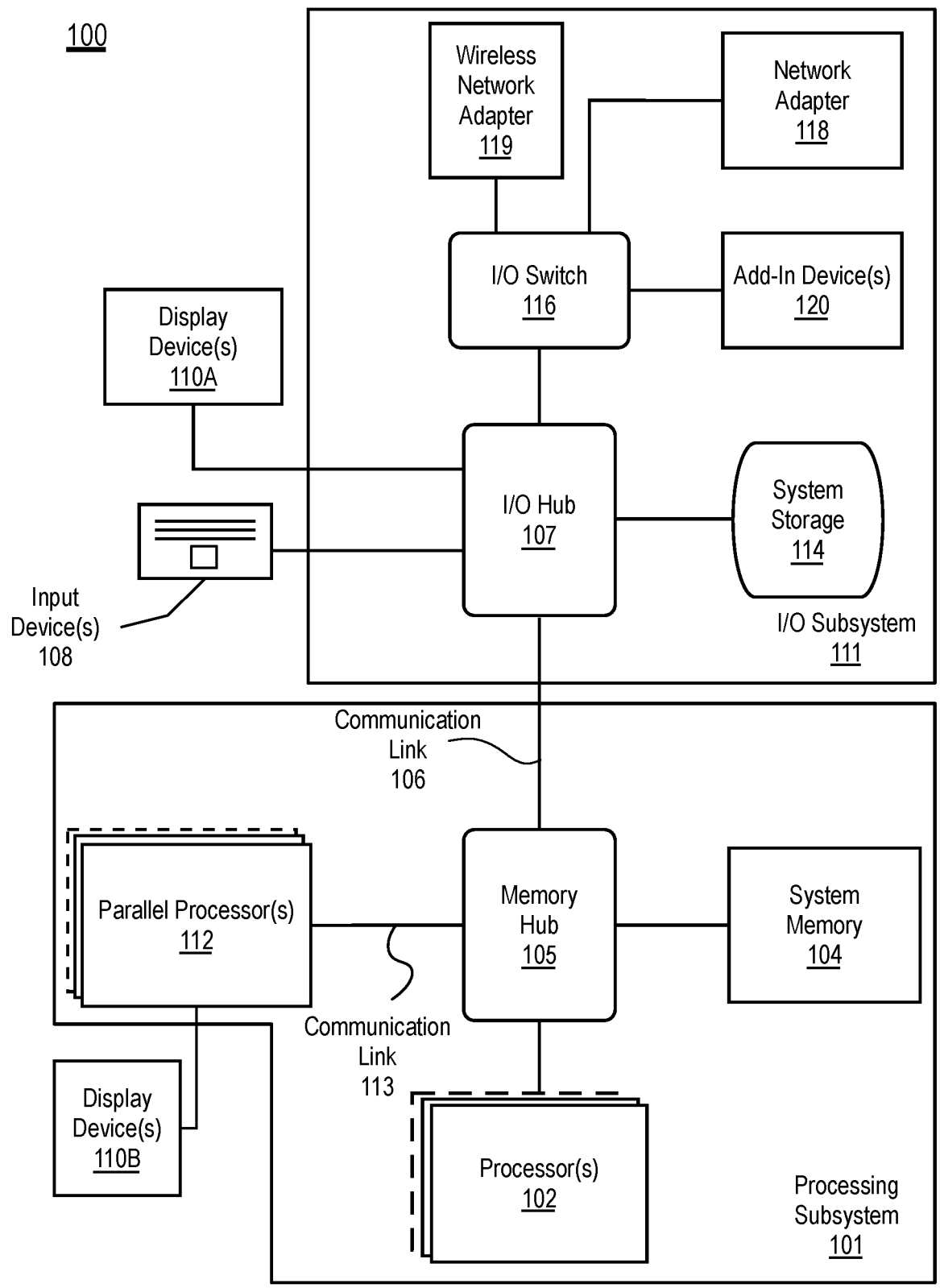
FIG. 1 is a block diagram illustrating a computer system configured to implement one or more aspects of the embodiments described herein.

FIG. 1 is a block diagram illustrating a computing system 100 configured to implement one or more aspects of the embodiments described herein. The computing system 100 includes a processing subsystem 101 having one or more processor(s) 102 and a system memory 104 communicating via an interconnection path that may include a memory hub 105. The memory hub 105 may be a separate component within a chipset component or may be integrated within the one or more processor(s) 102. The memory hub 105 couples with an I/O subsystem 111 via a communication link 106. The I/O subsystem 111 includes an I/O hub 107 that can enable the computing system 100 to receive input from one or more input device(s) 108. Additionally, the I/O hub 107 can enable a display controller, which may be included in the one or more processor(s) 102, to provide outputs to one or more display device(s) 110A. In one embodiment the one or more display device(s) 110A coupled with the I/O hub 107 can include a local, internal, or embedded display device.

The processing subsystem 101, for example, includes one or more parallel processor(s) 112 coupled to memory hub 105 via a bus or other communication link 113. The communication link 113 may be one of any number of standards-based communication link technologies or protocols, such as, but not limited to PCI Express, or may be a vendor specific communications interface or communications fabric. The one or more parallel processor(s) 112 may form a computationally focused parallel or vector processing system that can include a large number of processing cores and/or processing clusters, such as a many integrated core (MIC) processor. For example, the one or more parallel processor(s) 112 form a graphics processing subsystem that can output pixels to one of the one or more display device(s) 110A coupled via the I/O hub 107. The one or more parallel processor(s) 112 can also include a display controller and display interface (not shown) to enable a direct connection to one or more display device(s) 110B.

Within the I/O subsystem 111, a system storage unit 114 can connect to the I/O hub 107 to provide a storage mechanism for the computing system 100. An I/O switch 116 can be used to provide an interface mechanism to enable connections between the I/O hub 107 and other components, such as a network adapter 118 and/or wireless network adapter 119 that may be integrated into the platform, and various other devices that can be added via one or more add-in device(s) 120. The add-in device(s) 120 may also include, for example, one or more external graphics processor devices, graphics cards, and/or compute accelerators. The network adapter 118 can be an Ethernet adapter or another wired network adapter. The wireless network adapter 119 can include one or more of a Wi-Fi, Bluetooth, near field communication (NFC), or other network device that includes one or more wireless radios.

The computing system 100 can include other components not explicitly shown, including USB or other port connections, optical storage drives, video capture devices, and the like, which may also be connected to the I/O hub 107. Communication paths interconnecting the various components in FIG. 1 may be implemented using any suitable protocols, such as PCI (Peripheral Component Interconnect) based protocols (e.g., PCI-Express), or any other bus or point-to-point communication interfaces and/or protocol(s), such as the NVLink high-speed interconnect, Compute Express Link™ (CXL™) (e.g., CXL.mem), Infinity Fabric (IF), Ethernet (IEEE 802.3), remote direct memory access (RDMA), InfiniBand, Internet Wide Area RDMA Protocol (iWARP), Transmission Control Protocol (TCP), User Datagram Protocol (UDP), quick UDP Internet Connections (QUIC), RDMA over Converged Ethernet (RoCE), Intel QuickPath Interconnect (QPI), Intel Ultra Path Interconnect (UPI), Intel On-Chip System Fabric (IOSF), Omnipath, HyperTransport, Advanced Microcontroller Bus Architecture (AMBA) interconnect, OpenCAPI, Gen-Z, Cache Coherent Interconnect for Accelerators (CCIX), 3GPP Long Term Evolution (LTE) (4G), 3GPP 5G, and variations thereof, or wired or wireless interconnect protocols known in the art. In some examples, data can be copied or stored to virtualized storage nodes using a protocol such as non-volatile memory express (NVMe) over Fabrics (NVMe-oF) or NVMe.

The one or more parallel processor(s) 112 may incorporate circuitry optimized for graphics and video processing, including, for example, video output circuitry, and constitutes a graphics processing unit (GPU). Alternatively or additionally, the one or more parallel processor(s) 112 can incorporate circuitry optimized for general purpose processing, while preserving the underlying computational architecture, described in greater detail herein. Components of the computing system 100 may be integrated with one or more other system elements on a single integrated circuit. For example, the one or more parallel processor(s) 112, memory hub 105, processor(s) 102, and I/O hub 107 can be integrated into a system on chip (SoC) integrated circuit. Alternatively, the components of the computing system 100 can be integrated into a single package to form a system in package (SIP) configuration. In one embodiment at least a portion of the components of the computing system 100 can be integrated into a multi-chip module (MCM), which can be interconnected with other multi-chip modules into a modular computing system.

It will be appreciated that the computing system 100 shown herein is illustrative and that variations and modifications are possible. The connection topology, including the number and arrangement of bridges, the number of processor(s) 102, and the number of parallel processor(s) 112, may be modified as desired. For instance, system memory 104 can be connected to the processor(s) 102 directly rather than through a bridge, while other devices communicate with system memory 104 via the memory hub 105 and the processor(s) 102. In other alternative topologies, the parallel processor(s) 112 are connected to the I/O hub 107 or directly to one of the one or more processor(s) 102, rather than to the memory hub 105. In other embodiments, the I/O hub 107 and memory hub 105 may be integrated into a single chip. It is also possible that two or more sets of processor(s) 102 are attached via multiple sockets, which can couple with two or more instances of the parallel processor(s) 112.

Some of the particular components shown herein are optional and may not be included in all implementations of the computing system 100. For example, any number of add-in cards or peripherals may be supported, or some components may be eliminated. Furthermore, some architectures may use different terminology for components similar to those illustrated in FIG. 1. For example, the memory hub 105 may be referred to as a Northbridge in some architectures, while the I/O hub 107 may be referred to as a Southbridge.

Figure 2A:
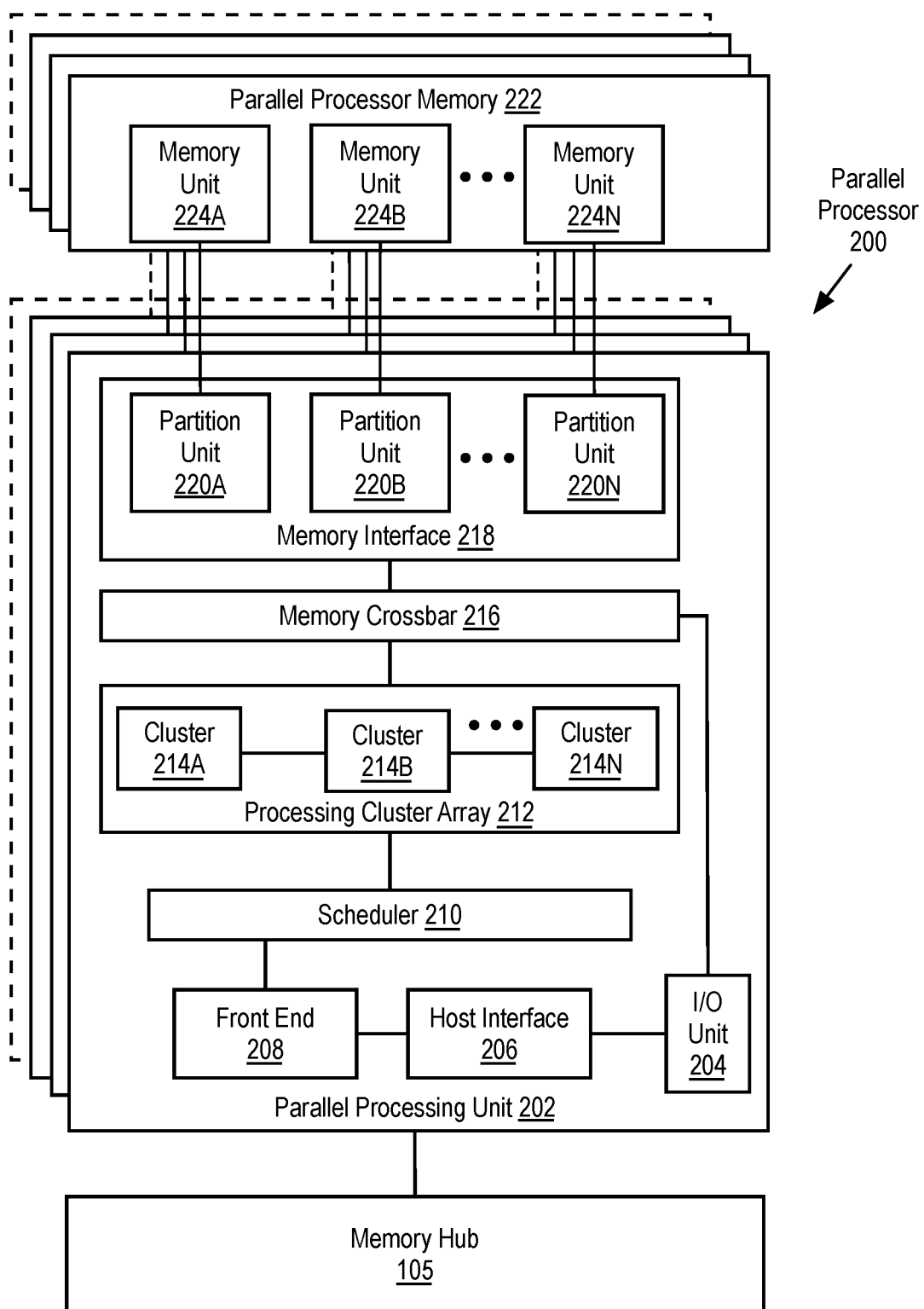
FIG. 2A-2D illustrate parallel processor components.

FIG. 2A illustrates a parallel processor 200. The parallel processor 200 may be a GPU, GPGPU or the like as described herein. The various components of the parallel processor 200 may be implemented using one or more integrated circuit devices, such as programmable processors, application specific integrated circuits (ASICs), or field programmable gate arrays (FPGA). The illustrated parallel processor 200 may be one or more of the parallel processor(s) 112 shown in FIG. 1.

The parallel processor 200 includes a parallel processing unit 202. The parallel processing unit includes an I/O unit 204 that enables communication with other devices, including other instances of the parallel processing unit 202. The I/O unit 204 may be directly connected to other devices. For instance, the I/O unit 204 connects with other devices via the use of a hub or switch interface, such as memory hub 105. The connections between the memory hub 105 and the I/O unit 204 form a communication link 113. Within the parallel processing unit 202, the I/O unit 204 connects with a host interface 206 and a memory crossbar 216, where the host interface 206 receives commands directed to performing processing operations and the memory crossbar 216 receives commands directed to performing memory operations.

When the host interface 206 receives a command buffer via the I/O unit 204, the host interface 206 can direct work operations to perform those commands to a front end 208. In one embodiment the front end 208 couples with a scheduler 210, which is configured to distribute commands or other work items to a processing cluster array 212. The scheduler 210 ensures that the processing cluster array 212 is properly configured and in a valid state before tasks are distributed to the processing clusters of the processing cluster array 212. The scheduler 210 may be implemented via firmware logic executing on a microcontroller. The microcontroller implemented scheduler 210 is configurable to perform complex scheduling and work distribution operations at coarse and fine granularity, enabling rapid preemption and context switching of threads executing on the processing cluster array 212. Preferably, the host software can prove workloads for scheduling on the processing cluster array 212 via one of multiple graphics processing doorbells. In other examples, polling for new workloads or interrupts can be used to identify or indicate availability of work to perform. The workloads can then be automatically distributed across the processing cluster array 212 by the scheduler 210 logic within the scheduler microcontroller.

The processing cluster array 212 can include up to "N" processing clusters (e.g., cluster 214A, cluster 214B, through cluster 214N). Each cluster 214A-214N of the processing cluster array 212 can execute a large number of concurrent threads. The scheduler 210 can allocate work to the clusters 214A-214N of the processing cluster array 212 using various scheduling and/or work distribution algorithms, which may vary depending on the workload arising for each type of program or computation. The scheduling can be handled dynamically by the scheduler 210 or can be assisted in part by compiler logic during compilation of program logic configured for execution by the processing cluster array 212. Optionally, different clusters 214A-214N of the processing cluster array 212 can be allocated for processing different types of programs or for performing different types of computations.

The processing cluster array 212 can be configured to perform various types of parallel processing operations. For example, the processing cluster array 212 is configured to perform general-purpose parallel compute operations. For example, the processing cluster array 212 can include logic to execute processing tasks including filtering of video and/or audio data, performing modeling operations, including physics operations, and performing data transformations.

The processing cluster array 212 is configured to perform parallel graphics processing operations. In such embodiments in which the parallel processor 200 is configured to perform graphics processing operations, the processing cluster array 212 can include additional logic to support the execution of such graphics processing operations, including, but not limited to texture sampling logic to perform texture operations, as well as tessellation logic and other vertex processing logic. Additionally, the processing cluster array 212 can be configured to execute graphics processing related shader programs such as, but not limited to vertex shaders, tessellation shaders, geometry shaders, and pixel shaders. The parallel processing unit 202 can transfer data from system memory via the I/O unit 204 for processing. During processing the transferred data can be stored to on-chip memory (e.g., parallel processor memory 222) during processing, then written back to system memory.

In embodiments in which the parallel processing unit 202 is used to perform graphics processing, the scheduler 210 may be configured to divide the processing workload into approximately equal sized tasks, to better enable distribution of the graphics processing operations to multiple clusters 214A-214N of the processing cluster array 212. In some of these embodiments, portions of the processing cluster array 212 can be configured to perform different types of processing. For example, a first portion may be configured to perform vertex shading and topology generation, a second portion may be configured to perform tessellation and geometry shading, and a third portion may be configured to perform pixel shading or other screen space operations, to produce a rendered image for display. Intermediate data produced by one or more of the clusters 214A-214N may be stored in buffers to allow the intermediate data to be transmitted between clusters 214A-214N for further processing.

During operation, the processing cluster array 212 can receive processing tasks to be executed via the scheduler 210, which receives commands defining processing tasks from front end 208. For graphics processing operations, processing tasks can include indices of data to be processed, e.g., surface (patch) data, primitive data, vertex data, and/or pixel data, as well as state parameters and commands defining how the data is to be processed (e.g., what program is to be executed). The scheduler 210 may be configured to fetch the indices corresponding to the tasks or may receive the indices from the front end 208. The front end 208 can be configured to ensure the processing cluster array 212 is configured to a valid state before the workload specified by incoming command buffers (e.g., batch-buffers, push buffers, etc.) is initiated.

Each of the one or more instances of the parallel processing unit 202 can couple with parallel processor memory 222. The parallel processor memory 222 can be accessed via the memory crossbar 216, which can receive memory requests from the processing cluster array 212 as well as the I/O unit 204. The memory crossbar 216 can access the parallel processor memory 222 via a memory interface 218. The memory interface 218 can include multiple partition units (e.g., partition unit 220A, partition unit 220B, through partition unit 220N) that can each couple to a portion (e.g., memory unit) of parallel processor memory 222. The number of partition units 220A-220N may be configured to be equal to the number of memory units, such that a first partition unit 220A has a corresponding first memory unit 224A, a second partition unit 220B has a corresponding second memory unit 224B, and an Nth partition unit 220N has a corresponding Nth memory unit 224N. In other embodiments, the number of partition units 220A-220N may not be equal to the number of memory devices.

The memory units 224A-224N can include various types of memory devices, including dynamic random-access memory (DRAM) or graphics random access memory, such as synchronous graphics random access memory (SGRAM), including graphics double data rate (GDDR) memory. Optionally, the memory units 224A-224N may also include 3D stacked memory, including but not limited to high bandwidth memory (HBM). Persons skilled in the art will appreciate that the specific implementation of the memory units 224A-224N can vary and can be selected from one of various conventional designs. Render targets, such as frame buffers or texture maps may be stored across the memory units 224A-224N, allowing partition units 220A-220N to write portions of each render target in parallel to efficiently use the available bandwidth of parallel processor memory 222. In some embodiments, a local instance of the parallel processor memory 222 may be excluded in favor of a unified memory design that utilizes system memory in conjunction with local cache memory.

Optionally, any one of the clusters 214A-214N of the processing cluster array 212 has the ability to process data that will be written to any of the memory units 224A-224N within parallel processor memory 222. The memory crossbar 216 can be configured to transfer the output of each cluster 214A-214N to any partition unit 220A-220N or to another cluster 214A-214N, which can perform additional processing operations on the output. Each cluster 214A-214N can communicate with the memory interface 218 through the memory crossbar 216 to read from or write to various external memory devices. In one of the embodiments with the memory crossbar 216 the memory crossbar 216 has a connection to the memory interface 218 to communicate with the I/O unit 204, as well as a connection to a local instance of the parallel processor memory 222, enabling the processing units within the different processing clusters 214A-214N to communicate with system memory or other memory that is not local to the parallel processing unit 202. Generally, the memory crossbar 216 may, for example, be able to use virtual channels to separate traffic streams between the clusters 214A-214N and the partition units 220A-220N.

While a single instance of the parallel processing unit 202 is illustrated within the parallel processor 200, any number of instances of the parallel processing unit 202 can be included. For example, multiple instances of the parallel processing unit 202 can be provided on a single add-in card, or multiple add-in cards can be interconnected. For example, the parallel processor 200 can be an add-in device, such as add-in device 120 of FIG. 1, which may be a graphics card such as a discrete graphics card that includes one or more GPUs, one or more memory devices, and device-to-device or network or fabric interfaces. The different instances of the parallel processing unit 202 can be configured to interoperate even if the different instances have different numbers of processing cores, different amounts of local parallel processor memory, and/or other configuration differences. Optionally, some instances of the parallel processing unit 202 can include higher precision floating point units relative to other instances. Systems incorporating one or more instances of the parallel processing unit 202 or the parallel processor 200 can be implemented in a variety of configurations and form factors, including but not limited to desktop, laptop, or handheld personal computers, servers, workstations, game consoles, and/or embedded systems. An orchestrator can form composite nodes for workload performance using one or more of: disaggregated processor resources, cache resources, memory resources, storage resources, and networking resources.

Figure 2B:
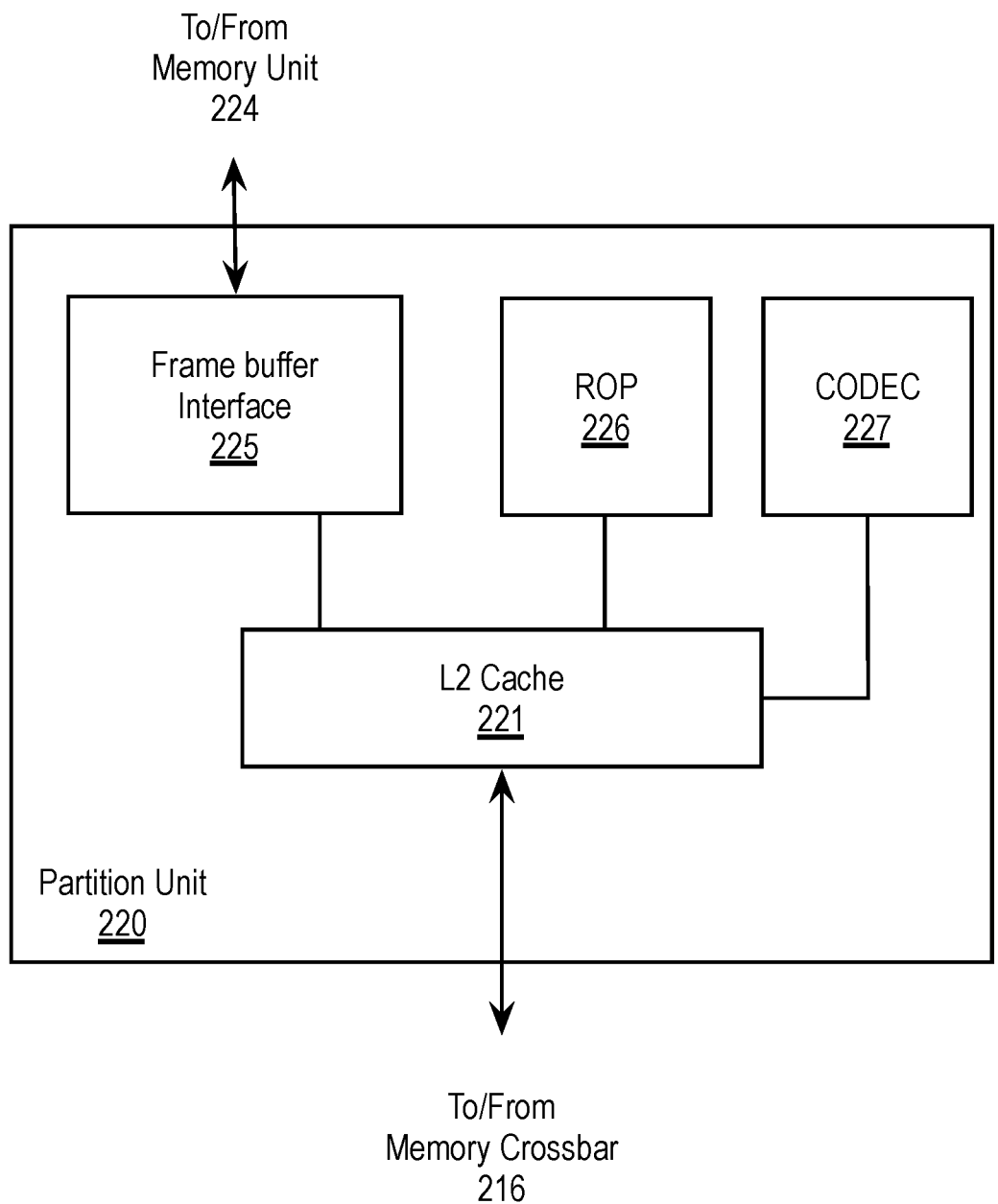

FIG. 2B is a block diagram of a partition unit 220. The partition unit 220 may be an instance of one of the partition units 220A-220N of FIG. 2A. As illustrated, the partition unit 220 includes an L2 cache 221, a frame buffer interface 225, and a ROP 226 (raster operations unit). The L2 cache 221 is a read/write cache that is configured to perform load and store operations received from the memory crossbar 216 and ROP 226. Read misses and urgent write-back requests are output by L2 cache 221 to frame buffer interface 225 for processing. Updates can also be sent to the frame buffer via the frame buffer interface 225 for processing. In one embodiment the frame buffer interface 225 interfaces with one of the memory units in parallel processor memory, such as the memory units 224A-224N of FIG. 2A (e.g., within parallel processor memory 222). The partition unit 220 may additionally or alternatively also interface with one of the memory units in parallel processor memory via a memory controller (not shown).

In graphics applications, the ROP 226 is a processing unit that performs raster operations such as stencil, z test, blending, and the like. The ROP 226 then outputs processed graphics data that is stored in graphics memory. In some embodiments the ROP 226 includes or couples with a CODEC 227 that includes compression logic to compress depth or color data that is written to memory or the L2 cache 221 and decompress depth or color data that is read from memory or the L2 cache 221. The compression logic can be lossless compression logic that makes use of one or more of multiple compression algorithms. The type of compression that is performed by the CODEC 227 can vary based on the statistical characteristics of the data to be compressed. For example, in one embodiment, delta color compression is performed on depth and color data on a per-tile basis. In one embodiment the CODEC 227 includes compression and decompression logic that can compress and decompress compute data associated with machine learning operations. The CODEC 227 can, for example, compress sparse matrix data for sparse machine learning operations. The CODEC 227 can also compress sparse matrix data that is encoded in a sparse matrix format (e.g., coordinate list encoding (COO), compressed sparse row (CSR), compress sparse column (CSC), etc.) to generate compressed and encoded sparse matrix data. The compressed and encoded sparse matrix data can be decompressed and/or decoded before being processed by processing elements or the processing elements can be configured to consume compressed, encoded, or compressed and encoded data for processing.

The ROP 226 may be included within each processing cluster (e.g., cluster 214A-214N of FIG. 2A) instead of within the partition unit 220. In such embodiment, read and write requests for pixel data are transmitted over the memory crossbar 216 instead of pixel fragment data. The processed graphics data may be displayed on a display device, such as one of the one or more display device(s) 110A-110B of FIG. 1, routed for further processing by the processor(s) 102, or routed for further processing by one of the processing entities within the parallel processor 200 of FIG. 2A.

Figure 2C:
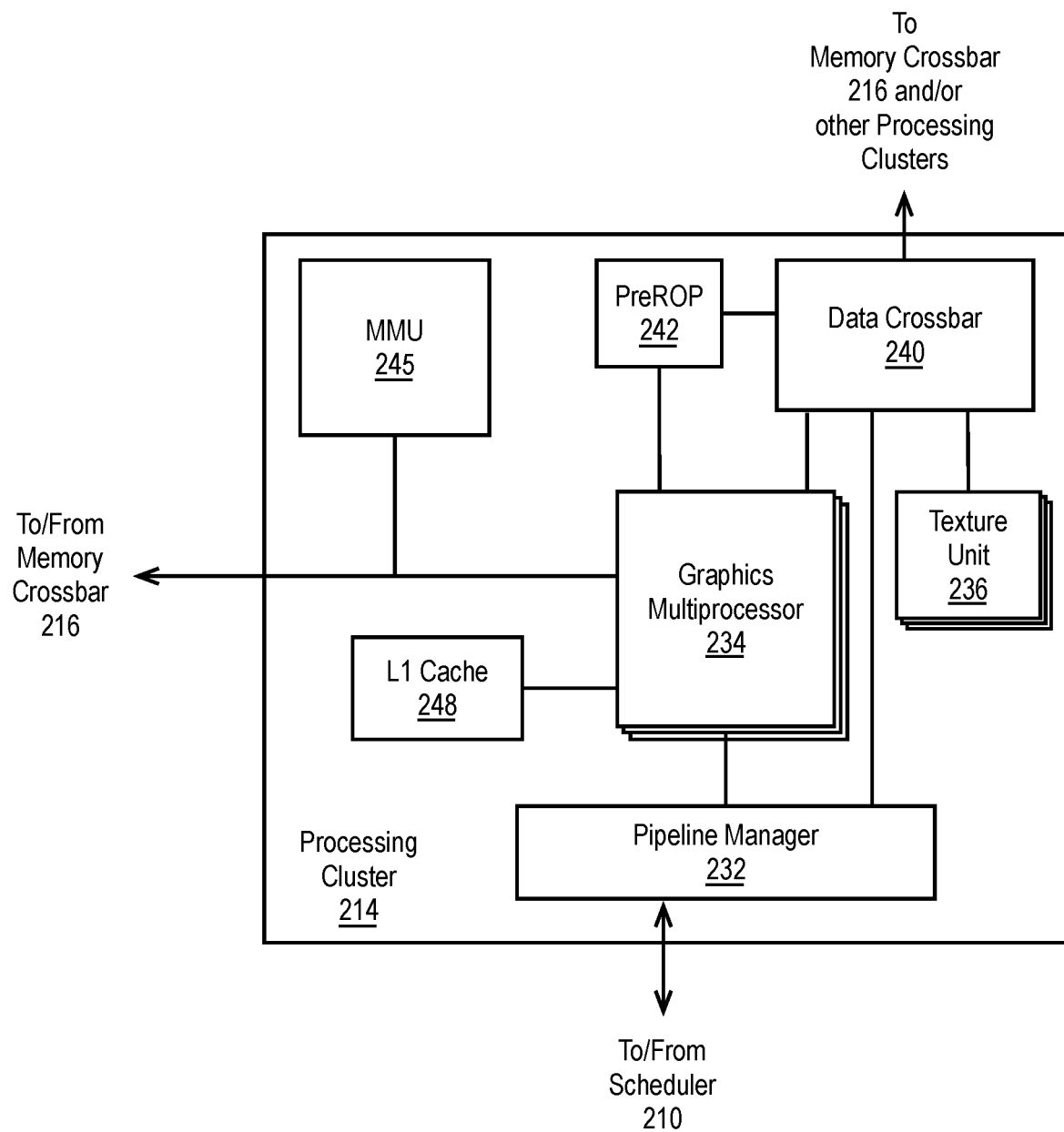

FIG. 2C is a block diagram of a processing cluster 214 within a parallel processing unit. For example, the processing cluster is an instance of one of the processing clusters 214A-214N of FIG. 2A. The processing cluster 214 can be configured to execute many threads in parallel, where the term "thread" refers to an instance of a particular program executing on a particular set of input data. Optionally, single-instruction, multiple-data (SIMD) instruction issue techniques may be used to support parallel execution of a large number of threads without providing multiple independent instruction units. Alternatively, single-instruction, multiple-thread (SIMT) techniques may be used to support parallel execution of a large number of generally synchronized threads, using a common instruction unit configured to issue instructions to a set of processing engines within each one of the processing clusters. Unlike a SIMD execution regime, where all processing engines typically execute identical instructions, SIMT execution allows different threads to more readily follow divergent execution paths through a given thread program. Persons skilled in the art will understand that a SIMD processing regime represents a functional subset of a SIMT processing regime.

Operation of the processing cluster 214 can be controlled via a pipeline manager 232 that distributes processing tasks to SIMT parallel processors. The pipeline manager 232 receives instructions from the scheduler 210 of FIG. 2A and manages execution of those instructions via a graphics multiprocessor 234 and/or a texture unit 236. The illustrated graphics multiprocessor 234 is an exemplary instance of a SIMT parallel processor. However, various types of SIMT parallel processors of differing architectures may be included within the processing cluster 214. One or more instances of the graphics multiprocessor 234 can be included within a processing cluster 214. The graphics multiprocessor 234 can process data and a data crossbar 240 can be used to distribute the processed data to one of multiple possible destinations, including other shader units. The pipeline manager 232 can facilitate the distribution of processed data by specifying destinations for processed data to be distributed via the data crossbar 240.

Each graphics multiprocessor 234 within the processing cluster 214 can include an identical set of functional execution logic (e.g., arithmetic logic units, load-store units, etc.).

The functional execution logic can be configured in a pipelined manner in which new instructions can be issued before previous instructions are complete. The functional execution logic supports a variety of operations including integer and floating-point arithmetic, comparison operations, Boolean operations, bit-shifting, and computation of various algebraic functions. The same functional-unit hardware could be leveraged to perform different operations and any combination of functional units may be present.

The instructions transmitted to the processing cluster 214 constitute a thread. A set of threads executing across the set of parallel processing engines is a thread group. A thread group executes the same program on different input data. Each thread within a thread group can be assigned to a different processing engine within a graphics multiprocessor 234. A thread group may include fewer threads than the number of processing engines within the graphics multiprocessor 234. When a thread group includes fewer threads than the number of processing engines, one or more of the processing engines may be idle during cycles in which that thread group is being processed. A thread group may also include more threads than the number of processing engines within the graphics multiprocessor 234. When the thread group includes more threads than the number of processing engines within the graphics multiprocessor 234, processing can be performed over consecutive clock cycles. Optionally, multiple thread groups can be executed concurrently on the graphics multiprocessor 234.

The graphics multiprocessor 234 may include an internal cache memory to perform load and store operations. Optionally, the graphics multiprocessor 234 can forego an internal cache and use a cache memory (e.g., level 1 (L1) cache 248) within the processing cluster 214. Each graphics multiprocessor 234 also has access to level 2 (L2) caches within the partition units (e.g., partition units 220A-220N of FIG. 2A) that are shared among all processing clusters 214 and may be used to transfer data between threads. The graphics multiprocessor 234 may also access off-chip global memory, which can include one or more of local parallel processor memory and/or system memory. Any memory external to the parallel processing unit 202 may be used as global memory. Embodiments in which the processing cluster 214 includes multiple instances of the graphics multiprocessor 234 can share common instructions and data, which may be stored in the L1 cache 248.

Each processing cluster 214 may include an MMU 245 (memory management unit) that is configured to map virtual addresses into physical addresses. In other embodiments, one or more instances of the MMU 245 may reside within the memory interface 218 of FIG. 2A. The MMU 245 includes a set of page table entries (PTEs) used to map a virtual address to a physical address of a tile and optionally a cache line index. The MMU 245 may include address translation lookaside buffers (TLB) or caches that may reside within the graphics multiprocessor 234 or the L1 cache 248 of processing cluster 214. The physical address is processed to distribute surface data access locality to allow efficient request interleaving among partition units. The cache line index may be used to determine whether a request for a cache line is a hit or miss.

In graphics and computing applications, a processing cluster 214 may be configured such that each graphics multiprocessor 234 is coupled to a texture unit 236 for performing texture mapping operations, e.g., determining texture sample positions, reading texture data, and filtering the texture data. Texture data is read from an internal texture L1 cache (not shown) or in some embodiments from the L1 cache within graphics multiprocessor 234 and is fetched from an L2 cache, local parallel processor memory, or system memory, as needed. Each graphics multiprocessor 234 outputs processed tasks to the data crossbar 240 to provide the processed task to another processing cluster 214 for further processing or to store the processed task in an L2 cache, local parallel processor memory, or system memory via the memory crossbar 216. A preROP 242 (pre-raster operations unit) is configured to receive data from graphics multiprocessor 234, direct data to ROP units, which may be located with partition units as described herein (e.g., partition units 220A-220N of FIG. 2A). The preROP 242 unit can perform optimizations for color blending, organize pixel color data, and perform address translations.

It will be appreciated that the core architecture described herein is illustrative and that variations and modifications are possible. Any number of processing units, e.g., graphics multiprocessor 234, texture units 236, preROPs 242, etc., may be included within a processing cluster 214. Further, while only one processing cluster 214 is shown, a parallel processing unit as described herein may include any number of instances of the processing cluster 214. Optionally, each processing cluster 214 can be configured to operate independently of other processing clusters 214 using separate and distinct processing units, L1 caches, L2 caches, etc.

Figure 2D:
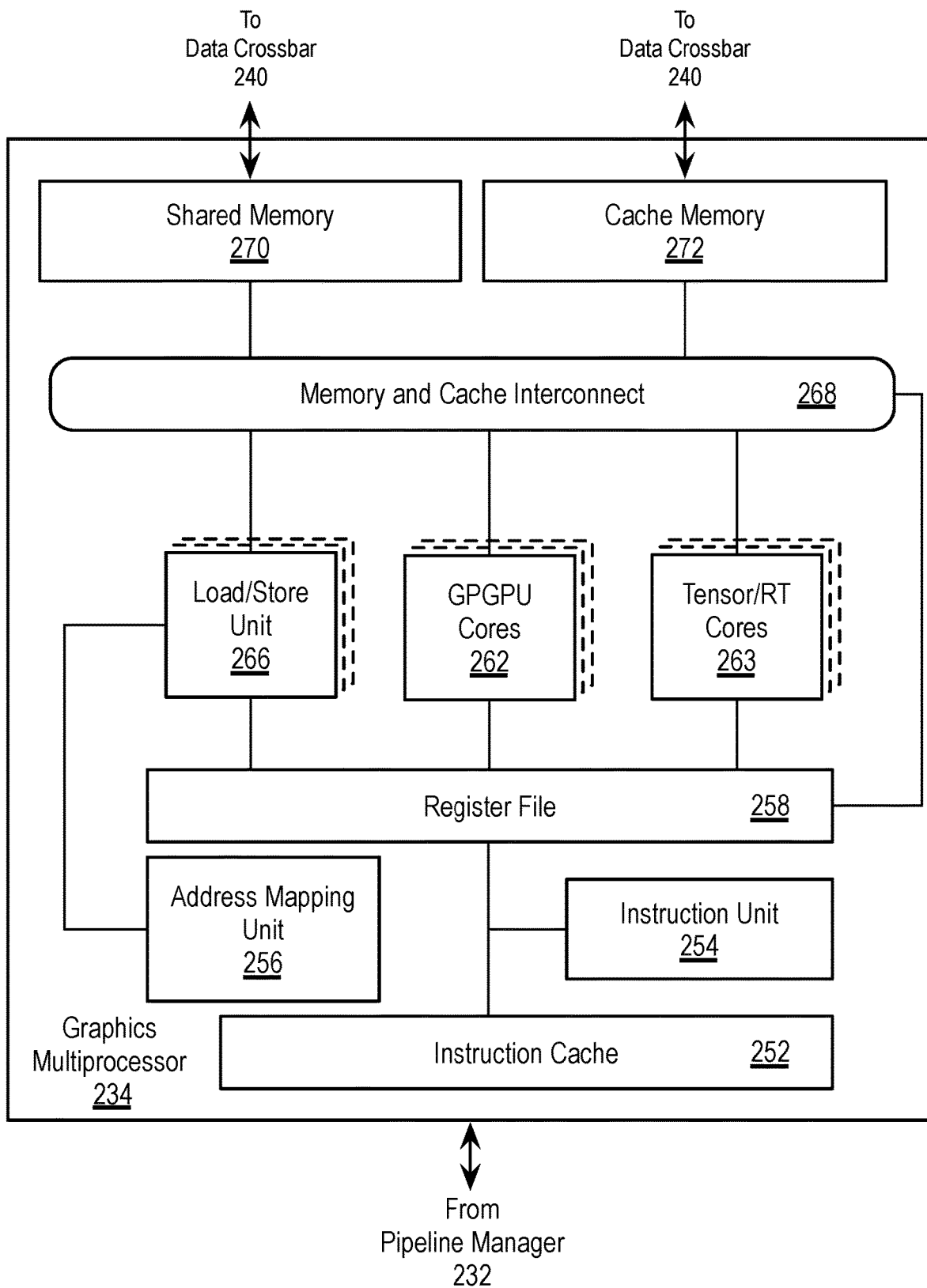

FIG. 2D shows an example of the graphics multiprocessor 234 in which the graphics multiprocessor 234 couples with the pipeline manager 232 of the processing cluster 214. The graphics multiprocessor 234 has an execution pipeline including but not limited to an instruction cache 252, an instruction unit 254, an address mapping unit 256, a register file 258, one or more general purpose graphics processing unit (GPGPU) cores 262, and one or more load/store units 266. The GPGPU cores 262 and load/store units 266 are coupled with cache memory 272 and shared memory 270 via a memory and cache interconnect 268. The graphics multiprocessor 234 may additionally include tensor and/or ray-tracing cores 263 that include hardware logic to accelerate matrix and/or ray-tracing operations.

The instruction cache 252 may receive a stream of instructions to execute from the pipeline manager 232. The instructions are cached in the instruction cache 252 and dispatched for execution by the instruction unit 254. The instruction unit 254 can dispatch instructions as thread groups (e.g., warps), with each thread of the thread group assigned to a different execution unit within GPGPU core 262. An instruction can access any of a local, shared, or global address space by specifying an address within a unified address space. The address mapping unit 256 can be used to translate addresses in the unified address space into a distinct memory address that can be accessed by the load/store units 266.

The register file 258 provides a set of registers for the functional units of the graphics multiprocessor 234. The register file 258 provides temporary storage for operands connected to the data paths of the functional units (e.g., GPGPU cores 262, load/store units 266) of the graphics multiprocessor 234. The register file 258 may be divided between each of the functional units such that each functional unit is allocated a dedicated portion of the register file 258. For example, the register file 258 may be divided between the different warps being executed by the graphics multiprocessor 234.

The GPGPU cores 262 can each include floating point units (FPUs) and/or integer arithmetic logic units (ALUs) that are used to execute instructions of the graphics multiprocessor 234. In some implementations, the GPGPU cores 262 can include hardware logic that may otherwise reside within the tensor and/or ray-tracing cores 263. The GPGPU cores 262 can be similar in architecture or can differ in architecture. For example and in one embodiment, a first portion of the GPGPU cores 262 include a single precision FPU and an integer ALU while a second portion of the GPGPU cores include a double precision FPU. Optionally, the FPUs can implement the IEEE 754-2008 standard for floating point arithmetic or enable variable precision floating point arithmetic. The graphics multiprocessor 234 can additionally include one or more fixed function or special function units to perform specific functions such as copy rectangle or pixel blending operations. One or more of the GPGPU cores can also include fixed or special function logic.

The GPGPU cores 262 may include SIMD logic capable of performing a single instruction on multiple sets of data. Optionally, GPGPU cores 262 can physically execute SIMD4, SIMD8, and SIMD16 instructions and logically execute SIMD1, SIMD2, and SIMD32 instructions. The SIMD instructions for the GPGPU cores can be generated at compile time by a shader compiler or automatically generated when executing programs written and compiled for single program multiple data (SPMD) or SIMT architectures. Multiple threads of a program configured for the SIMT execution model can be executed via a single SIMD instruction. For example and in one embodiment, eight SIMT threads that perform the same or similar operations can be executed in parallel via a single SIMD8 logic unit.

The memory and cache interconnect 268 is an interconnect network that connects each of the functional units of the graphics multiprocessor 234 to the register file 258 and to the shared memory 270. For example, the memory and cache interconnect 268 is a crossbar interconnect that allows the load/store unit 266 to implement load and store operations between the shared memory 270 and the register file 258. The register file 258 can operate at the same frequency as the GPGPU cores 262, thus data transfer between the GPGPU cores 262 and the register file 258 is very low latency. The shared memory 270 can be used to enable communication between threads that execute on the functional units within the graphics multiprocessor 234. The cache memory 272 can be used as a data cache for example, to cache texture data communicated between the functional units and the texture unit 236. The shared memory 270 can also be used as a program managed cached. The shared memory 270 and the cache memory 272 can couple with the data crossbar 240 to enable communication with other components of the processing cluster. Threads executing on the GPGPU cores 262 can programmatically store data within the shared memory in addition to the automatically cached data that is stored within the cache memory 272.

Figure 3A:
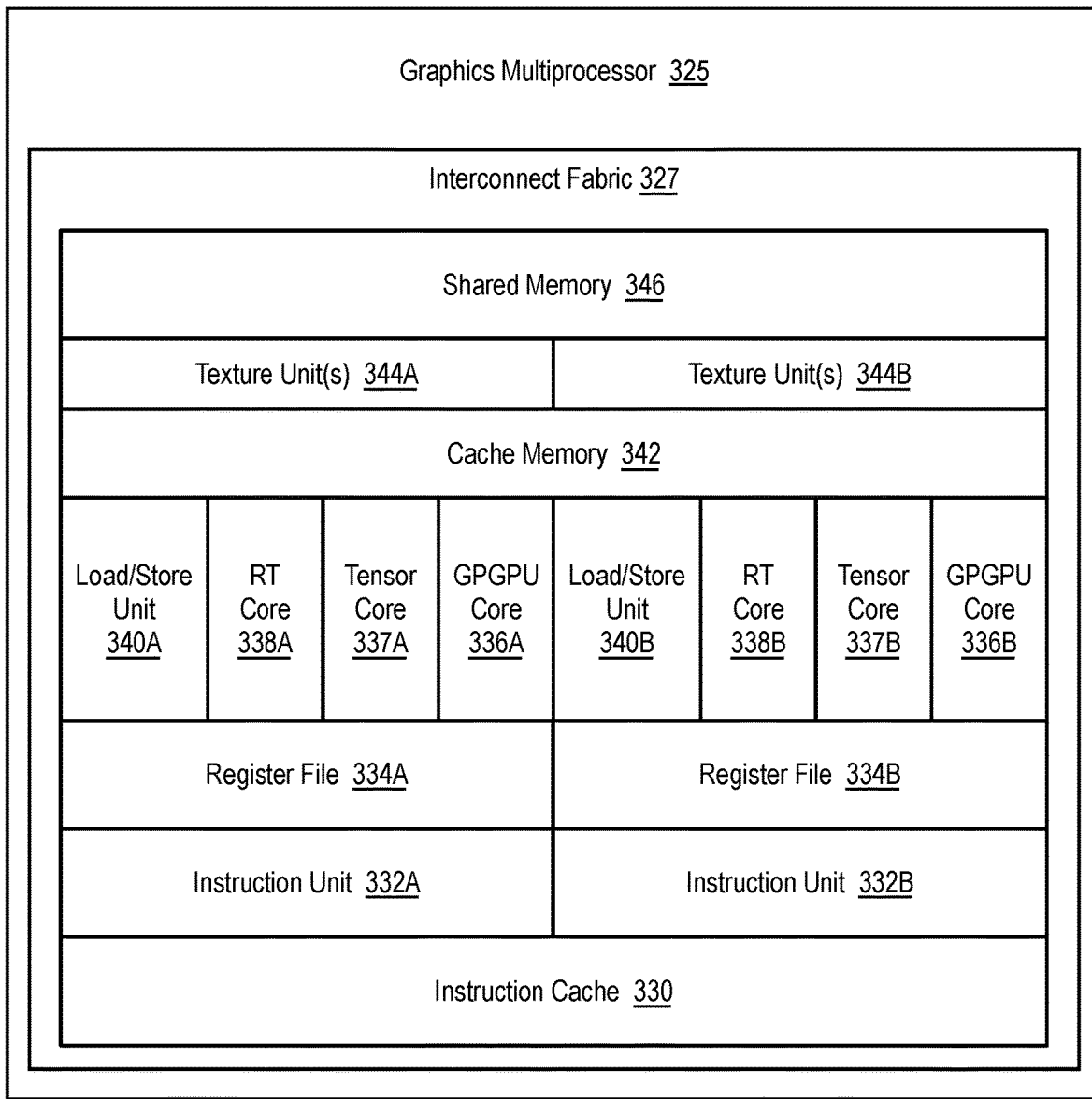
FIG. 3A-3C are block diagrams of graphics multiprocessors and multiprocessor-based GPUs.
Figure 3B:
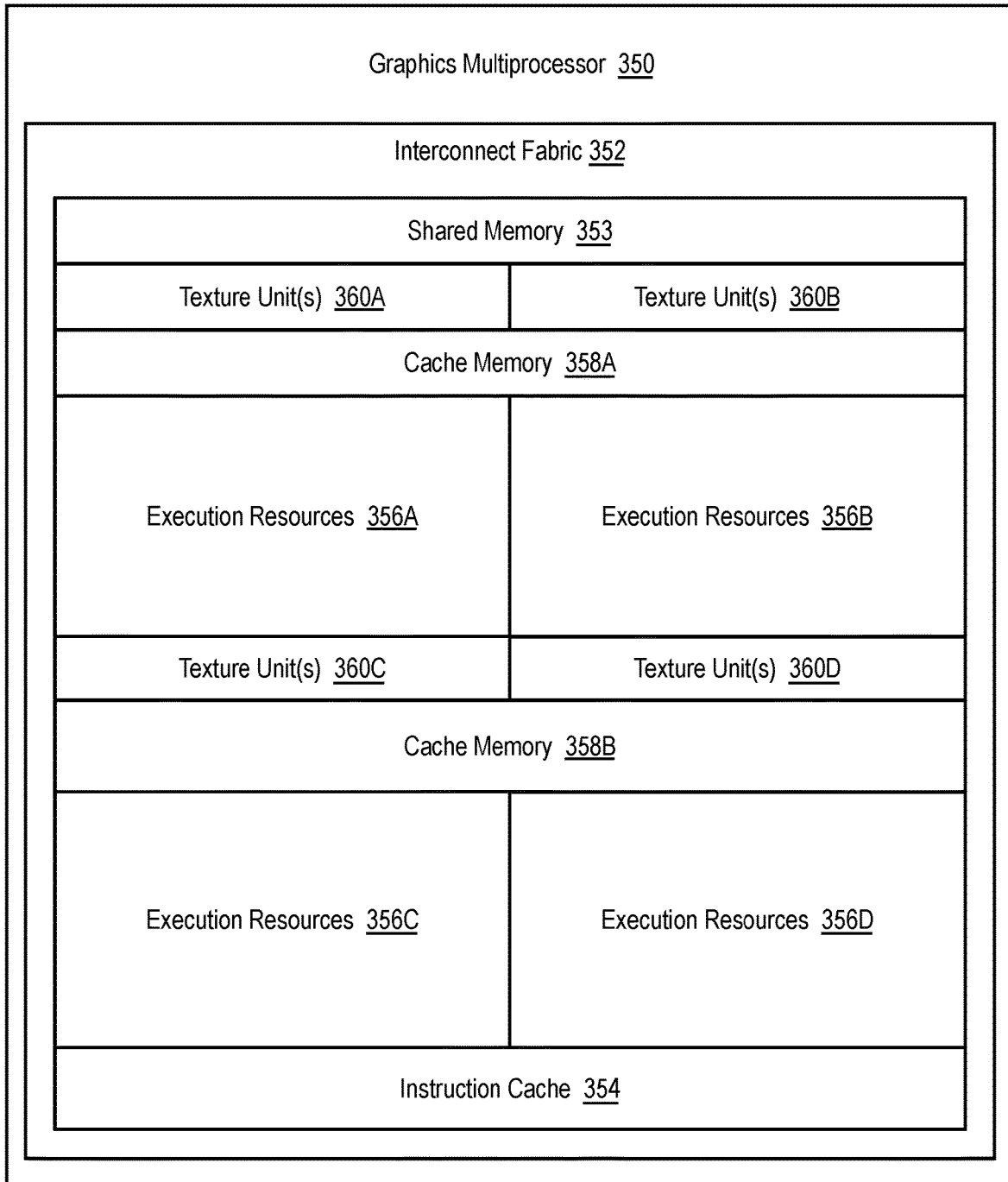
Figure 3C:
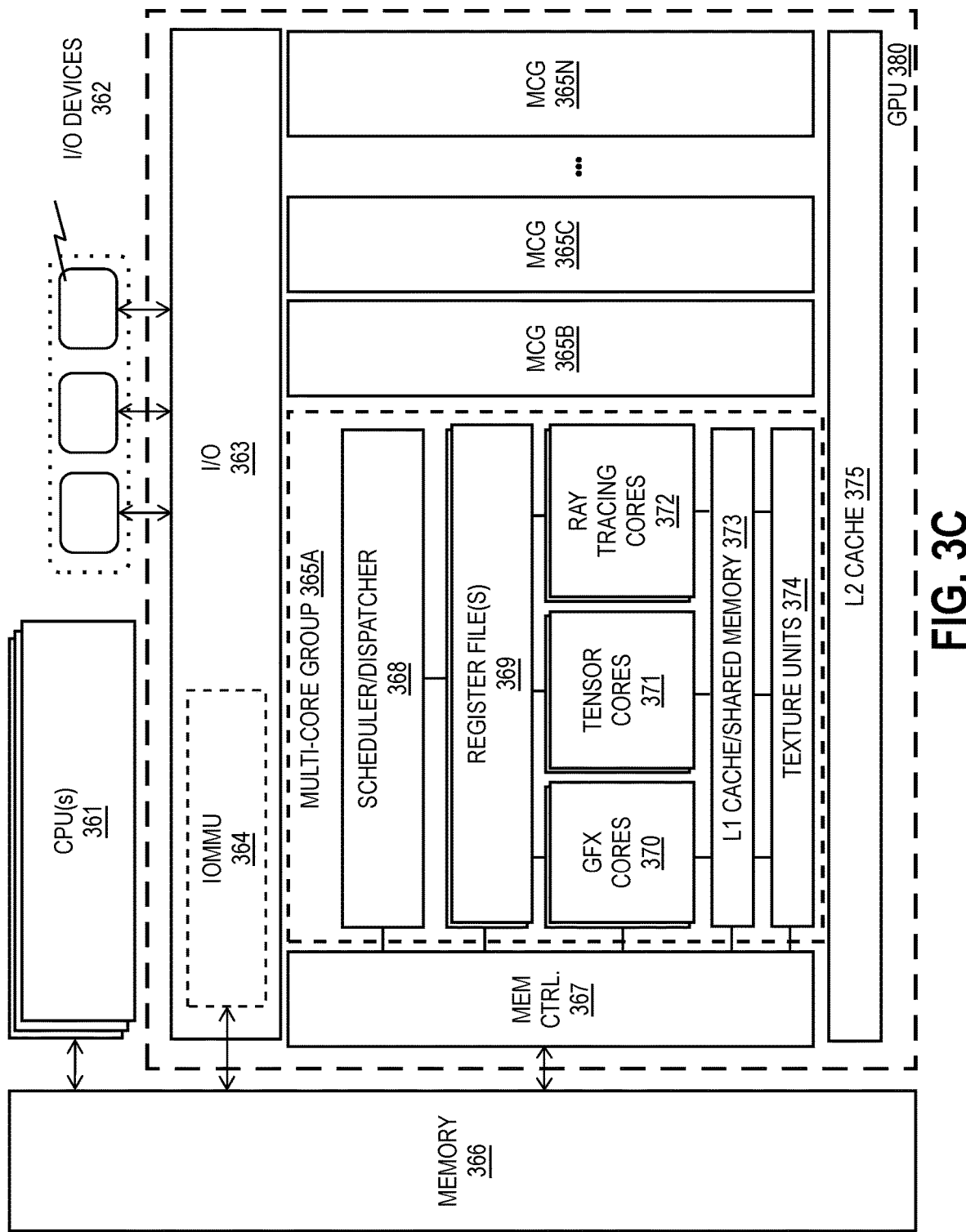

FIG. 3A-3C illustrate additional graphics multiprocessors, according to embodiments. FIG. 3A-3B illustrate graphics multiprocessors 325, 350, which are related to the graphics multiprocessor 234 of FIG. 2C and may be used in place of one of those. Therefore, the disclosure of any features in combination with the graphics multiprocessor 234 herein also discloses a corresponding combination with the graphics multiprocessor(s) 325, 350, but is not limited to such. FIG. 3C illustrates a graphics processing unit (GPU) 380 which includes dedicated sets of graphics processing resources arranged into multi-core groups 365A-365N, which correspond to the graphics multiprocessors 325, 350. The illustrated graphics multiprocessors 325, 350 and the multi-core groups 365A-365N can be streaming multiprocessors (SM) capable of simultaneous execution of a large number of execution threads.

The graphics multiprocessor 325 of FIG. 3A includes multiple additional instances of execution resource units relative to the graphics multiprocessor 234 of FIG. 2D. For example, the graphics multiprocessor 325 can include multiple instances of the instruction unit 332A-332B, register file 334A-334B, and texture unit(s) 344A-344B. The graphics multiprocessor 325 also includes multiple sets of graphics or compute execution units (e.g., GPGPU core 336A-336B, tensor core 337A-337B, ray-tracing core 338A-338B) and multiple sets of load/store units 340A-340B. The execution resource units have a common instruction cache 330, texture and/or data cache memory 342, and shared memory 346.

The various components can communicate via an interconnect fabric 327. The interconnect fabric 327 may include one or more crossbar switches to enable communication between the various components of the graphics multiprocessor 325. The interconnect fabric 327 may be a separate, high-speed network fabric layer upon which each component of the graphics multiprocessor 325 is stacked. The components of the graphics multiprocessor 325 communicate with remote components via the interconnect fabric 327. For example, the cores 336A-336B, 337A-337B, and 338A-338B can each communicate with shared memory 346 via the interconnect fabric 327. The interconnect fabric 327 can arbitrate communication within the graphics multiprocessor 325 to ensure a fair bandwidth allocation between components.

The graphics multiprocessor 350 of FIG. 3B includes multiple sets of execution resources 356A-356D, where each set of execution resource includes multiple instruction units, register files, GPGPU cores, and load store units, as illustrated in FIG. 2D and FIG. 3A. The execution resources 356A-356D can work in concert with texture unit(s) 360A-360D for texture operations, while sharing an instruction cache 354, and shared memory 353. For example, the execution resources 356A-356D can share an instruction cache 354 and shared memory 353, as well as multiple instances of a texture and/or data cache memory 358A-358B. The various components can communicate via an interconnect fabric 352 similar to the interconnect fabric 327 of FIG. 3A.

Persons skilled in the art will understand that the architecture described in FIGS. 1, 2A-2D, and 3A-3B are descriptive and not limiting as to the scope of the present embodiments. Thus, the techniques described herein may be implemented on any properly configured processing unit, including, without limitation, one or more mobile application processors, one or more desktop or server central processing units (CPUs) including multi-core CPUs, one or more parallel processing units, such as the parallel processing unit 202 of FIG. 2A, as well as one or more graphics processors or special purpose processing units, without departure from the scope of the embodiments described herein.

The parallel processor or GPGPU as described herein may be communicatively coupled to host/processor cores to accelerate graphics operations, machine-learning operations, pattern analysis operations, and various general-purpose GPU (GPGPU) functions. The GPU may be communicatively coupled to the host processor/cores over a bus or other interconnect (e.g., a high-speed interconnect such as PCIe, NVLink, or other known protocols, standardized protocols, or proprietary protocols). In other embodiments, the GPU may be integrated on the same package or chip as the cores and communicatively coupled to the cores over an internal processor bus/interconnect (i.e., internal to the package or chip). Regardless of the manner in which the GPU is connected, the processor cores may allocate work to the GPU in the form of sequences of commands/instructions contained in a work descriptor. The GPU then uses dedicated circuitry/logic for efficiently processing these commands/instructions.

FIG. 3C illustrates a graphics processing unit (GPU) 380 which includes dedicated sets of graphics processing resources arranged into multi-core groups 365A-365N. While the details of only a single multi-core group 365A are provided, it will be appreciated that the other multi-core groups 365B-365N may be equipped with the same or similar sets of graphics processing resources. Details described with respect to the multi-core groups 365A-365N may also apply to any graphics multiprocessor 234, 325, 350 described herein.

As illustrated, a multi-core group 365A may include a set of graphics cores 370, a set of tensor cores 371, and a set of ray tracing cores 372. A scheduler/dispatcher 368 schedules and dispatches the graphics threads for execution on the various cores 370, 371, 372. A set of register files 369 store operand values used by the cores 370, 371, 372 when executing the graphics threads. These may include, for example, integer registers for storing integer values, floating point registers for storing floating point values, vector registers for storing packed data elements (integer and/or floating-point data elements) and tile registers for storing tensor/matrix values. The tile registers may be implemented as combined sets of vector registers.

One or more combined level 1 (L1) caches and shared memory units 373 store graphics data such as texture data, vertex data, pixel data, ray data, bounding volume data, etc., locally within each multi-core group 365A. One or more texture units 374 can also be used to perform texturing operations, such as texture mapping and sampling. A Level 2 (L2) cache 375 shared by all or a subset of the multi-core groups 365A-365N stores graphics data and/or instructions for multiple concurrent graphics threads. As illustrated, the L2 cache 375 may be shared across a plurality of multi-core groups 365A-365N. One or more memory controllers 367 couple the GPU 380 to a memory 366 which may be a system memory (e.g., DRAM) and/or a dedicated graphics memory (e.g., GDDR6 or GDDR7 memory).

Input/output (I/O) circuitry 363 couples the GPU 380 to one or more I/O devices 362 such as digital signal processors (DSPs), network controllers, or user input devices. An on-chip interconnect may be used to couple the I/O devices 362 to the GPU 380 and memory 366. One or more I/O memory management units (IOMMUs) 364 of the I/O circuitry 363 couple the I/O devices 362 directly to the system memory 366. Optionally, the IOMMU 364 manages multiple sets of page tables to map virtual addresses to physical addresses in system memory 366. The I/O devices 362, CPU(s) 361, and GPU(s) 380 may then share the same virtual address space.

In one implementation of the IOMMU 364, the IOMMU 364 supports virtualization. In this case, it may manage a first set of page tables to map guest/graphics virtual addresses to guest/graphics physical addresses and a second set of page tables to map the guest/graphics physical addresses to system/host physical addresses (e.g., within system memory 366). The base addresses of each of the first and second sets of page tables may be stored in control registers and swapped out on a context switch (e.g., so that the new context is provided with access to the relevant set of page tables). While not illustrated in FIG. 3C, each of the cores 370, 371, 372 and/or multi-core groups 365A-365N may include translation lookaside buffers (TLBs) to cache guest virtual to guest physical translations, guest physical to host physical translations, and guest virtual to host physical translations.

The CPU(s) 361, GPUs 380, and I/O devices 362 may be integrated on a single semiconductor chip and/or chip package. The illustrated memory 366 may be integrated on the same chip or may be coupled to the memory controllers 367 via an off-chip interface. In one implementation, the memory 366 comprises GDDR6 memory which shares the same virtual address space as other physical system-level memories, although the underlying principles described herein are not limited to this specific implementation.

The tensor cores 371 may include a plurality of execution units specifically designed to perform matrix operations, which are the fundamental compute operation used to perform deep learning operations. For example, simultaneous matrix multiplication operations may be used for neural network training and inferencing. The tensor cores 371 may perform matrix processing using a variety of operand precisions including single precision floating-point (e.g., 32 bits), half-precision floating point (e.g., 16 bits), integer words (16 bits), bytes (8 bits), and half-bytes (4 bits). For example, a neural network implementation extracts features of each rendered scene, potentially combining details from multiple frames, to construct a high-quality final image.

In deep learning implementations, parallel matrix multiplication work may be scheduled for execution on the tensor cores 371. The training of neural networks, in particular, requires a significant number of matrix dot product operations. In order to process an inner-product formulation of an N×N×N matrix multiply, the tensor cores 371 may include at least N dot-product processing elements. Before the matrix multiply begins, one entire matrix is loaded into tile registers and at least one column of a second matrix is loaded each cycle for N cycles. Each cycle, there are N dot products that are processed.

Matrix elements may be stored at different precisions depending on the particular implementation, including 16-bit words, 8-bit bytes (e.g., INT8) and 4-bit half-bytes (e.g., INT4). Different precision modes may be specified for the tensor cores 371 to ensure that the most efficient precision is used for different workloads (e.g., such as inferencing workloads which can tolerate quantization to bytes and half-bytes). Supported formats additionally include 64-bit floating point (FP64) and non-IEEE floating point formats such as the bfloat16 format (e.g., Brain floating point), a 16-bit floating point format with one sign bit, eight exponent bits, and eight significand bits, of which seven are explicitly stored. One embodiment includes support for a reduced precision tensor-float (TF32) mode, which performs computations using the range of FP32 (8-bits) and the precision of FP16 (10-bits). Reduced precision TF32 operations can be performed on FP32 inputs and produce FP32 outputs at higher performance relative to FP32 and increased precision relative to FP16. In one embodiment, 8-bit floating point formats are supported.

In one embodiment the tensor cores 371 support a sparse mode of operation for matrices in which the vast majority of values are zero. The tensor cores 371 include support for sparse input matrices that are encoded in a sparse matrix representation (e.g., coordinate list encoding (COO), compressed sparse row (CSR), compress sparse column (CSC), etc.). The tensor cores 371 also include support for compressed sparse matrix representations in the event that the sparse matrix representation may be further compressed. Compressed, encoded, and/or compressed and encoded matrix data, along with associated compression and/or encoding metadata, can be read by the tensor cores 371 and the non-zero values can be extracted. For example, for a given input matrix A, a non-zero value can be loaded from the compressed and/or encoded representation of at least a portion of matrix A. Based on the location in matrix A for the non-zero value, which may be determined from index or coordinate metadata associated with the non-zero value, a corresponding value in input matrix B may be loaded. Depending on the operation to be performed (e.g., multiply), the load of the value from input matrix B may be bypassed if the corresponding value is a zero value. In one embodiment, the pairings of values for certain operations, such as multiply operations, may be pre-scanned by scheduler logic and only operations between non-zero inputs are scheduled. Depending on the dimensions of matrix A and matrix B and the operation to be performed, output matrix C may be dense or sparse. Where output matrix C is sparse and depending on the configuration of the tensor cores 371, output matrix C may be output in a compressed format, a sparse encoding, or a compressed sparse encoding.

The ray tracing cores 372 may accelerate ray tracing operations for both real-time ray tracing and non-real-time ray tracing implementations. In particular, the ray tracing cores 372 may include ray traversal/intersection circuitry for performing ray traversal using bounding volume hierarchies (BVHs) and identifying intersections between rays and primitives enclosed within the BVH volumes. The ray tracing cores 372 may also include circuitry for performing depth testing and culling (e.g., using a Z buffer or similar arrangement). In one implementation, the ray tracing cores 372 perform traversal and intersection operations in concert with the image denoising techniques described herein, at least a portion of which may be executed on the tensor cores 371. For example, the tensor cores 371 may implement a deep learning neural network to perform denoising of frames generated by the ray tracing cores 372. However, the CPU(s) 361, graphics cores 370, and/or ray tracing cores 372 may also implement all or a portion of the denoising and/or deep learning algorithms.

In addition, as described above, a distributed approach to denoising may be employed in which the GPU 380 is in a computing device coupled to other computing devices over a network or high-speed interconnect. In this distributed approach, the interconnected computing devices may share neural network learning/training data to improve the speed with which the overall system learns to perform denoising for different types of image frames and/or different graphics applications.

The ray tracing cores 372 may process all BVH traversal and/or ray-primitive intersections, saving the graphics cores 370 from being overloaded with thousands of instructions per ray. For example, each ray tracing core 372 includes a first set of specialized circuitry for performing bounding box tests (e.g., for traversal operations) and/or a second set of specialized circuitry for performing the ray-triangle intersection tests (e.g., intersecting rays which have been traversed). Thus, for example, the multi-core group 365A can simply launch a ray probe, and the ray tracing cores 372 independently perform ray traversal and intersection and return hit data (e.g., a hit, no hit, multiple hits, etc.) to the thread context. The other cores 370, 371 are freed to perform other graphics or compute work while the ray tracing cores 372 perform the traversal and intersection operations.

Optionally, each ray tracing core 372 may include a traversal unit to perform BVH testing operations and/or an intersection unit which performs ray-primitive intersection tests. The intersection unit generates a "hit", "no hit", or "multiple hit" response, which it provides to the appropriate thread. During the traversal and intersection operations, the execution resources of the other cores (e.g., graphics cores 370 and tensor cores 371) are freed to perform other forms of graphics work.

In one optional embodiment described below, a hybrid rasterization/ray tracing approach is used in which work is distributed between the graphics cores 370 and ray tracing cores 372.

The ray tracing cores 372 (and/or other cores 370, 371) may include hardware support for a ray tracing instruction set such as Microsoft's DirectX Ray Tracing (DXR) which includes a DispatchRays command, as well as ray-generation, closest-hit, any-hit, and miss shaders, which enable the assignment of unique sets of shaders and textures for each object. Another ray tracing platform which may be supported by the ray tracing cores 372, graphics cores 370 and tensor cores 371 is Vulkan 1.1.85. Note, however, that the underlying principles described herein are not limited to any particular ray tracing ISA.

In general, the various cores 372, 371, 370 may support a ray tracing instruction set that includes instructions/functions for one or more of ray generation, closest hit, any hit, ray-primitive intersection, per-primitive and hierarchical bounding box construction, miss, visit, and exceptions. More specifically, a preferred embodiment includes ray tracing instructions to perform one or more of the following functions:

Ray Generation—Ray generation instructions may be executed for each pixel, sample, or other user-defined work assignment.

Closest Hit—A closest hit instruction may be executed to locate the closest intersection point of a ray with primitives within a scene.

Any Hit—An any hit instruction identifies multiple intersections between a ray and primitives within a scene, potentially to identify a new closest intersection point.

Intersection—An intersection instruction performs a ray-primitive intersection test and outputs a result.

Per-primitive Bounding box Construction—This instruction builds a bounding box around a given primitive or group of primitives (e.g., when building a new BVH or other acceleration data structure).

Miss—Indicates that a ray misses all geometry within a scene, or specified region of a scene.

Visit—Indicates the child volumes a ray will traverse.

Exceptions—Includes various types of exception handlers (e.g., invoked for various error conditions).

In one embodiment the ray tracing cores 372 may be adapted to accelerate general-purpose compute operations that can be accelerated using computational techniques that are analogous to ray intersection tests. A compute framework can be provided that enables shader programs to be compiled into low level instructions and/or primitives that perform general-purpose compute operations via the ray tracing cores. Exemplary computational problems that can benefit from compute operations performed on the ray tracing cores 372 include computations involving beam, wave, ray, or particle propagation within a coordinate space. Interactions associated with that propagation can be computed relative to a geometry or mesh within the coordinate space. For example, computations associated with electromagnetic signal propagation through an environment can be accelerated via the use of instructions or primitives that are executed via the ray tracing cores. Diffraction and reflection of the signals by objects in the environment can be computed as direct ray-tracing analogies.

Ray tracing cores 372 can also be used to perform computations that are not directly analogous to ray tracing. For example, mesh projection, mesh refinement, and volume sampling computations can be accelerated using the ray tracing cores 372. Generic coordinate space calculations, such as nearest neighbor calculations can also be performed. For example, the set of points near a given point can be discovered by defining a bounding box in the coordinate space around the point. BVH and ray probe logic within the ray tracing cores 372 can then be used to determine the set of point intersections within the bounding box. The intersections constitute the origin point and the nearest neighbors to that origin point. Computations that are performed using the ray tracing cores 372 can be performed in parallel with computations performed on the graphics cores 372 and tensor cores 371. A shader compiler can be configured to compile a compute shader or other general-purpose graphics processing program into low level primitives that can be parallelized across the graphics cores 370, tensor cores 371, and ray tracing cores 372.

Techniques for GPU to Host Processor Interconnection

Figure 4A:
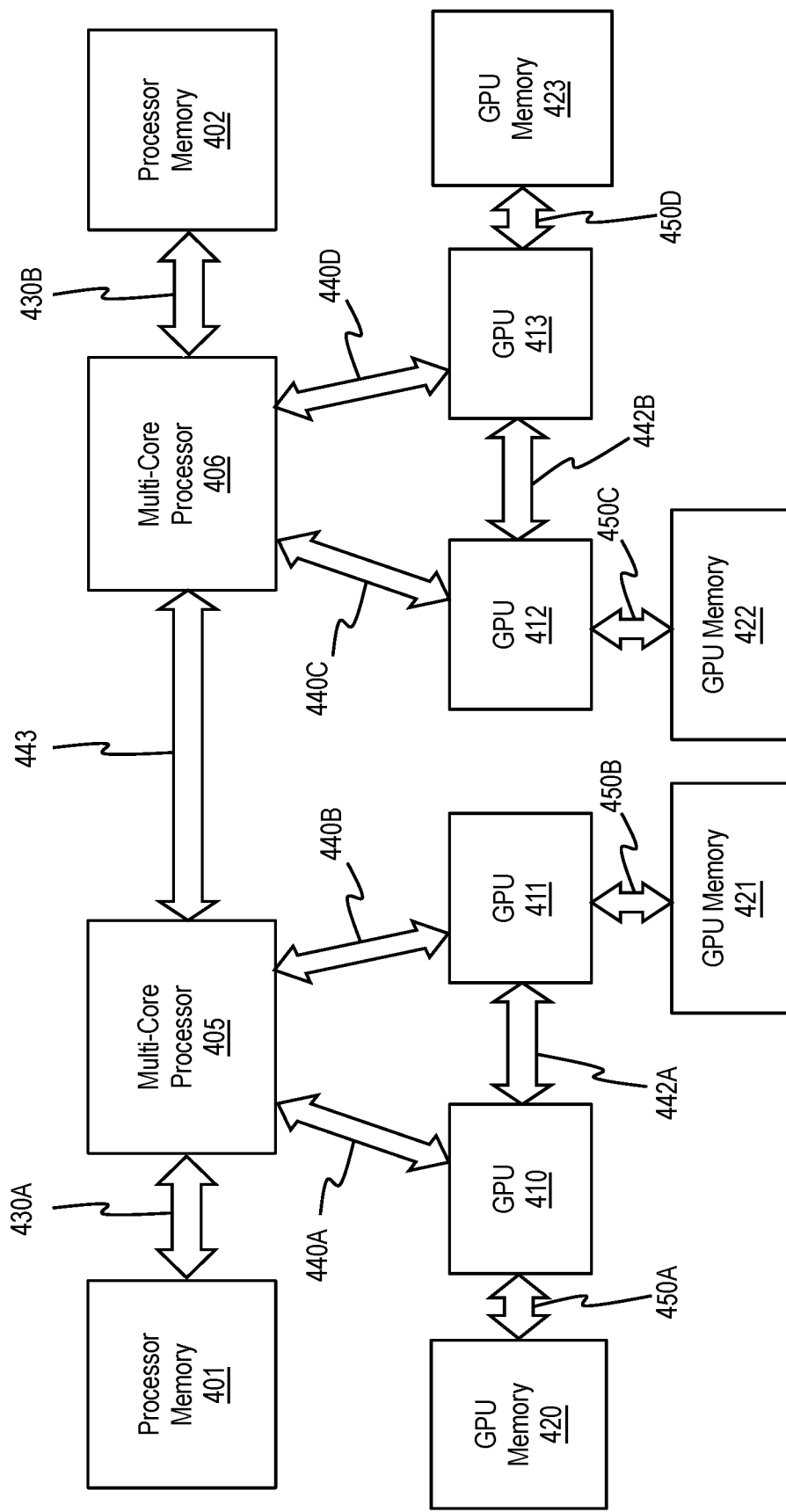
FIG. 4A-4F illustrate an exemplary architecture in which a plurality of GPUs is communicatively coupled to a plurality of multi-core processors.

FIG. 4A illustrates an exemplary architecture in which a plurality of GPUs 410-413, e.g., such as the parallel processors 200 shown in FIG. 2A, are communicatively coupled to a plurality of multi-core processors 405-406 over high-speed links 440A-440D (e.g., buses, point-to-point interconnects, etc.). The high-speed links 440A-440D may support a communication throughput of 4 GB/s, 30 GB/s, 80 GB/s or higher, depending on the implementation. Various interconnect protocols may be used including, but not limited to, PCIe 4.0 or 5.0 and NVLink 2.0. However, the underlying principles described herein are not limited to any particular communication protocol or throughput.

Two or more of the GPUs 410-413 may be interconnected over high-speed links 442A-442B, which may be implemented using the same or different protocols/links than those used for high-speed links 440A-440D. Similarly, two or more of the multi-core processors 405-406 may be connected over high-speed link 443 which may be symmetric multi-processor (SMP) buses operating at 20 GB/s, 30 GB/s, 120 GB/s or lower or higher speeds. Alternatively, all communication between the various system components shown in FIG. 4A may be accomplished using the same protocols/links (e.g., over a common interconnection fabric). As mentioned, however, the underlying principles described herein are not limited to any particular type of interconnect technology.

Each of multi-core processor 405 and multi-core processor 406 may be communicatively coupled to a processor memory 401-402, via memory interconnects 430A-430B, respectively, and each GPU 410-413 is communicatively coupled to GPU memory 420-423 over GPU memory interconnects 450A-450D, respectively. The memory interconnects 430A-430B and 450A-450D may utilize the same or different memory access technologies. By way of example, and not limitation, the processor memories 401-402 and GPU memories 420-423 may be volatile memories such as dynamic random-access memories (DRAMs) (including stacked DRAMs), Graphics DDR SDRAM (GDDR) (e.g., GDDR5, GDDR6, GDDR7), or High Bandwidth Memory (HBM) and/or may be non-volatile memories such as 3D XPoint/Optane or Nano-Ram. For example, some portion of the memories may be volatile memory and another portion may be non-volatile memory (e.g., using a two-level memory (2LM) hierarchy). A memory subsystem as described herein may be compatible with a number of memory technologies, such as Double Data Rate versions released by JEDEC (Joint Electronic Device Engineering Council).

As described below, although the various processors 405-406 and GPUs 410-413 may be physically coupled to a particular memory 401-402, 420-423, respectively, a unified memory architecture may be implemented in which the same virtual system address space (also referred to as the "effective address" space) is distributed among all of the various physical memories. For example, processor memories 401-402 may each comprise 64 GB of the system memory address space and GPU memories 420-423 may each comprise 32 GB of the system memory address space (resulting in a total of 256 GB addressable memory in this example).

Figure 4B:
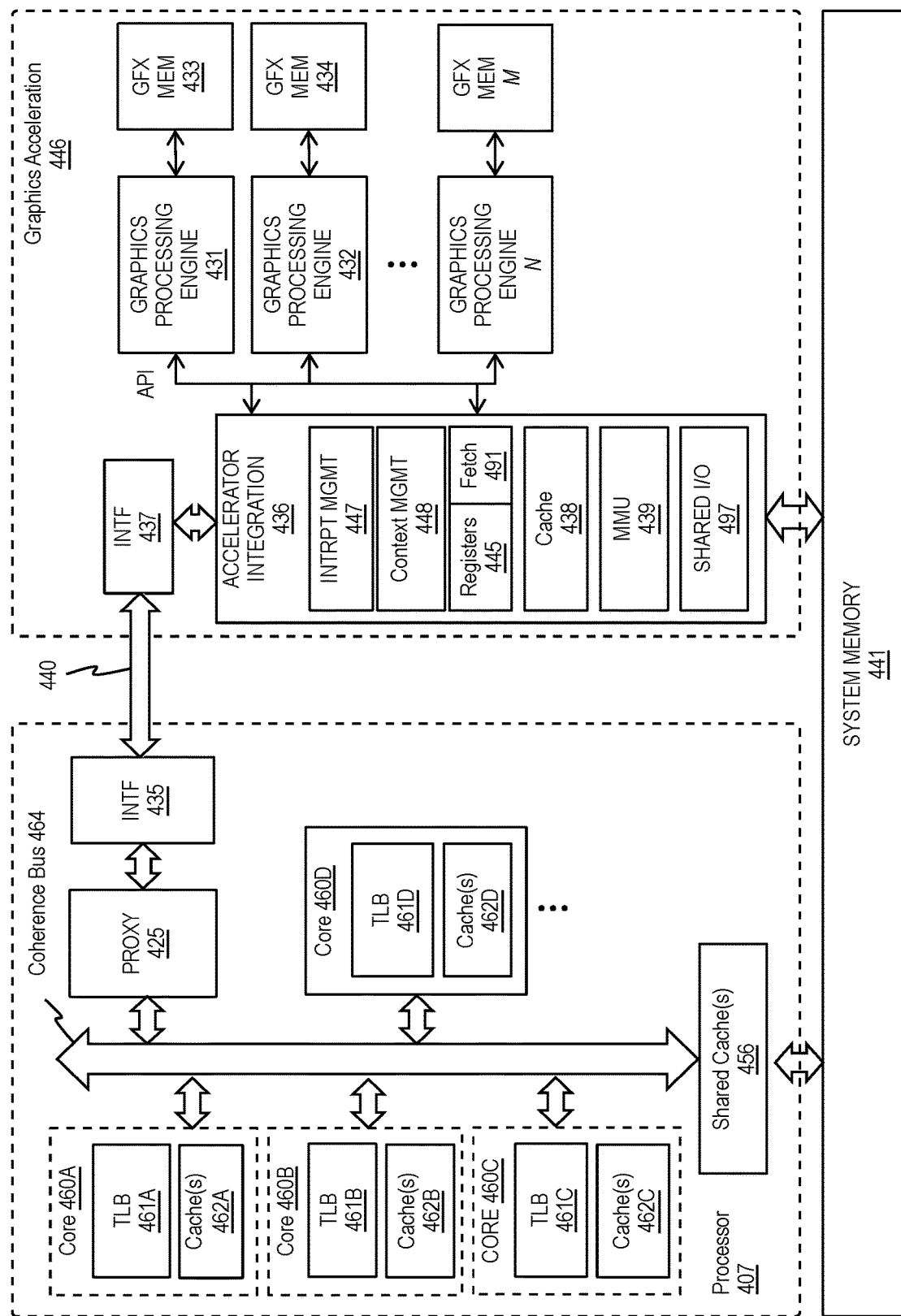

FIG. 4B illustrates additional optional details for an interconnection between a multi-core processor 407 and a graphics acceleration module 446. The graphics acceleration module 446 may include one or more GPU chips integrated on a line card which is coupled to the processor 407 via the high-speed link 440. Alternatively, the graphics acceleration module 446 may be integrated on the same package or chip as the processor 407.

The illustrated processor 407 includes a plurality of cores 460A-460D, each with a translation lookaside buffer 461A-461D and one or more caches 462A-462D. The cores may include various other components for executing instructions and processing data which are not illustrated to avoid obscuring the underlying principles of the components described herein (e.g., instruction fetch units, branch prediction units, decoders, execution units, reorder buffers, etc.). The caches 462A-462D may comprise level 1 (L1) and level 2 (L2) caches. In addition, one or more shared caches 456 may be included in the caching hierarchy and shared by sets of the cores 460A-460D. For example, one embodiment of the processor 407 includes 24 cores, each with its own L1 cache, twelve shared L2 caches, and twelve shared L3 caches. In this embodiment, one of the L2 and L3 caches are shared by two adjacent cores. The processor 407 and the graphics accelerator integration module 446 connect with system memory 441, which may include processor memories 401-402.

Coherency is maintained for data and instructions stored in the various caches 462A-462D, 456 and system memory 441 via inter-core communication over a coherence bus 464. For example, each cache may have cache coherency logic/circuitry associated therewith to communicate to over the coherence bus 464 in response to detected reads or writes to particular cache lines. In one implementation, a cache snooping protocol is implemented over the coherence bus 464 to snoop cache accesses. Cache snooping/coherency techniques are well understood by those of skill in the art and will not be described in detail here to avoid obscuring the underlying principles described herein.

A proxy circuit 425 may be provided that communicatively couples the graphics acceleration module 446 to the coherence bus 464, allowing the graphics acceleration module 446 to participate in the cache coherence protocol as a peer of the cores. In particular, an interface 435 provides connectivity to the proxy circuit 425 over high-speed link 440 (e.g., a PCIe bus, NVLink, etc.) and an interface 437 connects the graphics acceleration module 446 to the high-speed link 440.

In one implementation, an accelerator integration circuit 436 provides cache management, memory access, context management, and interrupt management services on behalf of a plurality of graphics processing engines 431, 432, N of the graphics acceleration module 446. The graphics processing engines 431, 432, N may each comprise a separate graphics processing unit (GPU). Alternatively, the graphics processing engines 431, 432, N may comprise different types of graphics processing engines within a GPU such as graphics execution units, media processing engines (e.g., video encoders/decoders), samplers, and blit engines. In other words, the graphics acceleration module may be a GPU with a plurality of graphics processing engines 431-432, N or the graphics processing engines 431-432, N may be individual GPUs integrated on a common package, line card, or chip.

The accelerator integration circuit 436 may include a memory management unit (MMU) 439 for performing various memory management functions such as virtual-to-physical memory translations (also referred to as effective-to-real memory translations) and memory access protocols for accessing system memory 441. The MMU 439 may also include a translation lookaside buffer (TLB) (not shown) for caching the virtual/effective to physical/real address translations. In one implementation, a cache 438 stores commands and data for efficient access by the graphics processing engines 431, 432, N. The data stored in cache 438 and graphics memories 433-434, M may be kept coherent with the core caches 462A-462D, 456 and system memory 441. As mentioned, this may be accomplished via proxy circuit 425 which takes part in the cache coherency mechanism on behalf of cache 438 and memories 433-434, M (e.g., sending updates to the cache 438 related to modifications/accesses of cache lines on processor caches 462A-462D, 456 and receiving updates from the cache 438).

A set of registers 445 store context data for threads executed by the graphics processing engines 431-432, N and a context management circuit 448 manages the thread contexts. For example, the context management circuit 448 may perform save and restore operations to save and restore contexts of the various threads during contexts switches (e.g., where a first thread is saved and a second thread is restored so that the second thread can be execute by a graphics processing engine). For example, on a context switch, the context management circuit 448 may store current register values to a designated region in memory (e.g., identified by a context pointer). It may then restore the register values when returning to the context. An interrupt management circuit 447, for example, may receive and processes interrupts received from system devices.

In one implementation, virtual/effective addresses from a graphics processing engine 431 are translated to real/physical addresses in system memory 441 by the MMU 439. Optionally, the accelerator integration circuit 436 supports multiple (e.g., 4, 8, 16) graphics accelerator modules 446 and/or other accelerator devices. The graphics accelerator module 446 may be dedicated to a single application executed on the processor 407 or may be shared between multiple applications. Optionally, a virtualized graphics execution environment is provided in which the resources of the graphics processing engines 431-432, N are shared with multiple applications, virtual machines (VMs), or containers. The resources may be subdivided into "slices" which are allocated to different VMs and/or applications based on the processing requirements and priorities associated with the VMs and/or applications. VMs and containers can be used interchangeably herein.

A virtual machine (VM) can be software that runs an operating system and one or more applications. A VM can be defined by specification, configuration files, virtual disk file, non-volatile random-access memory (NVRAM) setting file, and the log file and is backed by the physical resources of a host computing platform. A VM can include an operating system (OS) or application environment that is installed on software, which imitates dedicated hardware. The end user has the same experience on a virtual machine as they would have on dedicated hardware. Specialized software, called a hypervisor, emulates the PC client or server's CPU, memory, hard disk, network, and other hardware resources completely, enabling virtual machines to share the resources. The hypervisor can emulate multiple virtual hardware platforms that are isolated from each other, allowing virtual machines to run Linux®, Windows® Server, VMware ESXi, and other operating systems on the same underlying physical host.

A container can be a software package of applications, configurations, and dependencies so the applications run reliably on one computing environment to another. Containers can share an operating system installed on the server platform and run as isolated processes. A container can be a software package that contains everything the software needs to run such as system tools, libraries, and settings. Containers are not installed like traditional software programs, which allows them to be isolated from the other software and the operating system itself. The isolated nature of containers provides several benefits. First, the software in a container will run the same in different environments. For example, a container that includes PHP and MySQL can run identically on both a Linux® computer and a Windows® machine. Second, containers provide added security since the software will not affect the host operating system. While an installed application may alter system settings and modify resources, such as the Windows registry, a container can only modify settings within the container.

Thus, the accelerator integration circuit 436 acts as a bridge to the system for the graphics acceleration module 446 and provides address translation and system memory cache services. In one embodiment, to facilitate the bridging functionality, the accelerator integration circuit 436 may also include shared I/O 497 (e.g., PCIe, USB, or others) and hardware to enable system control of voltage, clocking, performance, thermals, and security. The shared I/O 497 may utilize separate physical connections or may traverse the high-speed link 440. In addition, the accelerator integration circuit 436 may provide virtualization facilities for the host processor to manage virtualization of the graphics processing engines, interrupts, and memory management.

Because hardware resources of the graphics processing engines 431-432, N are mapped explicitly to the real address space seen by the host processor 407, any host processor can address these resources directly using an effective address value. One optional function of the accelerator integration circuit 436 is the physical separation of the graphics processing engines 431-432, N so that they appear to the system as independent units.

One or more graphics memories 433-434, M may be coupled to each of the graphics processing engines 431-432, N, respectively. The graphics memories 433-434, M store instructions and data being processed by each of the graphics processing engines 431-432, N. The graphics memories 433-434, M may be volatile memories such as DRAMs (including stacked DRAMs), GDDR memory (e.g., GDDR5, GDDR6, GDDR7), or HBM, and/or may be non-volatile memories such as 3D XPoint/Optane, Samsung Z-NAND, or Nano-Ram.

To reduce data traffic over the high-speed link 440, biasing techniques may be used to ensure that the data stored in graphics memories 433-434, M is data which will be used most frequently by the graphics processing engines 431-432, N and preferably not used by the cores 460A-460D (at least not frequently). Similarly, the biasing mechanism attempts to keep data needed by the cores (and preferably not the graphics processing engines 431-432, N) within the caches 462A-462D, 456 of the cores and system memory 441.

Figure 4C:
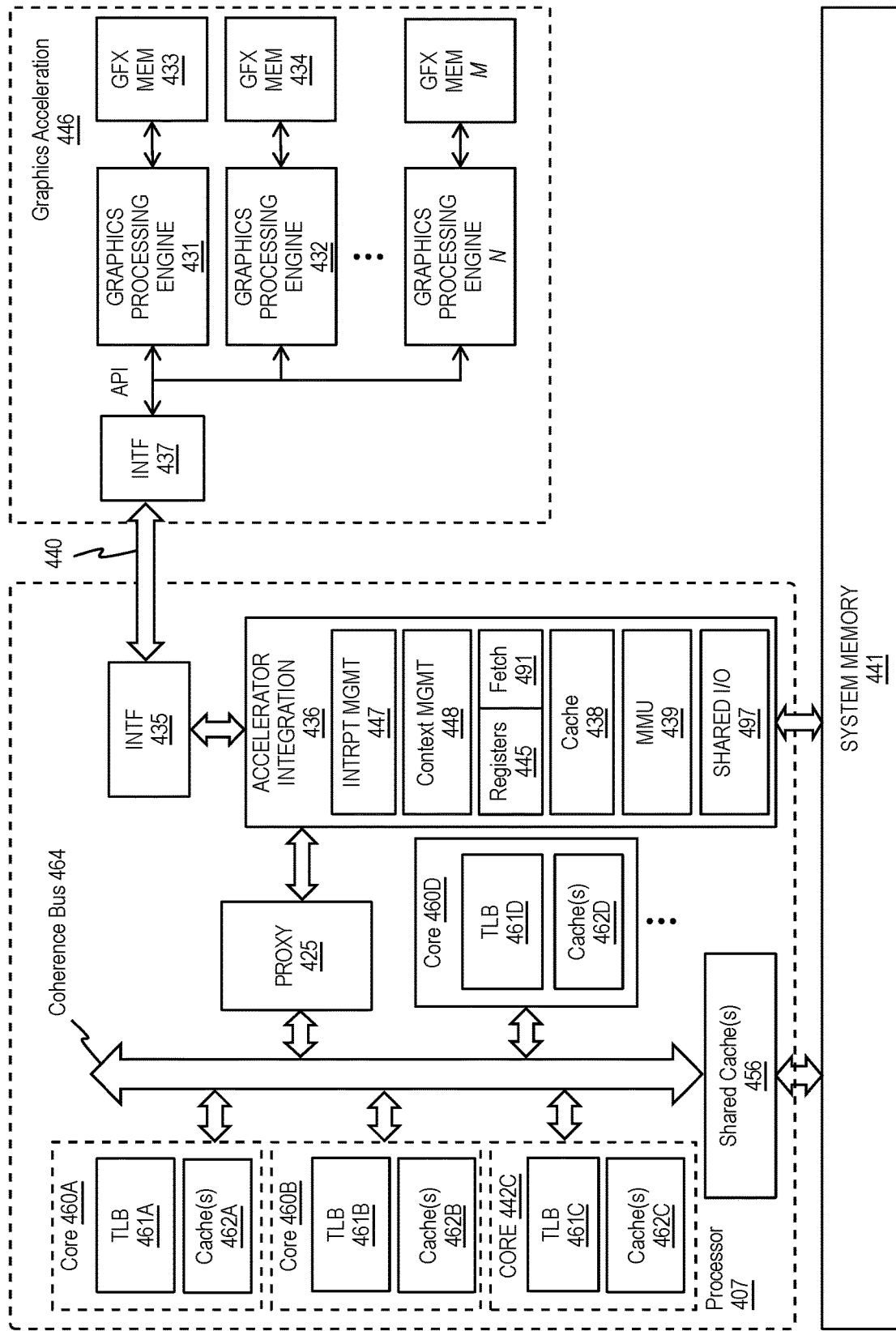

According to a variant shown in FIG. 4C the accelerator integration circuit 436 is integrated within the processor 407. The graphics processing engines 431-432, N communicate directly over the high-speed link 440 to the accelerator integration circuit 436 via interface 437 and interface 435 (which, again, may be utilize any form of bus or interface protocol). The accelerator integration circuit 436 may perform the same operations as those described with respect to FIG. 4B, but potentially at a higher throughput given its close proximity to the coherence bus 464 and caches 462A-462D, 456.

The embodiments described may support different programming models including a dedicated-process programming model (no graphics acceleration module virtualization) and shared programming models (with virtualization). The latter may include programming models which are controlled by the accelerator integration circuit 436 and programming models which are controlled by the graphics acceleration module 446.

In the embodiments of the dedicated process model, graphics processing engines 431, 432, . . . N may be dedicated to a single application or process under a single operating system. The single application can funnel other application requests to the graphics engines 431, 432, . . . N, providing virtualization within a VM/partition.

In the dedicated-process programming models, the graphics processing engines 431, 432, N, may be shared by multiple VM/application partitions. The shared models require a system hypervisor to virtualize the graphics processing engines 431-432, N to allow access by each operating system. For single-partition systems without a hypervisor, the graphics processing engines 431-432, N are owned by the operating system. In both cases, the operating system can virtualize the graphics processing engines 431-432, N to provide access to each process or application.

For the shared programming model, the graphics acceleration module 446 or an individual graphics processing engine 431-432, N selects a process element using a process handle. The process elements may be stored in system memory 441 and be addressable using the effective address to real address translation techniques described herein. The process handle may be an implementation-specific value provided to the host process when registering its context with the graphics processing engine 431-432, N (that is, calling system software to add the process element to the process element linked list). The lower 16-bits of the process handle may be the offset of the process element within the process element linked list.

Figure 4D:
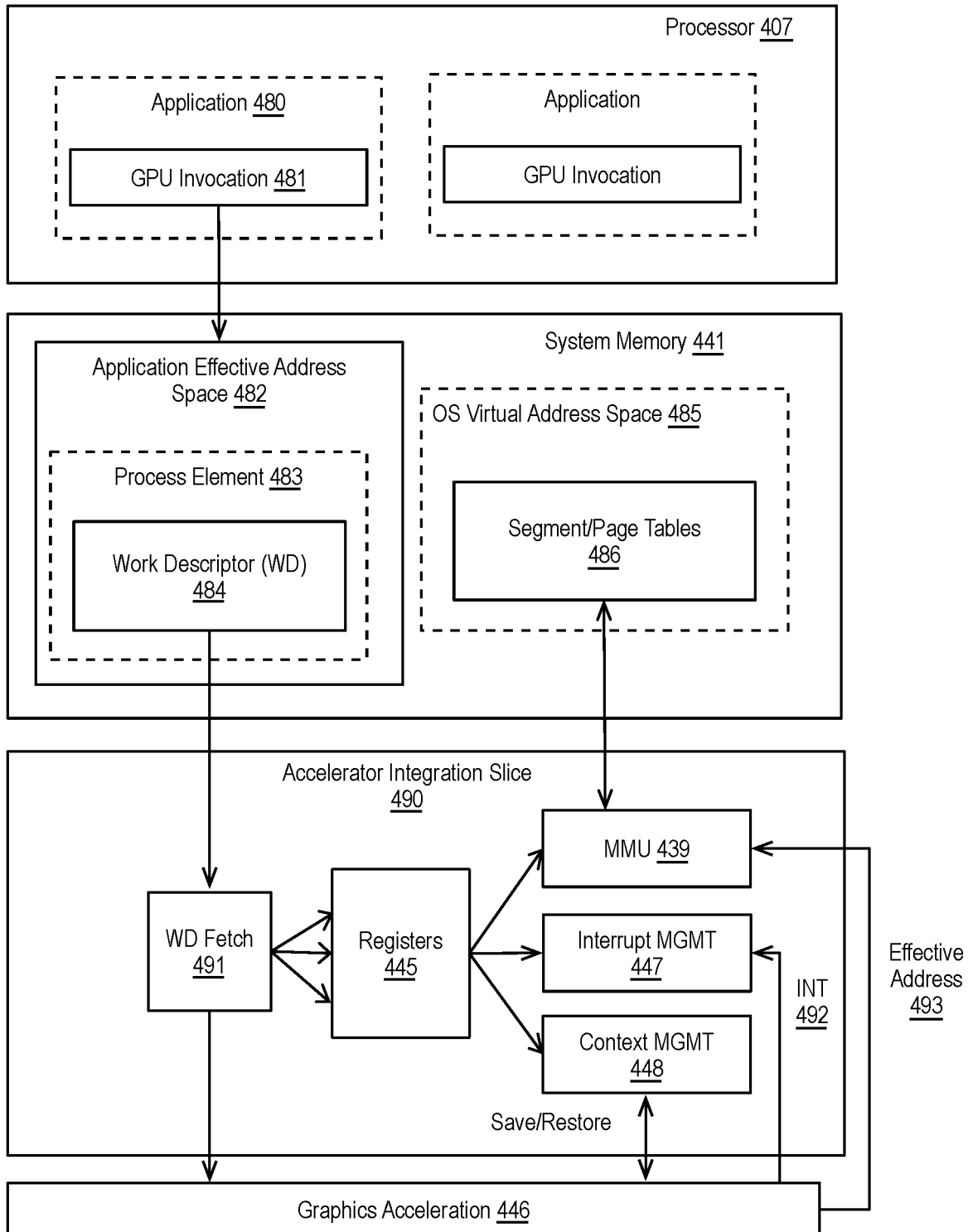

FIG. 4D illustrates an exemplary accelerator integration slice 490. As used herein, a "slice" comprises a specified portion of the processing resources of the accelerator integration circuit 436. Application effective address space 482 within system memory 441 stores process elements 483. The process elements 483 may be stored in response to GPU invocations 481 from applications 480 executed on the processor 407. A process element 483 contains the process state for the corresponding application 480. A work descriptor (WD) 484 contained in the process element 483 can be a single job requested by an application or may contain a pointer to a queue of jobs. In the latter case, the WD 484 is a pointer to the job request queue in the application's address space 482.

The graphics acceleration module 446 and/or the individual graphics processing engines 431-432, N can be shared by all or a subset of the processes in the system. For example, the technologies described herein may include an infrastructure for setting up the process state and sending a WD 484 to a graphics acceleration module 446 to start a job in a virtualized environment.

In one implementation, the dedicated-process programming model is implementation-specific. In this model, a single process owns the graphics acceleration module 446 or an individual graphics processing engine 431. Because the graphics acceleration module 446 is owned by a single process, the hypervisor initializes the accelerator integration circuit 436 for the owning partition and the operating system initializes the accelerator integration circuit 436 for the owning process at the time when the graphics acceleration module 446 is assigned.

In operation, a WD fetch unit 491 in the accelerator integration slice 490 fetches the next WD 484 which includes an indication of the work to be done by one of the graphics processing engines of the graphics acceleration module 446. Data from the WD 484 may be stored in registers 445 and used by the MMU 439, interrupt management circuit 447 and/or context management circuit 448 as illustrated. For example, the MMU 439 may include segment/page walk circuitry for accessing segment/page tables 486 within the OS virtual address space 485. The interrupt management circuit 447 may process interrupt events 492 received from the graphics acceleration module 446. When performing graphics operations, an effective address 493 generated by a graphics processing engine 431-432, N is translated to a real address by the MMU 439.

The same set of registers 445 may be duplicated for each graphics processing engine 431-432, N and/or graphics acceleration module 446 and may be initialized by the hypervisor or operating system. Each of these duplicated registers may be included in an accelerator integration slice 490. In one embodiment, each graphics processing engine 431-432, N may be presented to the hypervisor 496 as a distinct graphics processor device. QoS settings can be configured for clients of a specific graphics processing engine 431-432, N and data isolation between the clients of each engine can be enabled. Exemplary registers that may be initialized by the hypervisor are shown in Table 1.

TABLE 1

| | Hypervisor Initialized Registers |
|---|---|
| 1 | Slice Control Register |
| 2 | Real Address (RA) Scheduled Processes Area Pointer |
| 3 | Authority Mask Override Register |
| 4 | Interrupt Vector Table Entry Offset |
| 5 | Interrupt Vector Table Entry Limit |
| 6 | State Register |
| 7 | Logical Partition ID |
| 8 | Real address (RA) Hypervisor Accelerator Utilization Record Pointer |
| 9 | Storage Description Register |

Exemplary registers that may be initialized by the operating system are shown in Table 2.

TABLE 2

| | Operating System Initialized Registers |
|---|---|
| 1 | Process and Thread Identification |
| 2 | Effective Address (EA) Context Save/Restore Pointer |
| 3 | Virtual Address (VA) Accelerator Utilization Record Pointer |
| 4 | Virtual Address (VA) Storage Segment Table Pointer |
| 5 | Authority Mask |
| 6 | Work descriptor |

Each WD 484 may be specific to a particular graphics acceleration module 446 and/or graphics processing engine 431-432, N. It contains all the information a graphics processing engine 431-432, N requires to do its work or it can be a pointer to a memory location where the application has set up a command queue of work to be completed.

Figure 4E:
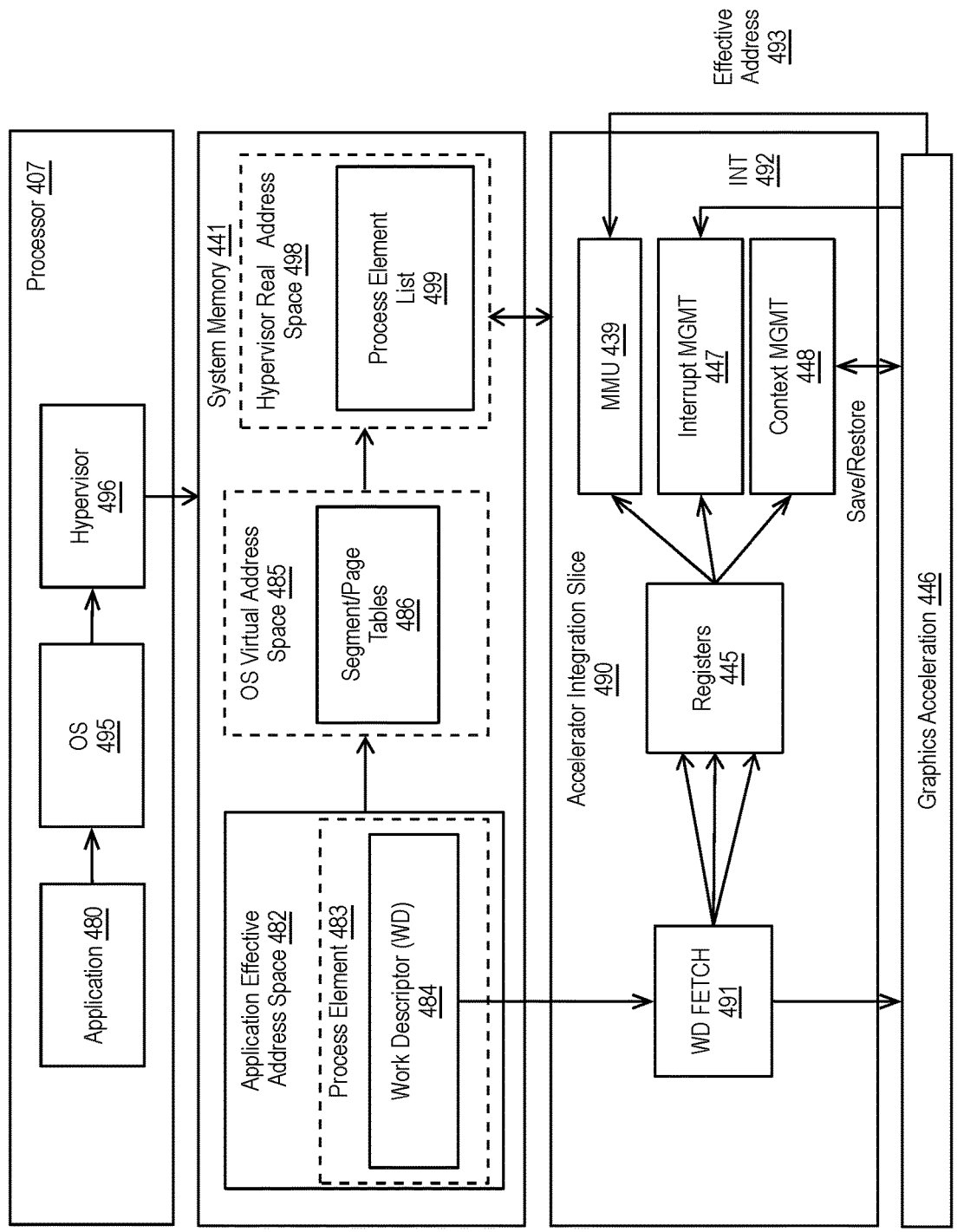

FIG. 4E illustrates additional optional details of a shared model. It includes a hypervisor real address space 498 in which a process element list 499 is stored. The hypervisor real address space 498 is accessible via a hypervisor 496 which virtualizes the graphics acceleration module engines for the operating system 495.

The shared programming models allow for all or a subset of processes from all or a subset of partitions in the system to use a graphics acceleration module 446. There are two programming models where the graphics acceleration module 446 is shared by multiple processes and partitions: time-sliced shared and graphics directed shared.

In this model, the system hypervisor 496 owns the graphics acceleration module 446 and makes its function available to all operating systems 495. For a graphics acceleration module 446 to support virtualization by the system hypervisor 496, the graphics acceleration module 446 may adhere to the following requirements: 1) An application's job request must be autonomous (that is, the state does not need to be maintained between jobs), or the graphics acceleration module 446 must provide a context save and restore mechanism. 2) An application's job request is guaranteed by the graphics acceleration module 446 to complete in a specified amount of time, including any translation faults, or the graphics acceleration module 446 provides the ability to preempt the processing of the job. 3) The graphics acceleration module 446 must be guaranteed fairness between processes when operating in the directed shared programming model.

For the shared model, the application 480 may be required to make an operating system 495 system call with a graphics acceleration module 446 type, a work descriptor (WD), an authority mask register (AMR) value, and a context save/restore area pointer (CSRP). The graphics acceleration module 446 type describes the targeted acceleration function for the system call. The graphics acceleration module 446 type may be a system-specific value. The WD is formatted specifically for the graphics acceleration module 446 and can be in the form of a graphics acceleration module 446 command, an effective address pointer to a user-defined structure, an effective address pointer to a queue of commands, or any other data structure to describe the work to be done by the graphics acceleration module 446. In one embodiment, the AMR value is the AMR state to use for the current process. The value passed to the operating system is similar to an application setting the AMR. If the accelerator integration circuit 436 and graphics acceleration module 446 implementations do not support a User Authority Mask Override Register (UAMOR), the operating system may apply the current UAMOR value to the AMR value before passing the AMR in the hypervisor call. The hypervisor 496 may optionally apply the current Authority Mask Override Register (AMOR) value before placing the AMR into the process element 483. The CSRP may be one of the registers 445 containing the effective address of an area in the application's address space 482 for the graphics acceleration module 446 to save and restore the context state. This pointer is optional if no state is required to be saved between jobs or when a job is preempted. The context save/restore area may be pinned system memory.

Upon receiving the system call, the operating system 495 may verify that the application 480 has registered and been given the authority to use the graphics acceleration module 446. The operating system 495 then calls the hypervisor 496 with the information shown in Table 3.

TABLE 3

| | OS to Hypervisor Call Parameters |
|---|---|
| 1 | A work descriptor (WD) |
| 2 | An Authority Mask Register (AMR) value (potentially masked). |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | The virtual address of the storage segment table pointer (SSTP) |
| 7 | A logical interrupt service number (LISN) |

Upon receiving the hypervisor call, the hypervisor 496 verifies that the operating system 495 has registered and been given the authority to use the graphics acceleration module 446. The hypervisor 496 then puts the process element 483 into the process element linked list for the corresponding graphics acceleration module 446 type. The process element may include the information shown in Table 4.

TABLE 4

| | Process Element Information |
|---|---|
| 1 | A work descriptor (WD) |
| 2 | An Authority Mask Register (AMR) value (potentially masked). |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | The virtual address of the storage segment table pointer (SSTP) |
| 7 | A logical interrupt service number (LISN) |
| 8 | Interrupt vector table, derived from the hypervisor call parameters. |
| 9 | A state register (SR) value |
| 10 | A logical partition ID (LPID) |
| 11 | A real address (RA) hypervisor accelerator utilization record pointer |
| 12 | The Storage Descriptor Register (SDR) |

The hypervisor may initialize a plurality of accelerator intergration slice 490 register 445.

Figure 4F:
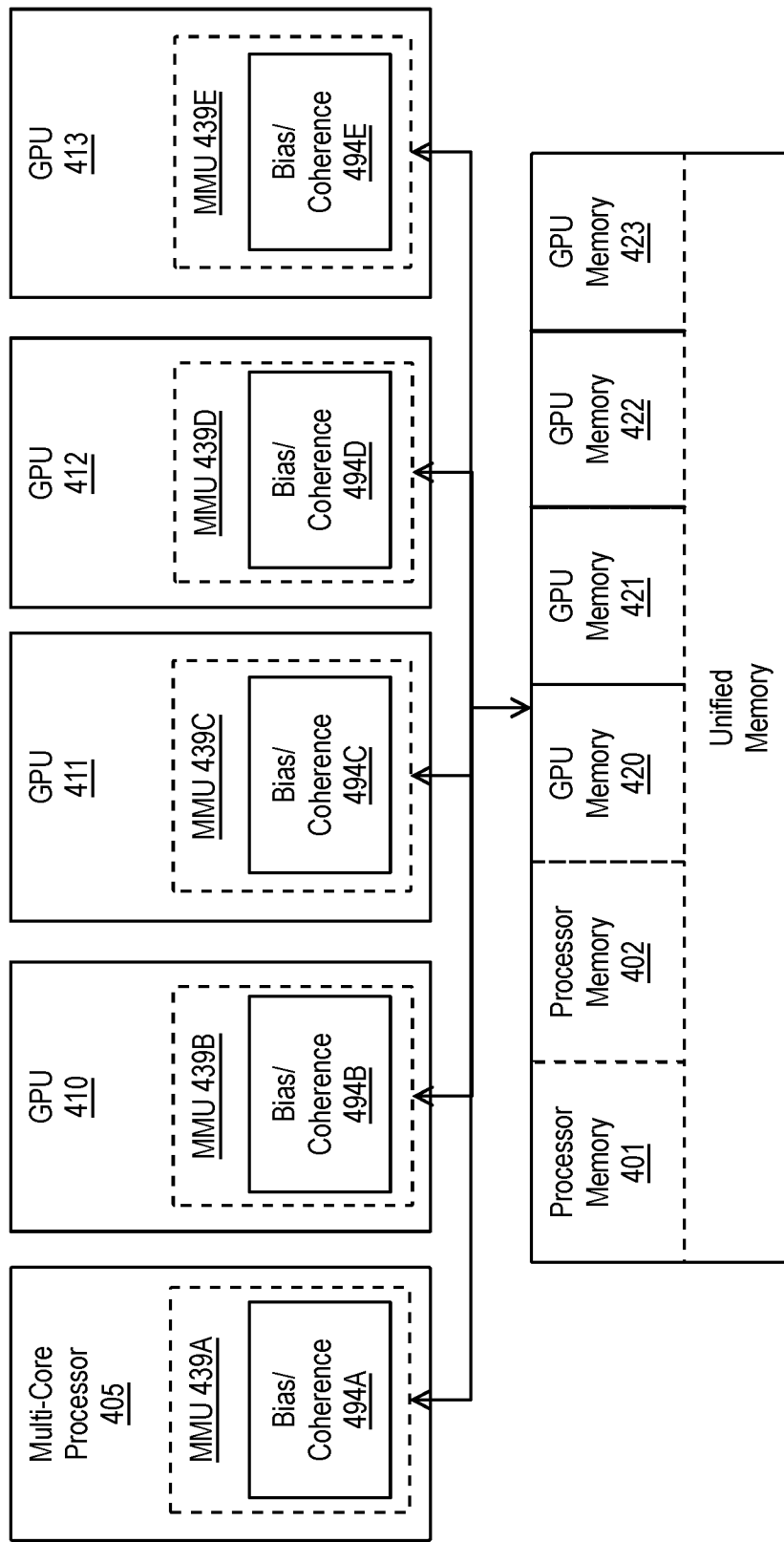

As illustrated in FIG. 4F, in one optional implementation a unified memory addressable via a common virtual memory address space used to access the physical processor memories 401-402 and GPU memories 420-423 is employed. In this implementation, operations executed on the GPUs 410-413 utilize the same virtual/effective memory address space to access the processors memories 401-402 and vice versa, thereby simplifying programmability. A first portion of the virtual/effective address space may be allocated to the processor memory 401, a second portion to the second processor memory 402, a third portion to the GPU memory 420, and so on. The entire virtual/effective memory space (sometimes referred to as the effective address space) may thereby be distributed across each of the processor memories 401-402 and GPU memories 420-423, allowing any processor or GPU to access any physical memory with a virtual address mapped to that memory.

Bias/coherence management circuitry 494A-494E within one or more of the MMUs 439A-439E may be provided that ensures cache coherence between the caches of the host processors (e.g., 405) and the GPUs 410-413 and implements biasing techniques indicating the physical memories in which certain types of data should be stored. While multiple instances of bias/coherence management circuitry 494A-494E are illustrated in FIG. 4F, the bias/coherence circuitry may be implemented within the MMU of one or more host processors 405 and/or within the accelerator integration circuit 436.

The GPU-attached memory 420-423 may be mapped as part of system memory and accessed using shared virtual memory (SVM) technology, but without suffering the typical performance drawbacks associated with full system cache coherence. The ability to GPU-attached memory 420-423 to be accessed as system memory without onerous cache coherence overhead provides a beneficial operating environment for GPU offload. This arrangement allows the host processor 405 software to setup operands and access computation results, without the overhead of tradition I/O DMA data copies. Such traditional copies involve driver calls, interrupts and memory mapped I/O (MMIO) accesses that are all inefficient relative to simple memory accesses. At the same time, the ability to access GPU attached memory 420-423 without cache coherence overheads can be critical to the execution time of an offloaded computation. In cases with substantial streaming write memory traffic, for example, cache coherence overhead can significantly reduce the effective write bandwidth seen by a GPU 410-413. The efficiency of operand setup, the efficiency of results access, and the efficiency of GPU computation all play a role in determining the effectiveness of GPU offload.

A selection between GPU bias and host processor bias may be driven by a bias tracker data structure. A bias table may be used, for example, which may be a page-granular structure (i.e., controlled at the granularity of a memory page) that includes 1 or 2 bits per GPU-attached memory page. The bias table may be implemented in a stolen memory range of one or more GPU-attached memories 420-423, with or without a bias cache in the GPU 410-413 (e.g., to cache frequently/recently used entries of the bias table). Alternatively, the entire bias table may be maintained within the GPU.

In one implementation, the bias table entry associated with each access to the GPU-attached memory 420-423 is accessed prior the actual access to the GPU memory, causing the following operations. First, local requests from the GPU 410-413 that find their page in GPU bias are forwarded directly to a corresponding GPU memory 420-423. Local requests from the GPU that find their page in host bias are forwarded to the processor 405 (e.g., over a high-speed link as discussed above). Optionally, requests from the processor 405 that find the requested page in host processor bias complete the request like a normal memory read. Alternatively, requests directed to a GPU-biased page may be forwarded to the GPU 410-413. The GPU may then transition the page to a host processor bias if it is not currently using the page.

The bias state of a page can be changed either by a software-based mechanism, a hardware-assisted software-based mechanism, or, for a limited set of cases, a purely hardware-based mechanism.

One mechanism for changing the bias state employs an API call (e.g., OpenCL), which, in turn, calls the GPU's device driver which, in turn, sends a message (or enqueues a command descriptor) to the GPU directing it to change the bias state and, for some transitions, perform a cache flushing operation in the host. The cache flushing operation is required for a transition from host processor 405 bias to GPU bias but is not required for the opposite transition.

Cache coherency may be maintained by temporarily rendering GPU-biased pages uncacheable by the host processor 405. To access these pages, the processor 405 may request access from the GPU 410 which may or may not grant access right away, depending on the implementation. Thus, to reduce communication between the host processor 405 and GPU 410 it is beneficial to ensure that GPU-biased pages are those which are required by the GPU but not the host processor 405 and vice versa.

Graphics Processing Pipeline

Figure 5:
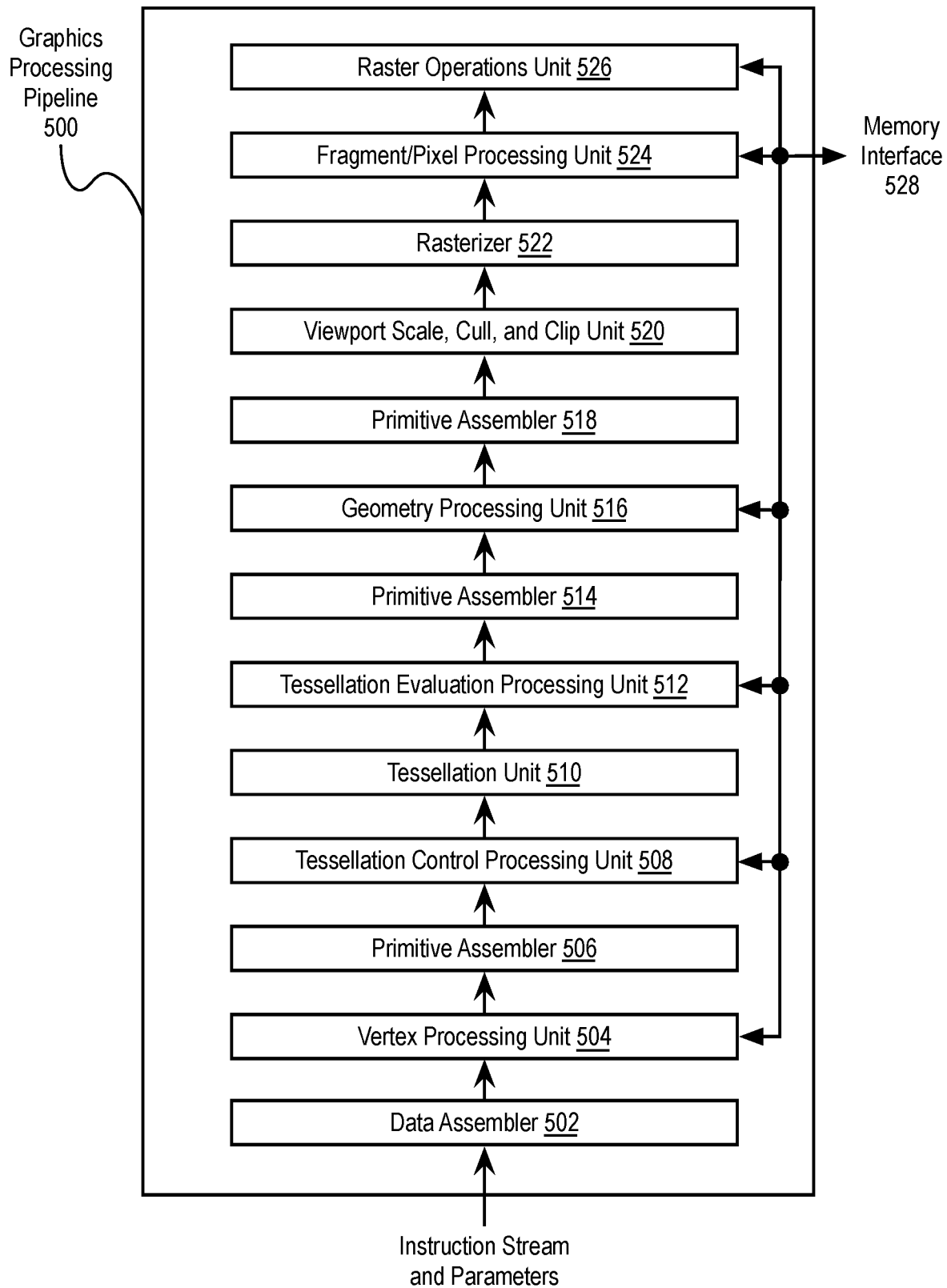
FIG. 5 illustrates a graphics processing pipeline.

FIG. 5 illustrates a graphics processing pipeline 500. A graphics multiprocessor, such as graphics multiprocessor 234 as in FIG. 2D, graphics multiprocessor 325 of FIG. 3A, graphics multiprocessor 350 of FIG. 3B can implement the illustrated graphics processing pipeline 500. The graphics multiprocessor can be included within the parallel processing subsystems as described herein, such as the parallel processor 200 of FIG. 2A, which may be related to the parallel processor(s) 112 of FIG. 1 and may be used in place of one of those. The various parallel processing systems can implement the graphics processing pipeline 500 via one or more instances of the parallel processing unit (e.g., parallel processing unit 202 of FIG. 2A) as described herein. For example, a shader unit (e.g., graphics multiprocessor 234 of FIG. 2C) may be configured to perform the functions of one or more of a vertex processing unit 504, a tessellation control processing unit 508, a tessellation evaluation processing unit 512, a geometry processing unit 516, and a fragment/pixel processing unit 524. The functions of data assembler 502, primitive assemblers 506, 514, 518, tessellation unit 510, rasterizer 522, and raster operations unit 526 may also be performed by other processing engines within a processing cluster (e.g., processing cluster 214 of FIG. 2A) and a corresponding partition unit (e.g., partition unit 220A-220N of FIG. 2A). The graphics processing pipeline 500 may also be implemented using dedicated processing units for one or more functions. It is also possible that one or more portions of the graphics processing pipeline 500 are performed by parallel processing logic within a general-purpose processor (e.g., CPU). Optionally, one or more portions of the graphics processing pipeline 500 can access on-chip memory (e.g., parallel processor memory 222 as in FIG. 2A) via a memory interface 528, which may be an instance of the memory interface 218 of FIG. 2A. The graphics processor pipeline 500 may also be implemented via a multi-core group 365A as in FIG. 3C.

The data assembler 502 is a processing unit that may collect vertex data for surfaces and primitives. The data assembler 502 then outputs the vertex data, including the vertex attributes, to the vertex processing unit 504. The vertex processing unit 504 is a programmable execution unit that executes vertex shader programs, lighting and transforming vertex data as specified by the vertex shader programs. The vertex processing unit 504 reads data that is stored in cache, local or system memory for use in processing the vertex data and may be programmed to transform the vertex data from an object-based coordinate representation to a world space coordinate space or a normalized device coordinate space.

A first instance of a primitive assembler 506 receives vertex attributes from the vertex processing unit 504. The primitive assembler 506 readings stored vertex attributes as needed and constructs graphics primitives for processing by tessellation control processing unit 508. The graphics primitives include triangles, line segments, points, patches, and so forth, as supported by various graphics processing application programming interfaces (APIs).

The tessellation control processing unit 508 treats the input vertices as control points for a geometric patch. The control points are transformed from an input representation from the patch (e.g., the patch's bases) to a representation that is suitable for use in surface evaluation by the tessellation evaluation processing unit 512. The tessellation control processing unit 508 can also compute tessellation factors for edges of geometric patches. A tessellation factor applies to a single edge and quantifies a view-dependent level of detail associated with the edge. A tessellation unit 510 is configured to receive the tessellation factors for edges of a patch and to tessellate the patch into multiple geometric primitives such as line, triangle, or quadrilateral primitives, which are transmitted to a tessellation evaluation processing unit 512. The tessellation evaluation processing unit 512 operates on parameterized coordinates of the subdivided patch to generate a surface representation and vertex attributes for each vertex associated with the geometric primitives.

A second instance of a primitive assembler 514 receives vertex attributes from the tessellation evaluation processing unit 512, reading stored vertex attributes as needed, and constructs graphics primitives for processing by the geometry processing unit 516. The geometry processing unit 516 is a programmable execution unit that executes geometry shader programs to transform graphics primitives received from primitive assembler 514 as specified by the geometry shader programs. The geometry processing unit 516 may be programmed to subdivide the graphics primitives into one or more new graphics primitives and calculate parameters used to rasterize the new graphics primitives.

The geometry processing unit 516 may be able to add or delete elements in the geometry stream. The geometry processing unit 516 outputs the parameters and vertices specifying new graphics primitives to primitive assembler 518. The primitive assembler 518 receives the parameters and vertices from the geometry processing unit 516 and constructs graphics primitives for processing by a viewport scale, cull, and clip unit 520. The geometry processing unit 516 reads data that is stored in parallel processor memory or system memory for use in processing the geometry data. The viewport scale, cull, and clip unit 520 performs clipping, culling, and viewport scaling and outputs processed graphics primitives to a rasterizer 522.

The rasterizer 522 can perform depth culling and other depth-based optimizations. The rasterizer 522 also performs scan conversion on the new graphics primitives to generate fragments and output those fragments and associated coverage data to the fragment/pixel processing unit 524. The fragment/pixel processing unit 524 is a programmable execution unit that is configured to execute fragment shader programs or pixel shader programs. The fragment/pixel processing unit 524 transforming fragments or pixels received from rasterizer 522, as specified by the fragment or pixel shader programs. For example, the fragment/pixel processing unit 524 may be programmed to perform operations included but not limited to texture mapping, shading, blending, texture correction and perspective correction to produce shaded fragments or pixels that are output to a raster operations unit 526. The fragment/pixel processing unit 524 can read data that is stored in either the parallel processor memory or the system memory for use when processing the fragment data. Fragment or pixel shader programs may be configured to shade at sample, pixel, tile, or other granularities depending on the sampling rate configured for the processing units.

The raster operations unit 526 is a processing unit that performs raster operations including, but not limited to stencil, z-test, blending, and the like, and outputs pixel data as processed graphics data to be stored in graphics memory (e.g., parallel processor memory 222 as in FIG. 2A, and/or system memory 104 as in FIG. 1), to be displayed on the one or more display device(s) 110A-110B or for further processing by one of the one or more processor(s) 102 or parallel processor(s) 112. The raster operations unit 526 may be configured to compress z or color data that is written to memory and decompress z or color data that is read from memory.

Machine Learning Overview

The architecture described above can be applied to perform training and inference operations using machine learning models. Machine learning has been successful at solving many kinds of tasks. The computations that arise when training and using machine learning algorithms (e.g., neural networks) lend themselves naturally to efficient parallel implementations. Accordingly, parallel processors such as general-purpose graphics processing units (GPGPUs) have played a significant role in the practical implementation of deep neural networks. Parallel graphics processors with single instruction, multiple thread (SIMT) architectures are designed to maximize the amount of parallel processing in the graphics pipeline. In an SIMT architecture, groups of parallel threads attempt to execute program instructions synchronously together as often as possible to increase processing efficiency. The efficiency provided by parallel machine learning algorithm implementations allows the use of high-capacity networks and enables those networks to be trained on larger datasets.

A machine learning algorithm is an algorithm that can learn based on a set of data. For example, machine learning algorithms can be designed to model high-level abstractions within a data set. For example, image recognition algorithms can be used to determine which of several categories to which a given input belong; regression algorithms can output a numerical value given an input; and pattern recognition algorithms can be used to generate translated text or perform text to speech and/or speech recognition.

An exemplary type of machine learning algorithm is a neural network. There are many types of neural networks; a simple type of neural network is a feedforward network. A feedforward network may be implemented as an acyclic graph in which the nodes are arranged in layers. Typically, a feedforward network topology includes an input layer and an output layer that are separated by at least one hidden layer. The hidden layer transforms input received by the input layer into a representation that is useful for generating output in the output layer. The network nodes are fully connected via edges to the nodes in adjacent layers, but there are no edges between nodes within each layer. Data received at the nodes of an input layer of a feedforward network are propagated (i.e., "fed forward") to the nodes of the output layer via an activation function that calculates the states of the nodes of each successive layer in the network based on coefficients ("weights") respectively associated with each of the edges connecting the layers. Depending on the specific model being represented by the algorithm being executed, the output from the neural network algorithm can take various forms.

Before a machine learning algorithm can be used to model a particular problem, the algorithm is trained using a training data set. Training a neural network involves selecting a network topology, using a set of training data representing a problem being modeled by the network, and adjusting the weights until the network model performs with a minimal error for all instances of the training data set. For example, during a supervised learning training process for a neural network, the output produced by the network in response to the input representing an instance in a training data set is compared to the "correct" labeled output for that instance, an error signal representing the difference between the output and the labeled output is calculated, and the weights associated with the connections are adjusted to minimize that error as the error signal is backward propagated through the layers of the network. The network is considered "trained" when the errors for each of the outputs generated from the instances of the training data set are minimized.

The accuracy of a machine learning algorithm can be affected significantly by the quality of the data set used to train the algorithm. The training process can be computationally intensive and may require a significant amount of time on a conventional general-purpose processor. Accordingly, parallel processing hardware is used to train many types of machine learning algorithms. This is particularly useful for optimizing the training of neural networks, as the computations performed in adjusting the coefficients in neural networks lend themselves naturally to parallel implementations. Specifically, many machine learning algorithms and software applications have been adapted to make use of the parallel processing hardware within general-purpose graphics processing devices.

Figure 6:
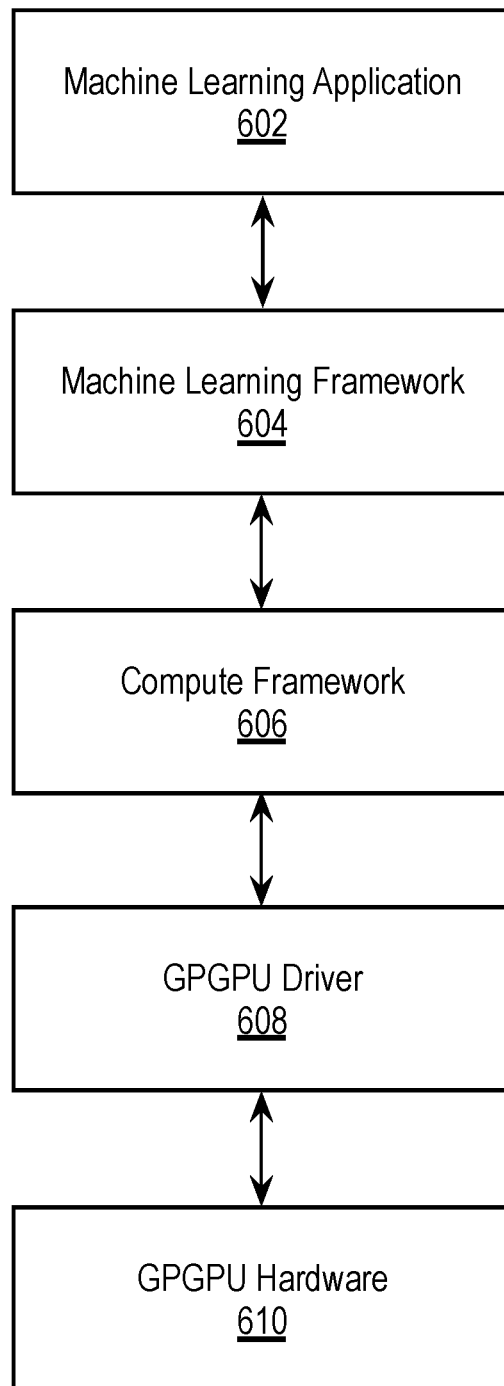
FIG. 6 illustrates a machine learning software stack.

FIG. 6 is a generalized diagram of a machine learning software stack 600. A machine learning application 602 is any logic that can be configured to train a neural network using a training dataset or to use a trained deep neural network to implement machine intelligence. The machine learning application 602 can include training and inference functionality for a neural network and/or specialized software that can be used to train a neural network before deployment. The machine learning application 602 can implement any type of machine intelligence including but not limited to image recognition, mapping and localization, autonomous navigation, speech synthesis, medical imaging, or language translation. Example machine learning applications 602 include, but are not limited to, voice-based virtual assistants, image or facial recognition algorithms, autonomous navigation, and the software tools that are used to train the machine learning models used by the machine learning applications 602.

Hardware acceleration for the machine learning application 602 can be enabled via a machine learning framework 604. The machine learning framework 604 can provide a library of machine learning primitives. Machine learning primitives are basic operations that are commonly performed by machine learning algorithms. Without the machine learning framework 604, developers of machine learning algorithms would be required to create and optimize the main computational logic associated with the machine learning algorithm, then re-optimize the computational logic as new parallel processors are developed. Instead, the machine learning application can be configured to perform the necessary computations using the primitives provided by the machine learning framework 604. Exemplary primitives include tensor convolutions, activation functions, and pooling, which are computational operations that are performed while training a convolutional neural network (CNN). The machine learning framework 604 can also provide primitives to implement basic linear algebra subprograms performed by many machine-learning algorithms, such as matrix and vector operations. Examples of a machine learning framework 604 include, but are not limited to, TensorFlow, TensorRT, PyTorch, MXNet, Caffee, and other high-level machine learning frameworks.

The machine learning framework 604 can process input data received from the machine learning application 602 and generate the appropriate input to a compute framework 606. The compute framework 606 can abstract the underlying instructions provided to the GPGPU driver 608 to enable the machine learning framework 604 to take advantage of hardware acceleration via the GPGPU hardware 610 without requiring the machine learning framework 604 to have intimate knowledge of the architecture of the GPGPU hardware 610. Additionally, the compute framework 606 can enable hardware acceleration for the machine learning framework 604 across a variety of types and generations of the GPGPU hardware 610. Exemplary compute frameworks 606 include the CUDA compute framework and associated machine learning libraries, such as the CUDA Deep Neural Network (cuDNN) library. The machine learning software stack 600 can also include communication libraries or frameworks to facilitate multi-GPU and multi-node compute.

GPGPU Machine Learning Acceleration

Figure 7:
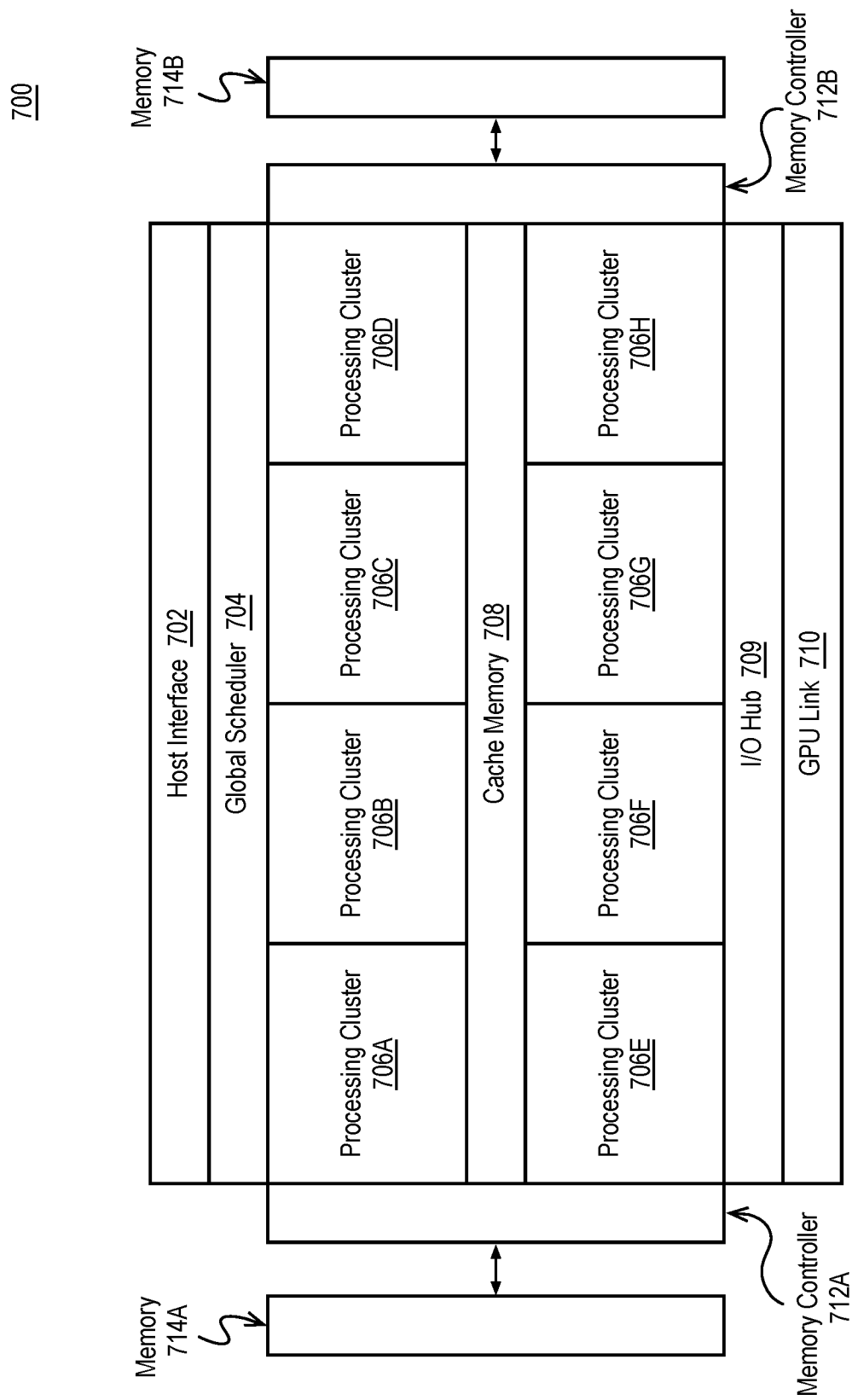
FIG. 7 illustrates a general-purpose graphics processing unit.

FIG. 7 illustrates a general-purpose graphics processing unit 700, which may be the parallel processor 200 of FIG. 2A or the parallel processor(s) 112 of FIG. 1. The general-purpose processing unit (GPGPU) 700 may be configured to provide support for hardware acceleration of primitives provided by a machine learning framework to accelerate the processing the type of computational workloads associated with training deep neural networks. Additionally, the GPGPU 700 can be linked directly to other instances of the GPGPU to create a multi-GPU cluster to improve training speed for particularly deep neural networks. Primitives are also supported to accelerate inference operations for deployed neural networks.

The GPGPU 700 includes a host interface 702 to enable a connection with a host processor. The host interface 702 may be a PCI Express interface. However, the host interface can also be a vendor specific communications interface or communications fabric. The GPGPU 700 receives commands from the host processor and uses a global scheduler 704 to distribute execution threads associated with those commands to a set of processing clusters 706A-706H. The processing clusters 706A-706H share a cache memory 708. The cache memory 708 can serve as a higher-level cache for cache memories within the processing clusters 706A-706H. The illustrated processing clusters 706A-706H may correspond with processing clusters 214A-214N as in FIG. 2A.

The GPGPU 700 includes memory 714A-714B coupled with the processing clusters 706A-706H via a set of memory controllers 712A-712B. The memory 714A-714B can include various types of memory devices including dynamic random-access memory (DRAM) or graphics random access memory, such as synchronous graphics random access memory (SGRAM), including graphics double data rate (GDDR) memory. The memory 714A-714B may also include 3D stacked memory, including but not limited to high bandwidth memory (HBM).

Each of the processing clusters 706A-706H may include a set of graphics multiprocessors, such as the graphics multiprocessor 234 of FIG. 2D, graphics multiprocessor 325 of FIG. 3A, graphics multiprocessor 350 of FIG. 3B, or may include a multi-core group 365A-365N as in FIG. 3C. The graphics multiprocessors of the compute cluster include multiple types of integer and floating-point logic units that can perform computational operations at a range of precisions including suited for machine learning computations. For example, at least a subset of the floating-point units in each of the processing clusters 706A-706H can be configured to perform 16-bit or 32-bit floating point operations, while a different subset of the floating-point units can be configured to perform 64-bit floating point operations.

Multiple instances of the GPGPU 700 can be configured to operate as a compute cluster. The communication mechanism used by the compute cluster for synchronization and data exchange varies across embodiments. For example, the multiple instances of the GPGPU 700 communicate over the host interface 702. In one embodiment the GPGPU 700 includes an I/O hub 709 that couples the GPGPU 700 with a GPU link 710 that enables a direct connection to other instances of the GPGPU. The GPU link 710 may be coupled to a dedicated GPU-to-GPU bridge that enables communication and synchronization between multiple instances of the GPGPU 700. Optionally, the GPU link 710 couples with a high-speed interconnect to transmit and receive data to other GPGPUs or parallel processors. The multiple instances of the GPGPU 700 may be located in separate data processing systems and communicate via a network device that is accessible via the host interface 702. The GPU link 710 may be configured to enable a connection to a host processor in addition to or as an alternative to the host interface 702.

While the illustrated configuration of the GPGPU 700 can be configured to train neural networks, an alternate configuration of the GPGPU 700 can be configured for deployment within a high performance or low power inferencing platform. In an inferencing configuration, the GPGPU 700 includes fewer of the processing clusters 706A-706H relative to the training configuration. Additionally, memory technology associated with the memory 714A-714B may differ between inferencing and training configurations. In one embodiment, the inferencing configuration of the GPGPU 700 can support inferencing specific instructions. For example, an inferencing configuration can provide support for one or more 8-bit integer dot product instructions, which are commonly used during inferencing operations for deployed neural networks.

Figure 8:
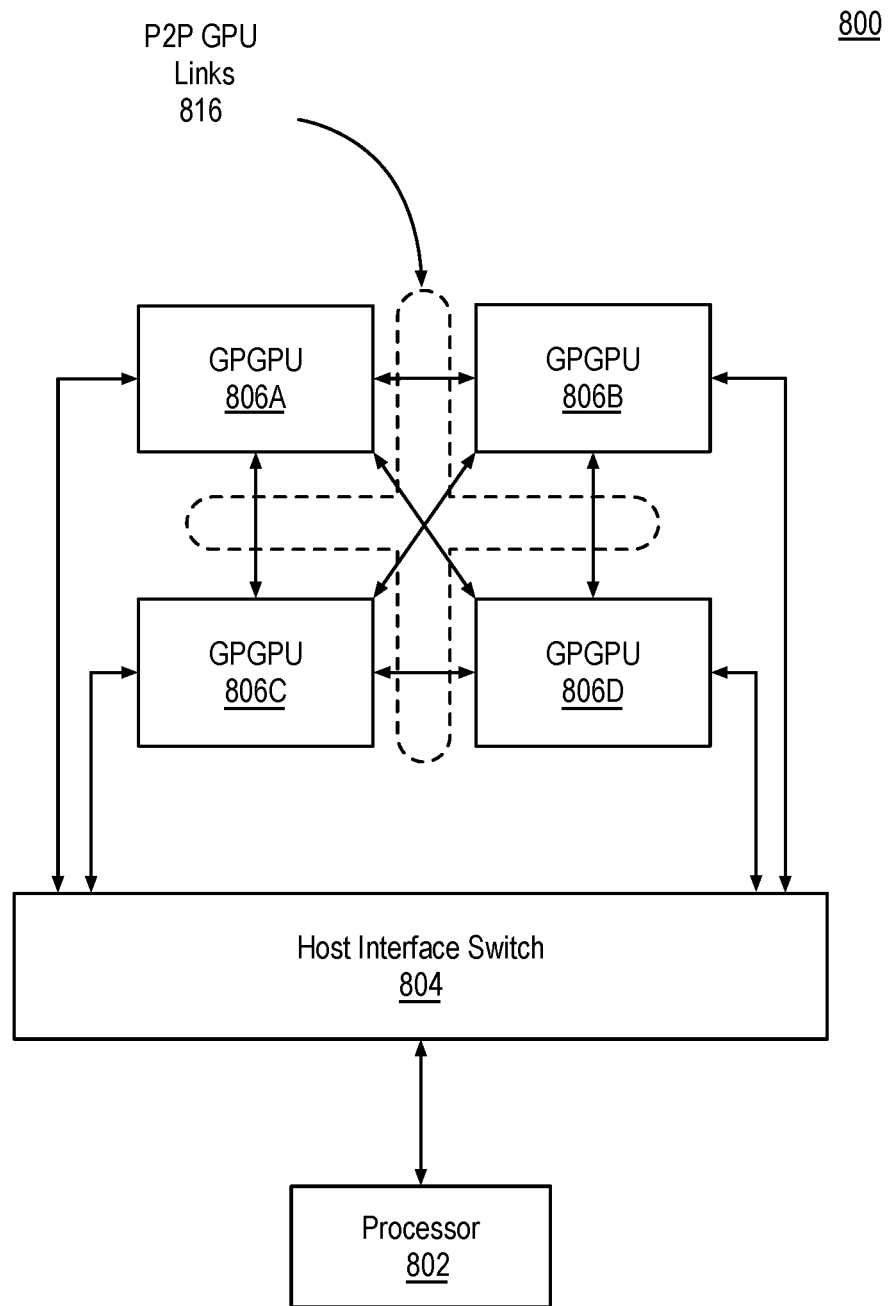
FIG. 8 illustrates a multi-GPU computing system.

FIG. 8 illustrates a multi-GPU computing system 800. The multi-GPU computing system 800 can include a processor 802 coupled to multiple GPGPUs 806A-806D via a host interface switch 804. The host interface switch 804 may be a PCI express switch device that couples the processor 802 to a PCI express bus over which the processor 802 can communicate with the set of GPGPUs 806A-806D. Each of the multiple GPGPUs 806A-806D can be an instance of the GPGPU 700 of FIG. 7. The GPGPUs 806A-806D can interconnect via a set of high-speed point to point GPU to GPU links 816. The high-speed GPU to GPU links can connect to each of the GPGPUs 806A-806D via a dedicated GPU link, such as the GPU link 710 as in FIG. 7. The P2P GPU links 816 enable direct communication between each of the GPGPUs 806A-806D without requiring communication over the host interface bus to which the processor 802 is connected. With GPU-to-GPU traffic directed to the P2P GPU links, the host interface bus remains available for system memory access or to communicate with other instances of the multi-GPU computing system 800, for example, via one or more network devices. While in FIG. 8 the GPGPUs 806A-806D connect to the processor 802 via the host interface switch 804, the processor 802 may alternatively include direct support for the P2P GPU links 816 and connect directly to the GPGPUs 806A-806D. In one embodiment the P2P GPU link 816 enable the multi-GPU computing system 800 to operate as a single logical GPU.

Machine Learning Neural Network Implementations

The computing architecture described herein can be configured to perform the types of parallel processing that is particularly suited for training and deploying neural networks for machine learning. A neural network can be generalized as a network of functions having a graph relationship. As is well-known in the art, there are a variety of types of neural network implementations used in machine learning. One exemplary type of neural network is the feedforward network, as previously described.

A second exemplary type of neural network is the Convolutional Neural Network (CNN). A CNN is a specialized feedforward neural network for processing data having a known, grid-like topology, such as image data. Accordingly, CNNs are commonly used for compute vision and image recognition applications, but they also may be used for other types of pattern recognition such as speech and language processing. The nodes in the CNN input layer are organized into a set of "filters" (feature detectors inspired by the receptive fields found in the retina), and the output of each set of filters is propagated to nodes in successive layers of the network. The computations for a CNN include applying the convolution mathematical operation to each filter to produce the output of that filter. Convolution is a specialized kind of mathematical operation performed by two functions to produce a third function that is a modified version of one of the two original functions. In convolutional network terminology, the first function to the convolution can be referred to as the input, while the second function can be referred to as the convolution kernel. The output may be referred to as the feature map. For example, the input to a convolution layer can be a multidimensional array of data that defines the various color components of an input image. The convolution kernel can be a multidimensional array of parameters, where the parameters are adapted by the training process for the neural network.

Recurrent neural networks (RNNs) are a family of feedforward neural networks that include feedback connections between layers. RNNs enable modeling of sequential data by sharing parameter data across different parts of the neural network. The architecture for an RNN includes cycles. The cycles represent the influence of a present value of a variable on its own value at a future time, as at least a portion of the output data from the RNN is used as feedback for processing subsequent input in a sequence. This feature makes RNNs particularly useful for language processing due to the variable nature in which language data can be composed.

The figures described below present exemplary feedforward, CNN, and RNN networks, as well as describe a general process for respectively training and deploying each of those types of networks. It will be understood that these descriptions are exemplary and non-limiting as to any specific embodiment described herein and the concepts illustrated can be applied generally to deep neural networks and machine learning techniques in general.

The exemplary neural networks described above can be used to perform deep learning. Deep learning is machine learning using deep neural networks. The deep neural networks used in deep learning are artificial neural networks composed of multiple hidden layers, as opposed to shallow neural networks that include only a single hidden layer. Deeper neural networks are generally more computationally intensive to train. However, the additional hidden layers of the network enable multistep pattern recognition that results in reduced output error relative to shallow machine learning techniques.

Deep neural networks used in deep learning typically include a front end network to perform feature recognition coupled to a back-end network which represents a mathematical model that can perform operations (e.g., object classification, speech recognition, etc.) based on the feature representation provided to the model. Deep learning enables machine learning to be performed without requiring hand crafted feature engineering to be performed for the model. Instead, deep neural networks can learn features based on statistical structure or correlation within the input data. The learned features can be provided to a mathematical model that can map detected features to an output. The mathematical model used by the network is generally specialized for the specific task to be performed, and different models will be used to perform different task.

Once the neural network is structured, a learning model can be applied to the network to train the network to perform specific tasks. The learning model describes how to adjust the weights within the model to reduce the output error of the network. Backpropagation of errors is a common method used to train neural networks. An input vector is presented to the network for processing. The output of the network is compared to the desired output using a loss function and an error value is calculated for each of the neurons in the output layer. The error values are then propagated backwards until each neuron has an associated error value which roughly represents its contribution to the original output. The network can then learn from those errors using an algorithm, such as the stochastic gradient descent algorithm, to update the weights of the of the neural network.

Figure 9A:
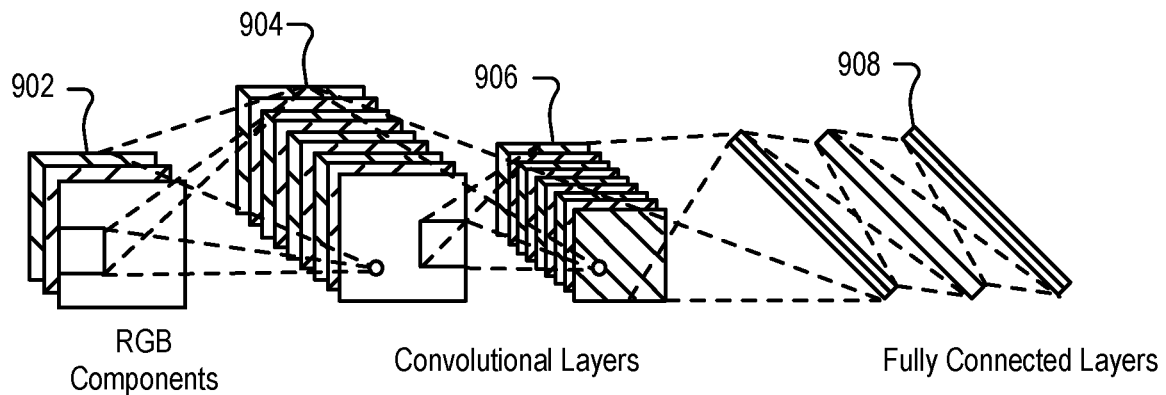
FIG. 9A-9B illustrate layers of exemplary deep neural networks.
Figure 9B:
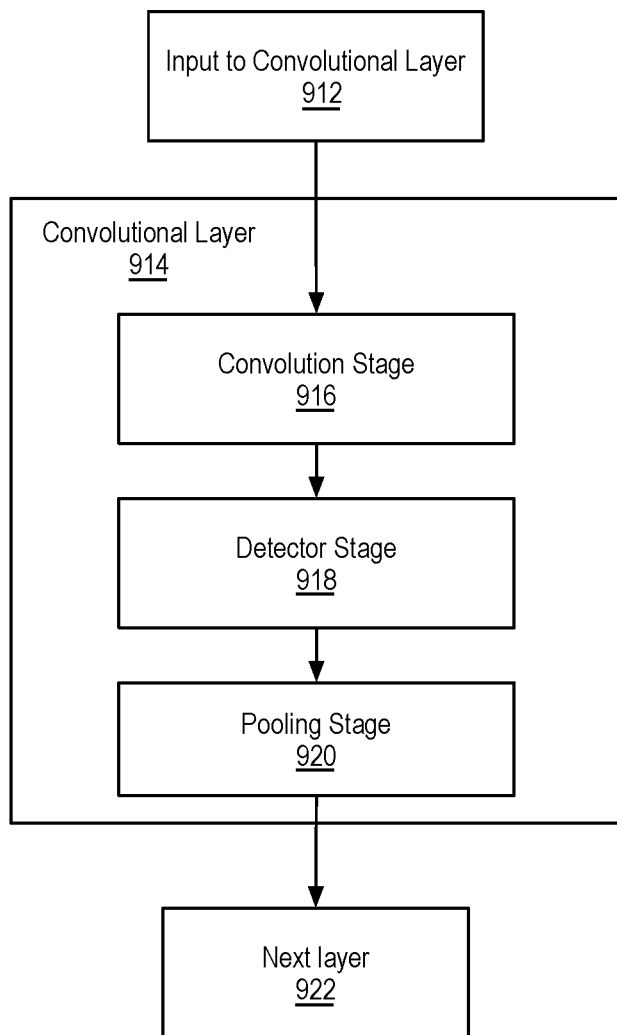

FIG. 9A-9B illustrate an exemplary convolutional neural network. FIG. 9A illustrates various layers within a CNN. As shown in FIG. 9A, an exemplary CNN used to model image processing can receive input 902 describing the red, green, and blue (RGB) components of an input image. The input 902 can be processed by multiple convolutional layers (e.g., convolutional layer 904, convolutional layer 906). The output from the multiple convolutional layers may optionally be processed by a set of fully connected layers 908. Neurons in a fully connected layer have full connections to all activations in the previous layer, as previously described for a feedforward network. The output from the fully connected layers 908 can be used to generate an output result from the network. The activations within the fully connected layers 908 can be computed using matrix multiplication instead of convolution. Not all CNN implementations make use of fully connected layers 908. For example, in some implementations the convolutional layer 906 can generate output for the CNN.

The convolutional layers are sparsely connected, which differs from traditional neural network configuration found in the fully connected layers 908. Traditional neural network layers are fully connected, such that every output unit interacts with every input unit. However, the convolutional layers are sparsely connected because the output of the convolution of a field is input (instead of the respective state value of each of the nodes in the field) to the nodes of the subsequent layer, as illustrated. The kernels associated with the convolutional layers perform convolution operations, the output of which is sent to the next layer. The dimensionality reduction performed within the convolutional layers is one aspect that enables the CNN to scale to process large images.

FIG. 9B illustrates exemplary computation stages within a convolutional layer of a CNN. Input to a convolutional layer 912 of a CNN can be processed in three stages of a convolutional layer 914. The three stages can include a convolution stage 916, a detector stage 918, and a pooling stage 920. The convolutional layer 914 can then output data to a successive convolutional layer. The final convolutional layer of the network can generate output feature map data or provide input to a fully connected layer, for example, to generate a classification value for the input to the CNN.

In the convolution stage 916 performs several convolutions in parallel to produce a set of linear activations. The convolution stage 916 can include an affine transformation, which is any transformation that can be specified as a linear transformation plus a translation. Affine transformations include rotations, translations, scaling, and combinations of these transformations. The convolution stage computes the output of functions (e.g., neurons) that are connected to specific regions in the input, which can be determined as the local region associated with the neuron. The neurons compute a dot product between the weights of the neurons and the region in the local input to which the neurons are connected. The output from the convolution stage 916 defines a set of linear activations that are processed by successive stages of the convolutional layer 914.

The linear activations can be processed by a detector stage 918. In the detector stage 918, each linear activation is processed by a non-linear activation function. The non-linear activation function increases the nonlinear properties of the overall network without affecting the receptive fields of the convolution layer. Several types of non-linear activation functions may be used. One particular type is the rectified linear unit (ReLU), which uses an activation function defined as $f(x)=\max(0, x)$, such that the activation is thresholded at zero.

The pooling stage 920 uses a pooling function that replaces the output of the convolutional layer 906 with a summary statistic of the nearby outputs. The pooling function can be used to introduce translation invariance into the neural network, such that small translations to the input do not change the pooled outputs. Invariance to local translation can be useful in scenarios where the presence of a feature in the input data is more important than the precise location of the feature. Various types of pooling functions can be used during the pooling stage 920, including max pooling, average pooling, and 12-norm pooling. Additionally, some CNN implementations do not include a pooling stage. Instead, such implementations substitute and additional convolution stage having an increased stride relative to previous convolution stages.

The output from the convolutional layer 914 can then be processed by the next layer 922. The next layer 922 can be an additional convolutional layer or one of the fully connected layers 908. For example, the first convolutional layer 904 of FIG. 9A can output to the second convolutional layer 906, while the second convolutional layer can output to a first layer of the fully connected layers 908.

Figure 10:
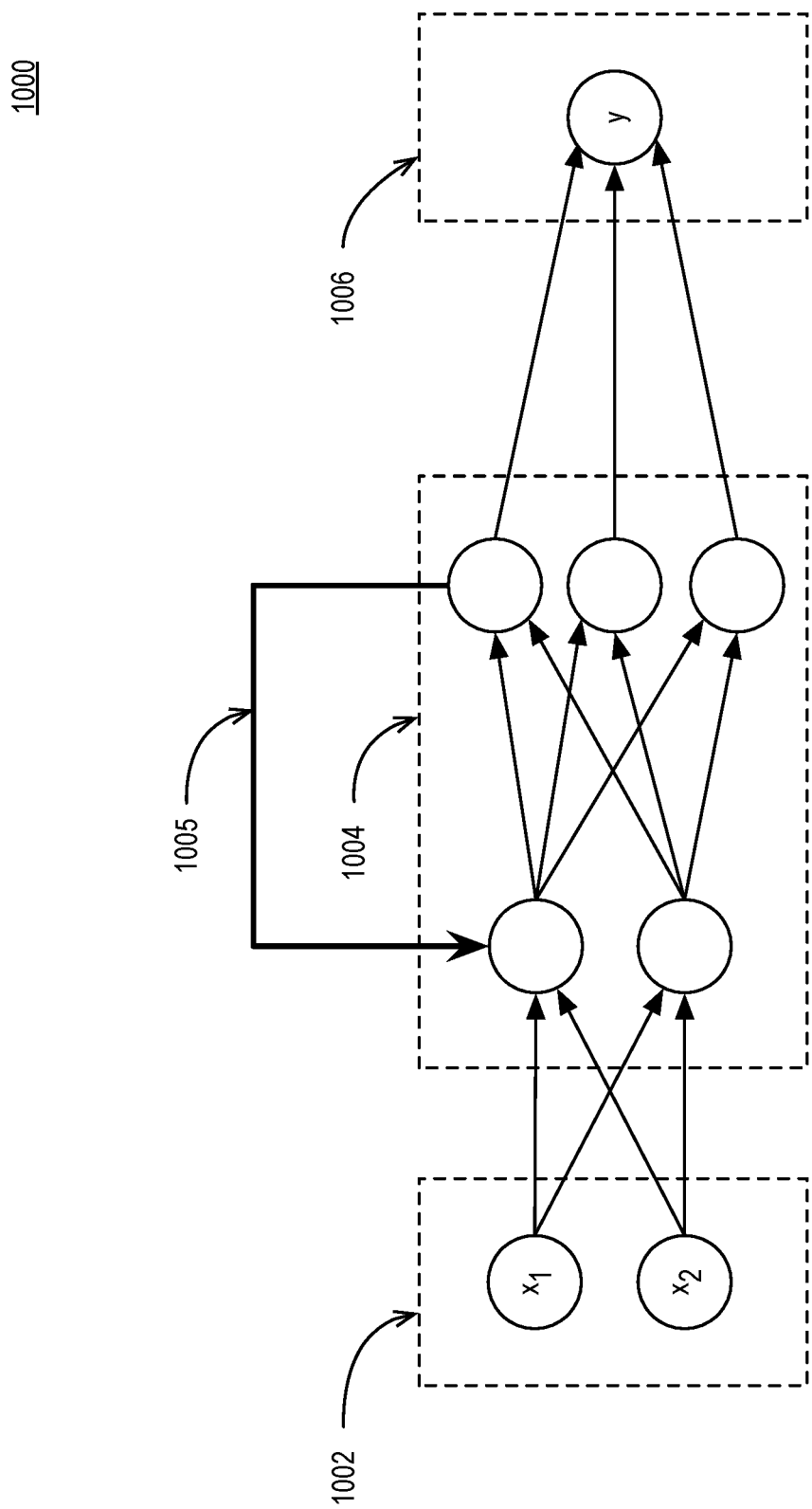
FIG. 10 illustrates an exemplary recurrent neural network.

FIG. 10 illustrates an exemplary recurrent neural network 1000. In a recurrent neural network (RNN), the previous state of the network influences the output of the current state of the network. RNNs can be built in a variety of ways using a variety of functions. The use of RNNs generally revolves around using mathematical models to predict the future based on a prior sequence of inputs. For example, an RNN may be used to perform statistical language modeling to predict an upcoming word given a previous sequence of words. The illustrated RNN 1000 can be described has having an input layer 1002 that receives an input vector, hidden layers 1004 to implement a recurrent function, a feedback mechanism 1005 to enable a 'memory' of previous states, and an output layer 1006 to output a result. The RNN 1000 operates based on time-steps. The state of the RNN at a given time step is influenced based on the previous time step via the feedback mechanism 1005. For a given time step, the state of the hidden layers 1004 is defined by the previous state and the input at the current time step. An initial input ($x_1$) at a first-time step can be processed by the hidden layer 1004. A second input ($x_2$) can be processed by the hidden layer 1004 using state information that is determined during the processing of the initial input ($x_1$). A given state can be computed as $s_t=f(Ux_t+Ws_{t-1})$, where U and W are parameter matrices. The function $f$ is generally a non-linearity, such as the hyperbolic tangent function (Tan h) or a variant of the rectifier function $f(x)=\max(0, x)$. However, the specific mathematical function used in the hidden layers 1004 can vary depending on the specific implementation details of the RNN 1000.

In addition to the basic CNN and RNN networks described above, acceleration for variations on those networks may be enabled. One example RNN variant is the long short term memory (LSTM) RNN. LSTM RNNs are capable of learning long-term dependencies that may be necessary for processing longer sequences of language. A variant on the CNN is a convolutional deep belief network, which has a structure similar to a CNN and is trained in a manner similar to a deep belief network. A deep belief network (DBN) is a generative neural network that is composed of multiple layers of stochastic (random) variables. DBNs can be trained layer-by-layer using greedy unsupervised learning. The learned weights of the DBN can then be used to provide pre-train neural networks by determining an optimal initial set of weights for the neural network. In further embodiments, acceleration for reinforcement learning is enabled. In reinforcement learning, an artificial agent learns by interacting with its environment. The agent is configured to optimize certain objectives to maximize cumulative rewards.

Figure 11:
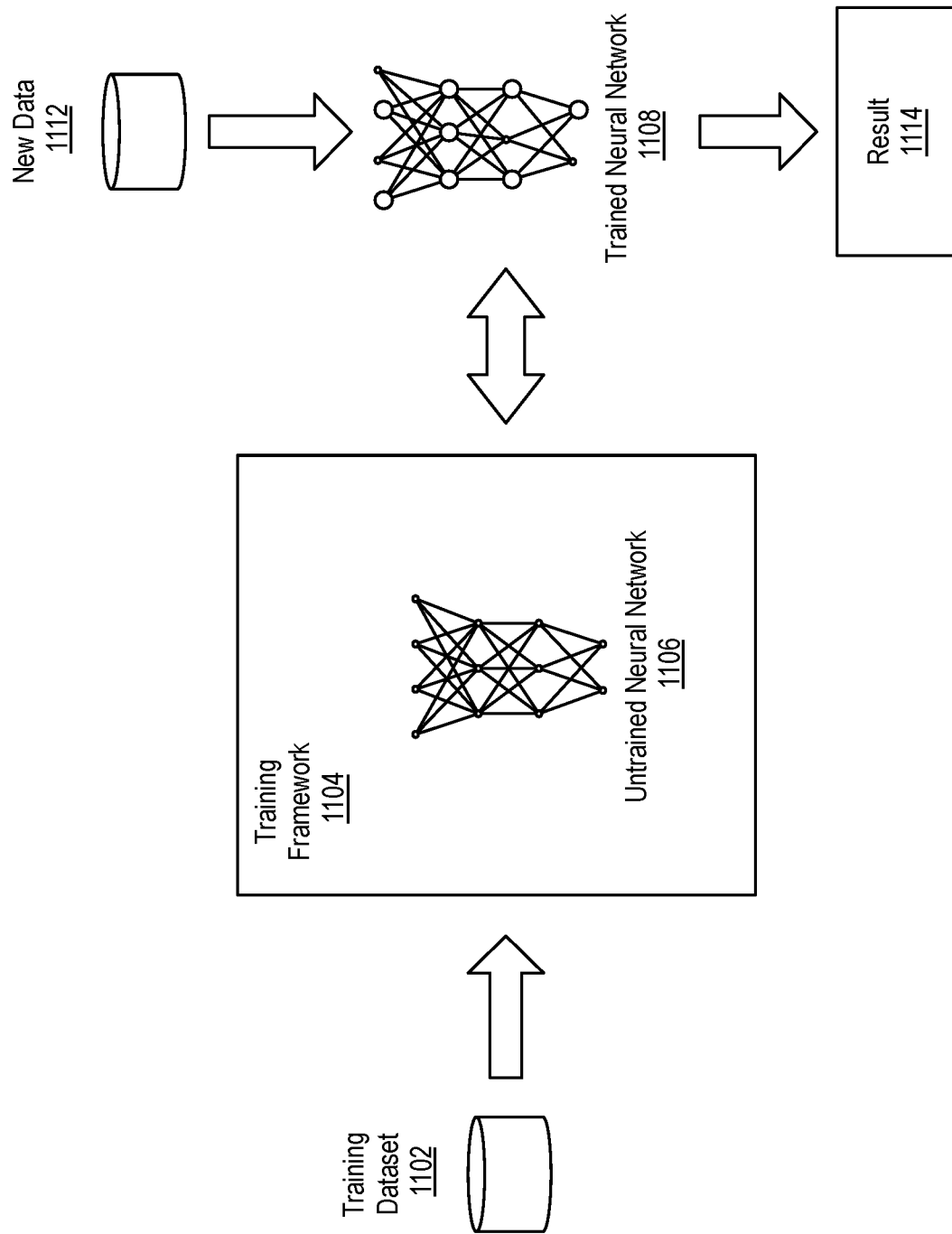
FIG. 11 illustrates training and deployment of a deep neural network.

FIG. 11 illustrates training and deployment of a deep neural network. Once a given network has been structured for a task the neural network is trained using a training dataset 1102. Various training frameworks 1104 have been developed to enable hardware acceleration of the training process. For example, the machine learning framework 604 of FIG. 6 may be configured as a training framework 1104. The training framework 1104 can hook into an untrained neural network 1106 and enable the untrained neural net to be trained using the parallel processing resources described herein to generate a trained neural network 1108.

To start the training process the initial weights may be chosen randomly or by pre-training using a deep belief network. The training cycle then be performed in either a supervised or unsupervised manner.

Supervised learning is a learning method in which training is performed as a mediated operation, such as when the training dataset 1102 includes input paired with the desired output for the input, or where the training dataset includes input having known output and the output of the neural network is manually graded. The network processes the inputs and compares the resulting outputs against a set of expected or desired outputs. Errors are then propagated back through the system. The training framework 1104 can adjust to adjust the weights that control the untrained neural network 1106. The training framework 1104 can provide tools to monitor how well the untrained neural network 1106 is converging towards a model suitable to generating correct answers based on known input data. The training process occurs repeatedly as the weights of the network are adjusted to refine the output generated by the neural network. The training process can continue until the neural network reaches a statistically desired accuracy associated with a trained neural network 1108. The trained neural network 1108 can then be deployed to implement any number of machine learning operations to generate an inference result 1114 based on input of new data 1112.

Unsupervised learning is a learning method in which the network attempts to train itself using unlabeled data. Thus, for unsupervised learning the training dataset 1102 will include input data without any associated output data. The untrained neural network 1106 can learn groupings within the unlabeled input and can determine how individual inputs are related to the overall dataset. Unsupervised training can be used to generate a self-organizing map, which is a type of trained neural network 1108 capable of performing operations useful in reducing the dimensionality of data. Unsupervised training can also be used to perform anomaly detection, which allows the identification of data points in an input dataset that deviate from the normal patterns of the data.

Variations on supervised and unsupervised training may also be employed. Semi-supervised learning is a technique in which in the training dataset 1102 includes a mix of labeled and unlabeled data of the same distribution. Incremental learning is a variant of supervised learning in which input data is continuously used to further train the model. Incremental learning enables the trained neural network 1108 to adapt to the new data 1112 without forgetting the knowledge instilled within the network during initial training.

Whether supervised or unsupervised, the training process for particularly deep neural networks may be too computationally intensive for a single compute node. Instead of using a single compute node, a distributed network of computational nodes can be used to accelerate the training process.

Figure 12A:
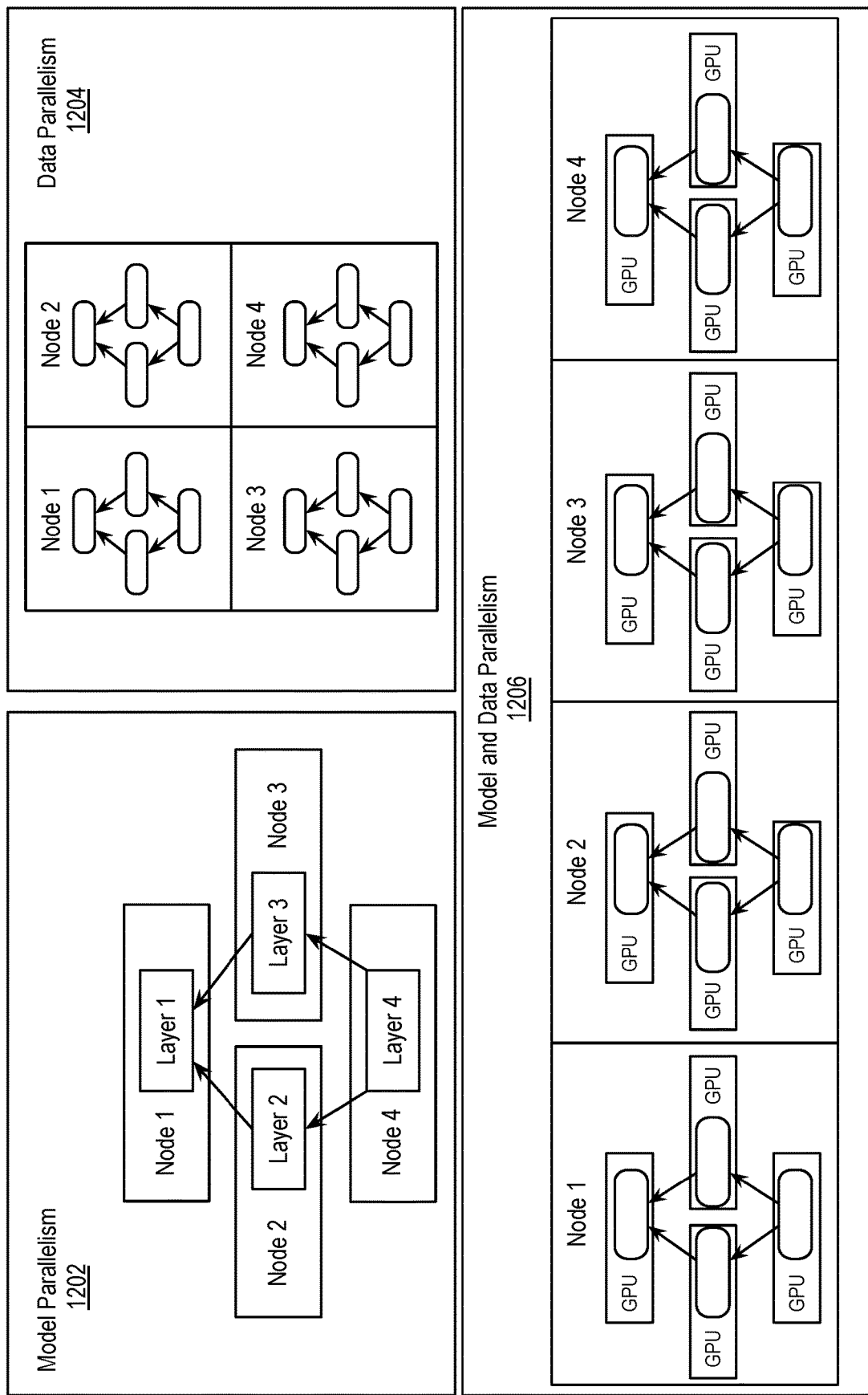
FIG. 12A is a block diagram illustrating distributed learning.

FIG. 12A is a block diagram illustrating distributed learning. Distributed learning is a training model that uses multiple distributed computing nodes to perform supervised or unsupervised training of a neural network. The distributed computational nodes can each include one or more host processors and one or more of the general-purpose processing nodes, such as the highly parallel general-purpose graphics processing unit 700 as in FIG. 7. As illustrated, distributed learning can be performed with model parallelism 1202, data parallelism 1204, or a combination of model and data parallelism 1206.

In model parallelism 1202, different computational nodes in a distributed system can perform training computations for different parts of a single network. For example, each layer of a neural network can be trained by a different processing node of the distributed system. The benefits of model parallelism include the ability to scale to particularly large models. Splitting the computations associated with different layers of the neural network enables the training of very large neural networks in which the weights of all layers would not fit into the memory of a single computational node. In some instances, model parallelism can be particularly useful in performing unsupervised training of large neural networks.

In data parallelism 1204, the different nodes of the distributed network have a complete instance of the model and each node receives a different portion of the data. The results from the different nodes are then combined. While different approaches to data parallelism are possible, data parallel training approaches all require a technique of combining results and synchronizing the model parameters between each node. Exemplary approaches to combining data include parameter averaging and update-based data parallelism. Parameter averaging trains each node on a subset of the training data and sets the global parameters (e.g., weights, biases) to the average of the parameters from each node. Parameter averaging uses a central parameter server that maintains the parameter data. Update based data parallelism is similar to parameter averaging except that instead of transferring parameters from the nodes to the parameter server, the updates to the model are transferred. Additionally, update-based data parallelism can be performed in a decentralized manner, where the updates are compressed and transferred between nodes.

Combined model and data parallelism 1206 can be implemented, for example, in a distributed system in which each computational node includes multiple GPUs. Each node can have a complete instance of the model with separate GPUs within each node are used to train different portions of the model.

Distributed training has increased overhead relative to training on a single machine. However, the parallel processors and GPGPUs described herein can each implement various techniques to reduce the overhead of distributed training, including techniques to enable high bandwidth GPU-to-GPU data transfer and accelerated remote data synchronization.

Figure 12B:
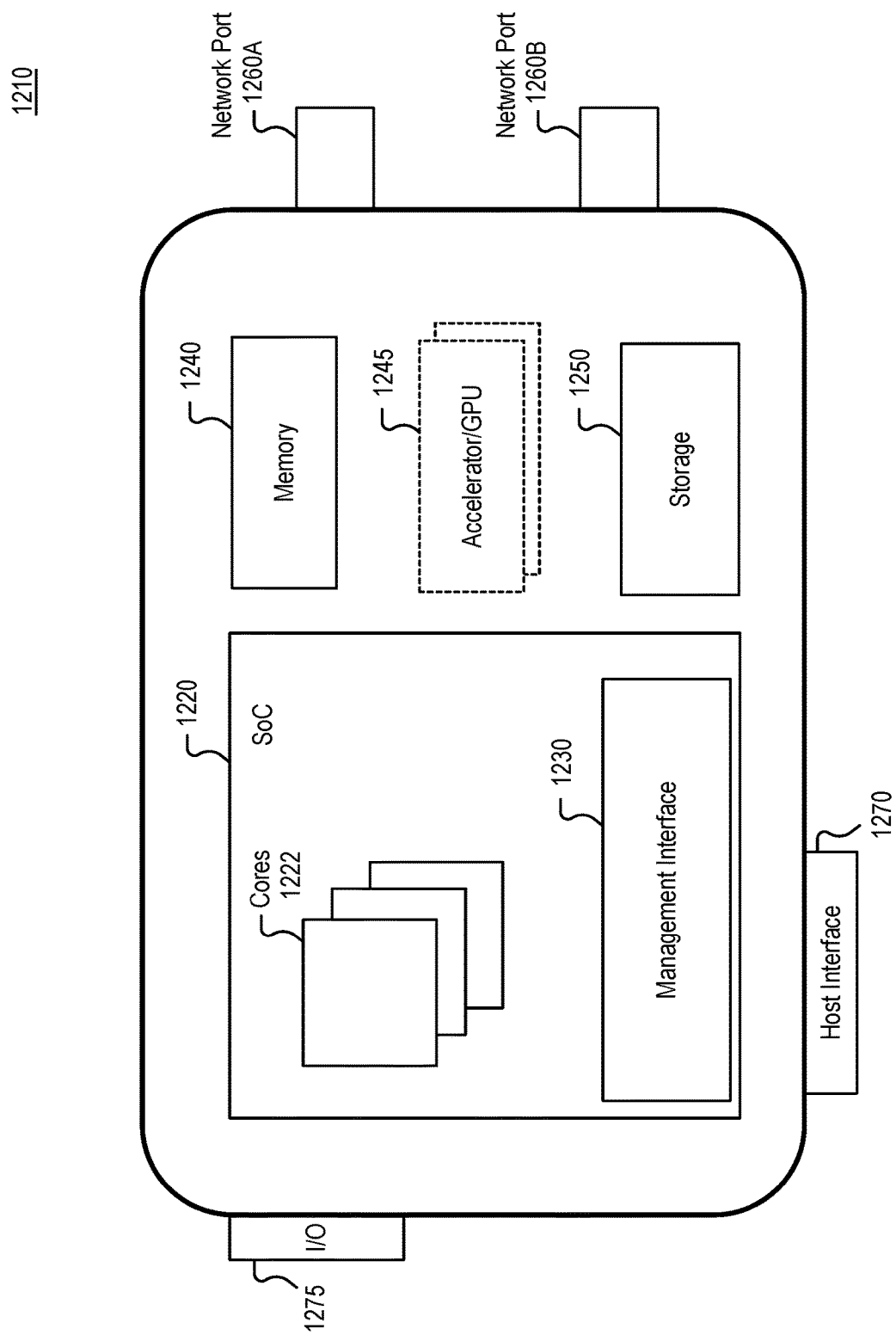
FIG. 12B is a block diagram illustrating a programmable network interface and data processing unit.

FIG. 12B is a block diagram illustrating a programmable network interface 1210 and data processing unit. The programmable network interface 1210 is a programmable network engine that can be used to accelerate network-based compute tasks within a distributed environment. The programmable network interface 1210 can couple with a host system via host interface 1270. The programmable network interface 1210 can be used to accelerate network or storage operations for CPUs or GPUs of the host system. The host system can be, for example, a node of a distributed learning system used to perform distributed training, for example, as shown in FIG. 12A. The host system can also be a data center node within a data center.

In one embodiment, access to remote storage containing model data can be accelerated by the programmable network interface 1210. For example, the programmable network interface 1210 can be configured to present remote storage devices as local storage devices to the host system. The programmable network interface 1210 can also accelerate remote direct memory access (RDMA) operations performed between GPUs of the host system with GPUs of remote systems. In one embodiment, the programmable network interface 1210 can enable storage functionality such as, but not limited to NVME-oF. The programmable network interface 1210 can also accelerate encryption, data integrity, compression, and other operations for remote storage on behalf of the host system, allowing remote storage to approach the latencies of storage devices that are directly attached to the host system.

The programmable network interface 1210 can also perform resource allocation and management on behalf of the host system. Storage security operations can be offloaded to the programmable network interface 1210 and performed in concert with the allocation and management of remote storage resources. Network-based operations to manage access to the remote storage that would otherwise by performed by a processor of the host system can instead be performed by the programmable network interface 1210.

In one embodiment, network and/or data security operations can be offloaded from the host system to the programmable network interface 1210. Data center security policies for a data center node can be handled by the programmable network interface 1210 instead of the processors of the host system. For example, the programmable network interface 1210 can detect and mitigate against an attempted network-based attack (e.g., DDoS) on the host system, preventing the attack from compromising the availability of the host system.

The programmable network interface 1210 can include a system on a chip (SoC 1220) that executes an operating system via multiple processor cores 1222. The processor cores 1222 can include general-purpose processor (e.g., CPU) cores. In one embodiment the processor cores 1222 can also include one or more GPU cores. The SoC 1220 can execute instructions stored in a memory device 1240. A storage device 1250 can store local operating system data. The storage device 1250 and memory device 1240 can also be used to cache remote data for the host system. Network ports 1260A-1260B enable a connection to a network or fabric and facilitate network access for the SoC 1220 and, via the host interface 1270, for the host system. The programmable network interface 1210 can also include an I/O interface 1275, such as a USB interface. The I/O interface 1275 can be used to couple external devices to the programmable network interface 1210 or as a debug interface. The programmable network interface 1210 also includes a management interface 1230 that enables software on the host device to manage and configure the programmable network interface 1210 and/or SoC 1220. In one embodiment the programmable network interface 1210 may also include one or more accelerators or GPUs 1245 to accept offload of parallel compute tasks from the SoC 1220, host system, or remote systems coupled via the network ports 1260A-1260B.

Exemplary Machine Learning Applications

Machine learning can be applied to solve a variety of technological problems, including but not limited to computer vision, autonomous driving and navigation, speech recognition, and language processing. Computer vision has traditionally been one of the most active research areas for machine learning applications. Applications of computer vision range from reproducing human visual abilities, such as recognizing faces, to creating new categories of visual abilities. For example, computer vision applications can be configured to recognize sound waves from the vibrations induced in objects visible in a video. Parallel processor accelerated machine learning enables computer vision applications to be trained using significantly larger training dataset than previously feasible and enables inferencing systems to be deployed using low power parallel processors.

Parallel processor accelerated machine learning has autonomous driving applications including lane and road sign recognition, obstacle avoidance, navigation, and driving control. Accelerated machine learning techniques can be used to train driving models based on datasets that define the appropriate responses to specific training input. The parallel processors described herein can enable rapid training of the increasingly complex neural networks used for autonomous driving solutions and enables the deployment of low power inferencing processors in a mobile platform suitable for integration into autonomous vehicles.

Parallel processor accelerated deep neural networks have enabled machine learning approaches to automatic speech recognition (ASR). ASR includes the creation of a function that computes the most probable linguistic sequence given an input acoustic sequence. Accelerated machine learning using deep neural networks have enabled the replacement of the hidden Markov models (HMMs) and Gaussian mixture models (GMMs) previously used for ASR.

Parallel processor accelerated machine learning can also be used to accelerate natural language processing. Automatic learning procedures can make use of statistical inference algorithms to produce models that are robust to erroneous or unfamiliar input. Exemplary natural language processor applications include automatic machine translation between human languages.

The parallel processing platforms used for machine learning can be divided into training platforms and deployment platforms. Training platforms are generally highly parallel and include optimizations to accelerate multi-GPU single node training and multi-node, multi-GPU training. Exemplary parallel processors suited for training include the general-purpose graphics processing unit 700 of FIG. 7 and the multi-GPU computing system 800 of FIG. 8. On the contrary, deployed machine learning platforms generally include lower power parallel processors suitable for use in products such as cameras, autonomous robots, and autonomous vehicles.

Additionally, machine learning techniques can be applied to accelerate or enhance graphics processing activities. For example, a machine learning model can be trained to recognize output generated by a GPU accelerated application and generate an upscaled version of that output. Such techniques can be applied to accelerate the generation of high-resolution images for a gaming application. Various other graphics pipeline activities can benefit from the use of machine learning. For example, machine learning models can be trained to perform tessellation operations on geometry data to increase the complexity of geometric models, allowing fine-detailed geometry to be automatically generated from geometry of relatively lower detail.

Figure 13:
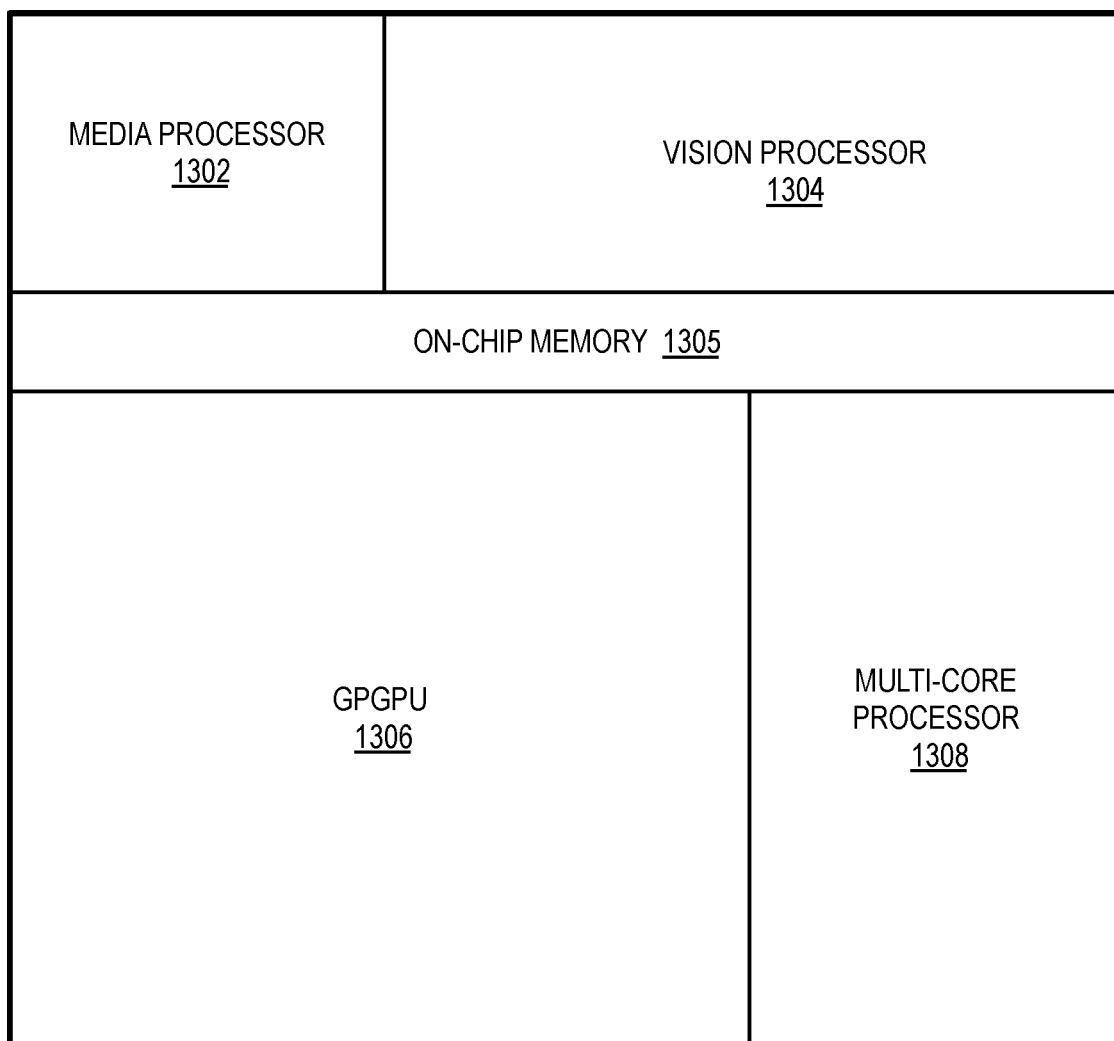
FIG. 13 illustrates an exemplary inferencing system on a chip (SOC) suitable for performing inferencing using a trained model.

FIG. 13 illustrates an exemplary inferencing system on a chip (SOC) 1300 suitable for performing inferencing using a trained model. The SOC 1300 can integrate processing components processor 1308. The GPGPU 1306 may be a GPGPU as described herein, such as the GPGPU 700, and the multi-core processor 1308 may be a multi-core processor described herein, such as the multi-core processors 405-406. The SOC 1300 can additionally include on-chip memory 1305 that can enable a shared on-chip data pool that is accessible by each of the processing components. The processing components can be optimized for low power operation to enable deployment to a variety of machine learning platforms, including autonomous vehicles and autonomous robots. For example, one implementation of the SOC 1300 can be used as a portion of the main control system for an autonomous vehicle. Where the SOC 1300 is configured for use in autonomous vehicles the SOC is designed and configured for compliance with the relevant functional safety standards of the deployment jurisdiction.

During operation, the media processor 1302 and vision processor 1304 can work in concert to accelerate computer vision operations. The media processor 1302 can enable low latency decode of multiple high-resolution (e.g., 4K, 8K) video streams. The decoded video streams can be written to a buffer in the on-chip memory 1305. The vision processor 1304 can then parse the decoded video and perform preliminary processing operations on the frames of the decoded video in preparation of processing the frames using a trained image recognition model. For example, the vision processor 1304 can accelerate convolution operations for a CNN that is used to perform image recognition on the high-resolution video data, while back-end model computations are performed by the GPGPU 1306.

The multi-core processor 1308 can include control logic to assist with sequencing and synchronization of data transfers and shared memory operations performed by the media processor 1302 and the vision processor 1304. The multi-core processor 1308 can also function as an application processor to execute software applications that can make use of the inferencing compute capability of the GPGPU 1306. For example, at least a portion of the navigation and driving logic can be implemented in software executing on the multi-core processor 1308. Such software can directly issue computational workloads to the GPGPU 1306 or the computational workloads can be issued to the multi-core processor 1308, which can offload at least a portion of those operations to the GPGPU 1306.

The GPGPU 1306 can include compute clusters such as a low power configuration of the processing clusters 706A-706H within general-purpose graphics processing unit 700. The compute clusters within the GPGPU 1306 can support instruction that are specifically optimized to perform inferencing computations on a trained neural network. For example, the GPGPU 1306 can support instructions to perform low precision computations such as 8-bit and 4-bit integer vector operations.

Additional System Overview

Figure 14:
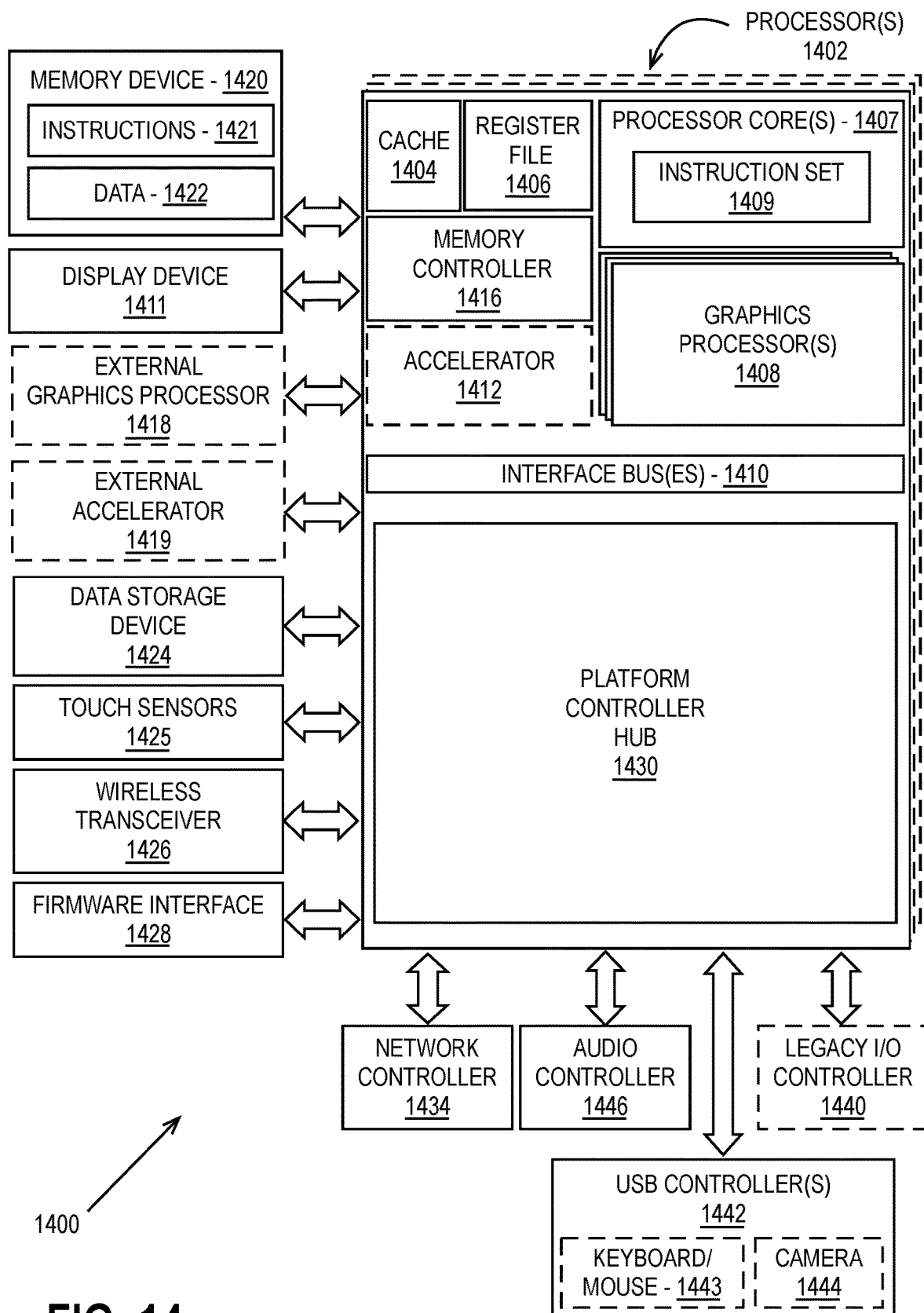
FIG. 14 is a block diagram of a processing system.

FIG. 14 is a block diagram of a processing system 1400. The elements of FIG. 14 having the same or similar names as the elements of any other figure herein describe the same elements as in the other figures, can operate or function in a manner similar to that, can comprise the same components, and can be linked to other entities, as those described elsewhere herein, but are not limited to such. System 1400 may be used in a single processor desktop system, a multiprocessor workstation system, or a server system having a large number of processors 1402 or processor cores 1407. The system 1400 may be a processing platform incorporated within a system-on-a-chip (SoC) integrated circuit for use in mobile, handheld, or embedded devices such as within Internet-of-things (IoT) devices with wired or wireless connectivity to a local or wide area network.

The system 1400 may be a processing system having components that correspond with those of FIG. 1. For example, in different configurations, processor(s) 1402 or processor core(s) 1407 may correspond with processor(s) 102 of FIG. 1. Graphics processor(s) 1408 may correspond with parallel processor(s) 112 of FIG. 1. External graphics processor 1418 may be one of the add-in device(s) 120 of FIG. 1.

The system 1400 can include, couple with, or be integrated within: a server-based gaming platform; a game console, including a game and media console; a mobile gaming console, a handheld game console, or an online game console. The system 1400 may be part of a mobile phone, smart phone, tablet computing device or mobile Internet-connected device such as a laptop with low internal storage capacity. Processing system 1400 can also include, couple with, or be integrated within: a wearable device, such as a smart watch wearable device; smart eyewear or clothing enhanced with augmented reality (AR) or virtual reality (VR) features to provide visual, audio or tactile outputs to supplement real world visual, audio or tactile experiences or otherwise provide text, audio, graphics, video, holographic images or video, or tactile feedback; other augmented reality (AR) device; or other virtual reality (VR) device. The processing system 1400 may include or be part of a television or set top box device. The system 1400 can include, couple with, or be integrated within a self-driving vehicle such as a bus, tractor trailer, car, motor or electric power cycle, plane or glider (or any combination thereof). The self-driving vehicle may use system 1400 to process the environment sensed around the vehicle.

The one or more processors 1402 may include one or more processor cores 1407 to process instructions which, when executed, perform operations for system or user software. The least one of the one or more processor cores 1407 may be configured to process a specific instruction set 1409. The instruction set 1409 may facilitate Complex Instruction Set Computing (CISC), Reduced Instruction Set Computing (RISC), or computing via a Very Long Instruction Word (VLIW). One or more processor cores 1407 may process a different instruction set 1409, which may include instructions to facilitate the emulation of other instruction sets. Processor core 1407 may also include other processing devices, such as a Digital Signal Processor (DSP).

The processor 1402 may include cache memory 1404. Depending on the architecture, the processor 1402 can have a single internal cache or multiple levels of internal cache. In some embodiments, the cache memory is shared among various components of the processor 1402. In some embodiments, the processor 1402 also uses an external cache (e.g., a Level-3 (L3) cache or Last Level Cache (LLC)) (not shown), which may be shared among processor cores 1407 using known cache coherency techniques. A register file 1406 can be additionally included in processor 1402 and may include different types of registers for storing different types of data (e.g., integer registers, floating point registers, status registers, and an instruction pointer register). Some registers may be general-purpose registers, while other registers may be specific to the design of the processor 1402.

The one or more processor(s) 1402 may be coupled with one or more interface bus(es) 1410 to transmit communication signals such as address, data, or control signals between processor 1402 and other components in the system 1400. The interface bus 1410, in one of these embodiments, can be a processor bus, such as a version of the Direct Media Interface (DMI) bus. However, processor busses are not limited to the DMI bus, and may include one or more Peripheral Component Interconnect buses (e.g., PCI, PCI express), memory busses, or other types of interface busses. For example, the processor(s) 1402 may include an integrated memory controller 1416 and a platform controller hub 1430. The memory controller 1416 facilitates communication between a memory device and other components of the system 1400, while the platform controller hub (PCH) 1430 provides connections to I/O devices via a local I/O bus.

The memory device 1420 can be a dynamic random-access memory (DRAM) device, a static random-access memory (SRAM) device, flash memory device, phase-change memory device, or some other memory device having suitable performance to serve as process memory. The memory device 1420 can, for example, operate as system memory for the system 1400, to store data 1422 and instructions 1421 for use when the one or more processors 1402 executes an application or process. Memory controller 1416 also couples with an optional external graphics processor 1418, which may communicate with the one or more graphics processors 1408 in processors 1402 to perform graphics and media operations. In some embodiments, graphics, media, and or compute operations may be assisted by an accelerator 1412 which is a coprocessor that can be configured to perform a specialized set of graphics, media, or compute operations. For example, the accelerator 1412 may be a matrix multiplication accelerator used to optimize machine learning or compute operations. The accelerator 1412 can be a ray-tracing accelerator that can be used to perform ray-tracing operations in concert with the graphics processor 1408. In one embodiment, an external accelerator 1419 may be used in place of or in concert with the accelerator 1412.

A display device 1411 may be provided that can connect to the processor(s) 1402. The display device 1411 can be one or more of an internal display device, as in a mobile electronic device or a laptop device or an external display device attached via a display interface (e.g., DisplayPort, etc.). The display device 1411 can be a head mounted display (HMD) such as a stereoscopic display device for use in virtual reality (VR) applications or augmented reality (AR) applications.

The platform controller hub 1430 may enable peripherals to connect to memory device 1420 and processor 1402 via a high-speed I/O bus. The I/O peripherals include, but are not limited to, an audio controller 1446, a network controller 1434, a firmware interface 1428, a wireless transceiver 1426, touch sensors 1425, a data storage device 1424 (e.g., non-volatile memory, volatile memory, hard disk drive, flash memory, NAND, 3D NAND, 3D XPoint/Optane, etc.). The data storage device 1424 can connect via a storage interface (e.g., SATA) or via a peripheral bus, such as a Peripheral Component Interconnect bus (e.g., PCI, PCI express). The touch sensors 1425 can include touch screen sensors, pressure sensors, or fingerprint sensors. The wireless transceiver 1426 can be a Wi-Fi transceiver, a Bluetooth transceiver, or a mobile network transceiver such as a 3G, 4G, 5G, or Long-Term Evolution (LTE) transceiver. The firmware interface 1428 enables communication with system firmware, and can be, for example, a unified extensible firmware interface (UEFI). The network controller 1434 can enable a network connection to a wired network. In some embodiments, a high-performance network controller (not shown) couples with the interface bus 1410. The audio controller 1446 may be a multi-channel high-definition audio controller. In some of these embodiments the system 1400 includes an optional legacy I/O controller 1440 for coupling legacy (e.g., Personal System 2 (PS/2)) devices to the system. The platform controller hub 1430 can also connect to one or more Universal Serial Bus (USB) controllers 1442 connect input devices, such as keyboard and mouse 1443 combinations, a camera 1444, or other USB input devices.

It will be appreciated that the system 1400 shown is exemplary and not limiting, as other types of data processing systems that are differently configured may also be used. For example, an instance of the memory controller 1416 and platform controller hub 1430 may be integrated into a discrete external graphics processor, such as the external graphics processor 1418. The platform controller hub 1430 and/or memory controller 1416 may be external to the one or more processor(s) 1402. For example, the system 1400 can include an external memory controller 1416 and platform controller hub 1430, which may be configured as a memory controller hub and peripheral controller hub within a system chipset that is in communication with the processor(s) 1402.

For example, circuit boards ("sleds") can be used on which components such as CPUs, memory, and other components are placed are designed for increased thermal performance. Processing components such as the processors may be located on a top side of a sled while near memory, such as DIMMs, are located on a bottom side of the sled. As a result of the enhanced airflow provided by this design, the components may operate at higher frequencies and power levels than in typical systems, thereby increasing performance. Furthermore, the sleds are configured to blindly mate with power and data communication cables in a rack, thereby enhancing their ability to be quickly removed, upgraded, reinstalled, and/or replaced. Similarly, individual components located on the sleds, such as processors, accelerators, memory, and data storage drives, are configured to be easily upgraded due to their increased spacing from each other. In the illustrative embodiment, the components additionally include hardware attestation features to prove their authenticity.

A data center can utilize a single network architecture ("fabric") that supports multiple other network architectures including Ethernet and Omni-Path. The sleds can be coupled to switches via optical fibers, which provide higher bandwidth and lower latency than typical twisted pair cabling (e.g., Category 5, Category 5e, Category 6, etc.). Due to the high bandwidth, low latency interconnections and network architecture, the data center may, in use, pool resources, such as memory, accelerators (e.g., GPUs, graphics accelerators, FPGAs, ASICs, neural network and/or artificial intelligence accelerators, etc.), and data storage drives that are physically disaggregated, and provide them to compute resources (e.g., processors) on an as needed basis, enabling the compute resources to access the pooled resources as if they were local.

A power supply or source can provide voltage and/or current to system 1400 or any component or system described herein. In one example, the power supply includes an AC to DC (alternating current to direct current) adapter to plug into a wall outlet. Such AC power can be renewable energy (e.g., solar power) power source. In one example, the power source includes a DC power source, such as an external AC to DC converter. A power source or power supply may also include wireless charging hardware to charge via proximity to a charging field. The power source can include an internal battery, alternating current supply, motion-based power supply, solar power supply, or fuel cell source.

Figure 15A:
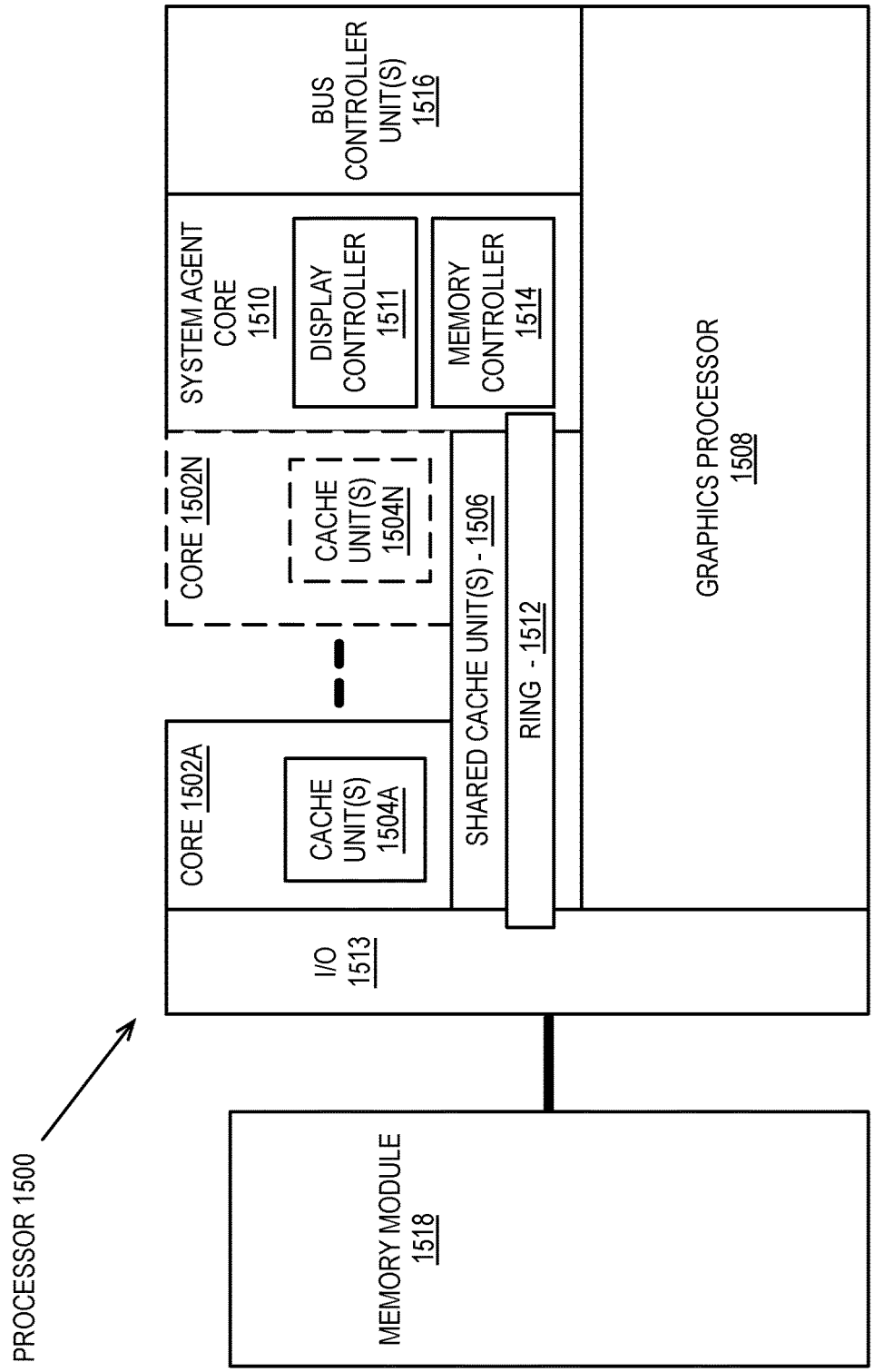
FIG. 15A-15C illustrate computing systems and graphics processors.
Figure 15B:
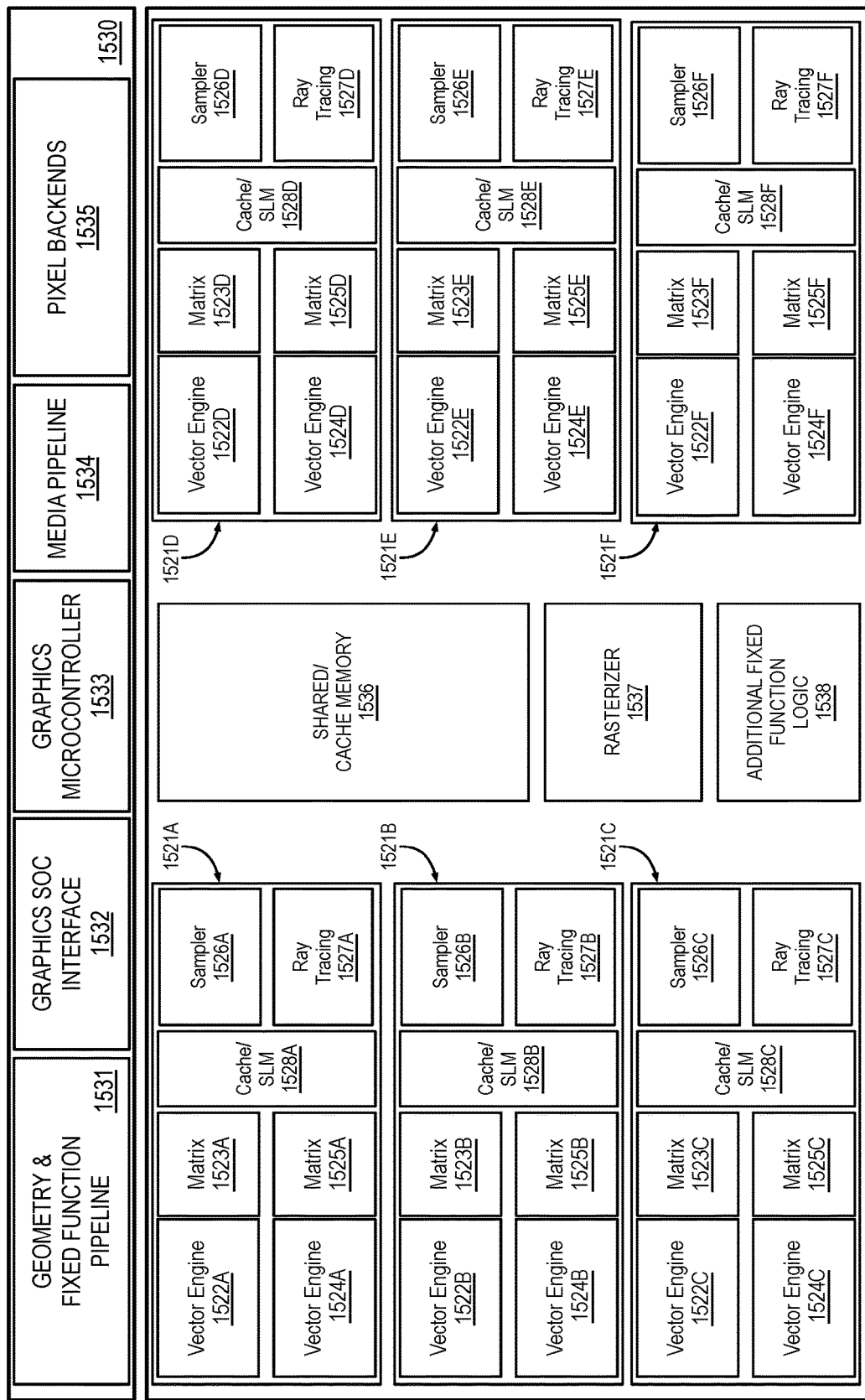
Figure 15C:
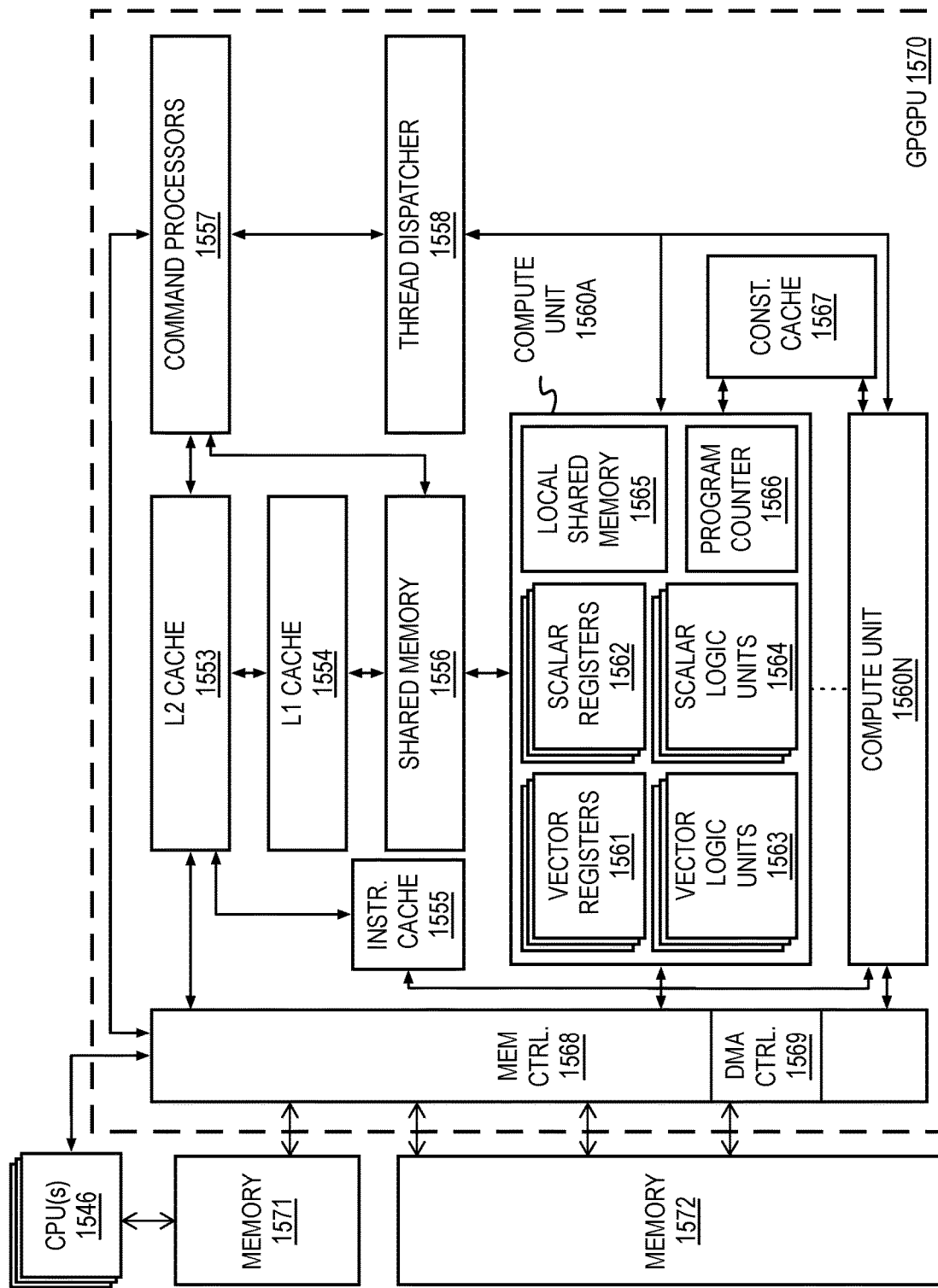

FIG. 15A-15C illustrate computing systems and graphics processors. The elements of FIG. 15A-15C having the same or similar names as the elements of any other figure herein describe the same elements as in the other figures, can operate or function in a manner similar to that, can comprise the same components, and can be linked to other entities, as those described elsewhere herein, but are not limited to such.

FIG. 15A is a block diagram of a processor 1500, which may be a variant of one of the processors 1402 and may be used in place of one of those. Therefore, the disclosure of any features in combination with the processor 1500 herein also discloses a corresponding combination with the processor(s) 1402 but is not limited to such. The processor 1500 may have one or more processor cores 1502A-1502N, an integrated memory controller 1514, and an integrated graphics processor 1508. Where an integrated graphics processor 1508 is excluded, the system that includes the processor will include a graphics processor device within a system chipset or coupled via a system bus. Processor 1500 can include additional cores up to and including additional core 1502N represented by the dashed lined boxes. Each of processor cores 1502A-1502N includes one or more internal cache units 1504A-1504N. In some embodiments each processor core 1502A-1502N also has access to one or more shared cache units 1506. The internal cache units 1504A-1504N and shared cache units 1506 represent a cache memory hierarchy within the processor 1500. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 1506 and 1504A-1504N.

The processor 1500 may also include a set of one or more bus controller units 1516 and a system agent core 1510. The one or more bus controller units 1516 manage a set of peripheral buses, such as one or more PCI or PCI express busses. System agent core 1510 provides management functionality for the various processor components. The system agent core 1510 may include one or more integrated memory controllers 1514 to manage access to various external memory devices (not shown).

For example, one or more of the processor cores 1502A-1502N may include support for simultaneous multi-threading. The system agent core 1510 includes components for coordinating and operating cores 1502A-1502N during multi-threaded processing. System agent core 1510 may additionally include a power control unit (PCU), which includes logic and components to regulate the power state of processor cores 1502A-1502N and graphics processor 1508.

The processor 1500 may additionally include graphics processor 1508 to execute graphics processing operations. In some of these embodiments, the graphics processor 1508 couples with the set of shared cache units 1506, and the system agent core 1510, including the one or more integrated memory controllers 1514. The system agent core 1510 may also include a display controller 1511 to drive graphics processor output to one or more coupled displays. The display controller 1511 may also be a separate module coupled with the graphics processor via at least one interconnect or may be integrated within the graphics processor 1508.

A ring-based interconnect 1512 may be used to couple the internal components of the processor 1500. However, an alternative interconnect unit may be used, such as a point-to-point interconnect, a switched interconnect, or other techniques, including techniques well known in the art. In some of these embodiments with a ring-based interconnect 1512, the graphics processor 1508 couples with the ring-based interconnect 1512 via an I/O link 1513.

The exemplary I/O link 1513 represents at least one of multiple varieties of I/O interconnects, including an on package I/O interconnect which facilitates communication between various processor components and a high-performance memory module 1518, such as an eDRAM module or high-bandwidth memory (HBM) module. Optionally, each of the processor cores 1502A-1502N and graphics processor 1508 can use the memory module 1518 as a shared Last Level Cache or a shared near memory pool, with attached DRAM acting as a far memory pool.

The processor cores 1502A-1502N may, for example, be homogenous cores executing the same instruction set architecture. Alternatively, the processor cores 1502A-1502N are heterogeneous in terms of instruction set architecture (ISA), where one or more of processor cores 1502A-1502N execute a first instruction set, while at least one of the other cores executes a subset of the first instruction set or a different instruction set. The processor cores 1502A-1502N may be heterogeneous in terms of microarchitecture, where one or more cores having a relatively higher power consumption couple with one or more power cores having a lower power consumption. As another example, the processor cores 1502A-1502N are heterogeneous in terms of computational capability. Additionally, processor 1500 can be implemented on one or more chips or as an SoC integrated circuit having the illustrated components, in addition to other components.

FIG. 15B is a block diagram of hardware logic of a graphics processor core block 1519, according to some embodiments described herein. In some embodiments, elements of FIG. 15B having the same reference numbers (or names) as the elements of any other figure herein may operate or function in a manner similar to that described elsewhere herein. The graphics processor core block 1519 is exemplary of one partition of a graphics processor. The graphics processor core block 1519 can be included within the integrated graphics processor 1508 of FIG. 15A or a discrete graphics processor, parallel processor, and/or compute accelerator. A graphics processor as described herein may include multiple graphics core blocks based on target power and performance envelopes. Each graphics processor core block 1519 can include a function block 1530 coupled with multiple graphics cores 1521A-1521F that include modular blocks of fixed function logic and general-purpose programmable logic. The graphics processor core block 1519 also includes shared/cache memory 1536 that is accessible by all graphics cores 1521A-1521F, rasterizer logic 1537, and additional fixed function logic 1538.

In some embodiments, the function block 1530 includes a geometry/fixed function pipeline 1531 that can be shared by all graphics cores in the graphics processor core block 1519. In various embodiments, the geometry/fixed function pipeline 1531 includes a 3D geometry pipeline a video front-end unit, a thread spawner and global thread dispatcher, and a unified return buffer manager, which manages unified return buffers. In one embodiment the function block 1530 also includes a graphics SoC interface 1532, a graphics microcontroller 1533, and a media pipeline 1534. The graphics SoC interface 1532 provides an interface between the graphics processor core block 1519 and other core blocks within a graphics processor or compute accelerator SoC. The graphics microcontroller 1533 is a programmable sub-processor that is configurable to manage various functions of the graphics processor core block 1519, including thread dispatch, scheduling, and pre-emption. The media pipeline 1534 includes logic to facilitate the decoding, encoding, pre-processing, and/or post-processing of multimedia data, including image and video data. The media pipeline 1534 implement media operations via requests to compute or sampling logic within the graphics cores 1521-1521F. One or more pixel backends 1535 can also be included within the and can perform blend operations and lossless color compression of rendered pixel data.

In one embodiment the graphics SoC interface 1532 enables the graphics processor core block 1519 to communicate with general-purpose application processor cores (e.g., CPUs) and/or other components within an SoC or a system host CPU that is coupled with the SoC via a peripheral interface. The graphics SoC interface 1532 also enables communication with off-chip memory hierarchy elements such as a shared last level cache memory, system RAM, and/or embedded on-chip or on-package DRAM. The SoC interface 1532 can also enable communication with fixed function devices within the SoC, such as camera imaging pipelines, and enables the use of and/or implements global memory atomics that may be shared between the graphics processor core block 1519 and CPUs within the SoC. The graphics SoC interface 1532 can also implement power management controls for the graphics processor core block 1519 and enable an interface between a clock domain of the graphics processor core block 1519 and other clock domains within the SoC. In one embodiment the graphics SoC interface 1532 enables receipt of command buffers from a command streamer and global thread dispatcher that are configured to provide commands and instructions to each of one or more graphics cores within a graphics processor. The commands and instructions can be dispatched to the media pipeline 1534 when media operations are to be performed, the geometry and fixed function pipeline 1531 when graphics processing operations are to be performed. When compute operations are to be performed, compute dispatch logic can dispatch the commands to the graphics cores 1521A-1521F, bypassing the geometry and media pipelines.

The graphics microcontroller 1533 can be configured to perform various scheduling and management tasks for the graphics processor core block 1519. In one embodiment the graphics microcontroller 1533 can perform graphics and/or compute workload scheduling on the various vector engines 1522A-1522F, 1524A-1524F and matrix engines 1523A-1523F, 1525A-1525F within the graphics cores 1521A-1521F. In this scheduling model, host software executing on a CPU core of an SoC including the graphics processor core block 1519 can submit workloads one of multiple graphics processor doorbells, which invokes a scheduling operation on the appropriate graphics engine. Scheduling operations include determining which workload to run next, submitting a workload to a command streamer, pre-empting existing workloads running on an engine, monitoring progress of a workload, and notifying host software when a workload is complete. In one embodiment the graphics microcontroller 1533 can also facilitate low-power or idle states for the graphics processor core block 1519, providing the graphics processor core block 1519 with the ability to save and restore registers within the graphics processor core block 1519 across low-power state transitions independently from the operating system and/or graphics driver software on the system.

The graphics processor core block 1519 may have greater than or fewer than the illustrated graphics cores 1521A-1521F, up to N modular graphics cores. For each set of N graphics cores, the graphics processor core block 1519 can also include shared/cache memory 1536, which can be configured as shared memory or cache memory, rasterizer logic 1537, and additional fixed function logic 1538 to accelerate various graphics and compute processing operations.

Within each graphics cores 1521A-1521F is set of execution resources that may be used to perform graphics, media, and compute operations in response to requests by graphics pipeline, media pipeline, or shader programs. The graphics cores 1521A-1521F include multiple vector engines 1522A-1522F, 1524A-1524F, matrix acceleration units 1523A-1523F, 1525A-1525D, cache/shared local memory (SLM), a sampler 1526A-1526F, and a ray tracing unit 1527A-1527F.

The vector engines 1522A-1522F, 1524A-1524F are general-purpose graphics processing units capable of performing floating-point and integer/fixed-point logic operations in service of a graphics, media, or compute operation, including graphics, media, or compute/GPGPU programs. The vector engines 1522A-1522F, 1524A-1524F can operate at variable vector widths using SIMD, SIMT, or SIMT+SIMD execution modes. The matrix acceleration units 1523A-1523F, 1525A-1525D include matrix-matrix and matrix-vector acceleration logic that improves performance on matrix operations, particularly low and mixed precision (e.g., INT8, FP16, BF16) matrix operations used for machine learning. In one embodiment, each of the matrix acceleration units 1523A-1523F, 1525A-1525D includes one or more systolic arrays of processing elements that can perform concurrent matrix multiply or dot product operations on matrix elements.

The sampler 1526A-1526F can read media or texture data into memory and can sample data differently based on a configured sampler state and the texture/media format that is being read. Threads executing on the vector engines 1522A-1522F, 1524A-1524F or matrix acceleration units 1523A-1523F, 1525A-1525D can make use of the cache/SLM 1528A-1528F within each of the graphics cores 1521A-1521F. The cache/SLM 1528A-1528F can be configured as cache memory or as a pool of shared memory that is local to each of the respective graphics cores 1521A-1521F. The ray tracing units 1527A-1527F within the graphics cores 1521A-1521F include ray traversal/intersection circuitry for performing ray traversal using bounding volume hierarchies (BVHs) and identifying intersections between rays and primitives enclosed within the BVH volumes. In one embodiment the ray tracing units 1527A-1527F include circuitry for performing depth testing and culling (e.g., using a depth buffer or similar arrangement). In one implementation, the ray tracing units 1527A-1527F perform traversal and intersection operations in concert with image denoising, at least a portion of which may be performed using an associated matrix acceleration unit 1523A-1523F, 1525A-1525D.

FIG. 15C is a block diagram of general-purpose graphics processing unit (GPGPU) 1570 that can be configured as a graphics processor, e.g., the graphics processor 1508, and/or compute accelerator, according to embodiments described herein. The GPGPU 1570 can interconnect with host processors (e.g., one or more CPU(s) 1546) and memory 1571, 1572 via one or more system and/or memory busses. Memory 1571 may be system memory that can be shared with the one or more CPU(s) 1546, while memory 1572 is device memory that is dedicated to the GPGPU 1570. For example, components within the GPGPU 1570 and memory 1572 may be mapped into memory addresses that are accessible to the one or more CPU(s) 1546. Access to memory 1571 and 1572 may be facilitated via a memory controller 1568. The memory controller 1568 may include an internal direct memory access (DMA) controller 1569 or can include logic to perform operations that would otherwise be performed by a DMA controller.

The GPGPU 1570 includes multiple cache memories, including an L2 cache 1553, L1 cache 1554, an instruction cache 1555, and shared memory 1556, at least a portion of which may also be partitioned as a cache memory. The GPGPU 1570 also includes multiple compute units 1560A-1560N. Each compute unit 1560A-1560N includes a set of vector registers 1561, scalar registers 1562, vector logic units 1563, and scalar logic units 1564. The compute units 1560A-1560N can also include local shared memory 1565 and a program counter 1566. The compute units 1560A-1560N can couple with a constant cache 1567, which can be used to store constant data, which is data that will not change during the run of kernel or shader program that executes on the GPGPU 1570. The constant cache 1567 may be a scalar data cache and cached data can be fetched directly into the scalar registers 1562.

During operation, the one or more CPU(s) 1546 can write commands into registers or memory in the GPGPU 1570 that has been mapped into an accessible address space. The command processors 1557 can read the commands from registers or memory and determine how those commands will be processed within the GPGPU 1570. A thread dispatcher 1558 can then be used to dispatch threads to the compute units 1560A-1560N to perform those commands. Each compute unit 1560A-1560N can execute threads independently of the other compute units. Additionally, each compute unit 1560A-1560N can be independently configured for conditional computation and can conditionally output the results of computation to memory. The command processors 1557 can interrupt the one or more CPU(s) 1546 when the submitted commands are complete.

Figure 16A:
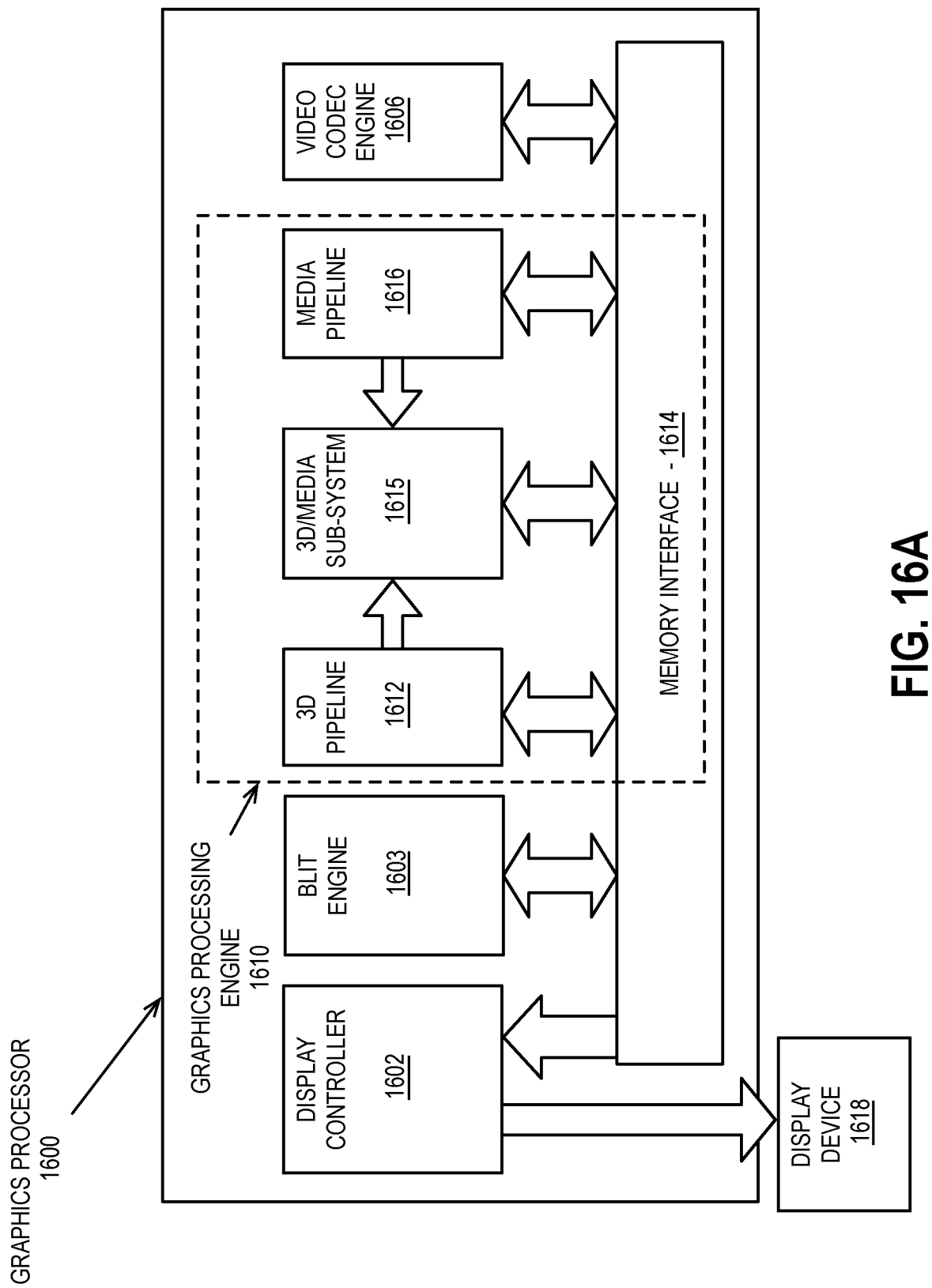
FIG. 16A-16C illustrate block diagrams of additional graphics processor and compute accelerator architectures.
Figure 16B:
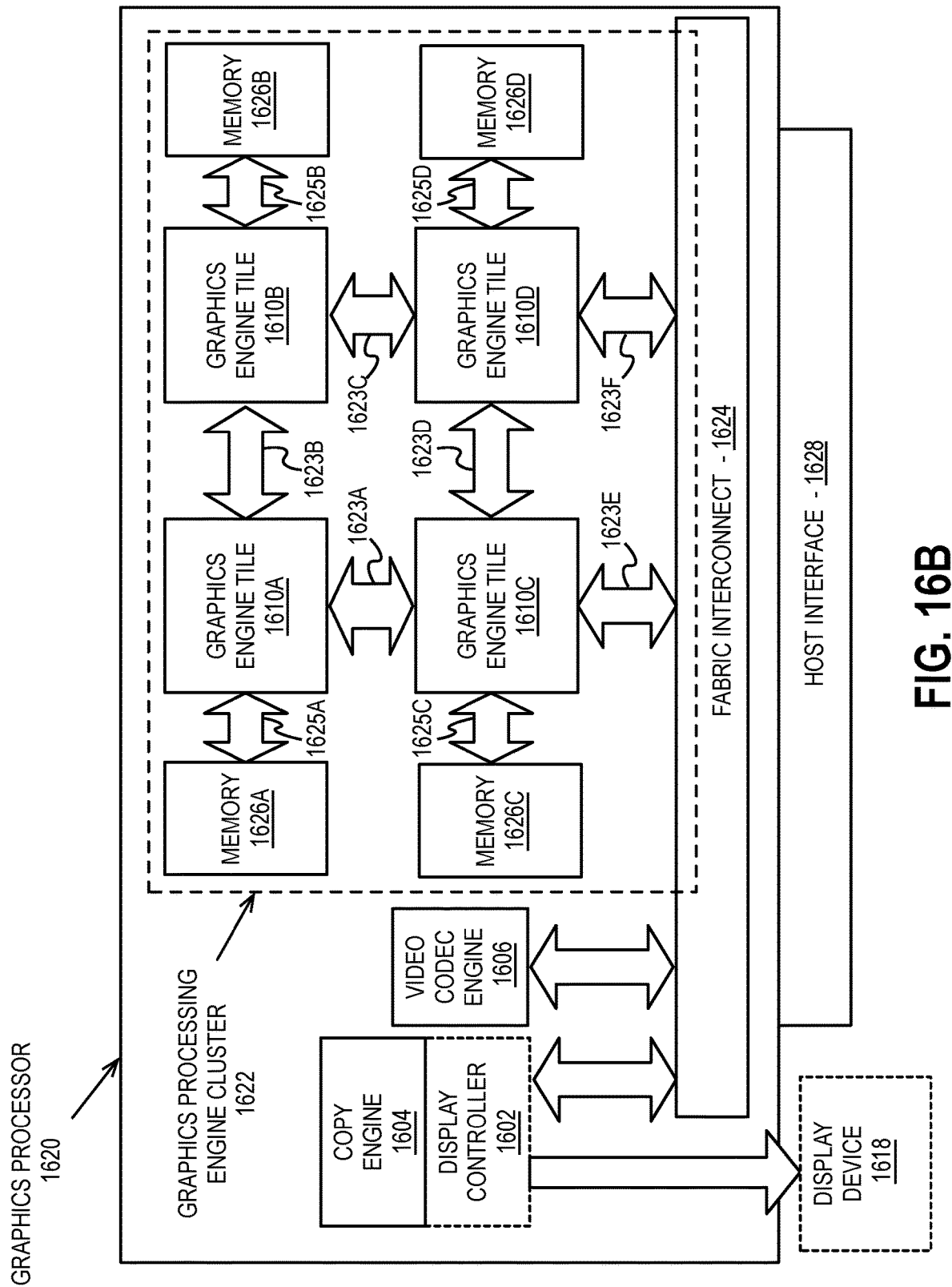
Figure 16C:
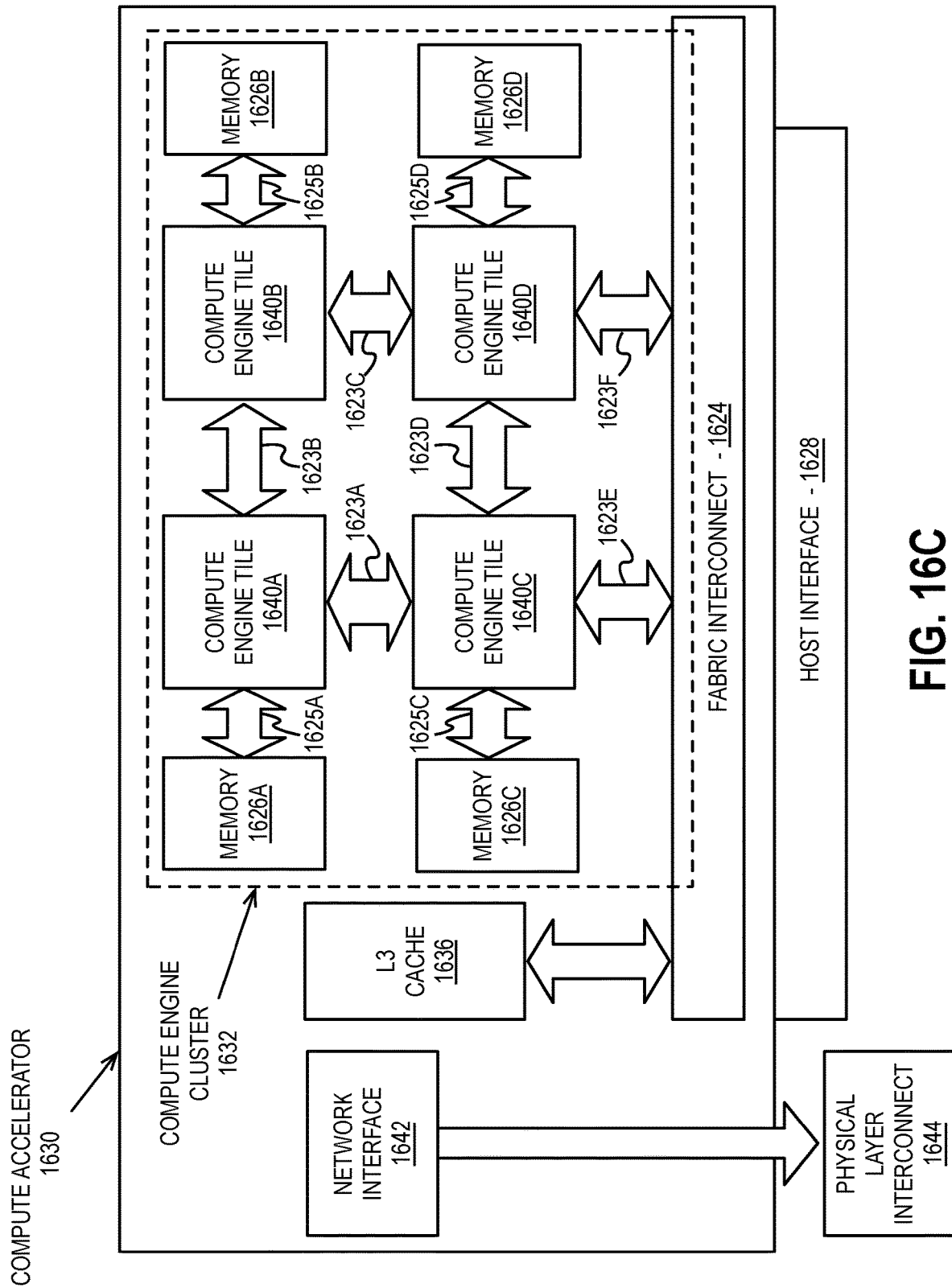

FIG. 16A-16C illustrate block diagrams of additional graphics processor and compute accelerator architectures provided by embodiments described herein, e.g., in accordance with FIG. 15A-15C. The elements of FIG. 16A-16C having the same or similar names as the elements of any other figure herein describe the same elements as in the other figures, can operate or function in a manner similar to that, can comprise the same components, and can be linked to other entities, as those described elsewhere herein, but are not limited to such.

FIG. 16A is a block diagram of a graphics processor 1600, which may be a discrete graphics processing unit, or may be a graphics processor integrated with a plurality of processing cores, or other semiconductor devices such as, but not limited to, memory devices or network interfaces. The graphics processor 1600 may be a variant of the graphics processor 1508 and may be used in place of the graphics processor 1508. Therefore, the disclosure of any features in combination with the graphics processor 1508 herein also discloses a corresponding combination with the graphics processor 1600 but is not limited to such. The graphics processor may communicate via a memory mapped I/O interface to registers on the graphics processor and with commands placed into the processor memory. Graphics processor 1600 may include a memory interface 1614 to access memory. Memory interface 1614 can be an interface to local memory, one or more internal caches, one or more shared external caches, and/or to system memory.

Optionally, graphics processor 1600 also includes a display controller 1602 to drive display output data to a display device 1618. Display controller 1602 includes hardware for one or more overlay planes for the display and composition of multiple layers of video or user interface elements. The display device 1618 can be an internal or external display device. In one embodiment the display device 1618 is a head mounted display device, such as a virtual reality (VR) display device or an augmented reality (AR) display device. Graphics processor 1600 may include a video codec engine 1606 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, H.265/HEVC, Alliance for Open Media (AOMedia) VP8, VP9, as well as the Society of Motion Picture & Television Engineers (SMPTE) 421M/VC-1, and joint Photographic Experts Group (JPEG) formats such as JPEG, and Motion JPEG (MJPEG) formats.

Graphics processor 1600 may include a block image transfer (BLIT) engine 1603 to perform two-dimensional (2D) rasterizer operations including, for example, bit-boundary block transfers. However, alternatively, 2D graphics operations may be performed using one or more components of graphics processing engine (GPE) 1610. In some embodiments, GPE 1610 is a compute engine for performing graphics operations, including three-dimensional (3D) graphics operations and media operations.

GPE 1610 may include a 3D pipeline 1612 for performing 3D operations, such as rendering three-dimensional images and scenes using processing functions that act upon 3D primitive shapes (e.g., rectangle, triangle, etc.). The 3D pipeline 1612 includes programmable and fixed function elements that perform various tasks within the element and/or spawn execution threads to a 3D/Media subsystem 1615. While 3D pipeline 1612 can be used to perform media operations, an embodiment of GPE 1610 also includes a media pipeline 1616 that is specifically used to perform media operations, such as video post-processing and image enhancement.

Media pipeline 1616 may include fixed function or programmable logic units to perform one or more specialized media operations, such as video decode acceleration, video de-interlacing, and video encode acceleration in place of, or on behalf of video codec engine 1606. Media pipeline 1616 may additionally include a thread spawning unit to spawn threads for execution on 3D/Media subsystem 1615. The spawned threads perform computations for the media operations on one or more graphics execution units included in 3D/Media subsystem 1615.

The 3D/Media subsystem 1615 may include logic for executing threads spawned by 3D pipeline 1612 and media pipeline 1616. The pipelines may send thread execution requests to 3D/Media subsystem 1615, which includes thread dispatch logic for arbitrating and dispatching the various requests to available thread execution resources. The execution resources include an array of graphics execution units to process the 3D and media threads. The 3D/Media subsystem 1615 may include one or more internal caches for thread instructions and data. Additionally, the 3D/Media subsystem 1615 may also include shared memory, including registers and addressable memory, to share data between threads and to store output data.

FIG. 16B illustrates a graphics processor 1620, being a variant of the graphics processor 1600 and may be used in place of the graphics processor 1600 and vice versa. Therefore, the disclosure of any features in combination with the graphics processor 1600 herein also discloses a corresponding combination with the graphics processor 1620 but is not limited to such. The graphics processor 1620 has a tiled architecture, according to embodiments described herein. The graphics processor 1620 may include a graphics processing engine cluster 1622 having multiple instances of the graphics processing engine 1610 of FIG. 16A within a graphics engine tile 1610A-1610D. Each graphics engine tile 1610A-1610D can be interconnected via a set of tile interconnects 1623A-1623F. Each graphics engine tile 1610A-1610D can also be connected to a memory module or memory device 1626A-1626D via memory interconnects 1625A-1625D. The memory devices 1626A-1626D can use any graphics memory technology. For example, the memory devices 1626A-1626D may be graphics double data rate (GDDR) memory. The memory devices 1626A-1626D may be high-bandwidth memory (HBM) modules that can be on-die with their respective graphics engine tile 1610A-1610D. The memory devices 1626A-1626D may be stacked memory devices that can be stacked on top of their respective graphics engine tile 1610A-1610D. Each graphics engine tile 1610A-1610D and associated memory 1626A-1626D may reside on separate chiplets, which are bonded to a base die or base substrate, as described in further detail in FIG. 24B-24D.

The graphics processor 1620 may be configured with a non-uniform memory access (NUMA) system in which memory devices 1626A-1626D are coupled with associated graphics engine tiles 1610A-1610D. A given memory device may be accessed by graphics engine tiles other than the tile to which it is directly connected. However, access latency to the memory devices 1626A-1626D may be lowest when accessing a local tile. In one embodiment, a cache coherent NUMA (ccNUMA) system is enabled that uses the tile interconnects 1623A-1623F to enable communication between cache controllers within the graphics engine tiles 1610A-1610D to keep a consistent memory image when more than one cache stores the same memory location.

The graphics processing engine cluster 1622 can connect with an on-chip or on-package fabric interconnect 1624. In one embodiment the fabric interconnect 1624 includes a network processor, network on a chip (NoC), or another switching processor to enable the fabric interconnect 1624 to act as a packet switched fabric interconnect that switches data packets between components of the graphics processor 1620. The fabric interconnect 1624 can enable communication between graphics engine tiles 1610A-1610D and components such as the video codec engine 1606 and one or more copy engines 1604. The copy engines 1604 can be used to move data out of, into, and between the memory devices 1626A-1626D and memory that is external to the graphics processor 1620 (e.g., system memory). The fabric interconnect 1624 can also be used to interconnect the graphics engine tiles 1610A-1610D. The graphics processor 1620 may optionally include a display controller 1602 to enable a connection with an external display device 1618. The graphics processor may also be configured as a graphics or compute accelerator. In the accelerator configuration, the display controller 1602 and display device 1618 may be omitted.

The graphics processor 1620 can connect to a host system via a host interface 1628. The host interface 1628 can enable communication between the graphics processor 1620, system memory, and/or other system components. The host interface 1628 can be, for example, a PCI express bus or another type of host system interface. For example, the host interface 1628 may be an NVLink or NVSwitch interface. The host interface 1628 and fabric interconnect 1624 can cooperate to enable multiple instances of the graphics processor 1620 to act as single logical device. Cooperation between the host interface 1628 and fabric interconnect 1624 can also enable the individual graphics engine tiles 1610A-1610D to be presented to the host system as distinct logical graphics devices.

FIG. 16C illustrates a compute accelerator 1630, according to embodiments described herein. The compute accelerator 1630 can include architectural similarities with the graphics processor 1620 of FIG. 16B and is optimized for compute acceleration. A compute engine cluster 1632 can include a set of compute engine tiles 1640A-1640D that include execution logic that is optimized for parallel or vector-based general-purpose compute operations. The compute engine tiles 1640A-1640D may not include fixed function graphics processing logic, although in some embodiments one or more of the compute engine tiles 1640A-1640D can include logic to perform media acceleration. The compute engine tiles 1640A-1640D can connect to memory 1626A-1626D via memory interconnects 1625A-1625D. The memory 1626A-1626D and memory interconnects 1625A-1625D may be similar technology as in graphics processor 1620 or can be different. The graphics compute engine tiles 1640A-1640D can also be interconnected via a set of tile interconnects 1623A-1623F and may be connected with and/or interconnected by a fabric interconnect 1624. In one embodiment the compute accelerator 1630 includes a large L3 cache 1636 that can be configured as a device-wide cache. The compute accelerator 1630 can also connect to a host processor and memory via a host interface 1628 in a similar manner as the graphics processor 1620 of FIG. 16B.

The compute accelerator 1630 can also include an integrated network interface 1642. In one embodiment the integrated network interface 1642 includes a network processor and controller logic that enables the compute engine cluster 1632 to communicate over a physical layer interconnect 1644 without requiring data to traverse memory of a host system. In one embodiment, one of the compute engine tiles 1640A-1640D is replaced by network processor logic and data to be transmitted or received via the physical layer interconnect 1644 may be transmitted directly to or from memory 1626A-1626D. Multiple instances of the compute accelerator 1630 may be joined via the physical layer interconnect 1644 into a single logical device. Alternatively, the various compute engine tiles 1640A-1640D may be presented as distinct network accessible compute accelerator devices.

Graphics Processing Engine

Figure 17:
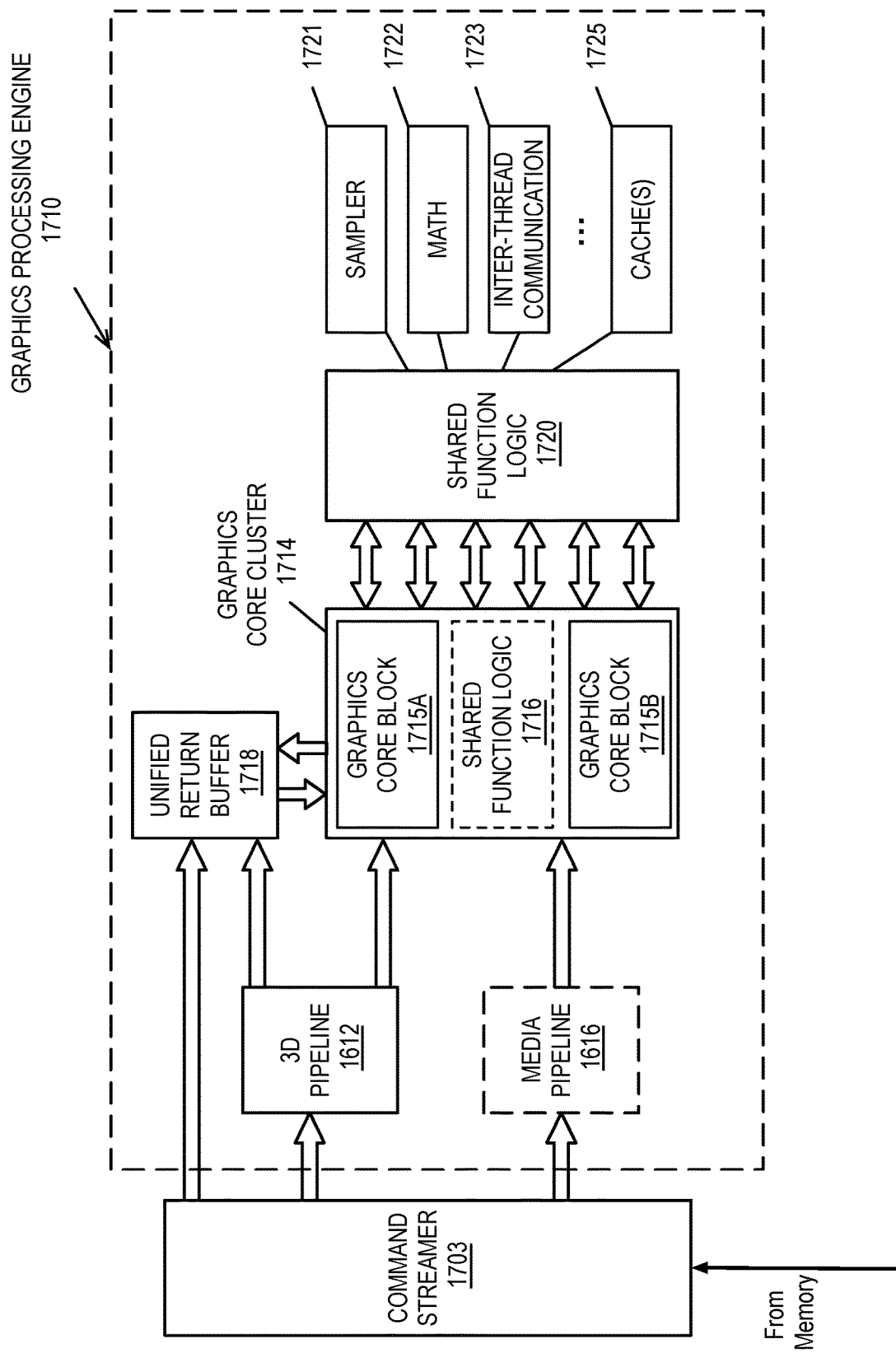
FIG. 17 is a block diagram of a graphics processing engine of a graphics processor.

FIG. 17 is a block diagram of a graphics processing engine 1710 of a graphics processor in accordance with some embodiments. The graphics processing engine (GPE) 1710 may be a version of the GPE 1610 shown in FIG. 16A and may also represent a graphics engine tile 1610A-1610D of FIG. 16B. The elements of FIG. 17 having the same or similar names as the elements of any other figure herein describe the same elements as in the other figures, can operate or function in a manner similar to that, can comprise the same components, and can be linked to other entities, as those described elsewhere herein, but are not limited to such. For example, the 3D pipeline 1612 and media pipeline 1616 of FIG. 16A are also illustrated in FIG. 17. The media pipeline 1616 is optional in some embodiments of the GPE 1710 and may not be explicitly included within the GPE 1710. For example and in at least one embodiment, a separate media and/or image processor is coupled to the GPE 1710.

GPE 1710 may couple with or include a command streamer 1703, which provides a command stream to the 3D pipeline 1612 and/or media pipelines 1616. Alternatively or additionally, the command streamer 1703 may be directly coupled to a unified return buffer 1718. The unified return buffer 1718 may be communicatively coupled to a graphics core cluster 1714. Optionally, the command streamer 1703 is coupled with memory, which can be system memory, or one or more of internal cache memory and shared cache memory. The command streamer 1703 may receive commands from the memory and sends the commands to 3D pipeline 1612 and/or media pipeline 1616. The commands are directives fetched from a ring buffer, which stores commands for the 3D pipeline 1612 and media pipeline 1616. The ring buffer can additionally include batch command buffers storing batches of multiple commands. The commands for the 3D pipeline 1612 can also include references to data stored in memory, such as but not limited to vertex and geometry data for the 3D pipeline 1612 and/or image data and memory objects for the media pipeline 1616. The 3D pipeline 1612 and media pipeline 1616 process the commands and data by performing operations via logic within the respective pipelines or by dispatching one or more execution threads to the graphics core cluster 1714. The graphics core cluster 1714 may include one or more blocks of graphics cores (e.g., graphics core block 1715A, graphics core block 1715B), each block including one or more graphics cores. Each graphics core includes a set of graphics execution resources that includes general-purpose and graphics specific execution logic to perform graphics and compute operations, as well as fixed function texture processing and/or machine learning and artificial intelligence acceleration logic.

In various embodiments the 3D pipeline 1612 can include fixed function and programmable logic to process one or more shader programs, such as vertex shaders, geometry shaders, pixel shaders, fragment shaders, compute shaders, or other shader programs, by processing the instructions and dispatching execution threads to the graphics core cluster 1714. The graphics core cluster 1714 provides a unified block of execution resources for use in processing these shader programs. Multi-purpose execution logic (e.g., execution units) within the graphics core block 1715A-1715B of the graphics core cluster 1714 includes support for various 3D API shader languages and can execute multiple simultaneous execution threads associated with multiple shaders.

The graphics core cluster 1714 may include execution logic to perform media functions, such as video and/or image processing. The execution units may include general-purpose logic that is programmable to perform parallel general-purpose computational operations, in addition to graphics processing operations. The general-purpose logic can perform processing operations in parallel or in conjunction with general-purpose logic within the processor core(s) 1407 of FIG. 14 or core 1502A-1502N as in FIG. 15A.

Output data generated by threads executing on the graphics core cluster 1714 can output data to memory in a unified return buffer (URB) 1718. The URB 1718 can store data for multiple threads. The URB 1718 may be used to send data between different threads executing on the graphics core cluster 1714. The URB 1718 may additionally be used for synchronization between threads on the graphics core cluster 1714 and fixed function logic within the shared function logic 1720.

Optionally, the graphics core cluster 1714 may be scalable, such that the array includes a variable number of graphics cores, each having a variable number of execution units based on the target power and performance level of GPE 1710. The execution resources may be dynamically scalable, such that execution resources may be enabled or disabled as needed.

The graphics core cluster 1714 couples with shared function logic 1720 that includes multiple resources that are shared between the graphics cores in the graphics core array. The shared functions within the shared function logic 1720 are hardware logic units that provide specialized supplemental functionality to the graphics core cluster 1714. In various embodiments, shared function logic 1720 includes but is not limited to sampler 1721, math 1722, and inter-thread communication (ITC) 1723 logic. Additionally, one or more cache(s) 1725 within the shared function logic 1720 may be implemented.

A shared function is implemented at least in a case where the demand for a given specialized function is insufficient for inclusion within the graphics core cluster 1714. Instead, a single instantiation of that specialized function is implemented as a stand-alone entity in the shared function logic 1720 and shared among the execution resources within the graphics core cluster 1714. The precise set of functions that are shared between the graphics core cluster 1714 and included within the graphics core cluster 1714 varies across embodiments. Specific shared functions within the shared function logic 1720 that are used extensively by the graphics core cluster 1714 may be included within shared function logic 1716 within the graphics core cluster 1714. Optionally, the shared function logic 1716 within the graphics core cluster 1714 can include some or all logic within the shared function logic 1720. All logic elements within the shared function logic 1720 may be duplicated within the shared function logic 1716 of the graphics core cluster 1714. Alternatively, the shared function logic 1720 is excluded in favor of the shared function logic 1716 within the graphics core cluster 1714.

Graphics Processing Resources

Figure 18A:
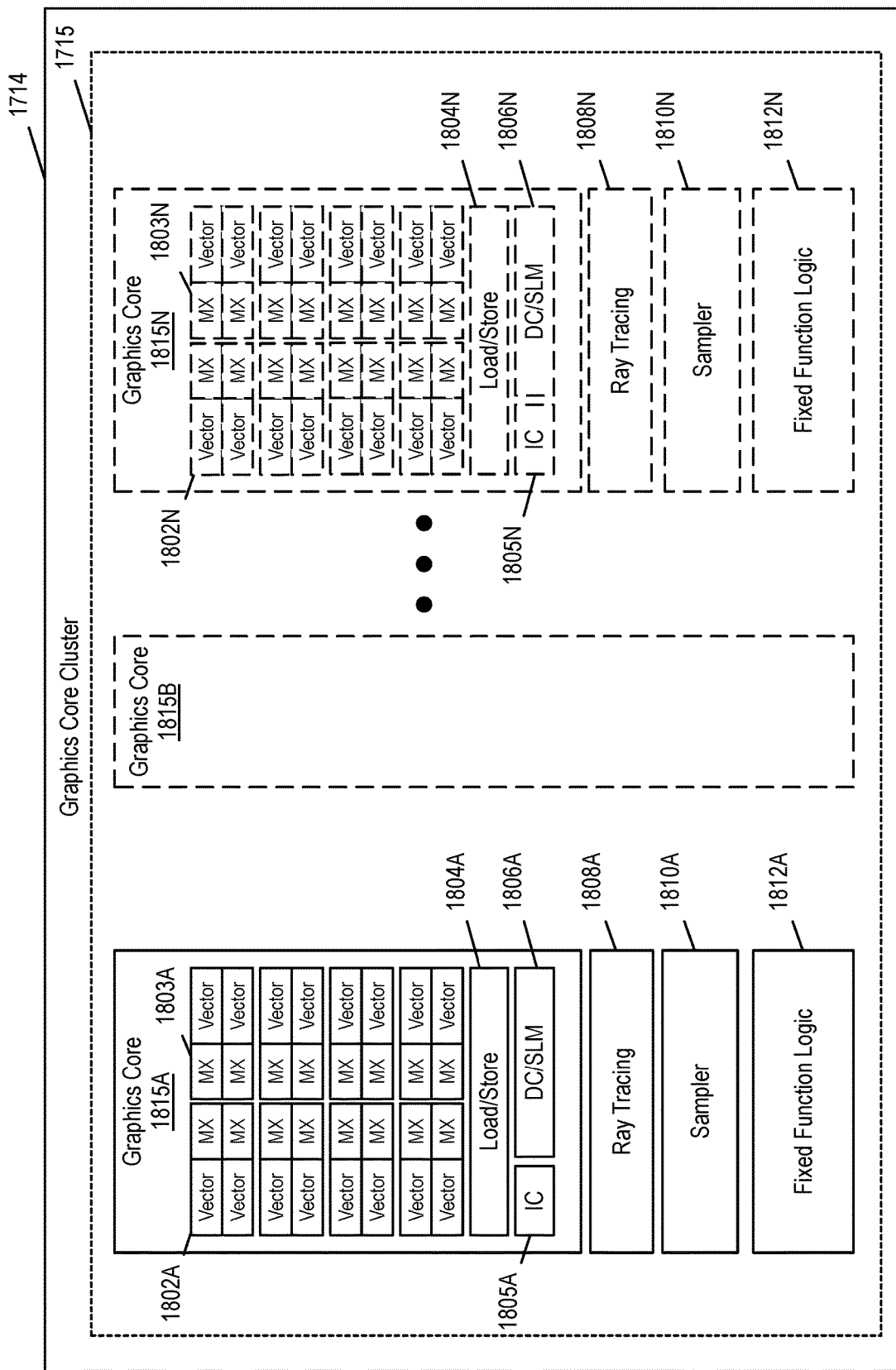
FIG. 18A-18C illustrate thread execution logic including an array of processing elements employed in a graphics processor core.
Figure 18B:
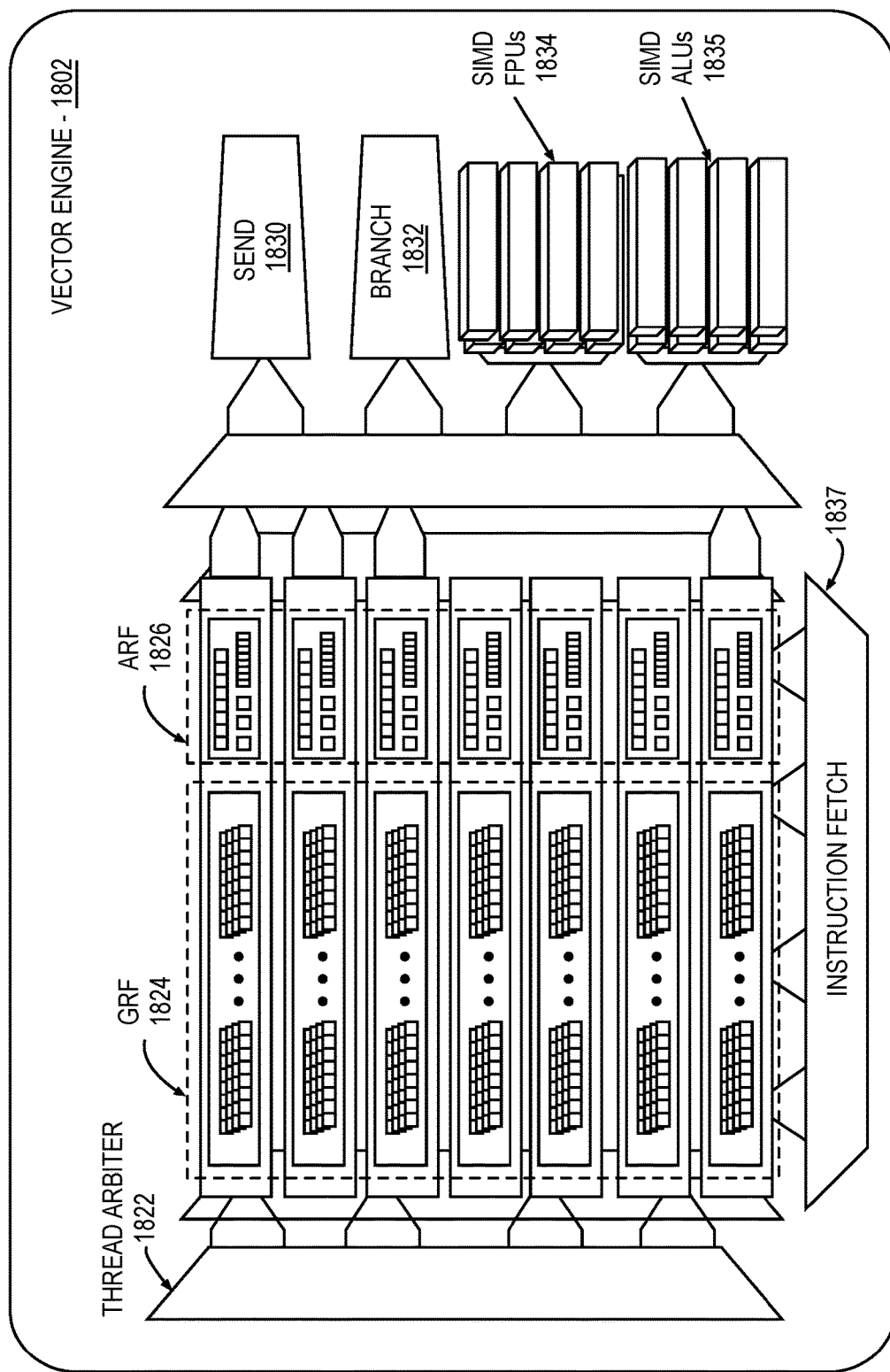
Figure 18C:
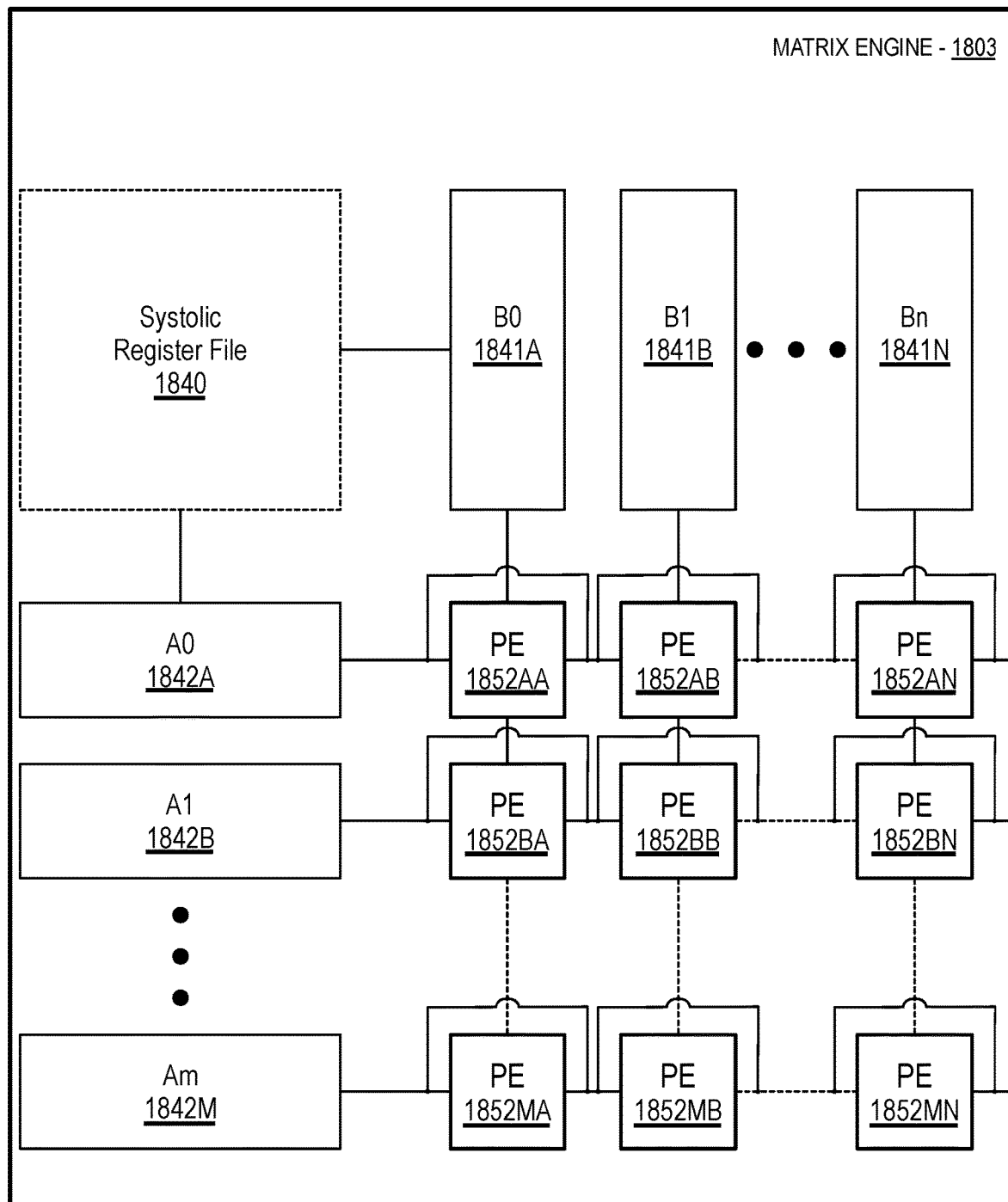

FIG. 18A-18C illustrate execution logic including an array of processing elements employed in a graphics processor, according to embodiments described herein. FIG. 18A illustrates graphics core cluster, according to an embodiment. FIG. 18B illustrates a vector engine of a graphics core, according to an embodiment. FIG. 18C illustrates a matrix engine of a graphics core, according to an embodiment. Elements of FIG. 18A-18C having the same reference numbers as the elements of any other figure herein may operate or function in any manner similar to that described elsewhere herein but are not limited as such. For example, the elements of FIG. 18A-18C can be considered in the context of the graphics processor core block 1519 of FIG. 15B, and/or the graphics core blocks 1715A-1715B of FIG. 17. In one embodiment, the elements of FIG. 18A-18C have similar functionality to equivalent components of the graphics processor 1508 of FIG. 15A or the GPGPU 1570 of FIG. 15C.

As shown in FIG. 18A, in one embodiment the graphics core cluster 1714 includes a graphics core block 1715, which may be graphics core block 1715A or graphics core block 1715B of FIG. 17. The graphics core block 1715 can include any number of graphics cores (e.g., graphics core 1815A, graphics core 1815B, through graphics core 1815N). Multiple instances of the graphics core block 1715 may be included. In one embodiment the elements of the graphics cores 1815A-1815N have similar or equivalent functionality as the elements of the graphics cores 1521A-1521F of FIG. 15B. In such embodiment, the graphics cores 1815A-1815N each include circuitry including but not limited to vector engines 1802A-1802N, matrix engines 1803A-1803N, memory load/store units 1804A-1804N, instruction caches 1805A-1805N, data caches/shared local memory 1806A-1806N, ray tracing units 1808A-1808N, samplers 1810A-15710N. The circuitry of the graphics cores 1815A-1815N can additionally include fixed function logic 1812A-1812N. The number of vector engines 1802A-1802N and matrix engines 1803A-1803N within the graphics cores 1815A-1815N of a design can vary based on the workload, performance, and power targets for the design.

With reference to graphics core 1815A, the vector engine 1802A and matrix engine 1803A are configurable to perform parallel compute operations on data in a variety of integer and floating-point data formats based on instructions associated with shader programs. Each vector engine 1802A and matrix engine 1803A can act as a programmable general-purpose computational unit that is capable of executing multiple simultaneous hardware threads while processing multiple data elements in parallel for each thread. The vector engine 1802A and matrix engine 1803A support the processing of variable width vectors at various SIMD widths, including but not limited to SIMD8, SIMD16, and SIMD32. Input data elements can be stored as a packed data type in a register and the vector engine 1802A and matrix engine 1803A can process the various elements based on the data size of the elements. For example, when operating on a 256-bit wide vector, the 256 bits of the vector are stored in a register and the vector is processed as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, different vector widths and register sizes are possible. In one embodiment, the vector engine 1802A and matrix engine 1803A are also configurable for SIMT operation on warps or thread groups of various sizes (e.g., 8, 16, or 32 threads).

Continuing with graphics core 1815A, the memory load/store unit 1804A services memory access requests that are issued by the vector engine 1802A, matrix engine 1803A, and/or other components of the graphics core 1815A that have access to memory. The memory access request can be processed by the memory load/store unit 1804A to load or store the requested data to or from cache or memory into a register file associated with the vector engine 1802A and/or matrix engine 1803A. The memory load/store unit 1804A can also perform prefetching operations. With additional reference to FIG. 19, in one embodiment, the memory load/store unit 1804A is configured to provide SIMT scatter/gather prefetching or block prefetching for data stored in memory 1910, from memory that is local to other tiles via the tile interconnect 1908, or from system memory. Prefetching can be performed to a specific L1 cache (e.g., data cache/shared local memory 1806A), the L2 cache 1904 or the L3 cache 1906. In one embodiment, a prefetch to the L3 cache 1906 automatically results in the data being stored in the L2 cache 1904.

The instruction cache 1805A stores instructions to be executed by the graphics core 1815A. In one embodiment, the graphics core 1815A also includes instruction fetch and prefetch circuitry that fetches or prefetches instructions into the instruction cache 1805A. The graphics core 1815A also includes instruction decode logic to decode instructions within the instruction cache 1805A. The data cache/shared local memory 1806A can be configured as a data cache that is managed by a cache controller that implements a cache replacement policy and/or configured as explicitly managed shared memory. The ray tracing unit 1808A includes circuitry to accelerate ray tracing operations. The sampler 1810A provides texture sampling for 3D operations and media sampling for media operations. The fixed function logic 1812A includes fixed function circuitry that is shared between the various instances of the vector engine 1802A and matrix engine 1803A. Graphics cores 1815B-1815N can operate in a similar manner as graphics core 1815A.

Functionality of the instruction caches 1805A-1805N, data caches/shared local memory 1806A-1806N, ray tracing units 1808A-1808N, samplers 1810A-1810N, and fixed function logic 1812A-1812N corresponds with equivalent functionality in the graphics processor architectures described herein. For example, the instruction caches 1805A-1805N can operate in a similar manner as instruction cache 1555 of FIG. 15C. The data caches/shared local memory 1806A-1806N, ray tracing units 1808A-1808N, and samplers 1810A-1810N can operate in a similar manner as the cache/SLM 1528A-1528F, ray tracing units 1527A-1527F, and samplers 1526A-1526F of FIG. 15B. The fixed function logic 1812A-1812N can include elements of the geometry/fixed function pipeline 1531 and/or additional fixed function logic 1538 of FIG. 15B. In one embodiment, the ray tracing units 1808A-1808N include circuitry to perform ray tracing acceleration operations performed by the ray tracing cores 372 of FIG. 3C.

As shown in FIG. 18B, in one embodiment the vector engine 1802 includes an instruction fetch unit 1837, a general register file array (GRF) 1824, an architectural register file array (ARF) 1826, a thread arbiter 1822, a send unit 1830, a branch unit 1832, a set of SIMD floating point units (FPUs) 1834, and in one embodiment a set of integer SIMD ALUs 1835. The GRF 1824 and ARF 1826 includes the set of general register files and architecture register files associated with each hardware thread that may be active in the vector engine 1802. In one embodiment, per thread architectural state is maintained in the ARF 1826, while data used during thread execution is stored in the GRF 1824. The execution state of each thread, including the instruction pointers for each thread, can be held in thread-specific registers in the ARF 1826. Register renaming may be used to dynamically allocate registers to hardware threads.

In one embodiment the vector engine 1802 has an architecture that is a combination of Simultaneous Multi-Threading (SMT) and fine-grained Interleaved Multi-Threading (IMT). The architecture has a modular configuration that can be fine-tuned at design time based on a target number of simultaneous threads and number of registers per graphics core, where graphics core resources are divided across logic used to execute multiple simultaneous threads. The number of logical threads that may be executed by the vector engine 1802 is not limited to the number of hardware threads, and multiple logical threads can be assigned to each hardware thread.

In one embodiment, the vector engine 1802 can co-issue multiple instructions, which may each be different instructions. The thread arbiter 1822 can dispatch the instructions to one of the send unit 1830, branch unit 1832, or SIMD FPU(s) 1834 for execution. Each execution thread can access 128 general-purpose registers within the GRF 1824, where each register can store 32 bytes, accessible as a variable width vector of 32-bit data elements. In one embodiment, each thread has access to 4 Kbytes within the GRF 1824, although embodiments are not so limited, and greater or fewer register resources may be provided in other embodiments. In one embodiment the vector engine 1802 is partitioned into seven hardware threads that can independently perform computational operations, although the number of threads per vector engine 1802 can also vary according to embodiments. For example, in one embodiment up to 16 hardware threads are supported. In an embodiment in which seven threads may access 4 Kbytes, the GRF 1824 can store a total of 28 Kbytes. Where 16 threads may access 4 Kbytes, the GRF 1824 can store a total of 64 Kbytes. Flexible addressing modes can permit registers to be addressed together to build effectively wider registers or to represent strided rectangular block data structures.

In one embodiment, memory operations, sampler operations, and other longer-latency system communications are dispatched via "send" instructions that are executed by the message passing send unit 1830. In one embodiment, branch instructions are dispatched to a dedicated branch unit 1832 to facilitate SIMD divergence and eventual convergence.

In one embodiment the vector engine 1802 includes one or more SIMD floating point units (FPU(s)) 1834 to perform floating-point operations. In one embodiment, the FPU(s) 1834 also support integer computation. In one embodiment the FPU(s) 1834 can execute up to M number of 32-bit floating-point (or integer) operations, or execute up to 2M 16-bit integer or 16-bit floating-point operations. In one embodiment, at least one of the FPU(s) provides extended math capability to support high-throughput transcendental math functions and double precision 64-bit floating-point. In some embodiments, a set of 8-bit integer SIMD ALUs 1835 are also present and may be specifically optimized to perform operations associated with machine learning computations. In one embodiment, the SIMD ALUs are replaced by an additional set of SIMD FPUs 1834 that are configurable to perform integer and floating-point operations. In one embodiment, the SIMD FPUs 1834 and SIMD ALUs 1835 are configurable to execute SIMT programs. In one embodiment, combined SIMD+SIMT operation is supported.

In one embodiment, arrays of multiple instances of the vector engine 1802 can be instantiated in a graphics core. For scalability, product architects can choose the exact number of vector engines per graphics core grouping. In one embodiment the vector engine 1802 can execute instructions across a plurality of execution channels. In a further embodiment, each thread executed on the vector engine 1802 is executed on a different channel.

As shown in FIG. 18C, in one embodiment the matrix engine 1803 includes an array of processing elements that are configured to perform tensor operations including vector/matrix and matrix/matrix operations, such as but not limited to matrix multiply and/or dot product operations. The matrix engine 1803 is configured with M rows and N columns of processing elements (PE 1852AA-PE 1852MN) that include multiplier and adder circuits organized in a pipelined fashion. In one embodiment, the processing elements 1852AA-PE 1852MN make up the physical pipeline stages of an N wide and M deep systolic array that can be used to perform vector/matrix or matrix/matrix operations in a data-parallel manner, including matrix multiply, fused multiply-add, dot product or other general matrix-matrix multiplication (GEMM) operations. In one embodiment the matrix engine 1803 supports 16-bit floating point operations, as well as 8-bit, 4-bit, 2-bit, and binary integer operations. The matrix engine 1803 can also be configured to accelerate specific machine learning operations. In such embodiments, the matrix engine 1803 can be configured with support for the bfloat (brain floating point) 16-bit floating point format or a tensor float 32-bit floating point format (TF32) that have different numbers of mantissa and exponent bits relative to Institute of Electrical and Electronics Engineers (IEEE) 754 formats.

In one embodiment, during each cycle, each stage can add the result of operations performed at that stage to the output of the previous stage. In other embodiments, the pattern of data movement between the processing elements 1852AA-1852MN after a set of computational cycles can vary based on the instruction or macro-operation being performed. For example, in one embodiment partial sum loopback is enabled and the processing elements may instead add the output of a current cycle with output generated in the previous cycle. In one embodiment, the final stage of the systolic array can be configured with a loopback to the initial stage of the systolic array. In such embodiment, the number of physical pipeline stages may be decoupled from the number of logical pipeline stages that are supported by the matrix engine 1803. For example, where the processing elements 1852AA-1852MN are configured as a systolic array of M physical stages, a loopback from stage M to the initial pipeline stage can enable the processing elements 1852AA-PE552MN to operate as a systolic array of, for example, 2M, 3M, 4M, etc., logical pipeline stages.

In one embodiment, the matrix engine 1803 includes memory 1841A-1841N, 1842A-1842M to store input data in the form of row and column data for input matrices. Memory 1842A-1842M is configurable to store row elements (A0-Am) of a first input matrix and memory 1841A-1841N is configurable to store column elements (B0-Bn) of a second input matrix. The row and column elements are provided as input to the processing elements 1852AA-1852MN for processing. In one embodiment, row and column elements of the input matrices can be stored in a systolic register file 1840 within the matrix engine 1803 before those elements are provided to the memory 1841A-1841N, 1842A-1842M. In one embodiment, the systolic register file 1840 is excluded and the memory 1841A-1841N, 1842A-1842M is loaded from registers in an associated vector engine (e.g., GRF 1824 of vector engine 1802 of FIG. 18B) or other memory of the graphics core that includes the matrix engine 1803 (e.g., data cache/shared local memory 1806A for matrix engine 1803A of FIG. 18A). Results generated by the processing elements 1852AA-1852MN are then output to an output buffer and/or written to a register file (e.g., systolic register file 1840, GRF 1824, data cache/shared local memory 1806A-1806N) for further processing by other functional units of the graphics processor or for output to memory.

In some embodiments, the matrix engine 1803 is configured with support for input sparsity, where multiplication operations for sparse regions of input data can be bypassed by skipping multiply operations that have a zero-value operand. In one embodiment, the processing elements 1852AA-1852MN are configured to skip the performance of certain operations that have zero value input. In one embodiment, sparsity within input matrices can be detected and operations having known zero output values can be bypassed before being submitted to the processing elements 1852AA-1852MN. The loading of zero value operands into the processing elements can be bypassed and the processing elements 1852AA-1852MN can be configured to perform multiplications on the non-zero value input elements. The matrix engine 1803 can also be configured with support for output sparsity, such that operations with results that are pre-determined to be zero are bypassed. For input sparsity and/or output sparsity, in one embodiment, metadata is provided to the processing elements 1852AA-1852MN to indicate, for a processing cycle, which processing elements and/or data channels are to be active during that cycle.

In one embodiment, the matrix engine 1803 includes hardware to enable operations on sparse data having a compressed representation of a sparse matrix that stores non-zero values and metadata that identifies the positions of the non-zero values within the matrix. Exemplary compressed representations include but are not limited to compressed tensor representations such as compressed sparse row (CSR), compressed sparse column (CSC), compressed sparse fiber (CSF) representations. Support for compressed representations enable operations to be performed on input in a compressed tensor format without requiring the compressed representation to be decompressed or decoded. In such embodiment, operations can be performed only on non-zero input values and the resulting non-zero output values can be mapped into an output matrix. In some embodiments, hardware support is also provided for machine-specific lossless data compression formats that are used when transmitting data within hardware or across system busses. Such data may be retained in a compressed format for sparse input data and the matrix engine 1803 can used the compression metadata for the compressed data to enable operations to be performed on only non-zero values, or to enable blocks of zero data input to be bypassed for multiply operations.

In various embodiments, input data can be provided by a programmer in a compressed tensor representation, or a codec can compress input data into the compressed tensor representation or another sparse data encoding. In addition to support for compressed tensor representations, streaming compression of sparse input data can be performed before the data is provided to the processing elements 1852AA-1852MN. In one embodiment, compression is performed on data written to a cache memory associated with the graphics core cluster 1714, with the compression being performed with an encoding that is supported by the matrix engine 1803. In one embodiment, the matrix engine 1803 includes support for input having structured sparsity in which a pre-determined level or pattern of sparsity is imposed on input data. This data may be compressed to a known compression ratio, with the compressed data being processed by the processing elements 1852AA-1852MN according to metadata associated with the compressed data.

Figure 19:
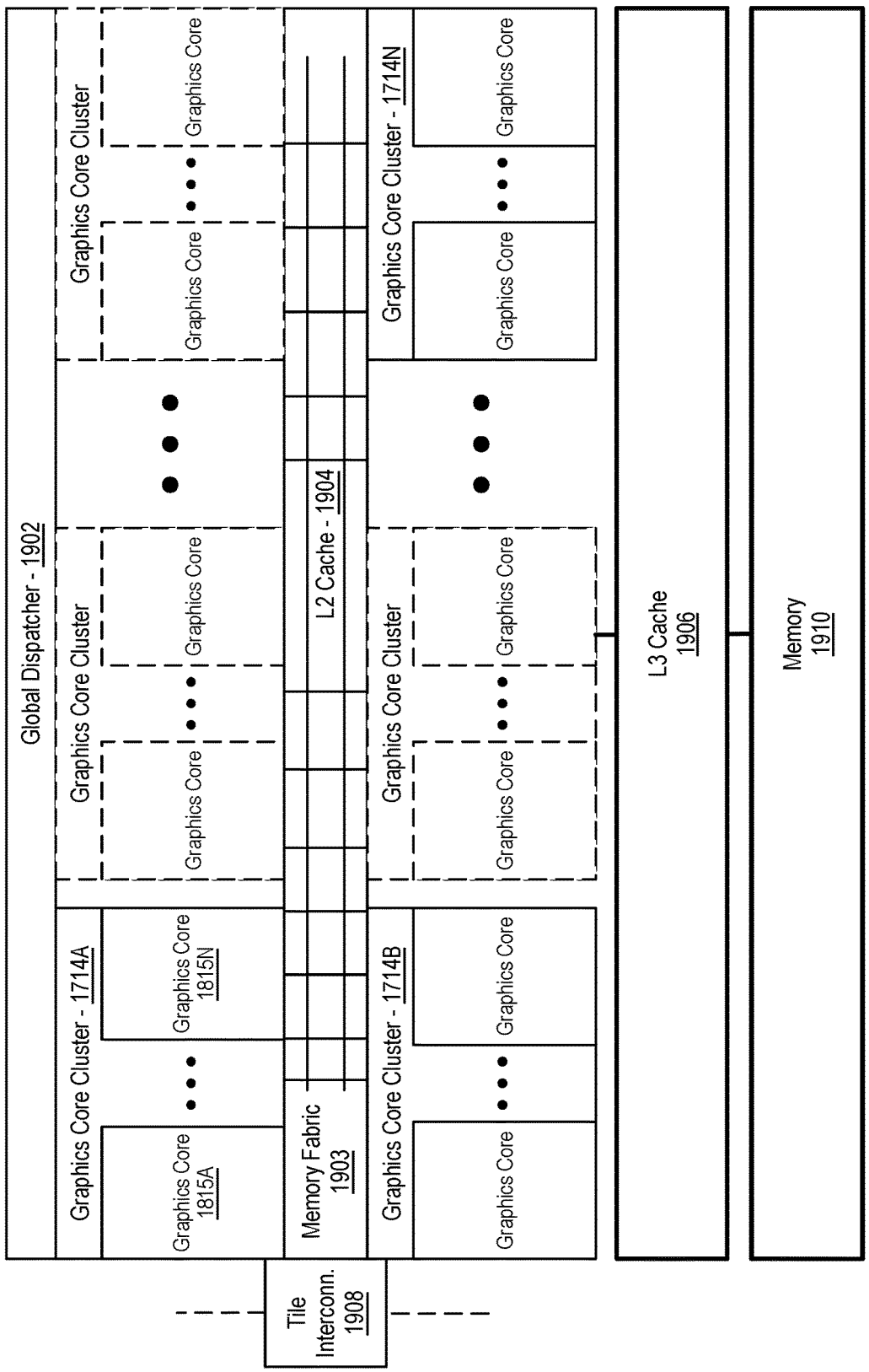
FIG. 19 illustrates a tile of a multi-tile processor, according to an embodiment.

FIG. 19 illustrates a tile 1900 of a multi-tile processor, according to an embodiment. In one embodiment, the tile 1900 is representative of one of the graphics engine tiles 1610A-1610D of FIG. 16B or compute engine tiles 1640A-1640D of FIG. 16C. The tile 1900 of the multi-tile graphics processor includes an array of graphics core clusters (e.g., graphics core cluster 1714A, graphics core cluster 1714B, through graphics core cluster 1714N), with each graphics core cluster having an array of graphics cores 515A-515N. The tile 1900 also includes a global dispatcher 1902 to dispatch threads to processing resources of the tile 1900.

The tile 1900 can include or couple with an L3 cache 1906 and memory 1910. In various embodiments, the L3 cache 1906 may be excluded or the tile 1900 can include additional levels of cache, such as an L4 cache. In one embodiment, each instance of the tile 1900 in the multi-tile graphics processor has an associated memory 1910, such as in FIG. 16B and FIG. 16C. In one embodiment, a multi-tile processor can be configured as a multi-chip module in which the L3 cache 1906 and/or memory 1910 reside on separate chiplets than the graphics core clusters 1714A-1714N. In this context, a chiplet is an at least partially packaged integrated circuit that includes distinct units of logic that can be assembled with other chiplets into a larger package. For example, the L3 cache 1906 can be included in a dedicated cache chiplet or can reside on the same chiplet as the graphics core clusters 1714A-1714N. In one embodiment, the L3 cache 1906 can be included in an active base die or active interposer, as illustrated in FIG. 24C.

A memory fabric 1903 enables communication among the graphics core clusters 1714A-1714N, L3 cache 1906, and memory 1910. An L2 cache 1904 couples with the memory fabric 1903 and is configurable to cache transactions performed via the memory fabric 1903. A tile interconnect 1908 enables communication with other tiles on the graphics processors and may be one of tile interconnects 1623A-1623F of FIGS. 16B and 16C. In embodiments in which the L3 cache 1906 is excluded from the tile 1900, the L2 cache 1904 may be configured as a combined L2/L3 cache. The memory fabric 1903 is configurable to route data to the L3 cache 1906 or memory controllers associated with the memory 1910 based on the presence or absence of the L3 cache 1906 in a specific implementation. The L3 cache 1906 can be configured as a per-tile cache that is dedicated to processing resources of the tile 1900 or may be a partition of a GPU-wide L3 cache.

FIG. 20 is a block diagram illustrating graphics processor instruction formats 2000. The graphics processor execution units support an instruction set having instructions in multiple formats. The solid lined boxes illustrate the components that are generally included in an execution unit instruction, while the dashed lines include components that are optional or that are only included in a sub-set of the instructions. In some embodiments the graphics processor instruction formats 2000 described and illustrated are macro-instructions, in that they are instructions supplied to the execution unit, as opposed to micro-operations resulting from instruction decode once the instruction is processed. Thus, a single instruction may cause hardware to perform multiple micro-operations The graphics processor execution units as described herein may natively support instructions in a 128-bit instruction format 2010. A 64-bit compacted instruction format 2030 is available for some instructions based on the selected instruction, instruction options, and number of operands. The native 128-bit instruction format 2010 provides access to all instruction options, while some options and operations are restricted in the 64-bit format 2030. The native instructions available in the 64-bit format 2030 vary by embodiment. The instruction is compacted in part using a set of index values in an index field 2013. The execution unit hardware references a set of compaction tables based on the index values and uses the compaction table outputs to reconstruct a native instruction in the 128-bit instruction format 2010. Other sizes and formats of instruction can be used.

For each format, instruction opcode 2012 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. Instruction control field 2014 may enable control over certain execution options, such as channels selection (e.g., predication) and data channel order (e.g., swizzle). For instructions in the 128-bit instruction format 2010 an exec-size field 2016 limits the number of data channels that will be executed in parallel. An exec-size field 2016 may not be available for use in the 64-bit compact instruction format 2030.

Some execution unit instructions have up to three operands including two source operands, src0 2020, src1 2022, and one destination operand (dest 2018). Other instructions, such as, for example, data manipulation instructions, dot product instructions, multiply-add instructions, or multiply-accumulate instructions, can have a third source operand (e.g., SRC2 2024). The instruction opcode 2012 determines the number of source operands. An instruction's last source operand can be an immediate (e.g., hard-coded) value passed with the instruction. The execution units may also support multiple destination instructions, where one or more of the destinations is implied or implicit based on the instruction and/or the specified destination.

The 128-bit instruction format 2010 may include an access/address mode field 2026 specifying, for example, whether direct register addressing mode or indirect register addressing mode is used. When direct register addressing mode is used, the register address of one or more operands is directly provided by bits in the instruction.

The 128-bit instruction format 2010 may also include an access/address mode field 2026, which specifies an address mode and/or an access mode for the instruction. The access mode may be used to define a data access alignment for the instruction. Access modes including a 16-byte aligned access mode and a 1-byte aligned access mode may be supported, where the byte alignment of the access mode determines the access alignment of the instruction operands. For example, when in a first mode, the instruction may use byte-aligned addressing for source and destination operands and when in a second mode, the instruction may use 16-byte-aligned addressing for all source and destination operands.

The address mode portion of the access/address mode field 2026 may determine whether the instruction is to use direct or indirect addressing. When direct register addressing mode is used bits in the instruction directly provide the register address of one or more operands. When indirect register addressing mode is used, the register address of one or more operands may be computed based on an address register value and an address immediate field in the instruction.

Instructions may be grouped based on opcode 2012 bit-fields to simplify Opcode decode 2040. For an 8-bit opcode, bits 4, 5, and 6 allow the execution unit to determine the type of opcode. The precise opcode grouping shown is merely an example. A move and logic opcode group 2042 may include data movement and logic instructions (e.g., move (mov), compare (cmp)). Move and logic group 2042 may share the five least significant bits (LSB), where move (mov) instructions are in the form of 0000xxxxb and logic instructions are in the form of 0001xxxxb. A flow control instruction group 2044 (e.g., call, jump (jmp)) includes instructions in the form of 0010xxxxb (e.g., synchronization instructions (e.g., wait, send) in the form of 0011xxxxb (e.g., 0x30). A parallel math instruction group 2048 includes component-wise arithmetic instructions (e.g., add, multiply (mul)) in the form of 0100xxxxb (e.g., 0x40). The parallel math instruction group 2048 performs the arithmetic operations in parallel across data channels. The vector math group 2050 includes arithmetic instructions (e.g., dp4) in the form of 0101xxxxb (e.g., 0x50). The vector math group performs arithmetic such as dot product calculations on vector operands. The illustrated opcode decode 2040, in one embodiment, can be used to determine which portion of an execution unit will be used to execute a decoded instruction. For example, some instructions may be designated as systolic instructions that will be performed by a systolic array. Other instructions, such as ray-tracing instructions (not shown) can be routed to a ray-tracing core or ray-tracing logic within a slice or partition of execution logic.

Graphics Pipeline

Figure 21:
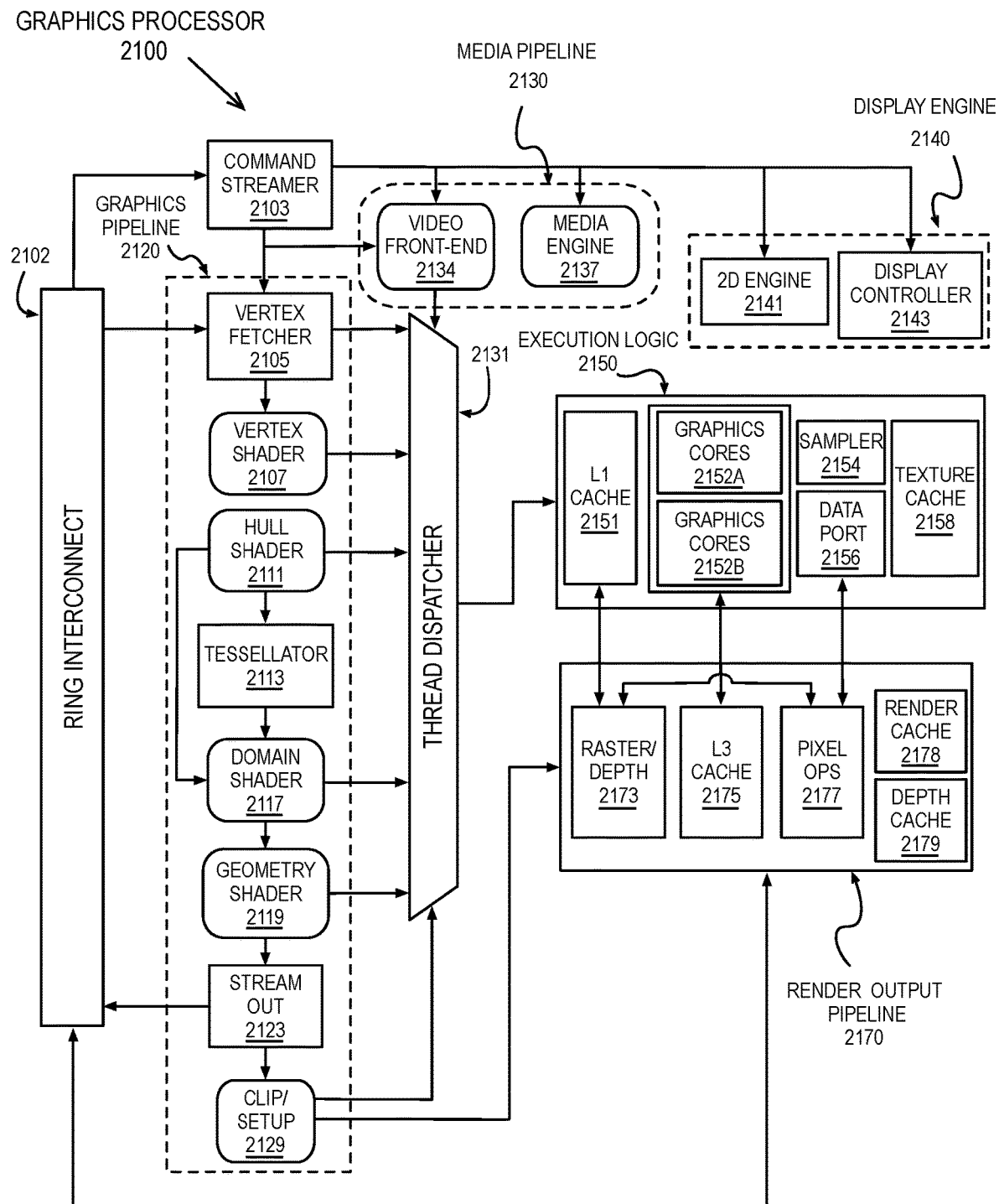
FIG. 21 is a block diagram of an additional graphics processor architecture.

FIG. 21 is a block diagram of graphics processor 2100, according to another embodiment. The elements of FIG. 21 having the same or similar names as the elements of any other figure herein describe the same elements as in the other figures, can operate or function in a manner similar to that, can comprise the same components, and can be linked to other entities, as those described elsewhere herein, but are not limited to such.

The graphics processor 2100 may include different types of graphics processing pipelines, such as a geometry pipeline 2120, a media pipeline 2130, a display engine 2140, thread execution logic 2150, and a render output pipeline 2170. Graphics processor 2100 may be a graphics processor within a multi-core processing system that includes one or more general-purpose processing cores. The graphics processor may be controlled by register writes to one or more control registers (not shown) or via commands issued to graphics processor 2100 via a ring interconnect 2102. Ring interconnect 2102 may couple graphics processor 2100 to other processing components, such as other graphics processors or general-purpose processors. Commands from ring interconnect 2102 are interpreted by a command streamer 2103, which supplies instructions to individual components of the geometry pipeline 2120 or the media pipeline 2130.

Command streamer 2103 may direct the operation of a vertex fetcher 2105 that reads vertex data from memory and executes vertex-processing commands provided by command streamer 2103. The vertex fetcher 2105 may provide vertex data to a vertex shader 2107, which performs coordinate space transformation and lighting operations to each vertex. Vertex fetcher 2105 and vertex shader 2107 may execute vertex-processing instructions by dispatching execution threads to graphics cores 2152A-2152B via a thread dispatcher 2131.

The graphics cores 2152A-2152B may be an array of vector processors having an instruction set for performing graphics and media operations. The graphics cores 2152A-2152B may have an attached L1 cache 2151 that is specific for each array or shared between the arrays. The cache can be configured as a data cache, an instruction cache, or a single cache that is partitioned to contain data and instructions in different partitions.

A geometry pipeline 2120 may include tessellation components to perform hardware-accelerated tessellation of 3D objects. A programmable hull shader 2111 may configure the tessellation operations. A programmable domain shader 2117 may provide back-end evaluation of tessellation output. A tessellator 2113 may operate at the direction of hull shader 2111 and contain special purpose logic to generate a set of detailed geometric objects based on a coarse geometric model that is provided as input to geometry pipeline 2120. In addition, if tessellation is not used, tessellation components (e.g., hull shader 2111, tessellator 2113, and domain shader 2117) can be bypassed. The tessellation components can operate based on data received from the vertex shader 2107.

Complete geometric objects may be processed by a geometry shader 2119 via one or more threads dispatched to graphics cores 2152A-2152B or can proceed directly to the clipper 2129. The geometry shader may operate on entire geometric objects, rather than vertices or patches of vertices as in previous stages of the graphics pipeline. If the tessellation is disabled, the geometry shader 2119 receives input from the vertex shader 2107. The geometry shader 2119 may be programmable by a geometry shader program to perform geometry tessellation if the tessellation units are disabled.

Before rasterization, a clipper 2129 processes vertex data. The clipper 2129 may be a fixed function clipper or a programmable clipper having clipping and geometry shader functions. A rasterizer and depth test component 2173 in the render output pipeline 2170 may dispatch pixel shaders to convert the geometric objects into per pixel representations. The pixel shader logic may be included in thread execution logic 2150. Optionally, an application can bypass the rasterizer and depth test component 2173 and access unrasterized vertex data via a stream out unit 2123.

The graphics processor 2100 has an interconnect bus, interconnect fabric, or some other interconnect mechanism that allows data and message passing amongst the major components of the cache 2151, sampler 2154, texture cache 2158, etc.) interconnect via a data port 2156 to perform memory access and communicate with render output pipeline components of the processor. A sampler 2154, caches 2151, 2158 and graphics cores 2152A-2152B each may have separate memory access paths. Optionally, the texture cache 2158 can also be configured as a sampler cache.

The render output pipeline 2170 may contain a rasterizer and depth test component 2173 that converts vertex-based objects into an associated pixel-based representation. The rasterizer logic may include a windower/masker unit to perform fixed function triangle and line rasterization. An associated render cache 2178 and depth cache 2179 are also available in some embodiments. A pixel operations component 2177 performs pixel-based operations on the data, though in some instances, pixel operations associated with 2D operations (e.g., bit block image transfers with blending) are performed by the 2D engine 2141 or substituted at display time by the display controller 2143 using overlay display planes. A shared L3 cache 2175 may be available to all graphics components, allowing the sharing of data without the use of main system memory.

The media pipeline 2130 may include a media engine 2137 and a video front end 2134. Video front end 2134 may receive pipeline commands from the command streamer 2103. The media pipeline 2130 may include a separate command streamer. Video front end 2134 may process media commands before sending the command to the media engine 2137. Media engine 2137 may include thread spawning functionality to spawn threads for dispatch to thread execution logic 2150 via thread dispatcher 2131.

The graphics processor 2100 may include a display engine 2140. This display engine 2140 may be external to processor 2100 and may couple with the graphics processor via the ring interconnect 2102, or some other interconnect bus or fabric. Display engine 2140 may include a 2D engine 2141 and a display controller 2143. Display engine 2140 may contain special purpose logic capable of operating independently of the 3D pipeline. Display controller 2143 may couple with a display device (not shown), which may be a system integrated display device, as in a laptop computer, or an external display device attached via a display device connector.

The geometry pipeline 2120 and media pipeline 2130 may be configurable to perform operations based on multiple graphics and media programming interfaces and are not specific to any one application programming interface (API). A driver software for the graphics processor may translate API calls that are specific to a particular graphics or media library into commands that can be processed by the graphics processor. Support may be provided for the Open Graphics Library from the Khronos Group. Support may also be provided for the Direct3D library from the Microsoft Corporation. A combination of these libraries may be supported. Support may also be provided for the Open Source Computer Vision Library (OpenCV). A future API with a compatible 3D pipeline would also be supported if a mapping can be made from the pipeline of the future API to the pipeline of the graphics processor.

Graphics Pipeline Programming

FIG. 22A is a block diagram illustrating a graphics processor command format 2200 used for programming graphics processing pipelines, such as, for example, the pipelines described herein. FIG. 22B is a block diagram illustrating a graphics processor command sequence 2210 according to an embodiment. The solid lined boxes in FIG. 22A illustrate the components that are generally included in a graphics command while the dashed lines include components that are optional or that are only included in a sub-set of the graphics commands. The exemplary graphics processor command format 2200 of FIG. 22A includes data fields to identify a client 2202, a command operation code (opcode) 2204, and data 2206 for the command. A sub-opcode 2205 and a command size 2208 are also included in some commands.

Client 2202 may specify the client unit of the graphics device that processes the command data. A graphics processor command parser may examine the client field of each command to condition the further processing of the command and route the command data to the appropriate client unit. The graphics processor client units may include a memory interface unit, a render unit, a 2D unit, a 3D unit, and a media unit. Each client unit may have a corresponding processing pipeline that processes the commands. Once the command is received by the client unit, the client unit reads the opcode 2204 and, if present, sub-opcode 2205 to determine the operation to perform. The client unit performs the command using information in data field 2206. For some commands an explicit command size 2208 is expected to specify the size of the command. The command parser may automatically determine the size of at least some of the commands based on the command opcode. Commands may be aligned via multiples of a double word. Other command formats can also be used.

The flow diagram in FIG. 22B illustrates an exemplary graphics processor command sequence 2210. Software or firmware of a data processing system that features an exemplary graphics processor may use a version of the command sequence shown to set up, execute, and terminate a set of graphics operations. A sample command sequence is shown and described for purposes of example only and is not limited to these specific commands or to this command sequence. Moreover, the commands may be issued as batch of commands in a command sequence, such that the graphics processor will process the sequence of commands in at least partially concurrence.

The graphics processor command sequence 2210 may begin with a pipeline flush command 2212 to cause any active graphics pipeline to complete the currently pending commands for the pipeline. Optionally, the 3D pipeline 2222 and the media pipeline 2224 may not operate concurrently. The pipeline flush is performed to cause the active graphics pipeline to complete any pending commands. In response to a pipeline flush, the command parser for the graphics processor will pause command processing until the active drawing engines complete pending operations and the relevant read caches are invalidated. Optionally, any data in the render cache that is marked 'dirty' can be flushed to memory. Pipeline flush command 2212 can be used for pipeline synchronization or before placing the graphics processor into a low power state.

A pipeline select command 2213 may be used when a command sequence requires the graphics processor to explicitly switch between pipelines. A pipeline select command 2213 may be required only once within an execution context before issuing pipeline commands unless the context is to issue commands for both pipelines. A pipeline flush command 2212 may be required immediately before a pipeline switch via the pipeline select command 2213.

A pipeline control command 2214 may configure a graphics pipeline for operation and may be used to program the 3D pipeline 2222 and the media pipeline 2224. The pipeline control command 2214 may configure the pipeline state for the active pipeline. The pipeline control command 2214 may be used for pipeline synchronization and to clear data from one or more cache memories within the active pipeline before processing a batch of commands.

Commands related to the return buffer state 2216 may be used to configure a set of return buffers for the respective pipelines to write data. Some pipeline operations require the allocation, selection, or configuration of one or more return buffers into which the operations write intermediate data during processing. The graphics processor may also use one or more return buffers to store output data and to perform cross thread communication. The return buffer state 2216 may include selecting the size and number of return buffers to use for a set of pipeline operations.

The remaining commands in the command sequence differ based on the active pipeline for operations. Based on a pipeline determination 2220, the command sequence is tailored to the 3D pipeline 2222 beginning with the 3D pipeline state 2230 or the media pipeline 2224 beginning at the media pipeline state 2240.

The commands to configure the 3D pipeline state 2230 include 3D state setting commands for vertex buffer state, vertex element state, constant color state, depth buffer state, and other state variables that are to be configured before 3D primitive commands are processed. The values of these commands are determined at least in part based on the particular 3D API in use. The 3D pipeline state 2230 commands may also be able to selectively disable or bypass certain pipeline elements if those elements will not be used.

A 3D primitive 2232 command may be used to submit 3D primitives to be processed by the 3D pipeline. Commands and associated parameters that are passed to the graphics processor via the 3D primitive 2232 command are forwarded to the vertex fetch function in the graphics pipeline. The vertex fetch function uses the 3D primitive 2232 command data to generate vertex data structures. The vertex data structures are stored in one or more return buffers. The 3D primitive 2232 command may be used to perform vertex operations on 3D primitives via vertex shaders. To process vertex shaders, 3D pipeline 2222 dispatches shader execution threads to graphics processor execution units.

The 3D pipeline 2222 may be triggered via an execute 2234 command or event. A register may write trigger command executions. An execution may be triggered via a 'go' or 'kick' command in the command sequence. Command execution may be triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back-end operations may also be included for those operations.

The graphics processor command sequence 2210 may follow the media pipeline 2224 path when performing media operations. In general, the specific use and manner of programming for the media pipeline 2224 depends on the media or compute operations to be performed. Specific media decode operations may be offloaded to the media pipeline during media decode. The media pipeline can also be bypassed and media decode can be performed in whole or in part using resources provided by one or more general-purpose processing cores. The media pipeline may also include elements for general-purpose graphics processor unit (GPGPU) operations, where the that are not explicitly related to the rendering of graphics primitives.

Media pipeline 2224 may be configured in a similar manner as the 3D pipeline 2222. A set of commands to configure the media pipeline state 2240 are dispatched or placed into a command queue before the media object commands 2242. Commands for the media pipeline state 2240 may include data to configure the media pipeline elements that will be used to process the media objects. This includes data to configure the video decode and video encode logic within the media pipeline, such as encode or decode format. Commands for the media pipeline state 2240 may also support the use of one or more pointers to "indirect" state elements that contain a batch of state settings.

Media object commands 2242 may supply pointers to media objects for processing by the media pipeline. The media objects include memory buffers containing video data to be processed. Optionally, all media pipeline states must be valid before issuing a media object command 2242. Once the pipeline state is configured and media object commands 2242 are queued, the media pipeline 2224 is triggered via an execute command 2244 or an equivalent execute event (e.g., register write). Output from media pipeline 2224 may then be post processed by operations provided by the 3D pipeline 2222 or the media pipeline 2224. GPGPU operations may be configured and executed in a similar manner as media operations.

Graphics Software Architecture

Figure 23:
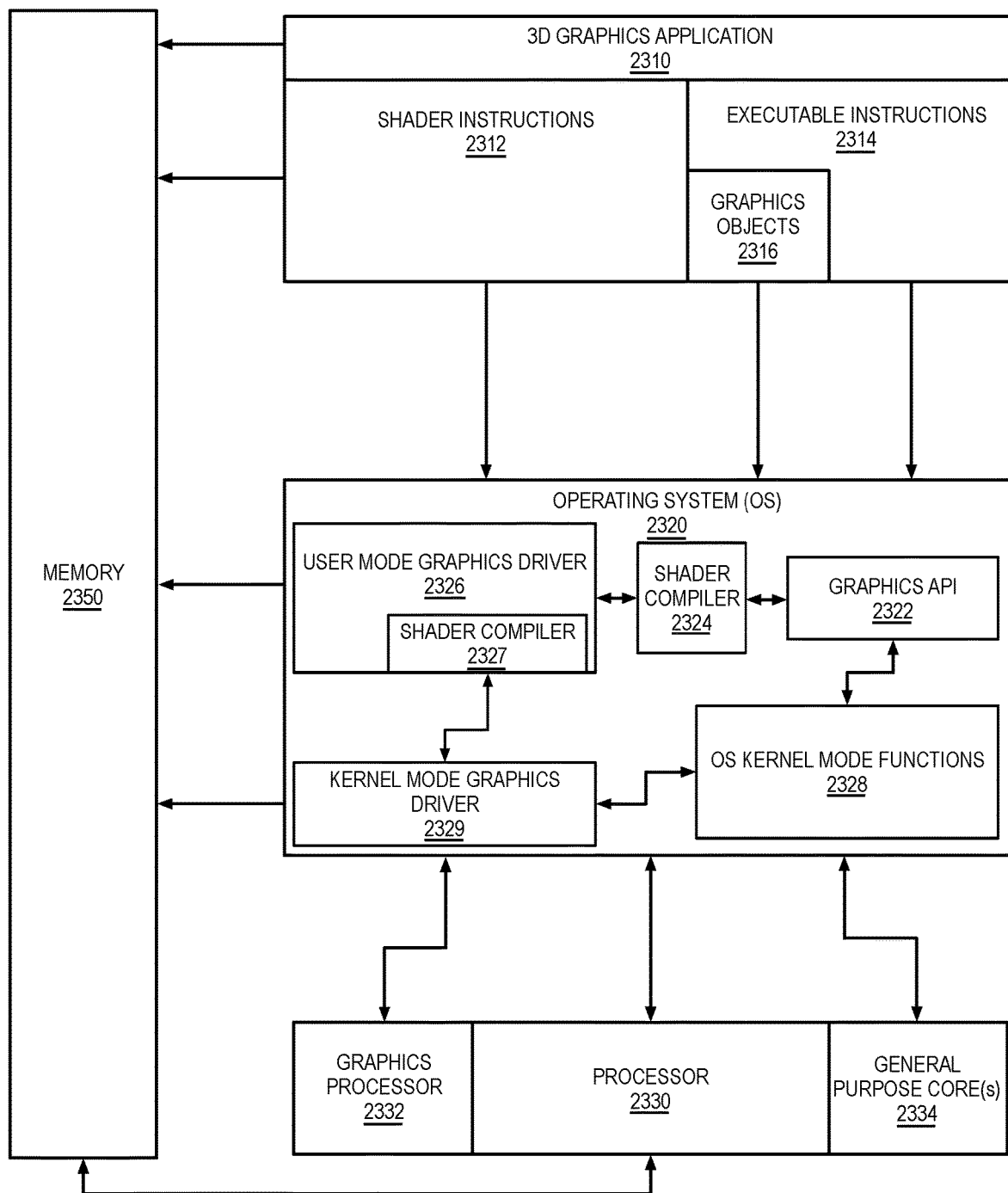
FIG. 23 illustrates exemplary graphics software architecture for a data processing system.

FIG. 23 illustrates an exemplary graphics software architecture for a data processing system 2300. Such a software architecture may include a 3D graphics application 2310, an operating system 2320, and at least one processor 2330. Processor 2330 may include a graphics processor 2332 and one or more general-purpose processor core(s) 2334. The processor 2330 may be a variant of the processor 1402 or any other of the processors described herein. The processor 2330 may be used in place of the processor 1402 or any other of the processors described herein. Therefore, the disclosure of any features in combination with the processor 1402 or any other of the processors described herein also discloses a corresponding combination with the graphics processor 2332 but is not limited to such. Moreover, the elements of FIG. 23 having the same or similar names as the elements of any other figure herein describe the same elements as in the other figures, can operate or function in a manner similar to that, can comprise the same components, and can be linked to other entities, as those described elsewhere herein, but are not limited to such. The graphics application 2310 and operating system 2320 are each executed in the system memory 2350 of the data processing system.

3D graphics application 2310 may contain one or more shader programs including shader instructions 2312. The shader language instructions may be in a high-level shader language, such as the High-Level Shader Language (HLSL) of Direct3D, the OpenGL Shader Language (GLSL), and so forth. The application may also include executable instructions 2314 in a machine language suitable for execution by the general-purpose processor core 2334. The application may also include graphics objects 2316 defined by vertex data.

The operating system 2320 may be a Microsoft® Windows® operating system from the Microsoft Corporation, a proprietary UNIX-like operating system, or an open-source UNIX-like operating system using a variant of the Linux kernel. The operating system 2320 can support a graphics API 2322 such as the Direct3D API, the OpenGL API, or the Vulkan API. When the Direct3D API is in use, the operating system 2320 uses a front-end shader compiler 2324 to compile any shader instructions 2312 in HLSL into a lower-level shader language. The compilation may be a just-in-time (JIT) compilation or the application can perform shader pre-compilation. High-level shaders may be compiled into low-level shaders during the compilation of the 3D graphics application 2310. The shader instructions 2312 may be provided in an intermediate form, such as a version of the Standard Portable Intermediate Representation (SPIR) used by the Vulkan API.

User mode graphics driver 2326 may contain a back-end shader compiler 2327 to convert the shader instructions 2312 into a hardware specific representation. When the OpenGL API is in use, shader instructions 2312 in the GLSL high-level language are passed to a user mode graphics driver 2326 for compilation. The user mode graphics driver 2326 may use operating system kernel mode functions 2328 to communicate with a kernel mode graphics driver 2329. The kernel mode graphics driver 2329 may communicate with graphics processor 2332 to dispatch commands and instructions.

IP Core Implementations

One or more aspects may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

Figure 24A:
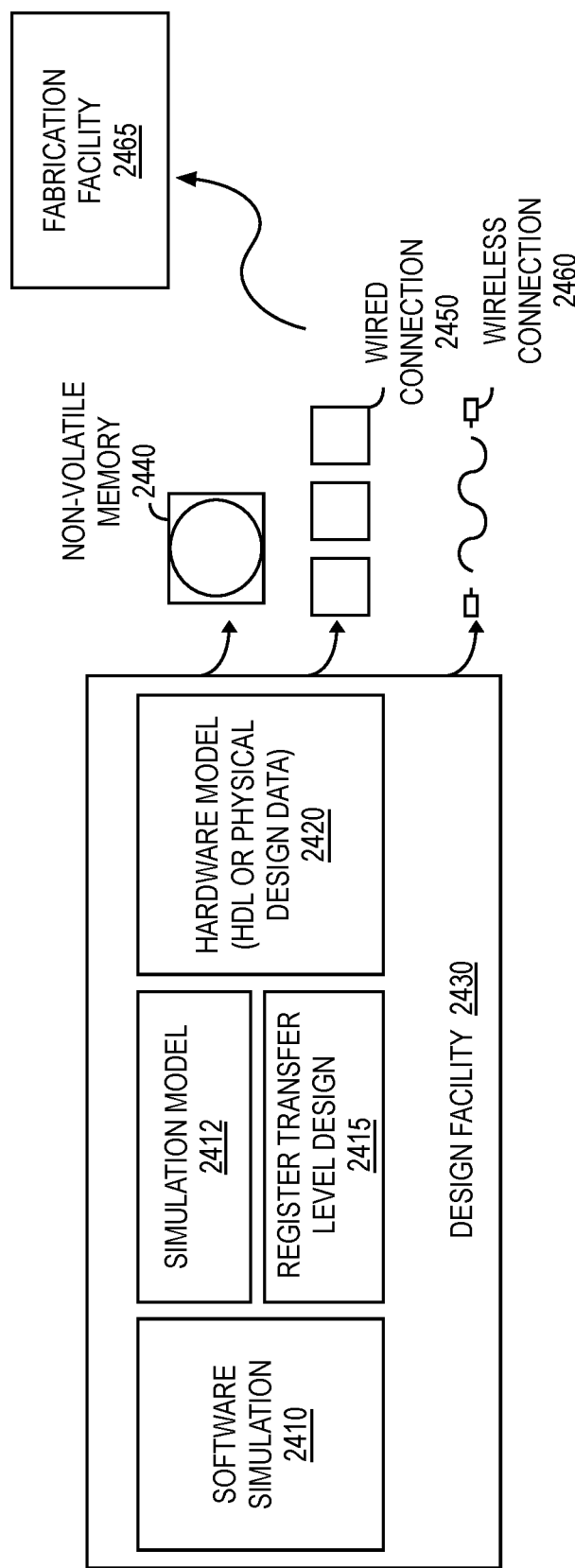
FIG. 24A is a block diagram illustrating an IP core development system.

FIG. 24A is a block diagram illustrating an IP core development system 2400 that may be used to manufacture an integrated circuit to perform operations according to an embodiment. The IP core development system 2400 may be used to generate modular, re-usable designs that can be incorporated into a larger design or used to construct an entire integrated circuit (e.g., an SOC integrated circuit). A design facility 2430 can generate a software simulation 2410 of an IP core design in a high-level programming language (e.g., C/C++). The software simulation 2410 can be used to design, test, and verify the behavior of the IP core using a simulation model 2412. The simulation model 2412 may include functional, behavioral, and/or timing simulations. A register transfer level (RTL) design 2415 can then be created or synthesized from the simulation model 2412. The RTL design 2415 is an abstraction of the behavior of the integrated circuit that models the flow of digital signals between hardware registers, including the associated logic performed using the modeled digital signals. In addition to an RTL design 2415, lower-level designs at the logic level or transistor level may also be created, designed, or synthesized. Thus, the particular details of the initial design and simulation may vary.

The RTL design 2415 or equivalent may be further synthesized by the design facility into a hardware model 2420, which may be in a hardware description language (HDL), or some other representation of physical design data. The HDL may be further simulated or tested to verify the IP core design. The IP core design can be stored for delivery to a $3^{rd}$ party fabrication facility 2465 using non-volatile memory 2440 (e.g., hard disk, flash memory, or any non-volatile storage medium). Alternatively, the IP core design may be transmitted (e.g., via the Internet) over a wired connection 2450 or wireless connection 2460. The fabrication facility 2465 may then fabricate an integrated circuit that is based at least in part on the IP core design. The fabricated integrated circuit can be configured to perform operations in accordance with at least one embodiment described herein.

Figure 24B:
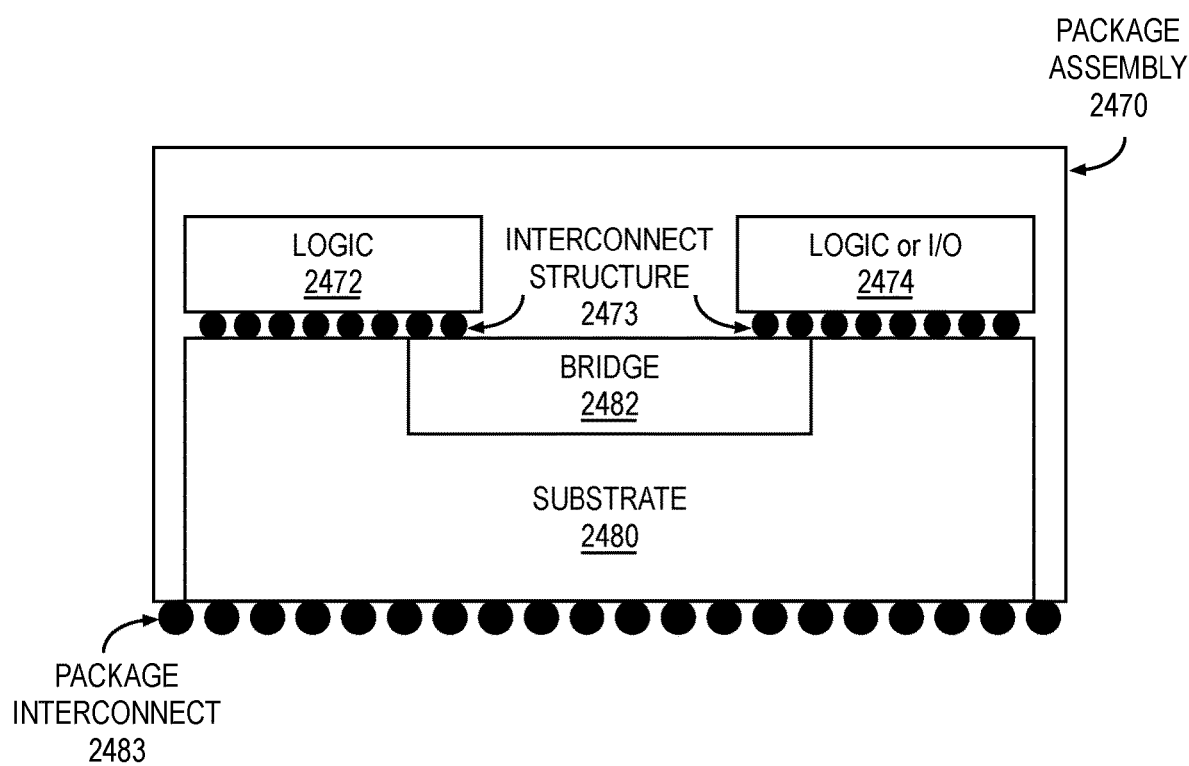
FIG. 24B illustrates a cross-section side view of an integrated circuit package assembly.
Figure 24C:
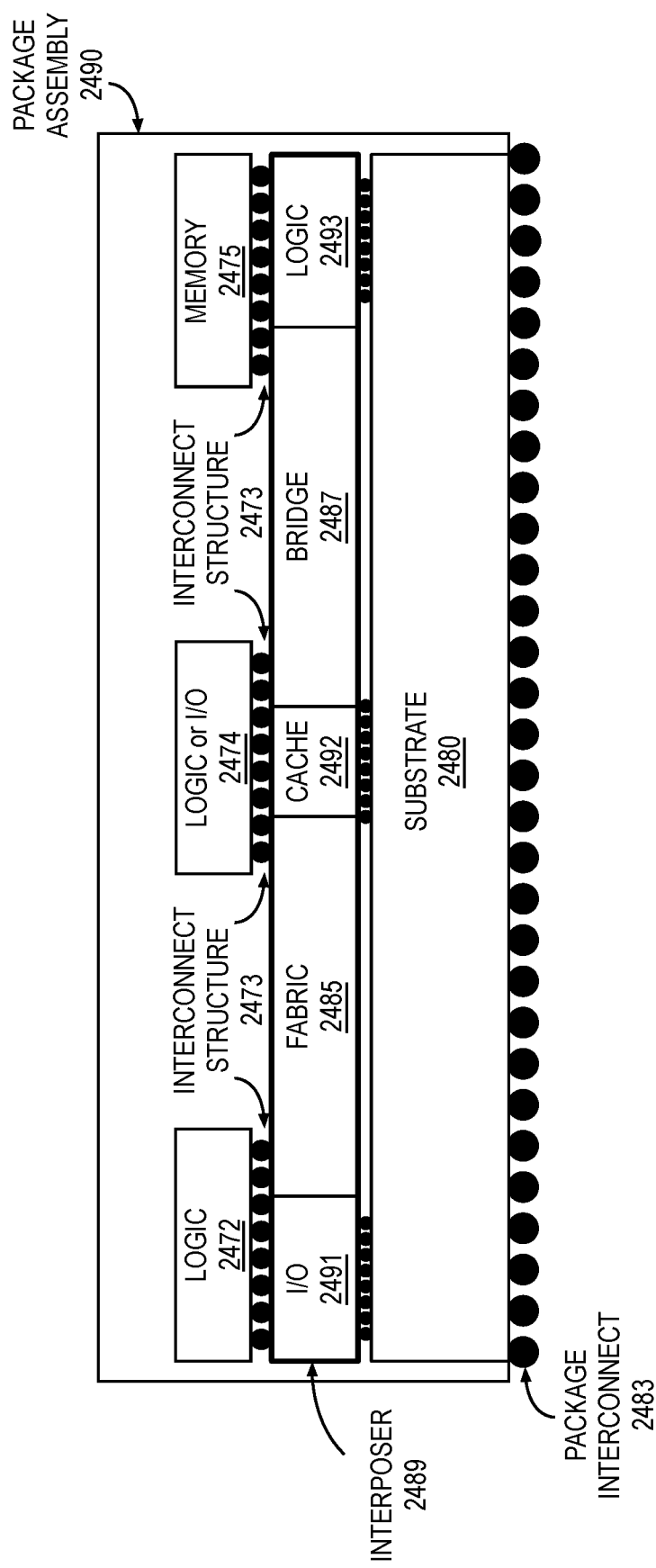
FIG. 24C illustrates a package assembly that includes multiple units of hardware logic chiplets connected to a substrate (e.g., base die)

FIG. 24B illustrates a cross-section side view of an integrated circuit package assembly 2470. The integrated circuit package assembly 2470 illustrates an implementation of one or more units of hardware logic 2472, 2474 connected to a substrate 2480. The logic 2472, 2474 may be implemented at least partly in configurable logic or fixed-functionality logic hardware and can include one or more portions of any of the processor core(s), graphics processor(s), or other accelerator devices described herein. Each unit of logic 2472, 2474 can be implemented within a semiconductor die and coupled with the substrate 2480 via an interconnect structure 2473. The interconnect structure 2473 may be configured to route electrical signals between the logic 2472, 2474 and the substrate 2480, and can include interconnects such as, but not limited to bumps or pillars. The interconnect structure 2473 may be configured to route electrical signals such as, for example, input/output (I/O) signals and/or power or ground signals associated with the operation of the logic 2472, 2474. Optionally, the substrate 2480 may be an epoxy-based laminate substrate. The substrate 2480 may also include other suitable types of substrates. The package assembly 2470 can be connected to other electrical devices via a package interconnect 2483. The package interconnect 2483 may be coupled to a surface of the substrate 2480 to route electrical signals to other electrical devices, such as a motherboard, other chipset, or multi-chip module.

The units of logic 2472, 2474 may be electrically coupled with a bridge 2482 that is configured to route electrical signals between the logic 2472, 2474. The bridge 2482 may be a dense interconnect structure that provides a route for electrical signals. The bridge 2482 may include a bridge substrate composed of glass or a suitable semiconductor material. Electrical routing features can be formed on the bridge substrate to provide a chip-to-chip connection between the logic 2472, 2474.

Although two units of logic 2472, 2474 and a bridge 2482 are illustrated, embodiments described herein may include more or fewer logic units on one or more dies. The one or more dies may be connected by zero or more bridges, as the bridge 2482 may be excluded when the logic is included on a single die. Alternatively, multiple dies or units of logic can be connected by one or more bridges. Additionally, multiple logic units, dies, and bridges can be connected together in other possible configurations, including three-dimensional configurations.

FIG. 24C illustrates a package assembly 2490 that includes multiple units of hardware logic chiplets connected to a substrate 2480 (e.g., base die). A graphics processing unit, parallel processor, and/or compute accelerator as described herein can be composed from diverse silicon chiplets that are separately manufactured. In this context, a chiplet is an at least partially packaged integrated circuit that includes distinct units of logic that can be assembled with other chiplets into a larger package. A diverse set of chiplets with different IP core logic can be assembled into a single device. Additionally, the chiplets can be integrated into a base die or base chiplet using active interposer technology. The concepts described herein enable the interconnection and communication between the different forms of IP within the GPU. IP cores can be manufactured using different process technologies and composed during manufacturing, which avoids the complexity of converging multiple IPs, especially on a large SoC with several flavors IPs, to the same manufacturing process. Enabling the use of multiple process technologies improves the time to market and provides a cost-effective way to create multiple product SKUs. Additionally, the disaggregated IPs are more amenable to being power gated independently, components that are not in use on a given workload can be powered off, reducing overall power consumption.

In various embodiments a package assembly 2490 can include fewer or greater number of components and chiplets that are interconnected by a fabric 2485 or one or more bridges 2487. The chiplets within the package assembly 2490 may have a 2.5D arrangement using Chip-on-Wafer-on-Substrate stacking in which multiple dies are stacked side-by-side on a silicon interposer that includes through-silicon vias (TSVs) to couple the chiplets with the substrate 2480, which includes electrical connections to the package interconnect 2483.

In one embodiment, silicon interposer is an active interposer 2489 that includes embedded logic in addition to TSVs. In such embodiment, the chiplets within the package assembly 2490 are arranged using 3D face to face die stacking on top of the active interposer 2489. The active interposer 2489 can include hardware logic for I/O 2491, cache memory 2492, and other hardware logic 2493, in addition to interconnect fabric 2485 and a silicon bridge 2487. The fabric 2485 enables communication between the various logic chiplets 2472, 2474 and the logic 2491, 2493 within the active interposer 2489. The fabric 2485 may be an NoC interconnect or another form of packet switched fabric that switches data packets between components of the package assembly. For complex assemblies, the fabric 2485 may be a dedicated chiplet enables communication between the various hardware logic of the package assembly 2490.

Bridge structures 2487 within the active interposer 2489 may be used to facilitate a point-to-point interconnect between, for example, logic or I/O chiplets 2474 and memory chiplets 2475. In some implementations, bridge structures 2487 may also be embedded within the substrate 2480.

The hardware logic chiplets can include special purpose hardware logic chiplets 2472, logic or I/O chiplets 2474, and/or memory chiplets 2475. The hardware logic chiplets 2472 and logic or I/O chiplets 2474 may be implemented at least partly in configurable logic or fixed-functionality logic hardware and can include one or more portions of any of the processor core(s), graphics processor(s), parallel processors, or other accelerator devices described herein. The memory chiplets 2475 can be DRAM (e.g., GDDR, HBM) memory or cache (SRAM) memory. Cache memory 2492 within the active interposer 2489 (or substrate 2480) can act as a global cache for the package assembly 2490, part of a distributed global cache, or as a dedicated cache for the fabric 2485

Each chiplet can be fabricated as separate semiconductor die and coupled with a base die that is embedded within or coupled with the substrate 2480. The coupling with the substrate 2480 can be performed via an interconnect structure 2473. The interconnect structure 2473 may be configured to route electrical signals between the various chiplets and logic within the substrate 2480. The interconnect structure 2473 can include interconnects such as, but not limited to bumps or pillars. In some embodiments, the interconnect structure 2473 may be configured to route electrical signals such as, for example, input/output (I/O) signals and/or power or ground signals associated with the operation of the logic, I/O and memory chiplets. In one embodiment, an additional interconnect structure couples the active interposer 2489 with the substrate 2480.

The substrate 2480 may be an epoxy-based laminate substrate, however, it is not limited to that and the substrate 2480 may also include other suitable types of substrates. The package assembly 2490 can be connected to other electrical devices via a package interconnect 2483. The package interconnect 2483 may be coupled to a surface of the substrate 2480 to route electrical signals to other electrical devices, such as a motherboard, other chipset, or multi-chip module.

A logic or I/O chiplet 2474 and a memory chiplet 2475 may be electrically coupled via a bridge 2487 that is configured to route electrical signals between the logic or I/O chiplet 2474 and a memory chiplet 2475. The bridge 2487 may be a dense interconnect structure that provides a route for electrical signals. The bridge 2487 may include a bridge substrate composed of glass or a suitable semiconductor material. Electrical routing features can be formed on the bridge substrate to provide a chip-to-chip connection between the logic or I/O chiplet 2474 and a memory chiplet 2475. The bridge 2487 may also be referred to as a silicon bridge or an interconnect bridge. For example, the bridge 2487 is an Embedded Multi-die Interconnect Bridge (EMIB). Alternatively, the bridge 2487 may simply be a direct connection from one chiplet to another chiplet.

Figure 24D:
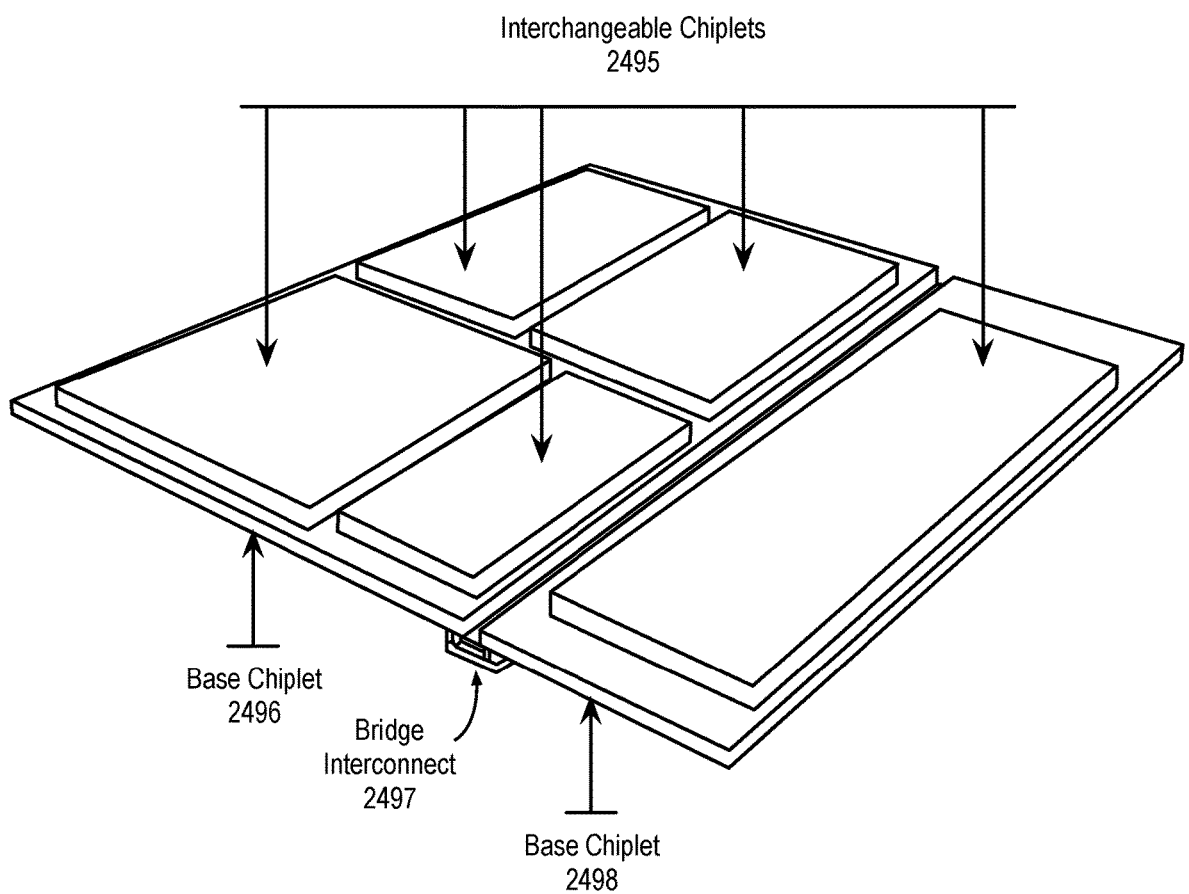
FIG. 24D illustrates a package assembly including interchangeable chiplets.

FIG. 24D illustrates a package assembly 2494 including interchangeable chiplets 2495, according to an embodiment. The interchangeable chiplets 2495 can be assembled into standardized slots on one or more base chiplets 2496, 2498. The base chiplets 2496, 2498 can be coupled via a bridge interconnect 2497, which can be similar to the other bridge interconnects described herein and may be, for example, an EMIB. Memory chiplets can also be connected to logic or I/O chiplets via a bridge interconnect. I/O and logic chiplets can communicate via an interconnect fabric. The base chiplets can each support one or more slots in a standardized format for one of logic or I/O or memory/cache.

SRAM and power delivery circuits may be fabricated into one or more of the base chiplets 2496, 2498, which can be fabricated using a different process technology relative to the interchangeable chiplets 2495 that are stacked on top of the base chiplets. For example, the base chiplets 2496, 2498 can be fabricated using a larger process technology, while the interchangeable chiplets can be manufactured using a smaller process technology. One or more of the interchangeable chiplets 2495 may be memory (e.g., DRAM) chiplets. Different memory densities can be selected for the package assembly 2494 based on the power, and/or performance targeted for the product that uses the package assembly 2494. Additionally, logic chiplets with a different number of type of functional units can be selected at time of assembly based on the power, and/or performance targeted for the product. Additionally, chiplets containing IP logic cores of differing types can be inserted into the interchangeable chiplet slots, enabling hybrid processor designs that can mix and match different technology IP blocks.

Exemplary System on a Chip Integrated Circuit

Figure 25:
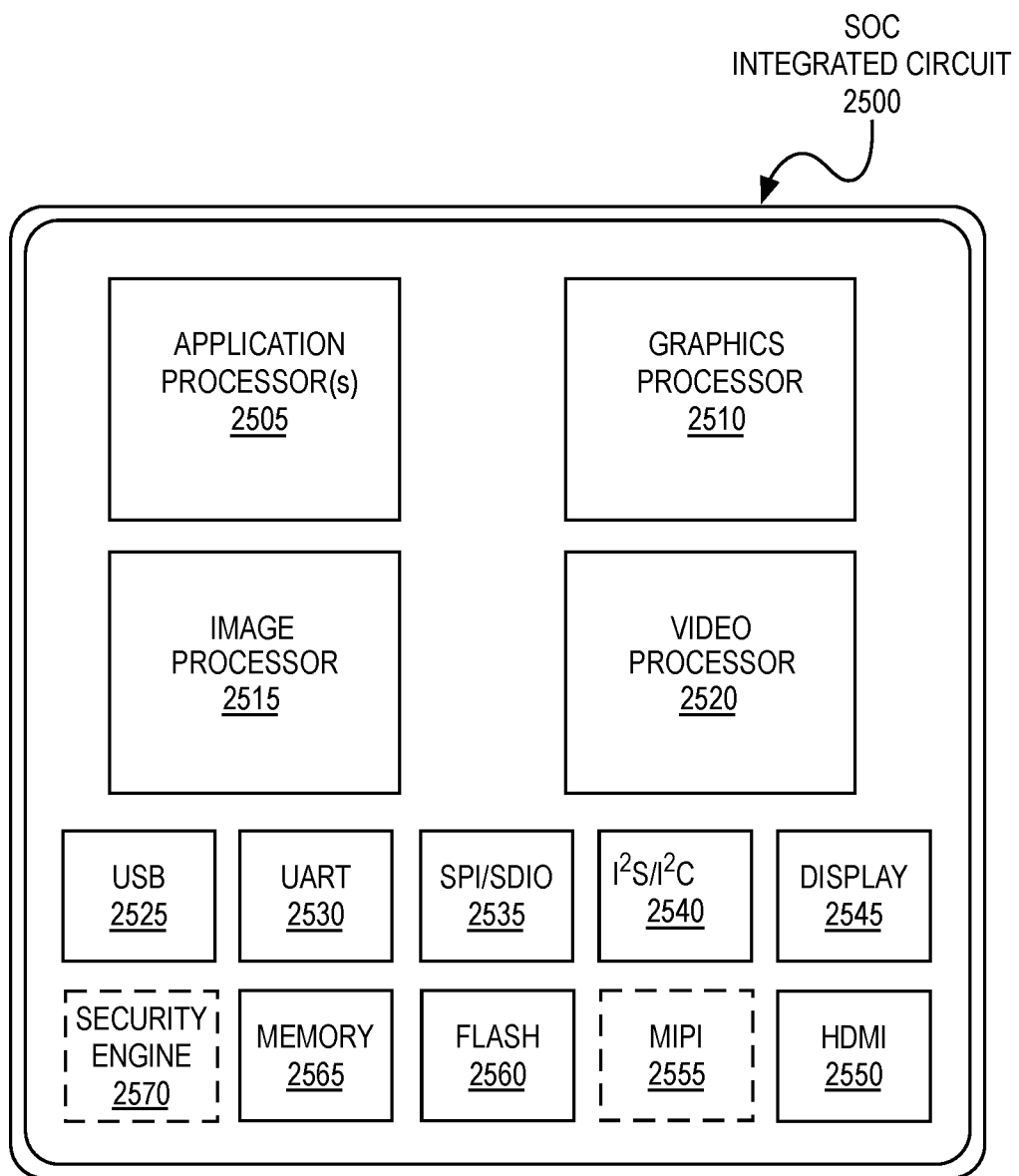
FIG. 25 is a block diagram illustrating an exemplary system on a chip integrated circuit.
Figure 26A:
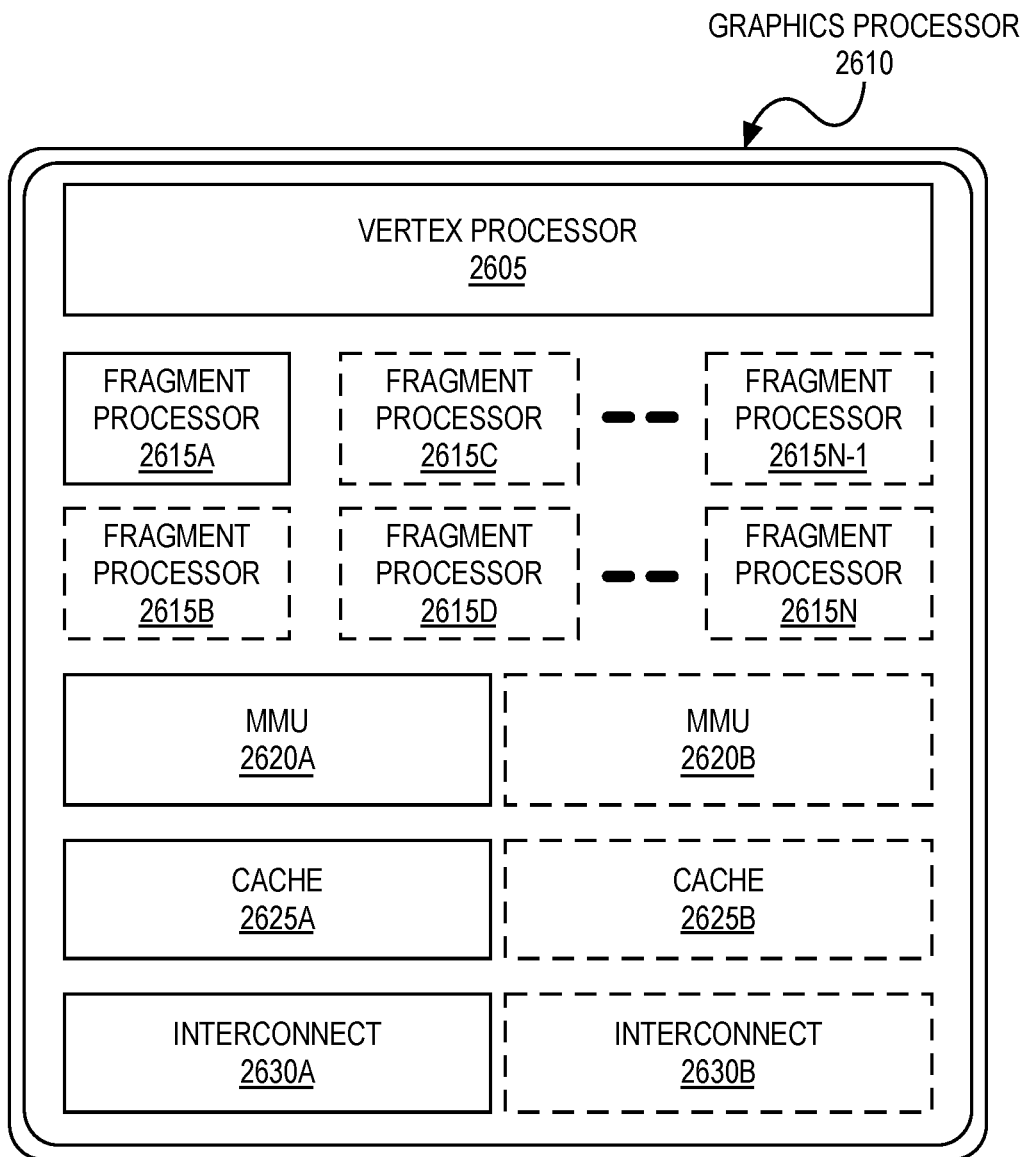
FIG. 26A-26B are block diagrams illustrating exemplary graphics processors for use within an SoC.
Figure 26B:
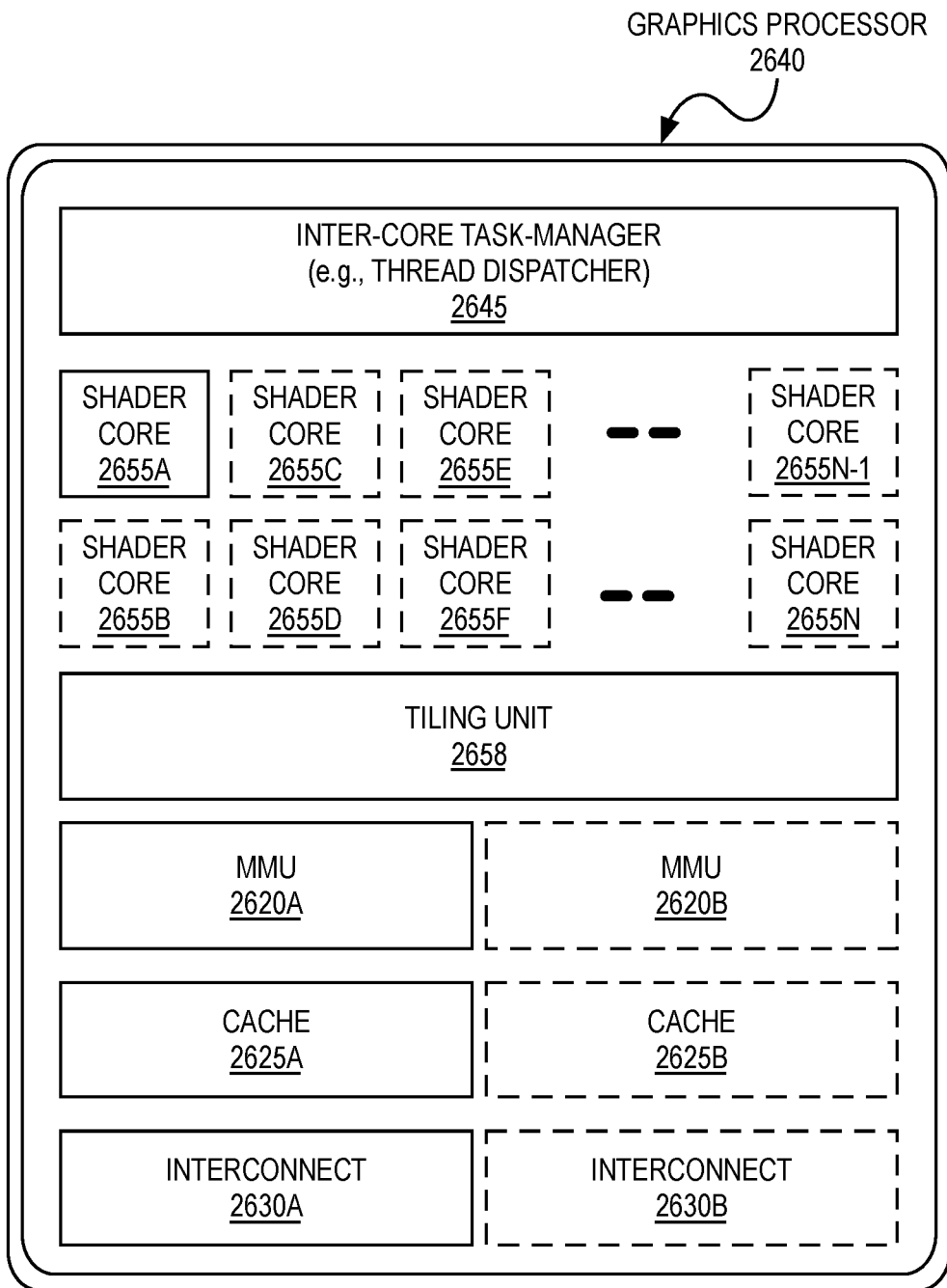

FIG. 25-26B illustrate exemplary integrated circuits and associated graphics processors that may be fabricated using one or more IP cores. In addition to what is illustrated, other logic and circuits may be included, including additional graphics processors/cores, peripheral interface controllers, or general-purpose processor cores. The elements of FIG. 25-26B having the same or similar names as the elements of any other figure herein describe the same elements as in the other figures, can operate or function in a manner similar to that, can comprise the same components, and can be linked to other entities, as those described elsewhere herein, but are not limited to such.

FIG. 25 is a block diagram illustrating an exemplary system on a chip integrated circuit 2500 that may be fabricated using one or more IP cores. Exemplary integrated circuit 2500 includes one or more application processor(s) 2505 (e.g., CPUs), at least one graphics processor 2510, which may be a variant of the graphics processor 1408, 1508, 2510, or of any graphics processor described herein and may be used in place of any graphics processor described. Therefore, the disclosure of any features in combination with a graphics processor herein also discloses a corresponding combination with the graphics processor 2510 but is not limited to such. The integrated circuit 2500 may additionally include an image processor 2515 and/or a video processor 2520, any of which may be a modular IP core from the same or multiple different design facilities. Integrated circuit 2500 may include peripheral or bus logic including a USB controller 2525, UART controller 2530, an SPI/SDIO controller 2535, and an I²S/I²C controller 2540. Additionally, the integrated circuit can include a display device 2545 coupled to one or more of a high-definition multimedia interface (HDMI) controller 2550 and a mobile industry processor interface (MIPI) display interface 2555. Storage may be provided by a flash memory subsystem 2560 including flash memory and a flash memory controller. Memory interface may be provided via a memory controller 2565 for access to SDRAM or SRAM memory devices. Some integrated circuits additionally include an embedded security engine 2570.

FIG. 26A-26B are block diagrams illustrating exemplary graphics processors for use within an SoC, according to embodiments described herein. The graphics processors may be variants of the graphics processor 1408, 1508, 2510, or any other graphics processor described herein. The graphics processors may be used in place of the graphics processor 1408, 1508, 2510, or any other of the graphics processors described herein. Therefore, the disclosure of any features in combination with the graphics processor 1408, 1508, 2510, or any other of the graphics processors described herein also discloses a corresponding combination with the graphics processors of FIG. 26A-26B but is not limited to such. FIG. 26A illustrates an exemplary graphics processor 2610 of a system on a chip integrated circuit that may be fabricated using one or more IP cores, according to an embodiment. FIG. 26B illustrates an additional exemplary graphics processor 2640 of a system on a chip integrated circuit that may be fabricated using one or more IP cores, according to an embodiment. Graphics processor 2610 of FIG. 26A is an example of a low power graphics processor core. Graphics processor 2640 of FIG. 26B is an example of a higher performance graphics processor core. For example, each of graphics processor 2610 and graphics processor 2640 can be a variant of the graphics processor 2510 of FIG. 25, as mentioned at the outset of this paragraph.

As shown in FIG. 26A, graphics processor 2610 includes a vertex processor 2605 and one or more fragment processor(s) 2615A-2615N (e.g., 2615A, 2615B, 2615C, 2615D, through 2615N-1, and 2615N). Graphics processor 2610 can execute different shader programs via separate logic, such that the vertex processor 2605 is optimized to execute operations for vertex shader programs, while the one or more fragment processor(s) 2615A-2615N execute fragment (e.g., pixel) shading operations for fragment or pixel shader programs. The vertex processor 2605 performs the vertex processing stage of the 3D graphics pipeline and generates primitives and vertex data. The fragment processor(s) 2615A-2615N use the primitive and vertex data generated by the vertex processor 2605 to produce a framebuffer that is displayed on a display device. The fragment processor(s) 2615A-2615N may be optimized to execute fragment shader programs as provided for in the OpenGL API, which may be used to perform similar operations as a pixel shader program as provided for in the Direct 3D API.

Graphics processor 2610 additionally includes one or more memory management units (MMUs) 2620A-2620B, cache(s) 2625A-2625B, and circuit interconnect(s) 2630A-2630B. The one or more MMU(s) 2620A-2620B provide for virtual to physical address mapping for the graphics processor 2610, including for the vertex processor 2605 and/or fragment processor(s) 2615A-2615N, which may reference vertex or image/texture data stored in memory, in addition to vertex or image/texture data stored in the one or more cache(s) 2625A-2625B. The one or more MMU(s) 2620A-2620B may be synchronized with other MMUs within the system, including one or more MMUs associated with the one or more application processor(s) 2505, image processor 2515, and/or video processor 2520 of FIG. 25, such that each processor 2505-2520 can participate in a shared or unified virtual memory system. Components of graphics processor 2610 may correspond with components of other graphics processors described herein. The one or more MMU(s) 2620A-2620B may correspond with MMU 245 of FIG. 2C. Vertex processor 2605 and fragment processor 2615A-2615N may correspond with graphics multiprocessor 234. The one or more circuit interconnect(s) 2630A-2630B enable graphics processor 2610 to interface with other IP cores within the SoC, either via an internal bus of the SoC or via a direct connection, according to embodiments. The one or more circuit interconnect(s) 2630A-2630B may correspond with the data crossbar 240 of FIG. 2C. Further correspondence may be found between analogous components of the graphics processor 2610 and the various graphics processor architectures described herein.

As shown FIG. 26B, graphics processor 2640 includes the one or more MMU(s) 2620A-2620B, cache(s) 2625A-2625B, and circuit interconnect(s) 2630A-2630B of the graphics processor 2610 of FIG. 26A. Graphics processor 2640 includes one or more shader cores 2655A-2655N (e.g., 2655A, 2655B, 2655C, 2655D, 2655E, 2655F, through 2655N-1, and 2655N), which provides for a unified shader core architecture in which a single core or type or core can execute all types of programmable shader code, including shader program code to implement vertex shaders, fragment shaders, and/or compute shaders. The exact number of shader cores present can vary among embodiments and implementations. Additionally, graphics processor 2640 includes an inter-core task manager 2645, which acts as a thread dispatcher to dispatch execution threads to one or more shader cores 2655A-2655N and a tiling unit 2658 to accelerate tiling operations for tile-based rendering, in which rendering operations for a scene are subdivided in image space, for example to exploit local spatial coherence within a scene or to optimize use of internal caches. Shader cores 2655A-2655N may correspond with, for example, graphics multiprocessor 234 as in FIG. 2D, or graphics multiprocessors 325, 350 of FIGS. 3A and 3B respectively, or multi-core group 365A of FIG. 3C.

Graphics Processor Memory Access Architecture

Figure 27:
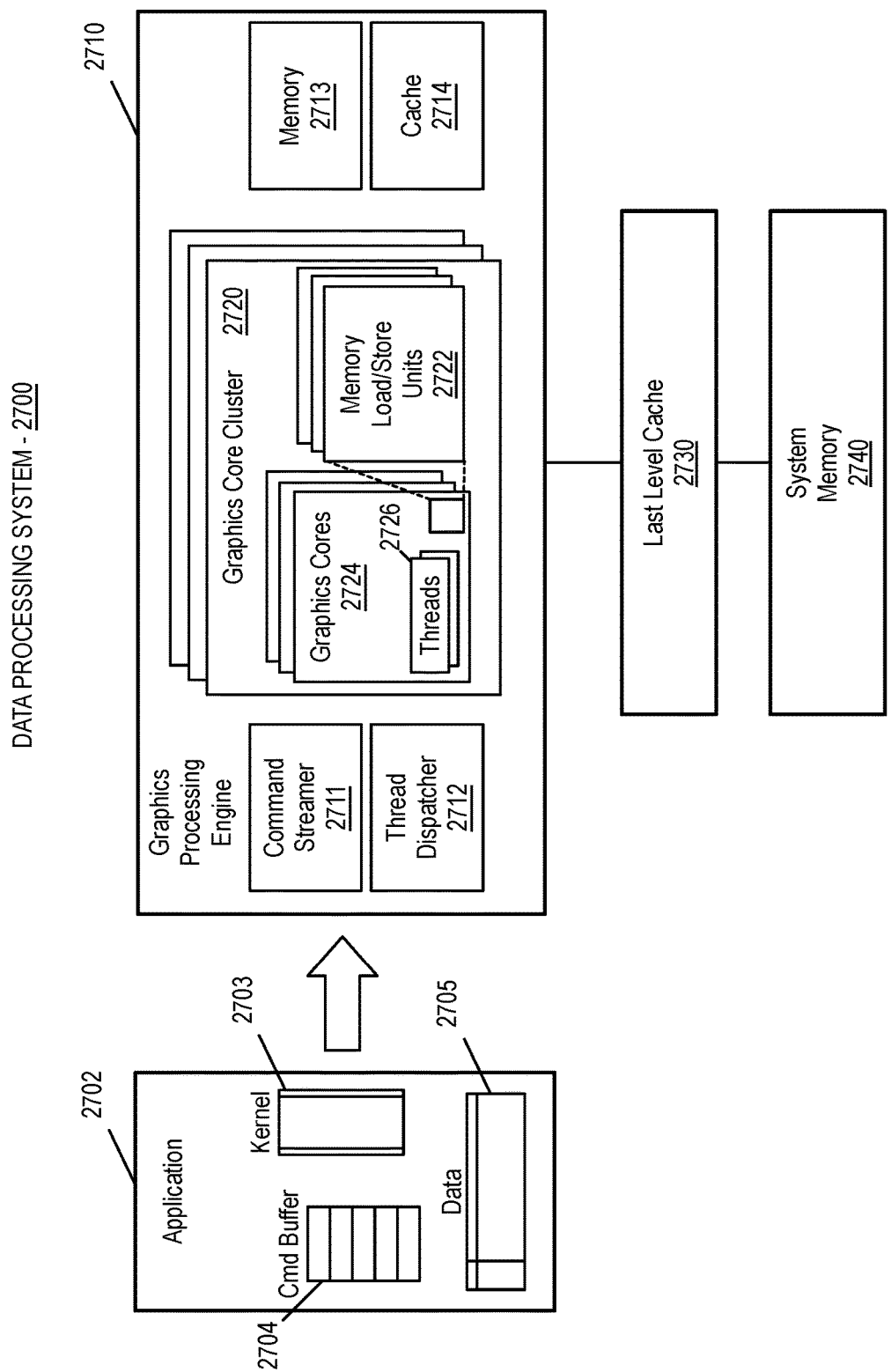
FIG. 27 illustrates a data processing system including a graphics core cluster having a memory load/store unit.

FIG. 27 illustrates a data processing system 2700 including a graphics core cluster having a memory load/store unit. The data processing system 2700 includes a graphics processor, parallel processor, and/or compute accelerator as described herein (e.g., parallel processor 200, GPU 380, GPU 410-413, GPGPU 700, GPUs 1245, GPGPU 1306, graphics processor 1408, graphics processor 1508, GPGPU 1570, graphics processor 1600, graphics processor 1620, compute accelerator 1630, graphics processor 2100, graphics processor 2332, graphics processor 2510, graphics processor 2610, and/or graphics processor 2640). The graphics processor includes one or more instances of a graphics processing engine 2710, which in various embodiments corresponds with GPE 1610, graphics processing engine cluster 1622, compute engine cluster 1632, and/or GPE 1710. The graphics processor and included one or more instances of the graphics processing engine 2710 couple with a last level cache 2730 that is shared with a host CPU and/or other processors in the system, as well as a system memory 2740 that is provided by a host computing system to which the graphics processor is attached. In one embodiment, the last level cache 2730 can include a memory module 1518 as in processor 1500.

The graphics processing engine 2710 includes a command streamer 2711, a thread dispatcher 2712, memory 2713, and a cache 2714, which service processing resources within one or more instances of a graphics core cluster 2720. The graphics core cluster 2720 includes a set of graphics cores 2724 and, in one embodiment, a set of memory load/store units 2722 coupled with the set of graphics cores 2724. The memory load/store units 2722 facilitates access to memory 2713 for threads 2726 executed by the graphics cores 2724 and can have similar functionality to load/store units 266 and/or load/store units 340A-340B. In one embodiment, the memory load/store unit also facilitates access to the system memory 2740 in concert with a host interconnect bus or fabric and/or memory load/store unit 2722 is part of a load/store/cache architecture that also manages access to the cache 2714 and last level cache 2730. The memory load/store unit 2722 can have similar circuitry and functionality as other load/store units described herein (e.g., load/store unit 266).

In one embodiment, the cache 2714 is a cache hierarchy that includes multiple cache levels, including an L2 and L3 cache. In one embodiment, the cache 2714 includes an L2 cache that is a distributed cache, such as the L2 cache 221 of partition unit 220 of FIG. 2B, which may be included in each of the partition units 220A-220N of the parallel processor 200 of FIG. 2A. In one embodiment, the cache 2714 includes an L2 cache that is coupled with a memory fabric and is configurable to caches transactions performed via the memory fabric, such as the L2 cache 1904 and memory fabric 1903 of FIG. 19. In general, unless the data to be access has been allocated as non-cached data, memory accesses requests via the store unit 2722 will be serviced from the cache 2714, last level cache 2730, or another element of the cache memory hierarchy of the graphics processor. A cache miss operation will be performed to transfer requested data from the memory 2713 or system memory 2740 if the data is not found within the cache memory hierarchy.

The data processing system 2700 can perform operations on behalf of an application 2702. The application 2702, which is executed by a host processor (e.g., CPU), can submit a kernel 2703 for execution by the graphics processing engine 2710. The application 2702, via a graphics or compute API, can submit commands that are translated by a graphics and/or API driver into commands that are inserted into a command buffer 2704. The command buffer 2704 includes commands to transfer the kernel 2703 to memory 2713 from system memory 2740. The commands in the command buffer 2704 can also include references to data 2705 stored in memory 2713 or system memory 2740, such as but not limited to vertex and geometry data, image data, and/or memory objects. Memory access requests to load the kernel 2703 and data 2705, as well as memory access requests that are generated by threads 2726 during kernel execution, can be processed via the memory load/store unit 2722.

Figure 28:
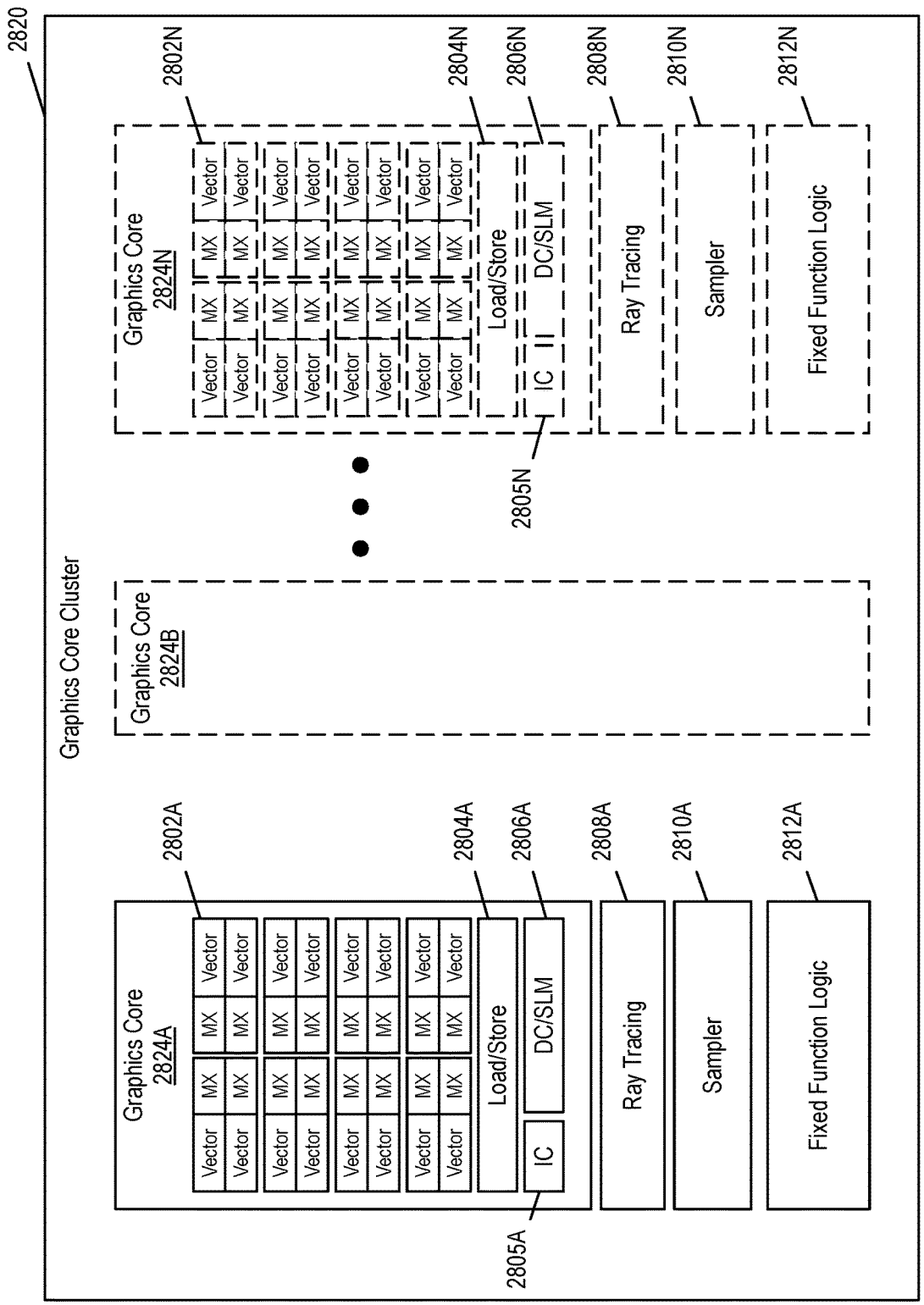
FIG. 28 illustrates a graphics core cluster including graphics cores having a memory load/store unit.

FIG. 28 illustrates a graphics core cluster 2820 including graphics cores having a memory load/store unit. The graphics core cluster 2820 include multiple graphics cores 2824A-2824N. In one embodiment, each of the multiple graphics cores 2824A-2824N includes compute logic 2802A-2802N, a memory load/store unit 2804A-2804N, an instruction cache 2805A-2805N, a data cache/shared local memory 2806A-2806N, a ray tracing unit 2808A-2808N, a sampler 2810A-2810N, and a block of fixed function logic 2812A-2812N. Functionality of the instruction cache sampler 2810A-2710N, and fixed function logic 2812A-2812N corresponds with equivalent functionality in the graphics processor architectures described above.

With reference to graphics core 2824A, the compute logic 2802A includes vector processing logic and matrix operation acceleration logic that are configurable to perform parallel compute operations on data in a variety of integer and floating-point data formats. The memory load/store unit 2804A, which may be equivalent to the memory load/store unit 2722 of FIG. 27, services memory access requests that are issued by the compute logic 2802A. For example, in response to an instruction to load data from memory or store data to memory, a message send unit (e.g., send unit 1830) can send a message to the memory load/store unit 2804A that includes a memory access request. The memory access request can be processed by the memory load/store unit 2804A to load or store the requested data to or from cache or memory into a register file associated with the compute logic 2802A. In some embodiments, memory accesses may also be performed based on operations executed by the ray tracing unit 2808A or sampler 2810A. The other graphics cores 2824B-2824N can operate in a similar manner as 2824A.

Figure 29:
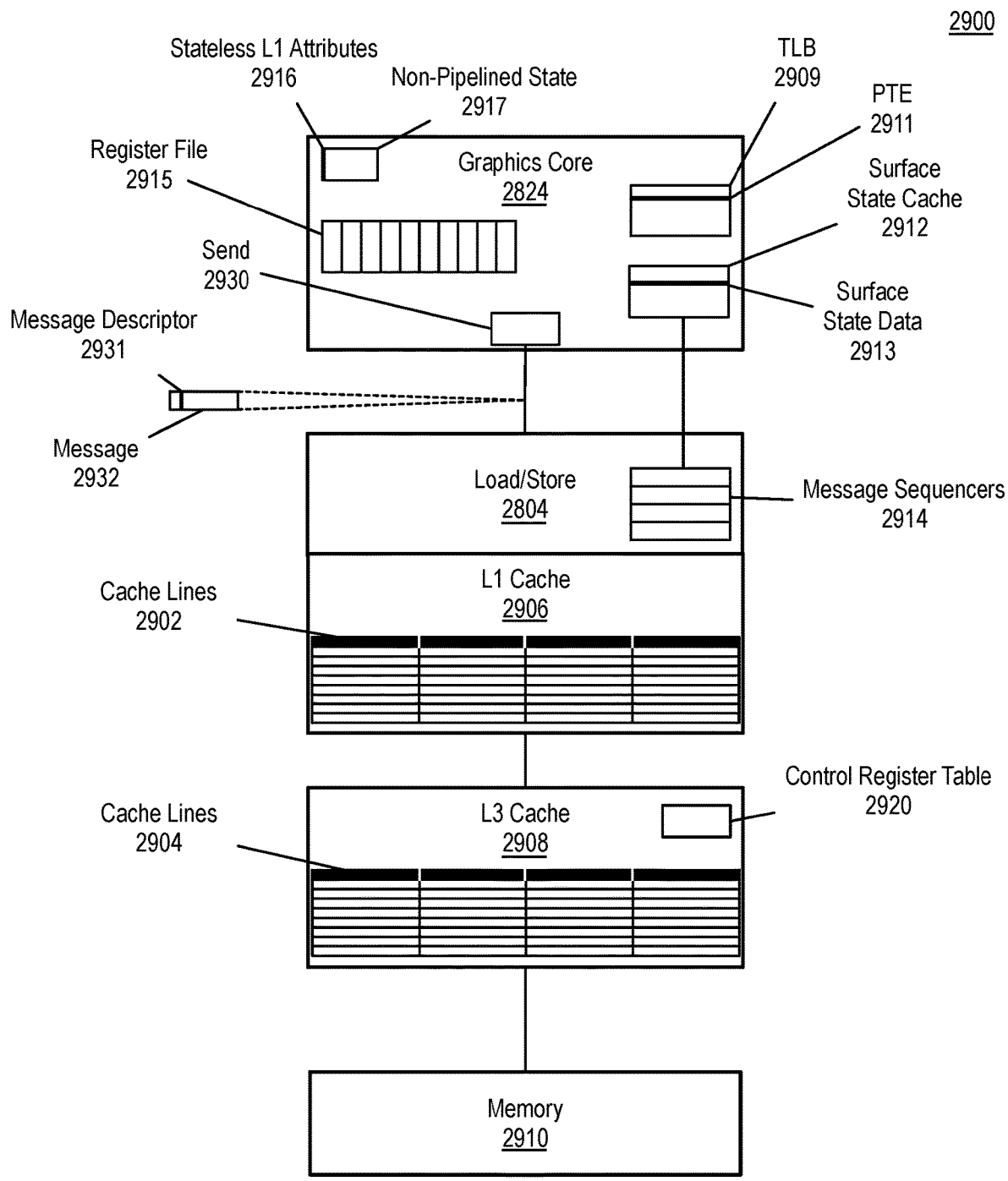
FIG. 29 illustrates a system of graphics processor components that are configurable to process load and store operations with cacheability control.

FIG. 29 illustrates a system 2900 of graphics processor components that are configurable to process load and store operations with cache attribute control. The load and store messages can be used to load data into a register file 2915 or store data that resides in the register file 2915 into memory 2910. The system 2900 includes a graphics core 2824, which can be any of the graphics cores 2824A-2824N of FIG. 28. The graphics core 2824 includes or couples with circuitry of a load/store unit 2804, which may be one of the memory load/store units 2804A-2804N of FIG. 28 and may include functionality described with respect to memory load/store unit 2722. The graphics core 2824 can also include a TLB 2909, which can cache a page table entry (PTE 2911) associated with a page of memory.

The graphics core 2824 also includes or couples with an L1 cache 2906 that is used to cache memory accesses performed by the graphics core 2824. In one embodiment, the L1 cache 2906 resides in the data cache/shared local memory of a graphics core (e.g., data cache/shared local memory 2806A of a graphics core 2824A). The L1 cache 2906 includes multiple cache lines 2902 and is controlled via cache control circuitry. In one embodiment the cache control circuitry is included within the L1 cache 2906. In one embodiment the load/store unit 2804 includes at least a portion of the cache control circuitry for the L1 cache 2906. The L1 cache 2906 can couple with a pixel pipeline that facilitates pixel-based operations. The graphics core also includes an L3 cache 2908, which can include functionality of the L3 cache 1906 of FIG. 19. The L3 cache 2908 includes multiple cache lines 2904 that can store data read from or written to memory 2910. The L3 cache 2908 can include cache control logic to manage allocation, fill, and replacement of the cache lines 2904.

Memory 2910 can be local memory (e.g., memory 2713) or system memory (e.g., system memory 2740). The memory 2910 can store surfaces in linear formats or one of a variety of tiled memory formats. The shader memory surfaces are associated with surface state data 2913 that may be stored in memory along with the surface and can be cached in a dedicated surface state cache 2912. The surface state data 2913 stores information about the surface such as bits per pixel, tiling mode, clear pixel status, compression status. For compressed data, this information can be used by a GPGPU codec unit (e.g., CODEC 227) to compress the data before sending the data to the memory subsystem. In embodiments described herein, cache attributes are also stored in the surface state data 2913, as described in further detail below.

The load/store unit 2804 includes a set of message sequencers 2914 that sequence a set of memory/cache operations to perform a complex loads or stores, such as block loads or stores or batch load or store operations across multiple cache lines. The sequencing logic within the message sequencers 2914 will split the L1 accesses for the row up until the nearest cacheline boundary. The message sequencers 2914 include multiple message processing elements that can process multiple load or store messages in parallel each cycle. The message sequencers 2914 can process an incoming message to decompose the message into multiple underlying data access requests that are used to service the load or store message.

If the data associated with a cached memory access resides in the L1 cache 2906, an L1 cache hit occurs. The data can then be read from or written to one or more cache lines 2902 of the L1 cache 2906. If a cache miss occurs on a load operation, an L1 fill operation is performed to retrieve the data, for example, from the L3 cache 2908 or the memory 2910. If the memory allocation associated with the data is configured to be L3 cachable and an L3 hit occurs, the data can be read from one or more cache lines 2904 of the L3 cache 2908 and stored to the L1 cache 2906. On an L1 fill, circuitry of the load/store unit 2804 can send a memory request for each cacheline of data to be written to the L1 cache. Accesses to memory allocations that are marked as uncacheable will bypass one or both of the L1 cache 2906 and the L3 cache 2908. Cacheability can be separately enabled for the L1 cache 2906 and the L3 cache 2908, such that, for example, an allocation may be cacheable for one cache but uncacheable for a separate cache.

L1 and L3 Cacheability Control

Described herein are techniques to control L1 and L3 caching attributes by—(1) attaching caching properties when a buffer gets created (e.g., via a driver created surface state), (2) application code directly controlling caching properties from instructions (e.g., ISA enhancements), (3) and via a kernel mode driver setting a memory side cache policy via attributes of a page table entry (PTE). In embodiments described herein, the L1 cache 2906 is virtually indexed. Accordingly, a cache control mechanism that stores cacheability attributes in a PTE 2911 control cannot be used, as the indexing is performed before or in parallel with virtual to physical address translation. In embodiments described herein, L1 cache attributes are stored in one surface state data 2913 and/or a send message descriptor.

Surface state data 2913 for memory allocations, which may be stored in the surface state cache 2912, can contain default L1 attributes for processing stateful messages for the surface. The L1 settings for stateless accesses will be stored as non-pipelined state 2917, which are state attributes that are directly specified to the graphics processing engine 2710. In one embodiment, stateless L1 attributes 2916 are programmed via the STATE BASE ADDRESS command. The STATE BASE ADDRESS command sets base pointers for subsequent state, instruction, and media indirect object accessed by the graphics processing engine 2710, and can specify default stateless L1 attributes 2916 as part of the non-pipelined state 2917.

Execution logic within the graphics core 2824 can perform memory accesses via a send instruction that is executed, for example, via a message passing send unit 2930, such as the send unit 1830 of a vector engine 1802 as in FIG. 18B. A similar unit may also reside in the matrix engine 1803 of FIG. 18C. A send message descriptor associated with a send message can be used to store optional L1 caching attributes. The send message descriptor is used for stateless messages where there is no associated "surface state" to enable per-buffer flexibility of cacheability settings or other settings for a memory allocation. However, the send message descriptor can also be used for stateful messages to override the default settings in the surface state.

In one embodiment, the L3 cache 2908 is physically indexed. Accordingly, access to the L3 cache is performed after a virtual to physical memory address translation is performed via the PTE 2911 associated with the accessed memory. The PTE 2911 can include a 1 bit L3 cache attribute field that indicates whether entries within the page should be cached in the L3 cache 2908. Alternatively, or additionally, in some embodiments the L3 cacheability settings can be set via a memory object control state (MOCS) index, which is a 2-bit index that will point to a table entry. The table entry will have the L3 cacheability setting. A 2-bit MOCS index provides 4 possible indices. In one embodiment, two states are supported (L3 cacheable and L3 uncacheable) and the remaining states are reserved. The MOCS index may be a portion of the surface state data 2913 for a surface and cached in the surface state cache 2912. In one embodiment, a control register table 2920 is defined in the L3 cache 2908 and the MOCS index can used to index into the table to determine cache control behavior to apply to a surface. The L3 cacheability state can also be set via a surface state or send message descriptor, similar to the L1 cacheability state.

Table 5 shows hardware supported L1 Cacheability Attributes, according to an embodiment.

TABLE 5

HW Support for L1 Cacheability Attributes

| Access Type | Attribute | Description |
|---|---|---|
| Store | UC | Writes are not cached |
| | WB | Writes are cached as "dirty" state |
| | WT | Writes are sent to memory as well as updated in the cache (in "clean" state). |
| | WS | Streaming store-cache at low priority-LRU position (e.g., use L1 to merge partial) |
| Load | UC | Read is not allocated in cache |
| | LDC | Regular cacheable load ($ in MRU position) |
| | LDS | Streaming load ($ in LRU position) |
| | IAR | Invalidate (if cache hit) after read (private memory only) |
| Atomic | UC | Atomics are not cached in L1-forced to be UC |
| Prefetch | UC | Prefetch is not allocated in L1 |
| | Cacheable-HP | Allocate in L1 as high priority (MRU) |
| | Cacheable-LP | Allocate in L1 as low priority (LRU) |

As shown in Table 5, supported access types with adjustable L1 cacheability include store, load, atomic, and prefetch operations. Stores can be uncached (UC) writes that bypass the L1 cache 2906, or one of write-back (WB), write-through (WS), or write-streaming (WS), with operation as described in Table 5 above. In one embodiment, partial cache lines writes are enabled for stores, with multiple partial cache line writes being mergeable at the L1 cache level. In some embodiments, the L1 cache is a sectored cache in which a 64-byte cache line can be divided into multiple sectors and sub-sectors. In one embodiment, an L1 cache 2906 is configured with an 8-byte sub-sector size and any partial write smaller than 8-bytes is considered a UC store. In one embodiment, an uncompressible write to a compressed surface is treated as a UC store. For example, if store operation is performed to a compressed surface in memory and the store operation contains data that cannot be compressed to the configured or minimum compression ratio for the surface, the data may be written to memory in an uncompressed format and the store will bypass the L1 cache. Any partial hits in the scenario may result in a merge and/or eviction and invalidation of the associated cache line.

Loads can be uncached reads for data that is not stored in the L1 (UC), a normal cachable load (LDC), a streaming load with a low probability of reuse (LDS), and an invalidate after read (JAR) load that, for private memory, is a cached load that is invalidated after a cache hit. In one embodiment, atomic operations are not cached in L1. In such embodiments, all atomic operations are marked as UC. In one embodiment, cache control is enabled for prefetch operations, which may be uncached (UC), or cached with a high priority (cacheable-HP) or a low priority (cacheable-LP). The priority associated with prefetch operations indicates a pre-configured likelihood that prefetched data will be selected for eviction by the L1 cache replacement algorithm based on the rate or frequency in which the prefetched data is accessed. In one embodiment, the cacheability attribute for prefetched data determines the cache replacement policy that is used when determining whether to evict that data, with multiple cache replacement policies being active for different sets of cache lines.

In the case of the L3 cache 2908, in one embodiment a 1-bit attribute may be set in the PTE 2911 for an allocation, which indicates either a cacheable allocation using the MRU cache replacement algorithm, or an uncacheable allocation. When setting L3 cache attributes via an untyped send message, more complex settings may be set via a send message descriptor associated with the untyped send message. Untyped send messages may be used to access "untyped" data, which is generally data associated with compute (e.g., non-pixel) data associated with a general-purpose compute program or compute shader (e.g., CUDA, OpenCL, oneAPI).

L1 and L3 Caching Attributes Encoded in Untyped Send Message Descriptor

In one embodiment, both L1 and L3 caching attributes may be encoded in an untyped send message descriptor. A send message descriptor 2931 may be used for a send message 2932 that is transmitted by a send unit (e.g., send unit 1830) of a processing resource described herein. The send message descriptor 2931 may be an untyped send message descriptor and the send message 2932 may be an untyped send message. In one embodiment, data that is transmitted by the send unit 2930 may include the message 2932 and associated message descriptor 2931. In one embodiment, the send unit 2930 sends a message that indicates that the load/store unit 2804 should read a message from one or more source registers in the register file 2915 and write a response to one or more destination registers in the register file 2915. In one embodiment, the send message descriptor can have a 4-bit field that can be used for L1/L3 cache control. L1 and L3 caching attributes that may be specified via a send message descriptor are shown in Table 6.

TABLE 6

Message Descriptor Cache Controls

| | Send Message Descriptor Cache Controls | L1 | L3 | Description |
|---|---|---|---|---|
| Store Messages | l1uc_l3uc | UC | UC | Don't cache anywhere |
| | l1uc_l3wb | UC | WB | Cache in L3 only |
| | l1wb_l3wb | WB | WB | Cache in all levels |
| | l1wt_l3uc | WT | UC | WT in L1 only |
| | l1wt_l3wb | WT | WB | WT in L1 |
| | l1ws_l3uc | WS | UC | Streaming store, L1 only |
| | l1ws_l3wb | WS | WB | Streaming store |
| | l1l3mocs | Use Default | Use MOCS | No setting |
| Load Messages | l1uc_l3uc | UC | UC | Don't cache anywhere |
| | l1uc_l3ldc | UC | LDC | Cache in L3 only |
| | l1ldc_l3uc | LDC | UC | Cache in L1 only |
| | l1ldc_l3ldc | LDC | LDC | Cache in all levels |
| | l1lds_l3uc | LDS | UC | Streaming load, L1 only |
| | l1cal_l3wb | LDS | LDC | Streaming load |
| | l1iar | IAR | LDC | Discard after read |
| | l1l3mocs | Use Default | Use MOCS | No setting |
| Atomic Messages | l1uc_l3uc | UC | UC | Don't cache anywhere |
| | l1uc_l3wb | UC | WB | Cache |
| | l1l3mocs | Use Default | Use MOCS | No setting |

TABLE 6-continued

Message Descriptor Cache Controls

| Send Message Descriptor Cache Controls | | | | |
|---|---|---|---|---|
| | | L1 | L3 | Description |
| Prefetch Messages | l1uc_l3ldc | UC | LDC | Prefetch to L3 |
| | l1ldc_l3uc | LDC | UC | Prefetch to L1 |
| | l1ldc_l3ldc | LDC | LDC | Prefetch in all levels |
| | l1lds_l3uc | LDS | UC | Streaming Prefetch, L1 only |
| | l1lds_l3wb | LDS | LDC | Streaming Prefetch |
| | l1l3mocs | Use Default | Use MOCS | No setting |

The load/store unit 2804 will decode the send message descriptor to get the cache attributes to send to the L1 bank. The MOCS index will also be sent to the L1 bank. For miss requests and evictions to the L3 cache 2908, the L1 cache 2906 will pass the 2-bit MOCS index and 2-bit instruction L3 control to the fabric interconnect (e.g., memory fabric 1903) that couples the graphics core 2824 and the load/store unit 2804 with the L3 cache 2908. The L1 cache can determine the MOCS index via a communication channel between the message sequencers 2914 and the surface state data 2913.

Default Caching Attributes and Conflict Resolution

As described above, stateless L1 attributes 2916 are stored in the non-pipelined state 2917 for stateless accesses, as programmed by the STATE BASE ADDRESS command. The surface state data 2913 stores L1 behavior for stateful accesses to a surface having a specified surface state. These settings store default settings and specify a pair of load and store behaviors in a 3-bit field, which encodes to the state settings shown in Table 7.

TABLE 7

Default L1 Caching Attributes

| Encoded State | Load Message Behavior | Store Message Behavior |
|---|---|---|
| WBP (write-bypass) | LDC | UC |
| UC (not cached) | UC | UC |
| WB (write-back) | LDC | WB |
| WT (write-through) | LDC | WT |
| WS (write-streaming) | LDS | WS |

The hardware defaults to a write-bypass mode, in which normal caching behavior (LDC) is sued for loads and stores bypass the L1 cache. The user mode driver can override the hardware default settings to either uncached mode (UC), write-back mode (WB), wire-though mode (WT), or write streaming mode (WS). If a send instruction specifies conflicting L1 cache attributes for a store or atomic operation, the conflict will be resolved as shown in Table 8.

TABLE 8

L1 Store/Atomic Cache Priority: Instruction v. Default

| | | Default | | | |
|---|---|---|---|---|---|
| | Instruction | UC | WT | WB | WS |
| Store/Atomics | UC | UC | UC | UC | UC |
| | WT | WT | WT | WT | WT |
| | WB | WB | WB | WB | WB |

TABLE 8-continued

L1 Store/Atomic Cache Priority: Instruction v. Default

| | | Default | | | |
|---|---|---|---|---|---|
| | Instruction | UC | WT | WB | WS |
| | WS | WS | WS | WS | WS |
| | None | UC | WT | WB | WS |

If a send instruction specifies conflicting L1 cache attributes for a load or prefetched operation, the conflict will be resolved as shown in Table 9.

TABLE 9

L1 Load/Prefetch Cache Priority: Instruction v. Default

| | | Default | | |
|---|---|---|---|---|
| | Instruction | UC | LDC | LDS |
| Load/Prefetch | UC | UC | UC | UC |
| | LDC | LDC | LDC | LDC |
| | IAR | IAR | IAR | IAR |
| | LDS | LDS | LDS | LDS |
| | None | UC | LDC | LDS |

In general, the default attribute is used of no L1 cache attributes are specified by the send instruction and the L1 cache attributes specified by the send instruction will override the default setting.

L3 Caching Attributes

The L3 cache 2908 will arbitrate between an instruction descriptor, MOCS, and PTE specified settings. Instruction setting will override the MOCS setting for L3 cacheability. Table 10 below shows L3 cache priority for arbitration between instruction specified L3 caching attributes and the attributes specified via the MOCS index in surface state data.

TABLE 10

L3 Cache Priority: Instruction v. MOCS

| | | Default MOCS | |
|---|---|---|---|
| | Instruction | UC | WB |
| Load/Store/ Prefetch/Atomic | UC WB/LDC | UC WB/LDC | UC WB/LDC |

As shown in Table 10, the default MOCS setting can be overridden for any individual memory access to either disable caching or enable write-back caching for stores or cached loads for load or prefetch operations. Atomic operations However, in one embodiment an instruction or MOCS setting cannot weaken the consistency requirement set by the PTE 2911, as shown in Table 11 below.

TABLE 11

L3 Cache Priority: Instruction v. MOCS

| | Instruction/ | PTE (cache bypass) | |
|---|---|---|---|
| | MOCS | UC | WB/LDC |
| Load/Store/ Prefetch/Atomic | UC WB/LDC | UC UC | UC WB/LDC |

As shown in Table 11, if the PTE specifies to bypass the L3 cache 2908, an instruction or MOCS setting cannot override that setting. However, an uncached operation can be performed to bypass the L3 cache 2908 if the PTE specifies that data should be cached. If an uncached write to memory hits the L3 cache, the entry will be invalidated.

SW/Firmware High Level View

Embodiments described also provide software extensions to enable the use of L1 and L3 cache attributes. For example, extensions may be provided to the SPIR-V or LLVM intermediate representations the enable per-message L1/L3 cache controls for loads and stores. Additionally, the non-temporal memory access semantic for SPIR-V may be implemented in part via the use of the WS cache attribute. In one embodiment, a per-kernel attribute is provided to specify the L1 cache behavior to apply when the SPIR-V non-temporal memory access semantic is enabled. In one embodiment, a build option is provided to specify the L1 cache behavior to apply when the SPIR-V non-temporal memory access semantic is enabled. The OpenCL prefetch extended instruction can be used to expose prefetch operations via a send instruction. A further extension may be provided to enable L1 and L3 prefetch controls for the prefetches. In one embodiment, a build option is provided to specify the L1 and L3 cache behavior to apply when in response to the generic prefetch extended instruction in an intermediate representation.

Memory Scope Attribute for Heterogenous Compute Nodes

In one embodiment, a memory scope attribute can be specified for a surface allocation. The memory scope attribute that tells the cache the visibility/scope of the data for the purposes if cache coherency and determining how to respond to L1 cache flush operations. Private, Local, and Global scopes are defined. The memory scope attribute is of particular benefit for heterogenous workloads that are executed on CPU and GPU nodes, where compute programs can execute using a large number of threads across a large number of heterogenous processing units.

FIG. 30 illustrates impact of the memory scope attribute for a surface on cache flush and coherency behavior. In one embodiment, when a private scope 3001 is specified, the data 3002 is thread private (e.g., per-thread scratch space). Each of the threads 3003 that access the data 3002 will see a thread-local instance of the data. In one embodiment, the data 3002 is treated as thread private even in scenarios where the data may be mapped to the context global memory virtual address space. Cache lines having private scope 3001 do not need to be coherent with other threads. There is no need to flush these cache lines due to an "L1 cache flush" operation. The L1 cache flush is used to make global data visible to all processing resources, and the cached data having a private scope is visible only to a single thread. In one embodiment, the private scope 3001 is used for stateless accesses to scratch space buffers. In such embodiment, any message that operates on "SCRATCH" surface type will automatically specify the private scope 3001. In one embodiment the "IAR" mode for loads is limited to cache lines having a private memory scope. Register spills to memory for scratch buffers stored in the register file may be cached in L1 as IAR, as the cached data will not be accessed again once the data is re-filled.

When a local scope 3004 is specified, data 3005 is shared locally within each graphics core 3006A-3006N, even in scenarios in which the data is mapped to a context global virtual address space. Cache lines associated with data 3005 having a local scope 3004 data do not need to be coherent with L1 caches associated with other graphics cores 3006A-3006N. In one embodiment, there is no need to flush cache lines with local scope in response to a "L1 cache flush" operation, as there is no need for data having the local scope 3004 to be visible outside of the graphics core. In one embodiment, the local scope 3004 is used fort "stack" data generated by ray tracing threads, as ray tracing threads will be executed locally to the graphics core to simplify ray probe operations performed on the ray tracing unit of the graphics core. For surfaces having the local scope 3004, the default caching policy will usually be "WB" and may be programmed in the surface state data and/or specified in the access message to the load/store unit.

When a global scope 3007 is specified, the data 3008 is globally visible across a heterogenous compute node. This data is visible across all threads in the GPU package, across all GPU packages 3009A-3009N in a GPU node, and among the host CPUs 3010A-3010N in the node. These lines are evicted due to a "L1 cache flush" operation to make data globally visible. In one embodiment, the global scope 3007 is the default memory scope.

Figure 31:
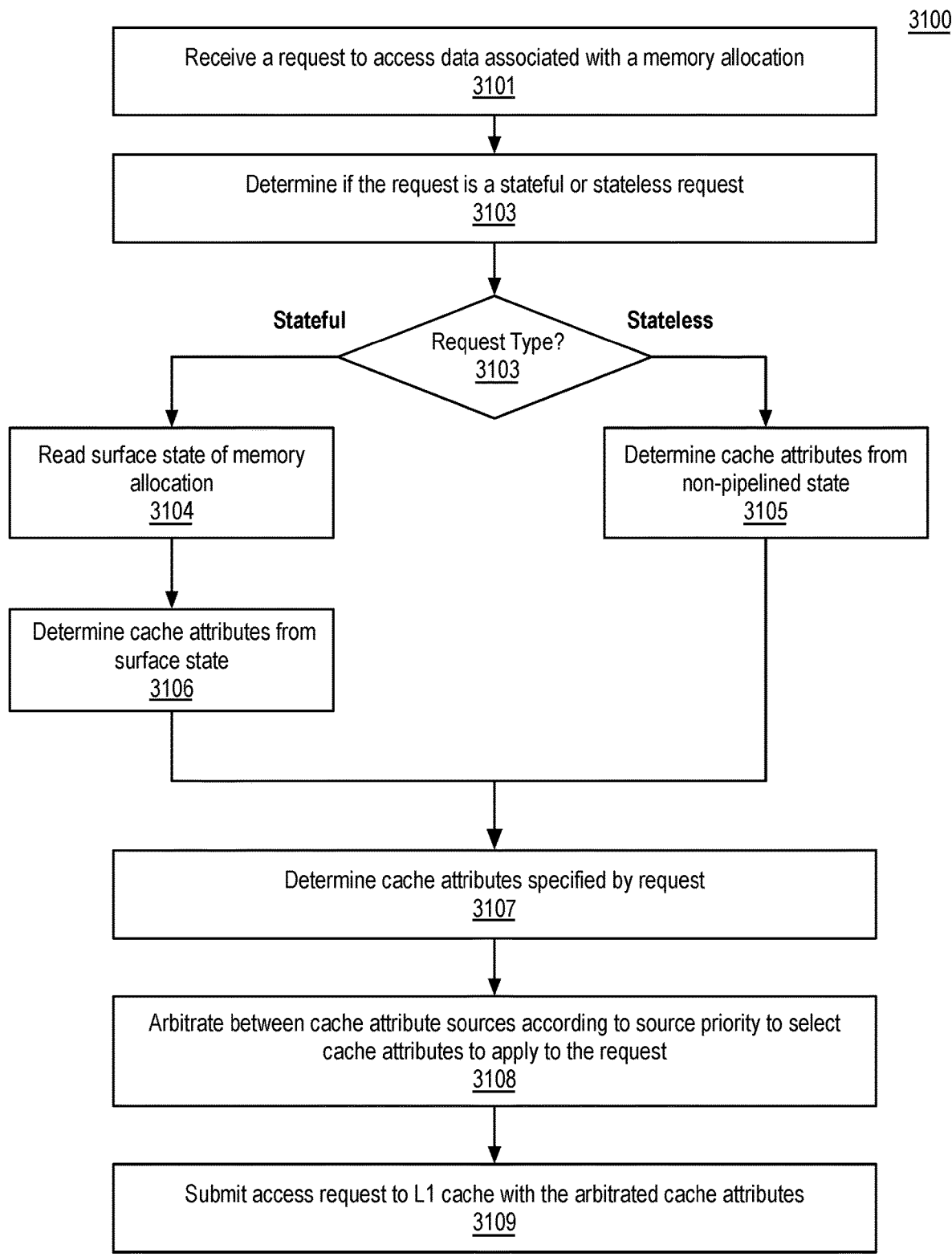
FIG. 31 illustrates a method of determining L1 cache attributes for memory requests, according to an embodiment.

FIG. 31 illustrates a method 3100 of determining L1 cache attributes for memory requests, according to an embodiment. The method 3100 can be performed by load/store circuitry described herein (e.g., load/store unit 2804), or equivalent memory access circuitry that is configured to perform memory access requests for processing resources of a graphics processor of compute accelerator.

Method 3100 includes, in one embodiment, for the memory access circuitry to receive a request to access data associated with a memory allocation (3101). The request can be in the form of a message sent by circuitry associated with a message passing unit (e.g., send unit 2930), where the message is sent in response to execution of an instruction by processing resources of a graphics core. The memory access circuitry can then determine if the request is a stateful or stateless request (3103). A stateful request is a request to access a memory allocation in a memory surface having an associated surface state. Information on how to access that surface can be retrieved from the surface state. A stateless request is for a surface or memory allocation that does not have an associated surface state.

The memory access circuitry can determine the request type (3103), in one embodiment, based on a header or descriptor of the request. For a stateful access, the memory access circuitry can read the surface state of the memory allocation (3104). The surface state can be read from a surface state cache, which upon a cache miss, can request the surface state information via a memory fabric. The memory access circuitry can then determine cache attributes from the surface state (3106). In the event of a stateless access, the memory access circuitry can determine cache attributes from non-pipelined state data that was provided to the GPU for the memory allocation (3105).

The memory access circuitry can then determine if request specifies a cache attribute (3107). A header or descriptor associated with the request can specify cache attributes that should be applied to the request. The memory access circuitry can then arbitrate between cache attribute sources according to source priority to select cache attributes to apply to the request (3108). If no cache attributes are set, the hardware default setting may be used. In one embodiment, the default setting for L1 cache access is a write-bypass mode, in which reads (loads) are cached and writes (stores) bypass the L1 cache. The software can specify default settings in the surface state or non-pipelined state which are used for stateful and stateless accesses unless conflicting attributes are specified in the request. If cache attributes are specified by the request, the request specified attributes will take priority for L1 accesses.

The memory access circuitry can then submit a memory access request to the L1 cache with the arbitrated cache attributes (3109). The arbitrated cache attributes are the L1 and L3 cache attributes that are selected from multiple sources based in source priority, the software configured default attributes if no attributes are included in the request, or the hardware default attributes if no cache attributes are set. The request is sent to the L1 cache even if L1 caching is disabled, in the event that any hit cache lines for an uncached access need to be invalidated. The L1 cache will return data associated with a hit on a cached request. The L1 cache will submit a fill request on a miss via the memory fabric. The fill request may be to the L3 cache if L3 caching is enabled in the cache attributes or to a local memory if L3 caching is disabled. In one embodiment, a request submitted via the memory fabric to memory or the L3 may hit the L2 cache, depending on the system configuration. If the memory attributes specify the use of a MOCS index, the L1 cache will submit the MOCS index along with the memory fabric request.

Figure 32:
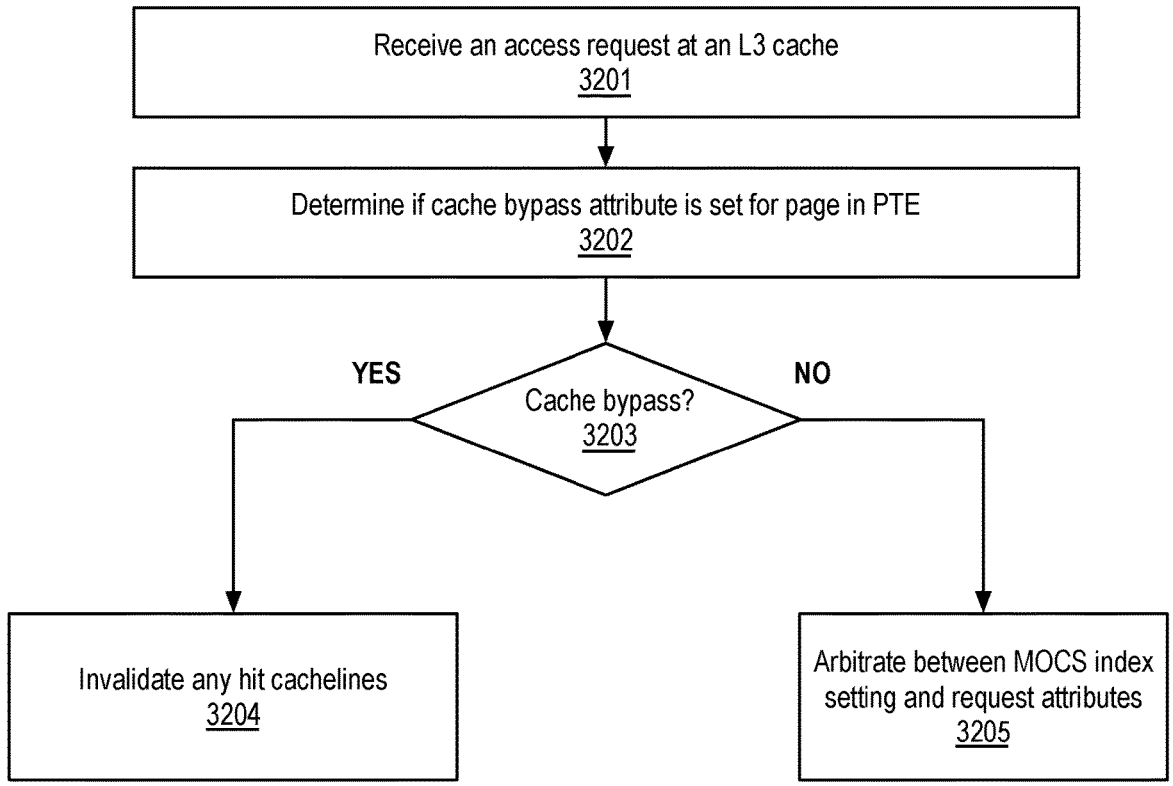
FIG. 32 illustrates a method of determining L3 cache attributes for memory requests, according to an embodiment.

FIG. 32 illustrates a method 3200 of determining L3 cache attributes for memory requests, according to an embodiment. In one embodiment, the method 3200 is performed by cache control logic associated with an L3 cache of a graphics processor or compute accelerator.

In one embodiment, the method 3200 includes to receive an access request at the L3 cache (3201). The access request can be an L1 cache fill request on an L1 cache miss or can be a request for data that is marked as UC for the L1 cache. The method 3200 additionally includes to determine if a cache bypass attribute is set in the page table entry for the address to be accessed (3202). In one embodiment, the cache bypass setting will be indicated in the request, as the virtual to physical address translation will have occurred before the memory access request has hit the L3 cache and one or more attributes set in the PTE may be included in the access request to the L3. In one embodiment, if the cache bypass attribute may be dynamically updated after a memory allocation is performed, the L3 cache may still receive a request when cache bypass is enabled, to enable any cache lines associated with the page to be invalidated (3204).

If cache bypass is not enabled (3203, NO), then the L3 cache can determine the L3 cache attributes to apply based on an arbitration performed based on a MOCS index or any cache attributes that may be includes in the request (3205). The MOCS index is an index into a control register table where L3 cache attributes are stored and may be used as the default attribute unless overridden by an instruction-based attribute.

According to the above description, a graphics processor may be provided that includes a processing resource having a graphics engine, a memory device, a first cache (e.g., L1) coupled with the processing resources and the memory device, and circuitry to process a memory access message received from the processing resource. The memory access message is to cause the circuitry to access data of the memory device on behalf of the graphics engine. To process the memory access message, the circuitry is configured to determine whether the memory access message includes a first cache attribute, the first cache attribute to indicate whether the data is cacheable within the first cache, determine whether state information associated with the data includes a second cache attribute, the second cache attribute to indicate whether the data is cacheable within the first cache, arbitrate between the first cache attribute and the second cache attribute according to presence or absence of the first cache attribute and the second cache attribute and respective priorities associated with the first cache attribute and the second cache attribute, and transmit a memory access request to the first cache memory. The memory access request includes the arbitrated cache attributes.

In one embodiment, the state information associated with the data includes a surface state for a stateful memory allocation associated with the data or a non-pipelined state for a stateless memory allocation associated with the data. The second cache attribute specifies a default cache attribute that can be overridden by the first cache attribute if/when the first cache attribute is present. Each of the first cache attribute and the second cache attribute encode a load message behavior and a store message behavior. The first cache can submit a fill request to a memory fabric of the graphics processor in response to a cache miss for data that is cacheable in the first cache.

In one embodiment, the first cache can determine a value of a third cache attribute that indicates whether the data is cacheable within a third cache (e.g., L3) and the first cache can submit the fill request to the third cache via the memory fabric in response to a determination that the data is cacheable within the third cache. The first cache can submit the fill request to the memory device via the memory fabric in response to a determination that the data is uncacheable within the third cache. The fill request to the third cache or the local memory may hit a second cache associated with the memory fabric and the second cache can respond to the fill request. The first cache is a virtually indexed cache and the third cache is a physically indexed cache, such that a virtual to physical address translation is performed before checking for a hit in the third cache. The virtual to physical address translation enables determination of a third cache attribute, which can be read from a page table entry for a page associated with the data. The third cache attribute may also read from a table (e.g., MOCS) within the third cache. The attribute may be read from the table via an index (MOCS index) that is included in the fill request.

The memory access message may be a load message to read from memory or a store message to write to memory. The store message, in one embodiment, may include an attribute to trigger an implicit fence, as described in further detail below.

Implicit Fence for Write Messages

In addition to the cache attributes that may be configured via state settings or memory access messages, an embodiment described herein facilitates the addition of an implicit fence for a memory write message that can be used to accelerate memory fence operations. In one embodiment, an implicit fence with a write message is provided, such that instead of having a separate 'fence' message, an attribute is added to write messages that enables a fence to be implied. to imply a fence. For some machine learning/deep learning kernels, up to an 8% improvement may be realized due to the reduced consumption message bandwidth enabled by the elimination of the fence message.

Figure 33:
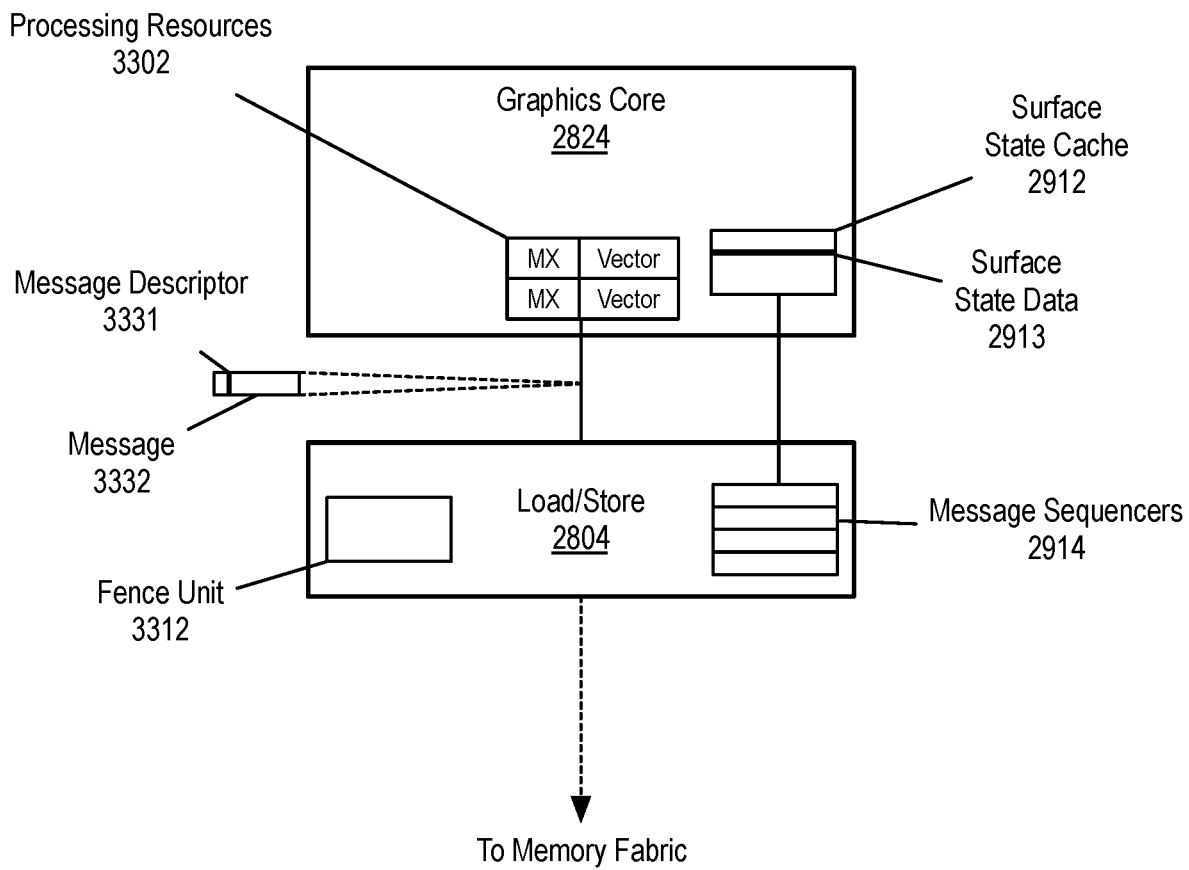
FIG. 33 illustrates a system in which an implicit fence is enabled via the addition of an attribute to a write message, according to an embodiment.

FIG. 33 illustrates a system 3300 in which an implicit fence is enabled via the addition of an attribute to a write message, according to an embodiment. In one embodiment, the system 3300 includes a graphics core 2824 as described in FIG. 28. The graphics core 2824 can include processing resource 3302 to execute matrix and vector operations, such as the vector engines 1522A-1522F, 1524A-1524F and matrix engines 1523A-1523F, 1525A-1525F as in FIG. 15B and/or other vector or matrix engines described herein. The graphics core 2824 can couple with a load/store unit 2804, as described in FIG. 28.

A kernel executed by the processing resources 3302 may perform various compute operations, including vector and matrix operations. Results of those operations may be written to memory via the load/store unit 2804. For operations that are performed across sets of processing resources 3302, a fence operation can be performed to ensure that all memory operations that are performed before the fence are completed before any memory operations that are performed after the fence. Execution of a fence instruction by the processing resources 3302 may result in a message 3332 being transmitted to the load/store unit 2804. When a message is a fence message, a fence unit 3312 in the load/store unit can synchronize memory operations to implement the fence operation. The fence operation enforces an ordering constraint on memory operations issued before and after the fence. Memory operations issued before the fence will be completed before any memory operations that are issued after the fence. In one embodiment, the fence unit 3312, when performing a fence operation, will allow all in-progress memory operations to complete before processing any new memory operations.

In previous implementations, the fence operation is implemented as a separate message. In one embodiment, an implicit fence is provided in which the fence unit 3312 can be triggered to implement a fence based on a message 3332 to implement a write operation, where a bit in a message descriptor 3331 indicates that a fence should be implemented after the write. The bit in the message descriptor 3331 can be set based on a bit in an operand of the write (e.g., store) instruction that triggers the write with implicit fence.

Figure 34A:
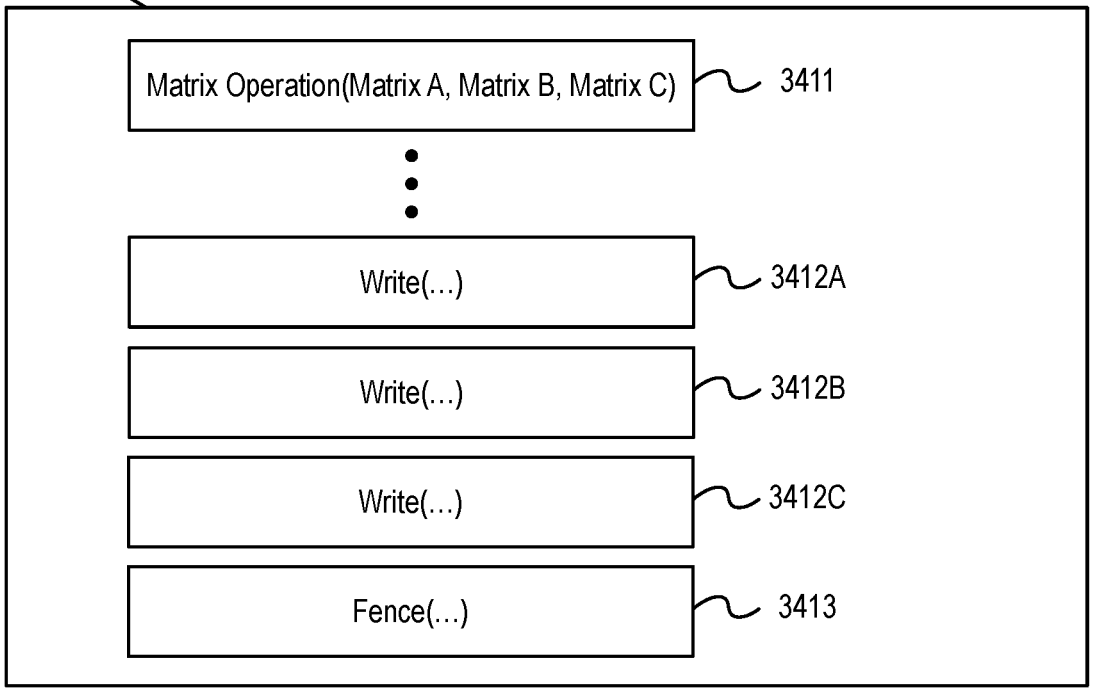
FIG. 34A-34B illustrates a comparison between an explicit and implicit fence operation, according to an embodiment.
Figure 34B:
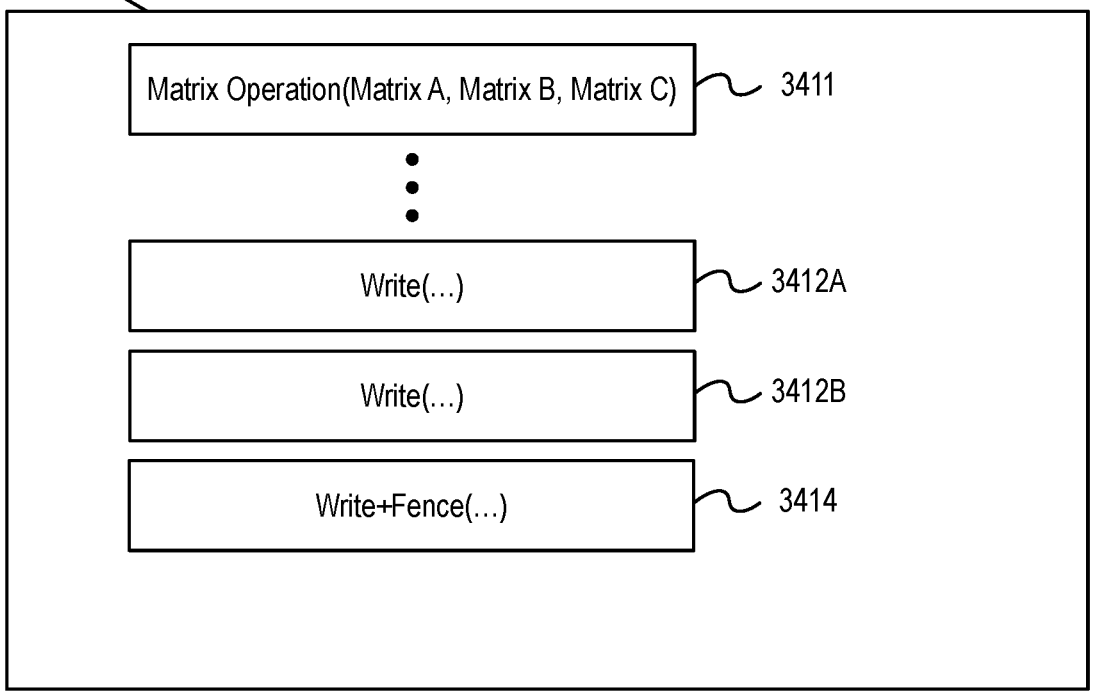

FIG. 34A-34B illustrates a comparison between an explicit and implicit fence operation, according to an embodiment. As shown in FIG. 34A, a kernel (kernel A 3410) can perform operations including a matrix operation 3411 on matrix A and matrix B to generate matrix C. Additional operations may be performed, with results being written via a plurality of write operations 3412A-3412C. A fence operation 3413 can be used to ensure the write operations 3412A-3412C are visible before other memory operations are performed. The write operations can be implemented by the load/store unit 2804 as store operations, which may be cached or uncached according to cacheability attributes described above. The fence operation 3413 can be implemented via a fence unit 3312 of the load/store unit 2804 in response to an explicit fence instruction executed by the kernel.

As shown in FIG. 34B, a kernel (kernel B 3420) can reduce the number of explicit operations that are performed by enabling an implicit fence via an attribute of a write operation. After the matrix operation 3411 and any additional operations, the write operations 3412A-3412C of kernel A 3410 can be replaced by a reduced number of write operations 3412A-3412B, with a final write operation 3414 that indicates an implicit fence. The load/store unit 2804 can detect the implicit fence indicator and signal the fence unit 3312 to perform the fence operation.

Figure 35:
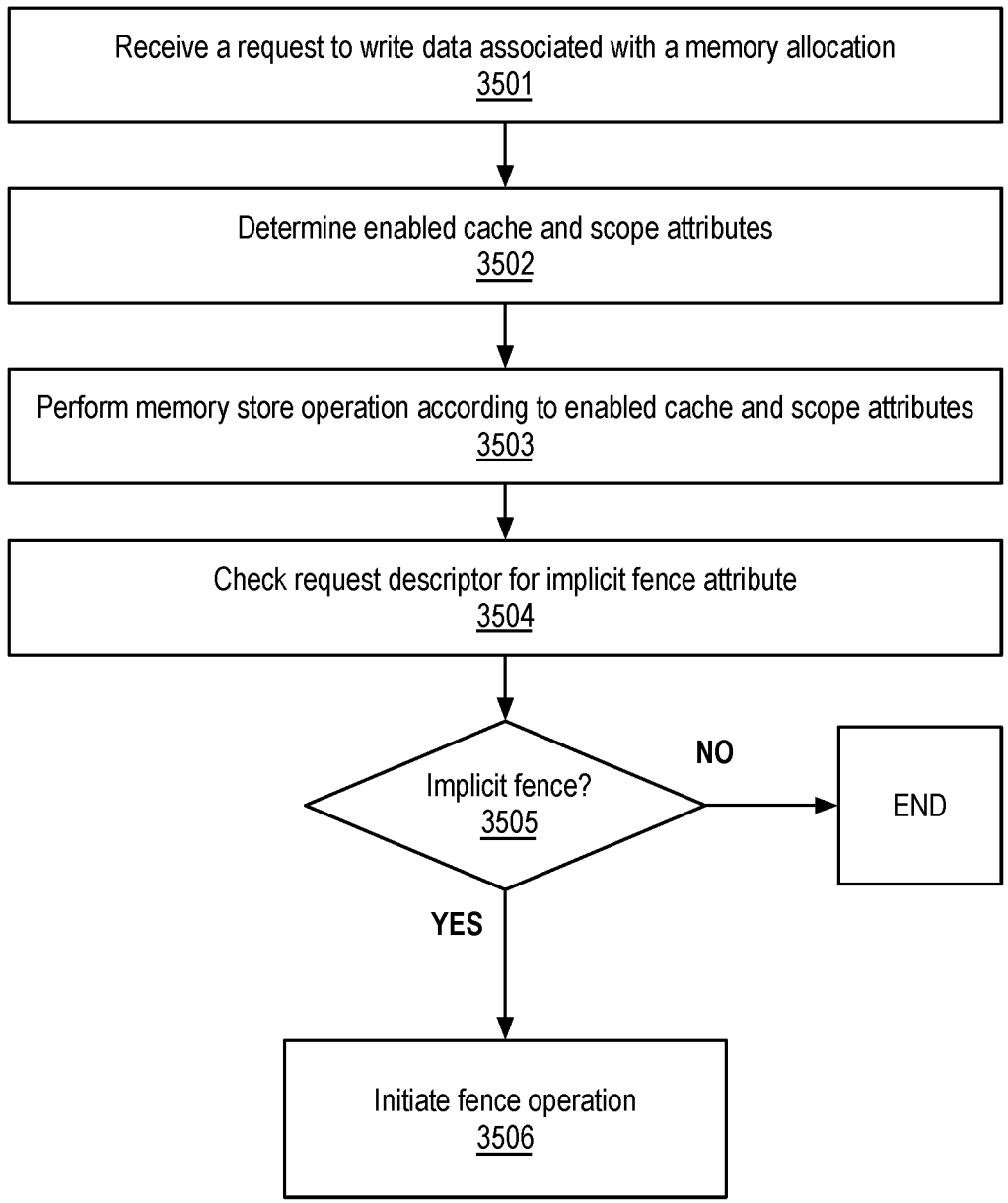
FIG. 35 illustrates a method of performing an implicit fence operation after a write operation, according to an embodiment.

FIG. 35 illustrates a method 3500 of performing an implicit fence operation after a write operation, according to an embodiment. The method 3500 can be performed by load/store circuitry described herein (e.g., load/store unit 2804), or equivalent memory access circuitry that is configured to perform memory access requests for processing resources of a graphics processor of compute accelerator.

The method 3500 includes for the memory access circuitry to receive a request to write data associated with a memory allocation (3501). The memory access circuitry can determine the enabled cache and scope attributes for the write using techniques described above (3502). The memory access circuitry can then perform a memory store operation according to the enabled cache and scope attributes (3503). The memory access circuitry can also check a request descriptor for an implicit fence attribute (3504). The memory access circuitry can then use the implicit fence attribute to determine if implicit fencing is enabled for this write (3505). The implicit fence attribute can be determined concurrently with the determination of the enabled cache and scope attributes. If an implicit fence is not enabled (3505, NO), then the method 3500 may end. If an implicit fence is enabled (3505, YES), then the memory access circuitry can initiate a fence operation (3506), which may be performed via a fence unit 3312 as in FIG. 33.

Enabling a fence to be initiated after a write operation reduces the number of operations performed by kernels that perform write fencing operations, which can result in a measurable performance improvement.

Hardware Support for Activation Functions within a Matrix Engine

Embodiments described herein can also realize further improvement efficiencies by adding hardware support for activation functions within a matrix engine. Returning to FIG. 33, the processing resources 3302 of a graphics core 2824 can include vector engines and matrix engines, such as, for example, a vector engine 1802 and a matrix engine 1803, or similar functional units described herein. In various embodiments, the matrix engine 1803 may include functionality of the tensor/ray-tracing cores 263, tensor cores 337A-337B, tensor cores 371, or another accelerator core described herein. The matrix engine 1803 can accelerate deep learning and machine learning algorithms described herein by enabling the rapid processing of multi-dimensional tensor data. As described above, data received at the nodes of an input layer of a feedforward network are propagated to the nodes of the output layer via an activation function that calculates the states of the nodes of each successive layer in the network based on coefficients respectively associated with each of the edges connecting the layers. Machine Learning frameworks or libraries may provide primitives to facilitate the fusion of activation functions with GEMM computations to remove the need for an additional kernel launch to apply an activation function to the output of the GEMM operation. However, greater efficiency may be realized by enabling a matrix engine to perform a fused GEMM+activation function operation entirely within hardware.

Figure 36A:
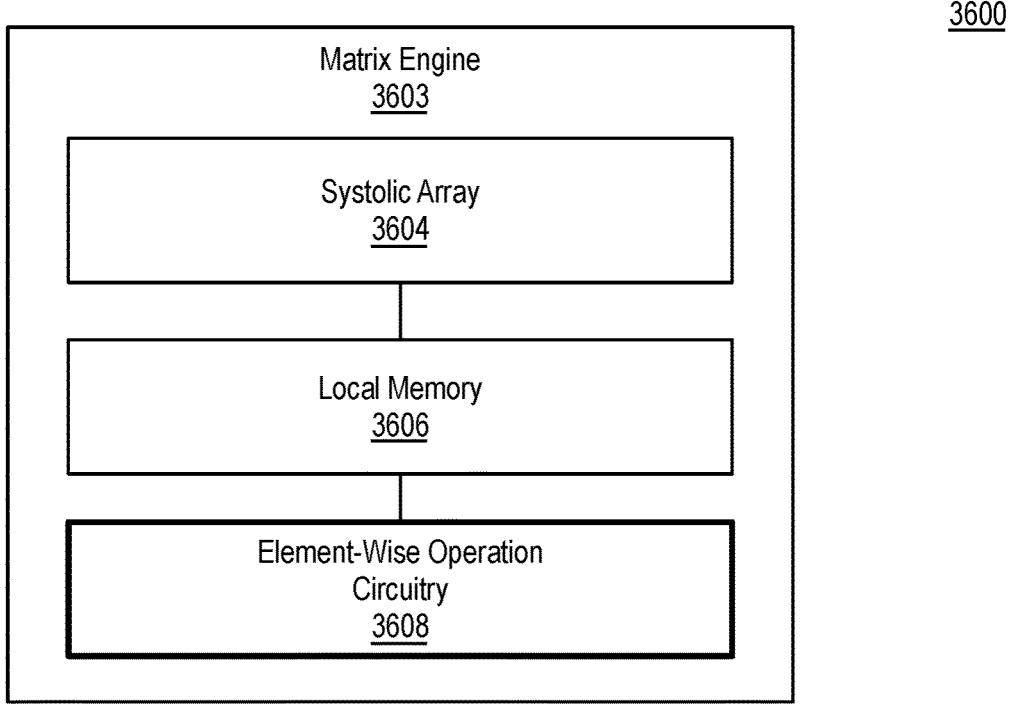
FIG. 36A-36B illustrate a system including circuitry to enable hardware support for activation functions within a matrix engine, according to an embodiment.
Figure 36B:
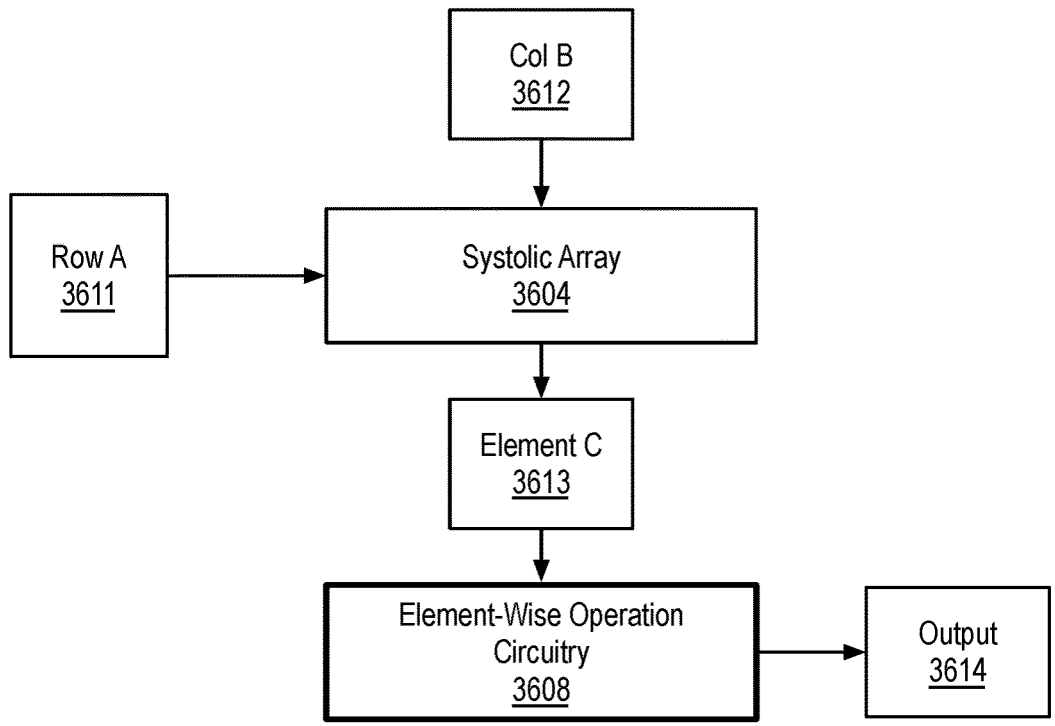

FIG. 36A-36B illustrate a system 3600 including circuitry to enable hardware support for activation functions within a matrix engine, according to an embodiment. As shown in FIG. 36A, the system 3600 includes a matrix engine 3603, which includes circuitry of a matrix engine 1803 of FIG. 18C and/or another tensor processing cores described herein (e.g., tensor/ray-tracing cores 263, tensor cores 337A-337B, tensor cores 371, etc.). For example, the matrix engine 3603 can include a systolic array 3604, a local memory 3606 (or local register file), and element-wise operation circuitry 3608. The systolic array 3604 can include an array of processing elements that can be configured to perform tensor operations including vector/matrix and matrix/matrix operations, such as but not limited to matrix multiply and/or dot product operations. In one embodiment, the systolic array 3604 is configurable to perform a GEMM operation in the form of C=αAB+βC, where A and B are matrix inputs and C may be an existing matrix, which may be overwritten to generate an output matrix or output to a third matrix D. The a and values are scalar values that are generally one or zero depending on the operation in which GEMM is applied.

The systolic array 3604 can read input from and write output to local memory 3606. In one embodiment, the local memory is a systolic register file 1840 as in FIG. 18C. In one embodiment, the local memory 3606 is a cache memory or shared local memory that may reside within the matrix engine 3603. Although illustrated as within the matrix engine 3603, in one embodiment the 3606 is external to but closely coupled with the matrix engine 3603, in a manner similar to the cache/SLM 1528A of graphics cores 1521A or data cache/shared local memory 1806A of graphics core 1815A.

In one embodiment, the matrix engine 3603 is configured to perform a variety of element-wise operations to output generated by the systolic array 3604 while the output resides in the local memory 3606, before the output is made locally visible within the graphics core or globally visible to all processing elements in a node. This functionality allows the element-wise operations to be performed without a round-trip to global memory, which would be required of the element-wise operations are performed by a subsequent kernel.

In one embodiment, element-wise operations on the output can be performed via element-wise operation circuitry 3608. In response to the execution of an instruction to perform a GEMM or GEMM-like operation or based on a parameter provided as input with such an instruction, the element-wise operation circuitry 3608 can apply one or more element-wise operations on output from the systolic array 3604 while the output resides in the local memory 3606. In various embodiments, the element-wise operation circuitry 3608 can perform a bias operation, apply an activation function, or perform a fused bias and activation function. A bias vector can be provided as input to the element-wise operation circuitry 3608 when performing a bias operation. An activation function selection may be provided as input to enable the element-wise operation circuitry 3608 to select from a plurality of activation functions for application. In one embodiment, supported activation functions include the rectified linear unit (RELU) function of equation (1), the sigmoid function of equation (2), or the hard sigmoid function of equation (3). Other embodiments may support additional activation functions.

$$f(x) = \max(0, x) \quad (1)$$

$$\sigma(x) = \frac{1}{(1+e^{-x})} \quad (2)$$

$$\sigma(x) = \max\left(0, \min\left(1, \frac{x+1}{2}\right)\right) \quad (3)$$

As shown in FIG. 36B, during operation of the matrix engine 3603, a row 3611 of input matrix A and a column 3612 of matrix B can be provided to the systolic array. In one embodiment, multiple sets of operations can be performed each cycle depending on the depth of the systolic array 3604. For each element 3613 of output matrix C that is stored to the local memory 3606, the element-wise operation circuitry 3608 can perform one or more operations, including adding an element of the bias matrix or applying an activation function. The matrix engine 3603 can then return output 3614 from the local memory 3606.

Figure 37:
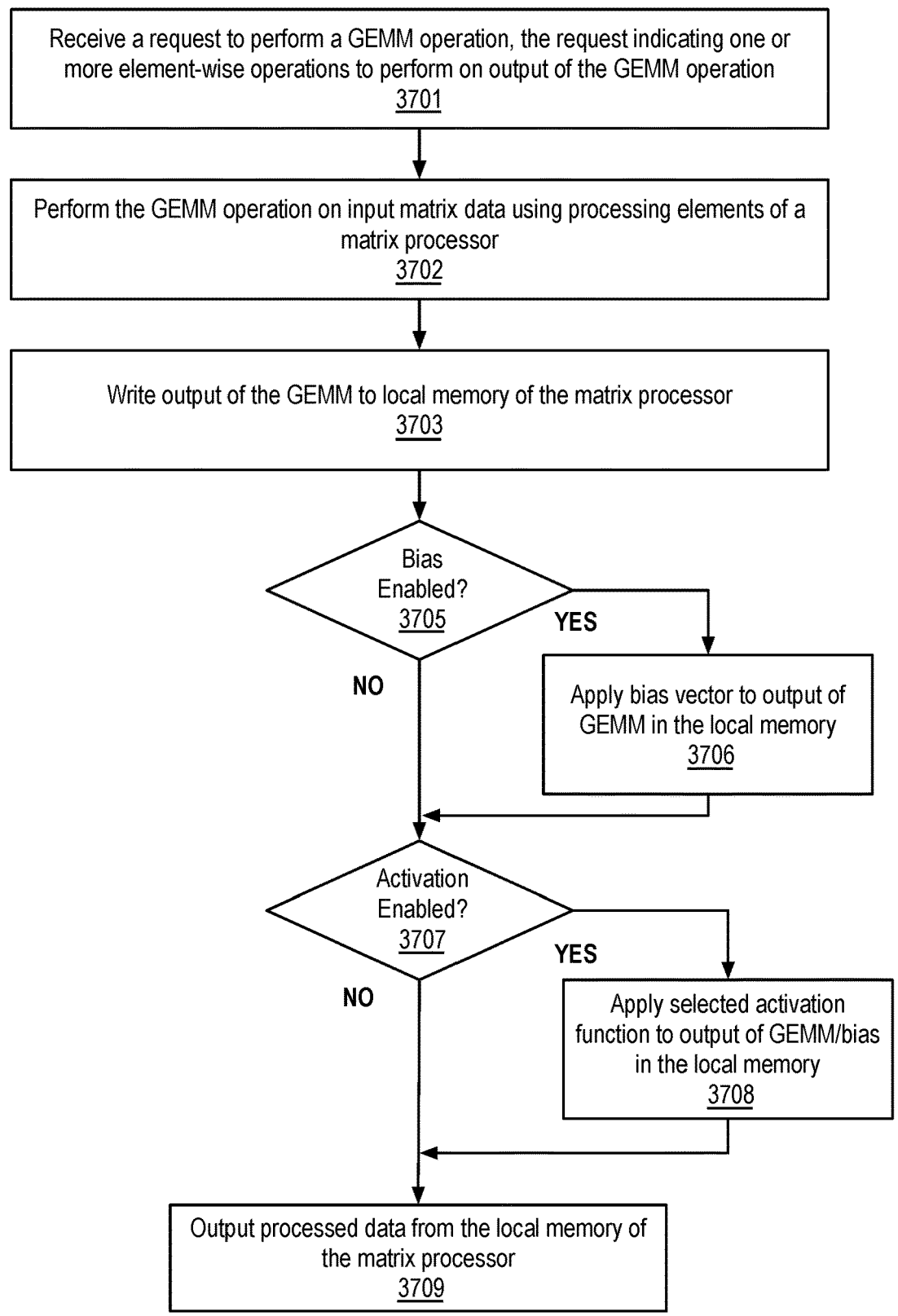
FIG. 37 illustrates a method of fusing element-wise operations, according to an embodiment.

FIG. 37 illustrates a method 3700 of fusing element-wise operations, according to an embodiment. In one embodiment, the method 3700 is implemented within a matrix processor, such as, for example, the matrix engine 3603 described herein. Method 3700 can be used to perform bias operations, apply an activation function, or perform a fused bias and activation function within the hardware of the matrix processing unit.

The method 3700 includes, at the matrix processing unit, to receive a request to perform a GEMM operation via a matrix accelerator, the request indicating one or more element-wise operations to perform on output of the GEMM operation (3701). The matrix processor can then perform the GEMM operation on the input matrix data (3702). The input matrix data can include one or more rows and columns of input matrices and can be performed over one or more clock cycles to generate an output matrix. The matrix processor can then write the output of the GEMM operation to local memory of the matrix processor (3703).

The method 3700 can then determine (3705), based on parameters of the request to perform the GEMM operation or other configuration data, whether a bias operation is to be performed on the data written to the local memory as output from the GEMM operation. If a bias operation is enabled (3705, YES), then the matrix processor can apply a bias vector to the output of the GEMM operation in the local memory. If the bias operation is not enabled (3705, NO), then the matrix accelerator can determine if application of an activation function is enabled (3706). If application of an activation function is enabled (3707, YES), the processing unit can apply a selected activation function to data in local memory (3708). The data in local memory may be the output of the GEMM operation or the output of a bias operation that was performed after the GEMM operation. The activation function to apply can be determined based on parameters of the request to perform the GEMM operation. Those parameters may be determined based on instruction operands or based on the specific instruction that was executed to trigger the request to perform the GEMM operation. As noted above, supported activation functions include but are not limited to RELU, sigmoid, and hard sigmoid. Other activation functions may be supported. If the activation function is not enabled (3707, NO), or after application of the activation function, the matrix processor can output processed data from the local memory of the matrix processor (3709). The processed data can be output to a register file of a graphics core or graphics processor that contains the matrix processor or a specified memory location in local or global memory.

According to the above described techniques, a data processing system may be provided that comprises a system interconnect and a graphics processor coupled with the system interconnect. The graphics processor includes a matrix processor configured to perform a general matrix-matrix multiplication (GEMM) operation in response to an instruction. The matrix processor includes first circuitry to perform the GEMM operation and second circuitry configured to perform an element-wise operation on a result of the GEMM operation before the result is output by the matrix processor. The element-wise operation can be one or more of a bias operation and an activation operation to apply an activation function. The instruction can specify s bias vector for use by the bias operation. The activation function can be a rectified linear unit (RELU) function, a sigmoid function, and/or a hard sigmoid function. The matrix processor can include memory within the matrix processor, the matrix processor can store the result of the GEMM operation in the local memory and perform the element-wise operation on the result in the local memory.

An additional embodiment provides a method to perform the operations of the above described data processing system.

Additional Exemplary Computing Device

Figure 38:
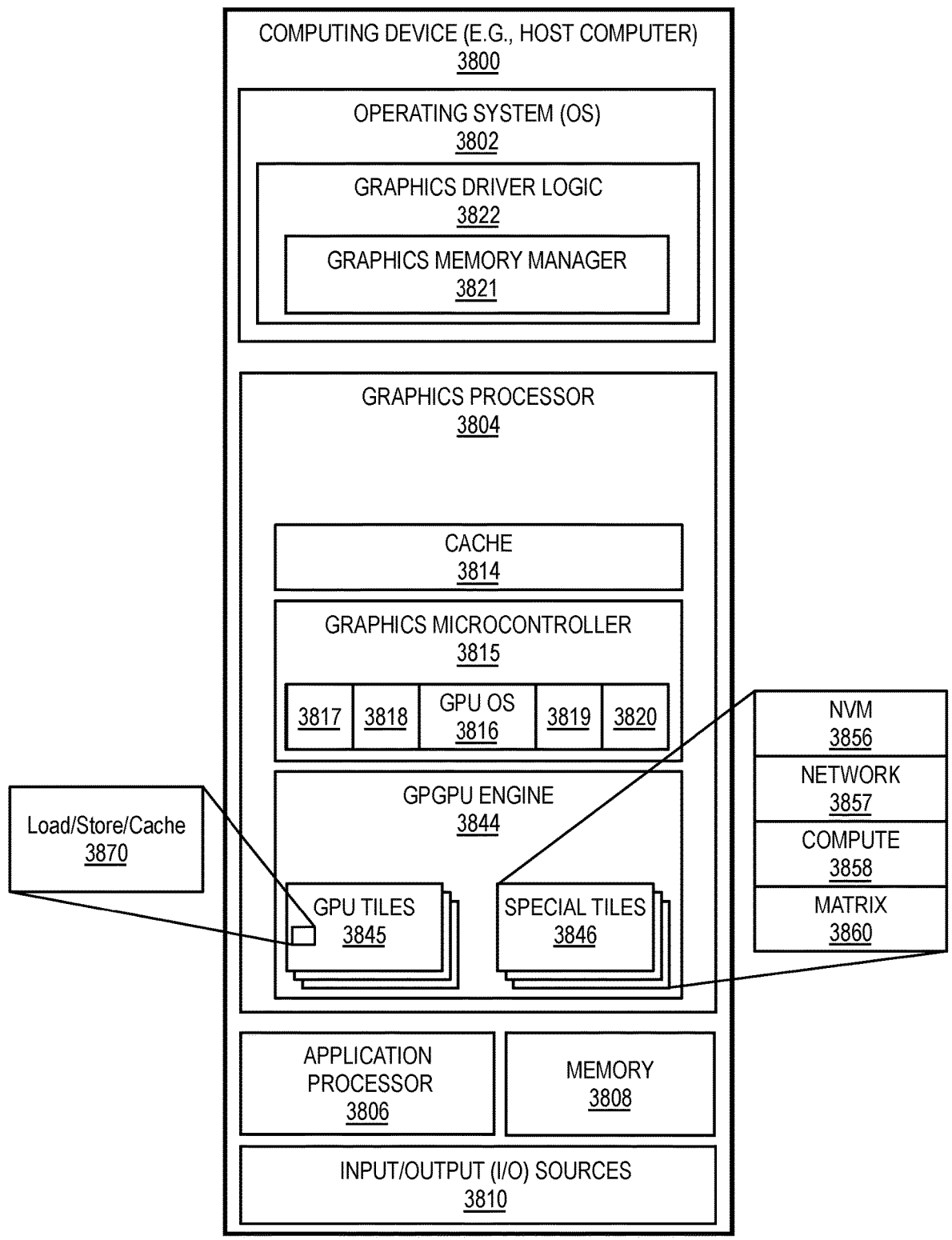
FIG. 38 is a block diagram of a computing device including a graphics processor, according to an embodiment.

FIG. 38 is a block diagram of a computing device 3800 including a graphics processor 3804, according to an embodiment. Versions of the computing device 3800 may be or be included within a communication device such as a set-top box (e.g., Internet-based cable television set-top boxes, etc.), global positioning system (GPS)-based devices, etc. The computing device 3800 may also be or be included within mobile computing devices such as cellular phones, smartphones, personal digital assistants (PDAs), tablet computers, laptop computers, e-readers, smart televisions, television platforms, wearable devices (e.g., glasses, watches, bracelets, smartcards, jewelry, clothing items, etc.), media players, etc. For example, in one embodiment, the computing device 3800 includes a mobile computing device employing an integrated circuit ("IC"), such as system on a chip ("SoC" or "SOC"), integrating various hardware and/or software components of computing device 3800 on a single chip. The computing device 3800 can be a computing device such as the computing system 100 as in of FIG. 1 or processing system 1400 of FIG. 14 and can include components to implement functionality provided by the various embodiments described herein.

The computing device 3800 includes a graphics processor 3804. The graphics processor 3804 represents any graphics processor described herein. In one embodiment, the graphics processor 3804 includes a cache 3814, which can be a single cache or divided into multiple segments of cache memory, including but not limited to any number of L1, L2, L3, or L4 caches, render caches, depth caches, sampler caches, and/or shader unit caches. In one embodiment the cache 3814 may be a last level cache that is shared with the application processor 3806.

In one embodiment the graphics processor 3804 includes a graphics microcontroller 3815 that implements control and scheduling logic for the graphics processor. The graphics microcontroller 3815 may be, for example, any of the graphics microcontrollers 3802A-3802B, 4102A-4102B described herein. The control and scheduling logic can be firmware executed by the graphics microcontroller 3815. The firmware may be loaded at boot by the graphics driver logic 3822. The firmware may also be programmed to an electronically erasable programmable read only memory or loaded from a flash memory device within the graphics microcontroller 3815. The firmware may enable a GPU OS 3816 that includes device management logic 3817, device driver logic 3818, and a scheduler 3819. The GPU OS 3816 may also include a graphics memory manager 3820 that can supplement or replace the graphics memory manager 3821 within the graphics driver logic 3822, and generally enables the offload of various graphics driver functionality from the graphics driver logic 3822 to the GPU OS 3816.

The graphics processor 3804 also includes a GPGPU engine 3844 that includes one or more graphics engine(s), graphics processor cores, and other graphics execution resources as described herein. Such graphics execution resources can be presented in the forms including but not limited to execution units, shader engines, fragment processors, vertex processors, streaming multiprocessors, graphics processor clusters, or any collection of computing resources suitable for the processing of graphics resources or image resources or performing general purpose computational operations in a heterogeneous processor. The processing resources of the GPGPU engine 3844 can be included within multiple tiles of hardware logic connected to a substrate, as illustrated in FIG. 24B-24D. The GPGPU engine 3844 can include GPU tiles 3845 that include graphics processing and execution resources, caches, samplers, etc. The GPU tiles 3845 may also include local volatile memory or can be coupled with one or more memory tiles, for example, as shown in FIG. 16B-16C. In one embodiment, the GPU tiles 3845 includes clusters of graphics processing cores, where each graphics processing core can include load/store/cache circuitry 3870 to perform memory access with instruction-based cache attribute control, as described herein.

The GPGPU engine 3844 can also include and one or more special tiles 3846 that include, for example, a non-volatile memory tile 3856, a network processor tile 3857, and/or a general-purpose compute tile 3858. The GPGPU engine 3844 also includes a matrix multiply accelerator 3860. The general-purpose compute tile 3858 may also include logic to accelerate matrix multiplication operations. The non-volatile memory tile 3856 can include non-volatile memory cells and controller logic. The controller logic of the non-volatile memory tile 3856 may be managed by the device management logic 3817 or the device driver logic 3818. The network processor tile 3857 can include network processing resources that are coupled to a physical interface within the input/output (I/O) sources 3810 of the computing device 3800. The network processor tile 3857 may be managed by one or more of device management logic 3817 or the device driver logic 3818. Any of the GPU tiles 3845 or one or more special tiles 3846 may include an active base with multiple stacked chiplets, as described herein.

The matrix multiply accelerator 3860 is a modular scalable sparse matrix multiply accelerator. The matrix multiply accelerator 3860 can includes multiple processing paths, with each processing path including multiple pipeline stages. Each processing path can execute a separate instruction. In various embodiments, the matrix multiply accelerator 3860 can have architectural features of any one of more of the matrix multiply accelerators described herein. For example, in one embodiment, the matrix multiply accelerator 3860 is a four-deep systolic array with a feedback loop that is configurable to operate with a multiple of four number of logical stages (e.g., four, eight, twelve, sixteen, etc.). In one embodiment the matrix multiply accelerator 3860 includes one or more instances of a two-path matrix multiply accelerator with a four stage pipeline or a four-path matrix multiply accelerator with a two stage pipeline. The matrix multiply accelerator 3860 can be configured to operate only on non-zero values of at least one input matrix. Operations on entire columns or submatrices can be bypassed where block sparsity is present. The matrix multiply accelerator 3860 can also include any logic based on any combination of these embodiments, and particularly include logic to enable support for random sparsity, according to embodiments described herein.

As illustrated, in one embodiment, and in addition to the graphics processor 3804, the computing device 3800 may further include any number and type of hardware components and/or software components, including, but not limited to an application processor 3806, memory 3808, and input/output (I/O) sources 3810. The application processor 3806 can interact with a hardware graphics pipeline, as illustrated with reference to FIG. 3A, to share graphics pipeline functionality. Processed data is stored in a buffer in the hardware graphics pipeline and state information is stored in memory 3808. The resulting data can be transferred to a display controller for output via a display device. The display device may be of various types, such as Cathode Ray Tube (CRT), Thin Film Transistor (TFT), Liquid Crystal Display (LCD), Organic Light Emitting Diode (OLED) array, etc., and may be configured to display information to a user via a graphical user interface.

The application processor 3806 can include one or processors, such as processor(s) 102 of FIG. 1 and may be the central processing unit (CPU) that is used at least in part to execute an operating system (OS) 3802 for the computing device 3800. The OS 3802 can serve as an interface between hardware and/or physical resources of the computing device 3800 and one or more users. The OS 3802 can include driver logic for various hardware devices in the computing device 3800. The driver logic can include graphics driver logic 3822, which can include the user mode graphics driver 2326 and/or kernel mode graphics driver 2329 of FIG. 23. The graphics driver logic can include a graphics memory manager 3821 to manage a virtual memory address space for the graphics processor 3804.

It is contemplated that in some embodiments the graphics processor 3804 may exist as part of the application processor 3806 (such as part of a physical CPU package) in which case, at least a portion of the memory 3808 may be shared by the application processor 3806 and graphics processor 3804, although at least a portion of the memory 3808 may be exclusive to the graphics processor 3804, or the graphics processor 3804 may have a separate store of memory. The memory 3808 may comprise a pre-allocated region of a buffer (e.g., framebuffer); however, it should be understood by one of ordinary skill in the art that the embodiments are not so limited, and that any memory accessible to the lower graphics pipeline may be used. The memory 3808 may include various forms of random-access memory (RAM) (e.g., SDRAM, SRAM, etc.) comprising an application that makes use of the graphics processor 3804 to render a desktop or 3D graphics scene. A memory controller, such as memory controller 1416 of FIG. 14 or any other memory controller described herein, may access data in the memory 3808 and forward it to graphics processor 3804 for graphics pipeline processing. The memory 3808 may be made available to other components within the computing device 3800. For example, any data (e.g., input graphics data) received from various I/O sources 3810 of the computing device 3800 can be temporarily queued into memory 3808 prior to their being operated upon by one or more processor(s) (e.g., application processor 3806) in the implementation of a software program or application. Similarly, data that a software program determines should be sent from the computing device 3800 to an outside entity through one of the computing system interfaces, or stored into an internal storage element, is often temporarily queued in memory 3808 prior to its being transmitted or stored.

The I/O sources can include devices such as touchscreens, touch panels, touch pads, virtual or regular keyboards, virtual or regular mice, ports, connectors, network devices, or the like, and can attach via a platform controller hub 1430 as referenced in FIG. 14. Additionally, the I/O sources 3810 may include one or more I/O devices that are implemented for transferring data to and/or from the computing device 3800 (e.g., a networking adapter); or, for a large-scale non-volatile storage within the computing device 3800 (e.g., SSD/HDD). User input devices, including alphanumeric and other keys, may be used to communicate information and command selections to graphics processor 3804. Another type of user input device is cursor control, such as a mouse, a trackball, a touchscreen, a touchpad, or cursor direction keys to communicate direction information and command selections to GPU and to control cursor movement on the display device. Camera and microphone arrays of the computing device 3800 may be employed to observe gestures, record audio and video and to receive and transmit visual and audio commands.

The I/O sources 3810 can include one or more network interfaces. The network interfaces may include associated network processing logic and/or be coupled with the network processor tile 3857. The one or more network interface can provide access to a LAN, a wide area network (WAN), a metropolitan area network (MAN), a personal area network (PAN), Bluetooth, a cloud network, a cellular or mobile network (e.g., $3^{rd}$ Generation (3G), $4^{th}$ Generation (4G), $5^{th}$ Generation (5G), etc.), an intranet, the Internet, etc. Network interface(s) may include, for example, a wireless network interface having one or more antenna(e). Network interface(s) may also include, for example, a wired network interface to communicate with remote devices via network cable, which may be, for example, an Ethernet cable, a coaxial cable, a fiber optic cable, a serial cable, or a parallel cable.

Network interface(s) may provide access to a LAN, for example, by conforming to IEEE 802.11 standards, and/or the wireless network interface may provide access to a personal area network, for example, by conforming to Bluetooth standards. Other wireless network interfaces and/or protocols, including previous and subsequent versions of the standards, may also be supported. In addition to, or instead of, communication via the wireless LAN standards, network interface(s) may provide wireless communication using, for example, Time Division, Multiple Access (TDMA) protocols, Global Systems for Mobile Communications (GSM) protocols, Code Division, Multiple Access (CDMA) protocols, and/or any other type of wireless communications protocols.

It is to be appreciated that a lesser or more equipped system than the example described above may be preferred for certain implementations. Therefore, the configuration of the computing devices described herein may vary from implementation to implementation depending upon numerous factors, such as price constraints, performance requirements, technological improvements, or other circumstances. Examples include (without limitation) a mobile device, a personal digital assistant, a mobile computing device, a smartphone, a cellular telephone, a handset, a one-way pager, a two-way pager, a messaging device, a computer, a personal computer (PC), a desktop computer, a laptop computer, a notebook computer, a handheld computer, a tablet computer, a server, a server array or server farm, a web server, a network server, an Internet server, a work station, a mini-computer, a main frame computer, a supercomputer, a network appliance, a web appliance, a distributed computing system, multiprocessor systems, processor-based systems, consumer electronics, programmable consumer electronics, television, digital television, set top box, wireless access point, base station, subscriber station, mobile subscriber center, radio network controller, router, hub, gateway, bridge, switch, machine, or combinations thereof.

Embodiments may be provided, for example, as a computer program product which may include one or more machine-readable media having stored thereon machine-executable instructions that, when executed by one or more machines such as a computer, network of computers, or other electronic devices, may result in the one or more machines carrying out operations in accordance with embodiments described herein. A machine-readable medium may include, but is not limited to, floppy diskettes, optical disks, CD-ROMs (Compact Disc-Read Only Memories), and magneto-optical disks, ROMs, RAMs, EPROMs (Erasable Programmable Read Only Memories), EEPROMs (Electrically Erasable Programmable Read Only Memories), magnetic or optical cards, flash memory, or other type of media/machine-readable medium suitable for storing machine-executable instructions.

Moreover, embodiments may be downloaded as a computer program product, wherein the program may be transferred from a remote computer (e.g., a server) to a requesting computer (e.g., a client) by way of one or more data signals embodied in and/or modulated by a carrier wave or other propagation medium via a communication link (e.g., a modem and/or network connection).

Throughout the document, term "user" may be interchangeably referred to as "viewer", "observer", "person", "individual", "end-user", and/or the like. It is to be noted that throughout this document, terms like "graphics domain" may be referenced interchangeably with "graphics processing unit", "graphics processor", or simply "GPU" and similarly, "CPU domain" or "host domain" may be referenced interchangeably with "computer processing unit", "application processor", or simply "CPU".

It is to be noted that terms like "node", "computing node", "server", "server device", "cloud computer", "cloud server", "cloud server computer", "machine", "host machine", "device", "computing device", "computer", "computing system", and the like, may be used interchangeably throughout this document. It is to be further noted that terms like "application", "software application", "program", "software program", "package", "software package", and the like, may be used interchangeably throughout this document. Also, terms like "job", "input", "request", "message", and the like, may be used interchangeably throughout this document.

It is contemplated that terms like "request", "query", "job", "work", "work item", and "workload" may be referenced interchangeably throughout this document. Similarly, an "application" or "agent" may refer to or include a computer program, a software application, a game, a workstation application, etc., offered through an application programming interface (API), such as a free rendering API, such as Open Graphics Library (OpenGL®), Open Computing Language (OpenCL®), CUDA®, DirectX® 11, DirectX® 12, etc., where "dispatch" may be interchangeably referred to as "work unit" or "draw" and similarly, "application" may be interchangeably referred to as "workflow" or simply "agent". For example, a workload, such as that of a three-dimensional (3D) game, may include and issue any number and type of "frames" where each frame may represent an image (e.g., sailboat, human face). Further, each frame may include and offer any number and type of work units, where each work unit may represent a part (e.g., mast of sailboat, forehead of human face) of the image (e.g., sailboat, human face) represented by its corresponding frame. However, for the sake of consistency, each item may be referenced by a single term (e.g., "dispatch", "agent", etc.) throughout this document.

References herein to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether explicitly described.

In the various embodiments described above, unless specifically noted otherwise, disjunctive language such as the phrase "at least one of A, B, or C" is intended to be understood to mean either A, B, or C, or any combination thereof (e.g., A, B, and/or C). As such, disjunctive language is not intended to, nor should it be understood to, imply that a given embodiment requires at least one of A, at least one of B, or at least one of C to each be present. Similarly, items listed in the form of "at least one of A, B, or C" can mean (A); (B); (C): (A and B); (B and C); or (A, B, and C).

In some embodiments, terms like "display screen" and "display surface" may be used interchangeably referring to the visible portion of a display device while the rest of the display device may be embedded into a computing device, such as a smartphone, a wearable device, etc. It is contemplated and to be noted that embodiments are not limited to any particular computing device, software application, hardware component, display device, display screen or surface, protocol, standard, etc. For example, embodiments may be applied to and used with any number and type of real-time applications on any number and type of computers, such as desktops, laptops, tablet computers, smartphones, head-mounted displays and other wearable devices, and/or the like. Further, for example, rendering scenarios for efficient performance using this novel technique may range from simple scenarios, such as desktop compositing, to complex scenarios, such as 3D games, augmented reality applications, etc.

The foregoing description and drawings are to be regarded in an illustrative rather than a restrictive sense. Persons skilled in the art will understand that various modifications and changes may be made to the embodiments described herein without departing from the broader spirit and scope of the features set forth in the appended claims.

Intersection—An intersection instruction performs a ray-primitive intersection test and outputs a result.
 Per-primitive Bounding box Construction—This instruction builds a bounding box around a given primitive or group of primitives (e.g., when building a new BVH or other acceleration data structure).
 Miss—Indicates that a ray misses all geometry within a scene, or specified region of a scene.
 Visit—Indicates the child volumes a ray will traverse.
 Exceptions—Includes various types of exception handlers (e.g., invoked for various error conditions).

In one embodiment the ray tracing cores 372 may be adapted to accelerate general-purpose compute operations that can be accelerated using computational techniques that are analogous to ray intersection tests. A compute framework can be provided that enables shader programs to be compiled into low level instructions and/or primitives that perform general-purpose compute operations via the ray tracing cores. Exemplary computational problems that can benefit from compute operations performed on the ray tracing cores 372 include computations involving beam, wave, ray, or particle propagation within a coordinate space. Interactions associated with that propagation can be computed relative to a geometry or mesh within the coordinate space. For example, computations associated with electromagnetic signal propagation through an environment can be accelerated via the use of instructions or primitives that are executed via the ray tracing cores. Diffraction and reflection of the signals by objects in the environment can be computed as direct ray-tracing analogies.

Ray tracing cores 372 can also be used to perform computations that are not directly analogous to ray tracing. For example, mesh projection, mesh refinement, and volume sampling computations can be accelerated using the ray tracing cores 372. Generic coordinate space calculations, such as nearest neighbor calculations can also be performed. For example, the set of points near a given point can be discovered by defining a bounding box in the coordinate space around the point. BVH and ray probe logic within the ray tracing cores 372 can then be used to determine the set of point intersections within the bounding box. The intersections constitute the origin point and the nearest neighbors to that origin point. Computations that are performed using the ray tracing cores 372 can be performed in parallel with computations performed on the graphics cores 372 and tensor cores 371. A shader compiler can be configured to compile a compute shader or other general-purpose graphics processing program into low level primitives that can be parallelized across the graphics cores 370, tensor cores 371, and ray tracing cores 372.

Techniques for GPU to Host Processor Interconnection

FIG. 4A illustrates an exemplary architecture in which a plurality of GPUs 410-413, e.g., such as the parallel processors 200 shown in FIG. 2A, are communicatively coupled to a plurality of multi-core processors 405-406 over high-speed links 440A-440D (e.g., buses, point-to-point interconnects, etc.). The high-speed links 440A-440D may support a communication throughput of 4 GB/s, 30 GB/s, 80 GB/s or higher, depending on the implementation. Various interconnect protocols may be used including, but not limited to, PCIe 4.0 or 5.0 and NVLink 2.0. However, the underlying principles described herein are not limited to any particular communication protocol or throughput.

Two or more of the GPUs 410-413 may be interconnected over high-speed links 442A-442B, which may be implemented using the same or different protocols/links than those used for high-speed links 440A-440D. Similarly, two or more of the multi-core processors 405-406 may be connected over high-speed link 443 which may be symmetric multi-processor (SMP) buses operating at 20 GB/s, 30 GB/s, 120 GB/s or lower or higher speeds. Alternatively, all communication between the various system components shown in FIG. 4A may be accomplished using the same protocols/links (e.g., over a common interconnection fabric). As mentioned, however, the underlying principles described herein are not limited to any particular type of interconnect technology.

Each of multi-core processor 405 and multi-core processor 406 may be communicatively coupled to a processor memory 401-402, via memory interconnects 430A-430B, respectively, and each GPU 410-413 is communicatively coupled to GPU memory 420-423 over GPU memory interconnects 450A-450D, respectively. The memory interconnects 430A-430B and 450A-450D may utilize the same or different memory access technologies. By way of example, and not limitation, the processor memories 401-402 and GPU memories 420-423 may be volatile memories such as dynamic random-access memories (DRAMs) (including stacked DRAMs), Graphics DDR SDRAM (GDDR) (e.g., GDDR5, GDDR6, GDDR7), or High Bandwidth Memory (HBM) and/or may be non-volatile memories such as 3D XPoint/Optane or Nano-Ram. For example, some portion of the memories may be volatile memory and another portion may be non-volatile memory (e.g., using a two-level memory (2LM) hierarchy). A memory subsystem as described herein may be compatible with a number of memory technologies, such as Double Data Rate versions released by JEDEC (Joint Electronic Device Engineering Council).

As described below, although the various processors 405-406 and GPUs 410-413 may be physically coupled to a particular memory 401-402, 420-423, respectively, a unified memory architecture may be implemented in which the same virtual system address space (also referred to as the "effective address" space) is distributed among all of the various physical memories. For example, processor memories 401-402 may each comprise 64 GB of the system memory address space and GPU memories 420-423 may each comprise 32 GB of the system memory address space (resulting in a total of 256 GB addressable memory in this example).

FIG. 4B illustrates additional optional details for an interconnection between a multi-core processor 407 and a graphics acceleration module 446. The graphics acceleration module 446 may include one or more GPU chips integrated on a line card which is coupled to the processor 407 via the high-speed link 440. Alternatively, the graphics acceleration module 446 may be integrated on the same package or chip as the processor 407.

The illustrated processor 407 includes a plurality of cores 460A-460D, each with a translation lookaside buffer 461A-461D and one or more caches 462A-462D. The cores may include various other components for executing instructions and processing data which are not illustrated to avoid obscuring the underlying principles of the components described herein (e.g., instruction fetch units, branch prediction units, decoders, execution units, reorder buffers, etc.). The caches 462A-462D may comprise level 1 (L1) and level 2 (L2) caches. In addition, one or more shared caches 456 may be included in the caching hierarchy and shared by sets of the cores 460A-460D. For example, one embodiment of the processor 407 includes 24 cores, each with its own L1 cache, twelve shared L2 caches, and twelve shared L3 caches. In this embodiment, one of the L2 and L3 caches are shared by two adjacent cores. The processor 407 and the graphics accelerator integration module 446 connect with system memory 441, which may include processor memories 401-402.

Coherency is maintained for data and instructions stored in the various caches 462A-462D, 456 and system memory 441 via inter-core communication over a coherence bus 464. For example, each cache may have cache coherency logic/circuitry associated therewith to communicate to over the coherence bus 464 in response to detected reads or writes to particular cache lines. In one implementation, a cache snooping protocol is implemented over the coherence bus 464 to snoop cache accesses. Cache snooping/coherency techniques are well understood by those of skill in the art and will not be described in detail here to avoid obscuring the underlying principles described herein.

A proxy circuit 425 may be provided that communicatively couples the graphics acceleration module 446 to the coherence bus 464, allowing the graphics acceleration module 446 to participate in the cache coherence protocol as a peer of the cores. In particular, an interface 435 provides connectivity to the proxy circuit 425 over high-speed link 440 (e.g., a PCIe bus, NVLink, etc.) and an interface 437 connects the graphics acceleration module 446 to the high-speed link 440.

In one implementation, an accelerator integration circuit 436 provides cache management, memory access, context management, and interrupt management services on behalf of a plurality of graphics processing engines 431, 432, N of the graphics acceleration module 446. The graphics processing engines 431, 432, N may each comprise a separate graphics processing unit (GPU). Alternatively, the graphics processing engines 431, 432, N may comprise different types of graphics processing engines within a GPU such as graphics execution units, media processing engines (e.g., video encoders/decoders), samplers, and blit engines. In other words, the graphics acceleration module may be a GPU with a plurality of graphics processing engines 431-432, N or the graphics processing engines 431-432, N may be individual GPUs integrated on a common package, line card, or chip.

The accelerator integration circuit 436 may include a memory management unit (MMU) 439 for performing various memory management functions such as virtual-to-physical memory translations (also referred to as effective-to-real memory translations) and memory access protocols for accessing system memory 441. The MMU 439 may also include a translation lookaside buffer (TLB) (not shown) for caching the virtual/effective to physical/real address translations. In one implementation, a cache 438 stores commands and data for efficient access by the graphics processing engines 431, 432, N. The data stored in cache 438 and graphics memories 433-434, M may be kept coherent with the core caches 462A-462D, 456 and system memory 441. As mentioned, this may be accomplished via proxy circuit 425 which takes part in the cache coherency mechanism on behalf of cache 438 and memories 433-434, M (e.g., sending updates to the cache 438 related to modifications/accesses of cache lines on processor caches 462A-462D, 456 and receiving updates from the cache 438).

A set of registers 445 store context data for threads executed by the graphics processing engines 431-432, N and a context management circuit 448 manages the thread contexts. For example, the context management circuit 448 may perform save and restore operations to save and isolated from the other software and the operating system itself. The isolated nature of containers provides several benefits. First, the software in a container will run the same in different environments. For example, a container that includes PHP and MySQL can run identically on both a Linux® computer and a Windows® machine. Second, containers provide added security since the software will not affect the host operating system. While an installed application may alter system settings and modify resources, such as the Windows registry, a container can only modify settings within the container.

Thus, the accelerator integration circuit 436 acts as a bridge to the system for the graphics acceleration module 446 and provides address translation and system memory cache services. In one embodiment, to facilitate the bridging functionality, the accelerator integration circuit 436 may also include shared I/O 497 (e.g., PCIe, USB, or others) and hardware to enable system control of voltage, clocking, performance, thermals, and security. The shared I/O 497 may utilize separate physical connections or may traverse the high-speed link 440. In addition, the accelerator integration circuit 436 may provide virtualization facilities for the host processor to manage virtualization of the graphics processing engines, interrupts, and memory management.

Because hardware resources of the graphics processing engines 431-432, N are mapped explicitly to the real address space seen by the host processor 407, any host processor can address these resources directly using an effective address value. One optional function of the accelerator integration circuit 436 is the physical separation of the graphics processing engines 431-432, N so that they appear to the system as independent units.

One or more graphics memories 433-434, M may be coupled to each of the graphics processing engines 431-432, N, respectively. The graphics memories 433-434, M store instructions and data being processed by each of the graphics processing engines 431-432, N. The graphics memories 433-434, M may be volatile memories such as DRAMs (including stacked DRAMs), GDDR memory (e.g., GDDR5, GDDR6, GDDR7), or HBM, and/or may be non-volatile memories such as 3D XPoint/Optane, Samsung Z-NAND, or Nano-Ram.

To reduce data traffic over the high-speed link 440, biasing techniques may be used to ensure that the data stored in graphics memories 433-434, M is data which will be used most frequently by the graphics processing engines 431-432, N and preferably not used by the cores 460A-460D (at least not frequently). Similarly, the biasing mechanism attempts to keep data needed by the cores (and preferably not the graphics processing engines 431-432, N) within the caches 462A-462D, 456 of the cores and system memory 441.

According to a variant shown in FIG. 4C the accelerator integration circuit 436 is integrated within the processor 407. The graphics processing engines 431-432, N communicate directly over the high-speed link 440 to the accelerator integration circuit 436 via interface 437 and interface 435 (which, again, may be utilize any form of bus or interface protocol). The accelerator integration circuit 436 may perform the same operations as those described with respect to FIG. 4B, but potentially at a higher throughput given its close proximity to the coherence bus 464 and caches 462A-462D, 456.

The embodiments described may support different programming models including a dedicated-process programming model (no graphics acceleration module virtualization) and shared programming models (with virtualization). The latter may include programming models which are controlled by the accelerator integration circuit 436 and programming models which are controlled by the graphics acceleration module 446.

In the embodiments of the dedicated process model, graphics processing engines 431, 432, . . . N may be dedicated to a single application or process under a single operating system. The single application can funnel other application requests to the graphics engines 431, 432, . . . N, providing virtualization within a VM/partition.

In the dedicated-process programming models, the graphics processing engines 431, 432, N, may be shared by multiple VM/application partitions. The shared models require a system hypervisor to virtualize the graphics processing engines 431-432, N to allow access by each operating system. For single-partition systems without a hypervisor, the graphics processing engines 431-432, N are owned by the operating system. In both cases, the operating system can virtualize the graphics processing engines 431-432, N to provide access to each process or application.

For the shared programming model, the graphics acceleration module 446 or an individual graphics processing engine 431-432, N selects a process element using a process handle. The process elements may be stored in system memory 441 and be addressable using the effective address to real address translation techniques described herein. The process handle may be an implementation-specific value provided to the host process when registering its context with the graphics processing engine 431-432, N (that is, calling system software to add the process element to the process element linked list). The lower 16-bits of the process handle may be the offset of the process element within the process element linked list.

FIG. 4D illustrates an exemplary accelerator integration slice 490. As used herein, a "slice" comprises a specified portion of the processing resources of the accelerator integration circuit engine can be enabled. Exemplary registers that may be initialized by the hypervisor are shown in Table 1.

TABLE 1

| | Hypervisor Initialized Registers |
|---|---|
| 1 | Slice Control Register |
| 2 | Real Address (RA) Scheduled Processes Area Pointer |
| 3 | Authority Mask Override Register |
| 4 | Interrupt Vector Table Entry Offset |
| 5 | Interrupt Vector Table Entry Limit |
| 6 | State Register |
| 7 | Logical Partition ID |
| 8 | Real address (RA) Hypervisor Accelerator Utilization Record Pointer |
| 9 | Storage Description Register |

Exemplary registers that may be initialized by the operating system are shown in Table 2.

TABLE 2

| | Operating System Initialized Registers |
|---|---|
| 1 | Process and Thread Identification |
| 2 | Effective Address (EA) Context Save/Restore Pointer |
| 3 | Virtual Address (VA) Accelerator Utilization Record Pointer |
| 4 | Virtual Address (VA) Storage Segment Table Pointer |
| 5 | Authority Mask |
| 6 | Work descriptor |

Each WD 484 may be specific to a particular graphics acceleration module 446 and/or graphics processing engine 431-432, N. It contains all the information a graphics processing engine 431-432, N requires to do its work or it can be a pointer to a memory location where the application has set up a command queue of work to be completed.

FIG. 4E illustrates additional optional details of a shared model. It includes a hypervisor real address space 498 in which a process element list 499 is stored. The hypervisor real address space 498 is accessible via a hypervisor 496 which virtualizes the graphics acceleration module engines for the operating system 495.

The shared programming models allow for all or a subset of processes from all or a subset of partitions in the system to use a graphics acceleration module 446. There are two programming models where the graphics acceleration module 446 is shared by multiple processes and partitions: time-sliced shared and graphics directed shared.

In this model, the system hypervisor 496 owns the graphics acceleration module 446 and makes its function available to all operating systems 495. For a graphics acceleration module 446 to support virtualization by the system hypervisor 496, the graphics acceleration module 446 may adhere to the following requirements: 1) An application's job request must be autonomous (that is, the state does not need to be maintained between jobs), or the graphics acceleration module 446 must provide a context save and restore mechanism. 2) An application's job request is guaranteed by the graphics acceleration module 446 to complete in a specified amount of time, including any translation faults, or the graphics acceleration module 446 provides the ability to preempt the processing of the job. 3) The graphics acceleration module 446 must be guaranteed fairness between processes when operating in the directed shared programming model.

For the shared model, the application 480 may be required to make an operating system 495 system call with a graphics acceleration module 446 type, a work descriptor (WD), an authority mask register (AMR) value, and a context save/restore area pointer (CSRP). The graphics acceleration module 446 type describes the targeted acceleration function for the system call. The graphics acceleration module 446 type may be a system-specific value. The WD is formatted specifically for the graphics acceleration module 446 and can be in the form of a graphics acceleration module 446 command, an effective address pointer to a user-defined structure, an effective address pointer to a queue of commands, or any other data structure to describe the work to be done by the graphics acceleration module 446. In one embodiment, the AMR value is the AMR state to use for the current process. The value passed to the operating system is similar to an application setting the AMR. If the accelerator integration circuit 436 and graphics acceleration module 446 implementations do not support a User Authority Mask Override Register (UAMOR), the operating system may apply the current UAMOR value to the AMR value before passing the AMR in the hypervisor call. The hypervisor 496 may optionally apply the current Authority Mask Override Register (AMOR) value before placing the AMR into the process element 483. The CSRP may be one of the registers 445 containing the effective address of an area in the application's address space 482 for the graphics acceleration module 446 to save and restore the context state. This pointer is optional if no state is required to be saved between jobs or when a job is preempted. The context save/restore area may be pinned system memory.

Upon receiving the system call, the operating system 495 may verify that the application 480 has registered and been given the authority to use the graphics acceleration module 446. The operating system 495 then calls the hypervisor 496 with the information shown in Table 3.

TABLE 3

| | OS to Hypervisor Call Parameters |
|---|---|
| 1 | A work descriptor (WD) |
| 2 | An Authority Mask Register (AMR) value (potentially masked). |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | The virtual address of the storage segment table pointer (SSTP) |
| 7 | A logical interrupt service number (LISN) |

Upon receiving the hypervisor call, the hypervisor 496 verifies that the operating system 495 has registered and been given the authority to use the graphics acceleration module 446. The hypervisor 496 then puts the process element 483 into the process element linked list for the corresponding graphics acceleration module 446 type. The process element may include the information shown in Table 4.

TABLE 4

Process Element Information

| | |
|---|---|
| 1 | A work descriptor (WD) |
| 2 | An Authority Mask Register (AMR) value (potentially masked). |
| 3 | An effective address (EA) Context Save/Restore Area Pointer (CSRP) |
| 4 | A process ID (PID) and optional thread ID (TID) |
| 5 | A virtual address (VA) accelerator utilization record pointer (AURP) |
| 6 | The virtual address of the storage segment table pointer (SSTP) |
| 7 | A logical interrupt service number (LISN) |
| 8 | Interrupt vector table, derived from the hypervisor call parameters. |
| 9 | A state register (SR) value |
| 10 | A logical partition ID (LPID) |
| 11 | A real address (RA) hypervisor accelerator utilization record pointer |
| 12 | The Storage Descriptor Register (SDR) |

The hypervisor may initialize a plurality of accelerator intergration slice 490 register 445.

As illustrated in FIG. 4F, in one optional implementation a unified memory addressable via a common virtual memory address space used to access the physical processor memories 401-402 and GPU memories 420-423 is employed. In this implementation, operations executed on the GPUs 410-413 utilize the same virtual/effective memory address space to access the processors memories 401-402 and vice versa, thereby simplifying programmability. A first portion of the virtual/effective address space may be allocated to the processor memory 401, a second portion to the second processor memory 402, a third portion to the GPU memory 420, and so on. The entire virtual/effective memory space (sometimes referred to as the effective address space) may thereby be distributed across each of the processor memories 401-402 and GPU memories 420-423, allowing any processor or GPU to access any physical memory with a virtual address mapped to that memory.

Bias/coherence management circuitry 494A-494E within one or more of the MMUs 439A-439E may be provided that ensures cache coherence between the caches of the host processors (e.g., 405) and the GPUs 410-413 and implements biasing techniques indicating the physical memories in which certain types of data should be stored. While multiple instances of bias/coherence management circuitry 494A-494E are illustrated in FIG. 4F, the bias/coherence circuitry may be implemented within the MMU of one or more host processors 405 and/or within the accelerator integration circuit 436.

The GPU-attached memory 420-423 may be mapped as part of system memory and accessed using shared virtual memory (SVM) technology, but without suffering the typical performance drawbacks associated with full system cache coherence. The ability to GPU-attached memory 420-423 to be accessed as system memory without onerous cache coherence overhead provides a beneficial operating environment for GPU offload. This arrangement allows the host processor 405 software to setup operands and access computation results, without the overhead of tradition I/O DMA data copies. Such traditional copies involve driver calls, interrupts and memory mapped I/O (MMIO) accesses that are all inefficient relative to simple memory accesses. At the same time, the ability to access GPU attached memory 420-423 without cache coherence overheads can be critical to the execution time of an offloaded computation. In cases with substantial streaming write memory traffic, for example, cache coherence overhead can significantly reduce the effective write bandwidth seen by a GPU 410-413. The efficiency of operand setup, the efficiency of results access, and the efficiency of GPU computation all play a role in determining the effectiveness of GPU offload.

A selection between GPU bias and host processor bias may be driven by a bias tracker data structure. A bias table may be used, for example, which may be a page-granular structure (i.e., controlled at the granularity of a memory page) that includes 1 or 2 bits per GPU-attached memory page. The bias table may be implemented in a stolen memory range of one or more GPU-attached memories 420-423, with or without a bias cache in the GPU 410-413 (e.g., to cache frequently/recently used entries of the bias table). Alternatively, the entire bias table may be maintained within the GPU.

In one implementation, the bias table entry associated with each access to the GPU-attached memory 420-423 is accessed prior the actual access to the GPU memory, causing the following operations. First, local requests from the GPU 410-413 that find their page in GPU bias are forwarded directly to a corresponding GPU memory 420-423. Local requests from the GPU that find their page in host bias are forwarded to the processor 405 (e.g., over a high-speed link as discussed above). Optionally, requests from the processor 405 that find the requested page in host processor bias complete the request like a normal memory read. Alternatively, requests directed to a GPU-biased page may be forwarded to the GPU 410-413. The GPU may then transition the page to a host processor bias if it is not currently using the page.

The bias state of a page can be changed either by a software-based mechanism, a hardware-assisted software-based mechanism, or, for a limited set of cases, a purely hardware-based mechanism.

One mechanism for changing the bias state employs an API call (e.g., OpenCL), which, in turn, calls the GPU's device driver which, in turn, sends a message (or enqueues a command descriptor) to the GPU directing it to change the bias state and, for some transitions, perform a cache flushing operation in the host. The cache flushing operation is required for a transition from host processor 405 bias to GPU bias but is not required for the opposite transition.

Cache coherency may be maintained by temporarily rendering GPU-biased pages uncacheable by the host processor 405. To access these pages, the processor 405 may request access from the GPU 410 which may or may not grant access right away, depending on the implementation. Thus, to reduce communication between the host processor 405 and GPU 410 it is beneficial to ensure that GPU-biased pages are those which are required by the GPU but not the host processor 405 and vice versa.

Graphics Processing Pipeline

FIG. 5 illustrates a graphics processing pipeline 500. A graphics multiprocessor, such as graphics multiprocessor 234 as in FIG. 2D, graphics multiprocessor 325 of FIG. 3A, graphics multiprocessor 350 of FIG. 3B can implement the illustrated graphics processing pipeline 500. The graphics multiprocessor can be included within the parallel processing subsystems as described herein, such as the parallel processor 200 of FIG. 2A, which may be related to the parallel processor(s) 112 of FIG. 1 and may be used in place of one of those. The various parallel processing systems can implement the graphics processing pipeline 500 via one or more instances of the parallel processing unit (e.g., parallel processing unit 202 of FIG. 2A) as described herein. For example, a shader unit (e.g., graphics multiprocessor 234 of FIG. 2C) may be configured to perform the functions of one or more of a vertex processing unit 504, a tessellation control processing unit 508, a tessellation evaluation processing unit 512, a geometry processing unit 516, and a fragment/pixel processing unit 524. The functions of data assembler 502, primitive assemblers 506, 514, 518, tessellation unit 510, rasterizer 522, and raster operations unit 526 may also be performed by other processing engines within a processing cluster (e.g., processing cluster 214 of FIG. 2A) and a corresponding partition unit (e.g., partition unit 220A-220N of FIG. 2A). The graphics processing pipeline 500 may also be implemented using dedicated processing units for one or more functions. It is also possible that one or more portions of the graphics processing pipeline 500 are performed by parallel processing logic within a general-purpose processor (e.g., CPU). Optionally, one or more portions of the graphics processing pipeline 500 can access on-chip memory (e.g., parallel processor memory 222 as in FIG. 2A) via a memory interface 528, which may be an instance of the memory interface 218 of FIG. 2A. The graphics processor pipeline 500 may also be implemented via a multi-core group 365A as in FIG. 3C.

The data assembler 502 is a processing unit that may collect vertex data for surfaces and primitives. The data assembler 502 then outputs the vertex data, including the vertex attributes, to the vertex processing unit 504. The vertex processing unit 504 is a programmable execution unit that executes vertex shader programs, lighting and transforming vertex data as specified by the vertex shader programs. The vertex processing unit 504 reads data that is stored in cache, local or system memory for use in processing the vertex data and may be programmed to transform the vertex data from an object-based coordinate representation to a world space coordinate space or a normalized device coordinate space.

A first instance of a primitive assembler 506 receives vertex attributes from the vertex processing unit 504. The primitive assembler 506 readings stored vertex attributes as needed and constructs graphics primitives for processing by tessellation control processing unit 508. The graphics primitives include triangles, line segments, points, patches, and so forth, as supported by various graphics processing application programming interfaces (APIs).

The tessellation control processing unit 508 treats the input vertices as control points for a geometric patch. The control points are transformed from an input representation from the patch (e.g., the patch's bases) to a representation that is suitable for use in surface evaluation by the tessellation evaluation processing unit 512. The tessellation control processing unit 508 can also compute tessellation factors for edges of geometric patches. A tessellation factor applies to a single edge and quantifies a view-dependent level of detail associated with the edge. A tessellation unit 510 is configured to receive the tessellation factors for edges of a patch and to tessellate the patch into multiple geometric primitives such as line, triangle, or quadrilateral primitives, which are transmitted to a tessellation evaluation processing unit 512. The tessellation evaluation processing unit 512 operates on parameterized coordinates of the subdivided patch to generate a surface representation and vertex attributes for each vertex associated with the geometric primitives.

A second instance of a primitive assembler 514 receives vertex attributes from the tessellation evaluation processing unit 512, reading stored vertex attributes as needed, and constructs graphics primitives for processing by the geometry processing unit 516. The geometry processing unit 516 is a programmable execution unit that executes geometry shader programs to transform graphics primitives received from primitive assembler 514 as specified by the geometry shader programs. The geometry processing unit 516 may be programmed to subdivide the graphics primitives into one or more new graphics primitives and calculate parameters used to rasterize the new graphics primitives.

The geometry processing unit 516 may be able to add or delete elements in the geometry stream. The geometry processing unit 516 outputs the parameters and vertices specifying new graphics primitives to primitive assembler 518. The primitive assembler 518 receives the parameters and vertices from the geometry processing unit 516 and constructs graphics primitives for processing by a viewport scale, cull, and clip unit 520. The geometry processing unit 516 reads data that is stored in parallel processor memory or system memory for use in processing the geometry data. The viewport scale, cull, and clip unit 520 performs clipping, culling, and viewport scaling and outputs processed graphics primitives to a rasterizer 522.

The rasterizer 522 can perform depth culling and other depth-based optimizations. The rasterizer 522 also performs scan conversion on the new graphics primitives to generate fragments and output those fragments and associated coverage data to the fragment/pixel processing unit 524. The fragment/pixel processing unit 524 is a programmable execution unit that is configured to execute fragment shader programs or pixel shader programs. The fragment/pixel processing unit 524 transforming fragments or pixels received from rasterizer 522, as specified by the fragment or pixel shader programs. For example, the fragment/pixel processing unit 524 may be programmed to perform operations included but not limited to texture mapping, shading, blending, texture correction and perspective correction to produce shaded fragments or pixels that are output to a raster operations unit 526. The fragment/pixel processing unit 524 can read data that is stored in either the parallel processor memory or the system memory for use when processing the fragment data. Fragment or pixel shader programs may be configured to shade at sample, pixel, tile, or other granularities depending on the sampling rate configured for the processing units.

The raster operations unit 526 is a processing unit that performs raster operations including, but not limited to stencil, z-test, blending, and the like, and outputs pixel data as processed graphics data to be stored in graphics memory (e.g., parallel processor memory 222 as in FIG. 2A, and/or system memory 104 as in FIG. 1), to be displayed on the one or more display device(s) 110A-110B or for further processing by one of the one or more processor(s) 102 or parallel processor(s) 112. The raster operations unit 526 may be configured to compress z or color data that is written to memory and decompress z or color data that is read from memory.

Machine Learning Overview

The architecture described above can be applied to perform training and inference operations using machine learning models. Machine learning has been successful at solving many kinds of tasks. The computations that arise when training and using machine learning algorithms (e.g., neural networks) lend themselves naturally to efficient parallel implementations. Accordingly, parallel processors such as general-purpose graphics processing units (GPGPUs) have played a significant role in the practical implementation of deep neural networks. Parallel graphics processors with single instruction, multiple thread (SIMT) architectures are designed to maximize the amount of parallel processing in the graphics pipeline. In an SIMT architecture, groups of parallel threads attempt to execute program instructions synchronously together as often as possible to increase processing efficiency. The efficiency provided by parallel machine learning algorithm implementations allows the use of high-capacity networks and enables those networks to be trained on larger datasets.

A machine learning algorithm is an algorithm that can learn based on a set of data. For example, machine learning algorithms can be designed to model high-level abstractions within a data set. For example, image recognition algorithms can be used to determine which of several categories to which a given input belong; regression algorithms can output a numerical value given an input; and pattern recognition algorithms can be used to generate translated text or perform text to speech and/or speech recognition.

An exemplary type of machine learning algorithm is a neural network. There are many types of neural networks; a simple type of neural network is a feedforward network. A feedforward network may be implemented as an acyclic graph in which the nodes are arranged in layers. Typically, a feedforward network topology includes an input layer and an output layer that are separated by at least one hidden layer. The hidden layer transforms input received by the input layer into a representation that is useful for generating output in the output layer. The network nodes are fully connected via edges to the nodes in adjacent layers, but there are no edges between nodes within each layer. Data received at the nodes of an input layer of a feedforward network are propagated (i.e., "fed forward") to the nodes of the output layer via an activation function that calculates the states of the nodes of each successive layer in the network based on coefficients ("weights") respectively associated with each of the edges connecting the layers. Depending on the specific model being represented by the algorithm being executed, the output from the neural network algorithm can take various forms.

Before a machine learning algorithm can be used to model a particular problem, the algorithm is trained using a training data set. Training a neural network involves selecting a network topology, using a set of training data representing a problem being modeled by the network, and adjusting the weights until the network model performs with a minimal error for all instances of the training data set. For example, during a supervised learning training process for a neural network, the output produced by the network in response to the input representing an instance in a training data set is compared to the "correct" labeled output for that instance, an error signal representing the difference between the output and the labeled output is calculated, and the weights associated with the connections are adjusted to minimize that error as the error signal is backward propagated through the layers of the network. The network is considered "trained" when the errors for each of the outputs generated from the instances of the training data set are minimized.

The accuracy of a machine learning algorithm can be affected significantly by the quality of the data set used to train the algorithm. The training process can be computationally intensive and may require a significant amount of time on a conventional general-purpose processor. Accordingly, parallel processing hardware is used to train many types of machine learning algorithms. This is particularly useful for optimizing the training of neural networks, as the computations performed in adjusting the coefficients in neural networks lend themselves naturally to parallel implementations. Specifically, many machine learning algorithms and software applications have been adapted to make use of the parallel processing hardware within general-purpose graphics processing devices.

FIG. 6 is a generalized diagram of a machine learning software stack 600. A machine learning application 602 is any logic that can be configured to train a neural network using a training dataset or to use a trained deep neural network to implement machine intelligence. The machine learning application 602 can include training and inference functionality for a neural network and/or specialized software that can be used to train a neural network before deployment. The machine learning application 602 can implement any type of machine intelligence including but not limited to image recognition, mapping and localization, autonomous navigation, speech synthesis, medical imaging, or language translation. Example machine learning applications 602 include, but are not limited to, voice-based virtual assistants, image or facial recognition algorithms, autonomous navigation, and the software tools that are used to train the machine learning models used by the machine learning applications 602.

Hardware acceleration for the machine learning application 602 can be enabled via a machine learning framework 604. The machine learning framework 604 can provide a library of machine learning primitives. Machine learning primitives are basic operations that are commonly performed by machine learning algorithms. Without the machine learning framework 604, developers of machine learning algorithms would be required to create and optimize the main computational logic associated with the machine learning algorithm, then re-optimize the computational logic as new parallel processors are developed. Instead, the machine learning application can be configured to perform the necessary computations using the primitives provided by the machine learning framework 604. Exemplary primitives include tensor convolutions, activation functions, and pooling, which are computational operations that are performed while training a convolutional neural network (CNN). The machine learning framework 604 can also provide primitives to implement basic linear algebra subprograms performed by many machine-learning algorithms, such as matrix and vector operations. Examples of a machine learning framework 604 include, but are not limited to, TensorFlow, TensorRT, PyTorch, MXNet, Caffee, and other high-level machine learning frameworks.

The machine learning framework 604 can process input data received from the machine learning application 602 and generate the appropriate input to a compute framework 606. The compute framework 606 can abstract the underlying instructions provided to the GPGPU driver 608 to enable the machine learning framework 604 to take advantage of hardware acceleration via the GPGPU hardware 610 without requiring the machine learning framework 604 to have intimate knowledge of the architecture of the GPGPU hardware 610. Additionally, the compute framework 606 can enable hardware acceleration for the machine learning framework 604 across a variety of types and generations of the GPGPU hardware 610. Exemplary compute frameworks 606 include the CUDA compute framework and associated machine learning libraries, such as the CUDA Deep Neural Network (cuDNN) library. The machine learning software stack 600 can also include communication libraries or frameworks to facilitate multi-GPU and multi-node compute.

GPGPU Machine Learning Acceleration

FIG. 7 illustrates a general-purpose graphics processing unit 700, which may be the parallel processor 200 of FIG.

2A or the parallel processor(s) 112 of FIG. 1. The general-purpose processing unit (GPGPU) 700 may be configured to provide support for hardware acceleration of primitives provided by a machine learning framework to accelerate the processing the type of computational workloads associated with training deep neural networks. Additionally, the GPGPU 700 can be linked directly to other instances of the GPGPU to create a multi-GPU cluster to improve training speed for particularly deep neural networks. Primitives are also supported to accelerate inference operations for deployed neural networks.

The GPGPU 700 includes a host interface 702 to enable a connection with a host processor. The host interface 702 may be a PCI Express interface. However, the host interface can also be a vendor specific communications interface or communications fabric. The GPGPU 700 receives commands from the host processor and uses a global scheduler 704 to distribute execution threads associated with those commands to a set of processing clusters 706A-706H. The processing clusters 706A-706H share a cache memory 708. The cache memory 708 can serve as a higher-level cache for cache memories within the processing clusters 706A-706H. The illustrated processing clusters 706A-706H may correspond with processing clusters 214A-214N as in FIG. 2A.

The GPGPU 700 includes memory 714A-714B coupled with the processing clusters 706A-706H via a set of memory controllers 712A-712B. The memory 714A-714B can include various types of memory devices including dynamic random-access memory (DRAM) or graphics random access memory, such as synchronous graphics random access memory (SGRAM), including graphics double data rate (GDDR) memory. The memory 714A-714B may also include 3D stacked memory, including but not limited to high bandwidth memory (HBM).

Each of the processing clusters 706A-706H may include a set of graphics multiprocessors, such as the graphics multiprocessor 234 of FIG. 2D, graphics multiprocessor 325 of FIG. 3A, graphics multiprocessor 350 of FIG. 3B, or may include a multi-core group 365A-365N as in FIG. 3C. The graphics multiprocessors of the compute cluster include multiple types of integer and floating-point logic units that can perform computational operations at a range of precisions including suited for machine learning computations. For example, at least a subset of the floating-point units in each of the processing clusters 706A-706H can be configured to perform 16-bit or 32-bit floating point operations, while a different subset of the floating-point units can be configured to perform 64-bit floating point operations.

Multiple instances of the GPGPU 700 can be configured to operate as a compute cluster. The communication mechanism used by the compute cluster for synchronization and data exchange varies across embodiments. For example, the multiple instances of the GPGPU 700 communicate over the host interface 702. In one embodiment the GPGPU 700 includes an I/O hub 709 that couples the GPGPU 700 with a GPU link 710 that enables a direct connection to other instances of the GPGPU. The GPU link 710 may be coupled to a dedicated GPU-to-GPU bridge that enables communication and synchronization between multiple instances of the GPGPU 700. Optionally, the GPU link 710 couples with a high-speed interconnect to transmit and receive data to other GPGPUs or parallel processors. The multiple instances of the GPGPU 700 may be located in separate data processing systems and communicate via a network device that is accessible via the host interface 702. The GPU link 710 may be configured to enable a connection to a host processor in addition to or as an alternative to the host interface 702.

While the illustrated configuration of the GPGPU 700 can be configured to train neural networks, an alternate configuration of the GPGPU 700 can be configured for deployment within a high performance or low power inferencing platform. In an inferencing configuration, the GPGPU 700 includes fewer of the processing clusters 706A-706H relative to the training configuration. Additionally, memory technology associated with the memory 714A-714B may differ between inferencing and training configurations. In one embodiment, the inferencing configuration of the GPGPU 700 can support inferencing specific instructions. For example, an inferencing configuration can provide support for one or more 8-bit integer dot product instructions, which are commonly used during inferencing operations for deployed neural networks.

FIG. 8 illustrates a multi-GPU computing system 800. The multi-GPU computing system 800 can include a processor 802 coupled to multiple GPGPUs 806A-806D via a host interface switch 804. The host interface switch 804 may be a PCI express switch device that couples the processor 802 to a PCI express bus over which the processor 802 can communicate with the set of GPGPUs 806A-806D. Each of the multiple GPGPUs 806A-806D can be an instance of the GPGPU 700 of FIG. 7. The GPGPUs 806A-806D can interconnect via a set of high-speed point to point GPU to GPU links 816. The high-speed GPU to GPU links can connect to each of the GPGPUs 806A-806D via a dedicated GPU link, such as the GPU link 710 as in FIG. 7. The P2P GPU links 816 enable direct communication between each of the GPGPUs 806A-806D without requiring communication over the host interface bus to which the processor 802 is connected. With GPU-to-GPU traffic directed to the P2P GPU links, the host interface bus remains available for system memory access or to communicate with other instances of the multi-GPU computing system 800, for example, via one or more network devices. While in FIG. 8 the GPGPUs 806A-806D connect to the processor 802 via the host interface switch 804, the processor 802 may alternatively include direct support for the P2P GPU links 816 and connect directly to the GPGPUs 806A-806D. In one embodiment the P2P GPU link 816 enable the multi-GPU computing system 800 to operate as a single logical GPU.

Machine Learning Neural Network Implementations

The computing architecture described herein can be configured to perform the types of parallel processing that is particularly suited for training and deploying neural networks for machine learning. A neural network can be generalized as a network of functions having a graph relationship. As is well-known in the art, there are a variety of types of neural network implementations used in machine learning. One exemplary type of neural network is the feedforward network, as previously described.

A second exemplary type of neural network is the Convolutional Neural Network (CNN). A CNN is a specialized feedforward neural network for processing data having a known, grid-like topology, such as image data. Accordingly, CNNs are commonly used for compute vision and image recognition applications, but they also may be used for other types of pattern recognition such as speech and language processing. The nodes in the CNN input layer are organized into a set of "filters" (feature detectors inspired by the receptive fields found in the retina), and the output of each set of filters is propagated to nodes in successive layers of the network. The computations for a CNN include applying the convolution mathematical operation to each filter to produce the output of that filter. Convolution is a specialized kind of mathematical operation performed by two functions to produce a third function that is a modified version of one of the two original functions. In convolutional network terminology, the first function to the convolution can be referred to as the input, while the second function can be referred to as the convolution kernel. The output may be referred to as the feature map. For example, the input to a convolution layer can be a multidimensional array of data that defines the various color components of an input image. The convolution kernel can be a multidimensional array of parameters, where the parameters are adapted by the training process for the neural network.

Recurrent neural networks (RNNs) are a family of feedforward neural networks that include feedback connections between layers. RNNs enable modeling of sequential data by sharing parameter data across different parts of the neural network. The architecture for an RNN includes cycles. The cycles represent the influence of a present value of a variable on its own value at a future time, as at least a portion of the output data from the RNN is used as feedback for processing subsequent input in a sequence. This feature makes RNNs particularly useful for language processing due to the variable nature in which language data can be composed.

The figures described below present exemplary feedforward, CNN, and RNN networks, as well as describe a general process for respectively training and deploying each of those types of networks. It will be understood that these descriptions are exemplary and non-limiting as to any specific embodiment described herein and the concepts illustrated can be applied generally to deep neural networks and machine learning techniques in general.

The exemplary neural networks described above can be used to perform deep learning. Deep learning is machine learning using deep neural networks. The deep neural networks used in deep learning are artificial neural networks composed of multiple hidden layers, as opposed to shallow neural networks that include only a single hidden layer. Deeper neural networks are generally more computationally intensive to train. However, the additional hidden layers of the network enable multistep pattern recognition that results in reduced output error relative to shallow machine learning techniques.

Deep neural networks used in deep learning typically include a front end network to perform feature recognition coupled to a back-end network which represents a mathematical model that can perform operations (e.g., object classification, speech recognition, etc.) based on the feature representation provided to the model. Deep learning enables machine learning to be performed without requiring hand crafted feature engineering to be performed for the model. Instead, deep neural networks can learn features based on statistical structure or correlation within the input data. The learned features can be provided to a mathematical model that can map detected features to an output. The mathematical model used by the network is generally specialized for the specific task to be performed, and different models will be used to perform different task.

Once the neural network is structured, a learning model can be applied to the network to train the network to perform specific tasks. The learning model describes how to adjust the weights within the model to reduce the output error of the network. Backpropagation of errors is a common method used to train neural networks. An input vector is presented to the network for processing. The output of the network is compared to the desired output using a loss function and an error value is calculated for each of the neurons in the output layer. The error values are then propagated backwards until each neuron has an associated error value which roughly represents its contribution to the original output. The network can then learn from those errors using an algorithm, such as the stochastic gradient descent algorithm, to update the weights of the of the neural network.

FIG. 9A-9B illustrate an exemplary convolutional neural network. FIG. 9A illustrates various layers within a CNN. As shown in FIG. 9A, an exemplary CNN used to model image processing can receive input 902 describing the red, green, and blue (RGB) components of an input image. The input 902 can be processed by multiple convolutional layers (e.g., convolutional layer 904, convolutional layer 906). The output from the multiple convolutional layers may optionally be processed by a set of fully connected layers 908. Neurons in a fully connected layer have full connections to all activations in the previous layer, as previously described for a feedforward network. The output from the fully connected layers 908 can be used to generate an output result from the network. The activations within the fully connected layers 908 can be computed using matrix multiplication instead of convolution. Not all CNN implementations make use of fully connected layers 908. For example, in some implementations the convolutional layer 906 can generate output for the CNN.

The convolutional layers are sparsely connected, which differs from traditional neural network configuration found in the fully connected layers 908. Traditional neural network layers are fully connected, such that every output unit interacts with every input unit. However, the convolutional layers are sparsely connected because the output of the convolution of a field is input (instead of the respective state value of each of the nodes in the field) to the nodes of the subsequent layer, as illustrated. The kernels associated with the convolutional layers perform convolution operations, the output of which is sent to the next layer. The dimensionality reduction performed within the convolutional layers is one aspect that enables the CNN to scale to process large images.

FIG. 9B illustrates exemplary computation stages within a convolutional layer of a CNN. Input to a convolutional layer 912 of a CNN can be processed in three stages of a convolutional layer 914. The three stages can include a convolution stage 916, a detector stage 918, and a pooling stage 920. The convolutional layer 914 can then output data to a successive convolutional layer. The final convolutional layer of the network can generate output feature map data or provide input to a fully connected layer, for example, to generate a classification value for the input to the CNN.

In the convolution stage 916 performs several convolutions in parallel to produce a set of linear activations. The convolution stage 916 can include an affine transformation, which is any transformation that can be specified as a linear transformation plus a translation. Affine transformations include rotations, translations, scaling, and combinations of these transformations. The convolution stage computes the output of functions (e.g., neurons) that are connected to specific regions in the input, which can be determined as the local region associated with the neuron. The neurons compute a dot product between the weights of the neurons and the region in the local input to which the neurons are connected. The output from the convolution stage 916 defines a set of linear activations that are processed by successive stages of the convolutional layer 914.

The linear activations can be processed by a detector stage 918. In the detector stage 918, each linear activation is processed by a non-linear activation function. The non-linear activation function increases the nonlinear properties of the overall network without affecting the receptive fields of the convolution layer. Several types of non-linear activation functions may be used. One particular type is the rectified linear unit (ReLU), which uses an activation function defined as $f(x)=\max(0, x)$, such that the activation is thresholded at zero.

The pooling stage 920 uses a pooling function that replaces the output of the convolutional layer 906 with a summary statistic of the nearby outputs. The pooling function can be used to introduce translation invariance into the neural network, such that small translations to the input do not change the pooled outputs. Invariance to local translation can be useful in scenarios where the presence of a feature in the input data is more important than the precise location of the feature. Various types of pooling functions can be used during the pooling stage 920, including max pooling, average pooling, and 12-norm pooling. Additionally, some CNN implementations do not include a pooling stage. Instead, such implementations substitute and additional convolution stage having an increased stride relative to previous convolution stages.

The output from the convolutional layer 914 can then be processed by the next layer 922. The next layer 922 can be an additional convolutional layer or one of the fully connected layers 908. For example, the first convolutional layer 904 of FIG. 9A can output to the second convolutional layer 906, while the second convolutional layer can output to a first layer of the fully connected layers 908.

FIG. 10 illustrates an exemplary recurrent neural network 1000. In a recurrent neural network (RNN), the previous state of the network influences the output of the current state of the network. RNNs can be built in a variety of ways using a variety of functions. The use of RNNs generally revolves around using mathematical models to predict the future based on a prior sequence of inputs. For example, an RNN may be used to perform statistical language modeling to predict an upcoming word given a previous sequence of words. The illustrated RNN 1000 can be described has having an input layer 1002 that receives an input vector, hidden layers 1004 to implement a recurrent function, a feedback mechanism 1005 to enable a 'memory' of previous states, and an output layer 1006 to output a result. The RNN 1000 operates based on time-steps. The state of the RNN at a given time step is influenced based on the previous time step via the feedback mechanism 1005. For a given time step, the state of the hidden layers 1004 is defined by the previous state and the input at the current time step. An initial input ($x_1$) at a first-time step can be processed by the hidden layer 1004. A second input ($x_2$) can be processed by the hidden layer 1004 using state information that is determined during the processing of the initial input ($x_1$). A given state can be computed as $s_t=f(Ux_t+Ws_{t-1})$, where U and W are parameter matrices. The function $f$ is generally a non-linearity, such as the hyperbolic tangent function (Tan h) or a variant of the rectifier function $f(x)=\max(0, x)$. However, the specific mathematical function used in the hidden layers 1004 can vary depending on the specific implementation details of the RNN 1000.

In addition to the basic CNN and RNN networks described above, acceleration for variations on those networks may be enabled. One example RNN variant is the long short term memory (LSTM) RNN. LSTM RNNs are capable of learning long-term dependencies that may be necessary for processing longer sequences of language. A variant on the CNN is a convolutional deep belief network, which has a structure similar to a CNN and is trained in a manner similar to a deep belief network. A deep belief network (DBN) is a generative neural network that is composed of multiple layers of stochastic (random) variables. DBNs can be trained layer-by-layer using greedy unsupervised learning. The learned weights of the DBN can then be used to provide pre-train neural networks by determining an optimal initial set of weights for the neural network. In further embodiments, acceleration for reinforcement learning is enabled. In reinforcement learning, an artificial agent learns by interacting with its environment. The agent is configured to optimize certain objectives to maximize cumulative rewards.

FIG. 11 illustrates training and deployment of a deep neural network. Once a given network has been structured for a task the neural network is trained using a training dataset 1102. Various training frameworks 1104 have been developed to enable hardware acceleration of the training process. For example, the machine learning framework 604 of FIG. 6 may be configured as a training framework 1104. The training framework 1104 can hook into an untrained neural network 1106 and enable the untrained neural net to be trained using the parallel processing resources described herein to generate a trained neural network 1108.

To start the training process the initial weights may be chosen randomly or by pre-training using a deep belief network. The training cycle then be performed in either a supervised or unsupervised manner.

Supervised learning is a learning method in which training is performed as a mediated operation, such as when the training dataset 1102 includes input paired with the desired output for the input, or where the training dataset includes input having known output and the output of the neural network is manually graded. The network processes the inputs and compares the resulting outputs against a set of expected or desired outputs. Errors are then propagated back through the system. The training framework 1104 can adjust to adjust the weights that control the untrained neural network 1106. The training framework 1104 can provide tools to monitor how well the untrained neural network 1106 is converging towards a model suitable to generating correct answers based on known input data. The training process occurs repeatedly as the weights of the network are adjusted to refine the output generated by the neural network. The training process can continue until the neural network reaches a statistically desired accuracy associated with a trained neural network 1108. The trained neural network 1108 can then be deployed to implement any number of machine learning operations to generate an inference result 1114 based on input of new data 1112.

Unsupervised learning is a learning method in which the network attempts to train itself using unlabeled data. Thus, for unsupervised learning the training dataset 1102 will include input data without any associated output data. The untrained neural network 1106 can learn groupings within the unlabeled input and can determine how individual inputs are related to the overall dataset. Unsupervised training can be used to generate a self-organizing map, which is a type of trained neural network 1108 capable of performing operations useful in reducing the dimensionality of data. Unsupervised training can also be used to perform anomaly detection, which allows the identification of data points in an input dataset that deviate from the normal patterns of the data.

Variations on supervised and unsupervised training may also be employed. Semi-supervised learning is a technique in which in the training dataset 1102 includes a mix of labeled and unlabeled data of the same distribution. Incremental learning is a variant of supervised learning in which input data is continuously used to further train the model. Incremental learning enables the trained neural network 1108 to adapt to the new data 1112 without forgetting the knowledge instilled within the network during initial training.

Whether supervised or unsupervised, the training process for particularly deep neural networks may be too computationally intensive for a single compute node. Instead of using a single compute node, a distributed network of computational nodes can be used to accelerate the training process.

FIG. 12A is a block diagram illustrating distributed learning. Distributed learning is a training model that uses multiple distributed computing nodes to perform supervised or unsupervised training of a neural network. The distributed computational nodes can each include one or more host processors and one or more of the general-purpose processing nodes, such as the highly parallel general-purpose graphics processing unit 700 as in FIG. 7. As illustrated, distributed learning can be performed with model parallelism 1202, data parallelism 1204, or a combination of model and data parallelism 1206.

In model parallelism 1202, different computational nodes in a distributed system can perform training computations for different parts of a single network. For example, each layer of a neural network can be trained by a different processing node of the distributed system. The benefits of model parallelism include the ability to scale to particularly large models. Splitting the computations associated with different layers of the neural network enables the training of very large neural networks in which the weights of all layers would not fit into the memory of a single computational node. In some instances, model parallelism can be particularly useful in performing unsupervised training of large neural networks.

In data parallelism 1204, the different nodes of the distributed network have a complete instance of the model and each node receives a different portion of the data. The results from the different nodes are then combined. While different approaches to data parallelism are possible, data parallel training approaches all require a technique of combining results and synchronizing the model parameters between each node. Exemplary approaches to combining data include parameter averaging and update-based data parallelism. Parameter averaging trains each node on a subset of the training data and sets the global parameters (e.g., weights, biases) to the average of the parameters from each node. Parameter averaging uses a central parameter server that maintains the parameter data. Update based data parallelism is similar to parameter averaging except that instead of transferring parameters from the nodes to the parameter server, the updates to the model are transferred. Additionally, update-based data parallelism can be performed in a decentralized manner, where the updates are compressed and transferred between nodes.

Combined model and data parallelism 1206 can be implemented, for example, in a distributed system in which each computational node includes multiple GPUs. Each node can have a complete instance of the model with separate GPUs within each node are used to train different portions of the model.

Distributed training has increased overhead relative to training on a single machine. However, the parallel processors and GPGPUs described herein can each implement various techniques to reduce the overhead of distributed training, including techniques to enable high bandwidth GPU-to-GPU data transfer and accelerated remote data synchronization.

FIG. 12B is a block diagram illustrating a programmable network interface 1210 and data processing unit. The programmable network interface 1210 is a programmable network engine that can be used to accelerate network-based compute tasks within a distributed environment. The programmable network interface 1210 can couple with a host system via host interface 1270. The programmable network interface 1210 can be used to accelerate network or storage operations for CPUs or GPUs of the host system. The host system can be, for example, a node of a distributed learning system used to perform distributed training, for example, as shown in FIG. 12A. The host system can also be a data center node within a data center.

In one embodiment, access to remote storage containing model data can be accelerated by the programmable network interface 1210. For example, the programmable network interface 1210 can be configured to present remote storage devices as local storage devices to the host system. The programmable network interface 1210 can also accelerate remote direct memory access (RDMA) operations performed between GPUs of the host system with GPUs of remote systems. In one embodiment, the programmable network interface 1210 can enable storage functionality such as, but not limited to NVME-oF. The programmable network interface 1210 can also accelerate encryption, data integrity, compression, and other operations for remote storage on behalf of the host system, allowing remote storage to approach the latencies of storage devices that are directly attached to the host system.

The programmable network interface 1210 can also perform resource allocation and management on behalf of the host system. Storage security operations can be offloaded to the programmable network interface 1210 and performed in concert with the allocation and management of remote storage resources. Network-based operations to manage access to the remote storage that would otherwise by performed by a processor of the host system can instead be performed by the programmable network interface 1210.

In one embodiment, network and/or data security operations can be offloaded from the host system to the programmable network interface 1210. Data center security policies for a data center node can be handled by the programmable network interface 1210 instead of the processors of the host system. For example, the programmable network interface 1210 can detect and mitigate against an attempted network-based attack (e.g., DDoS) on the host system, preventing the attack from compromising the availability of the host system.

The programmable network interface 1210 can include a system on a chip (SoC 1220) that executes an operating system via multiple processor cores 1222. The processor cores 1222 can include general-purpose processor (e.g., CPU) cores. In one embodiment the processor cores 1222 can also include one or more GPU cores. The SoC 1220 can execute instructions stored in a memory device 1240. A storage device 1250 can store local operating system data. The storage device 1250 and memory device 1240 can also be used to cache remote data for the host system. Network ports 1260A-1260B enable a connection to a network or fabric and facilitate network access for the SoC 1220 and, via the host interface 1270, for the host system. The programmable network interface 1210 can also include an I/O interface 1275, such as a USB interface. The I/O interface 1275 can be used to couple external devices to the programmable network interface 1210 or as a debug interface. The programmable network interface 1210 also includes a management interface 1230 that enables software on the host device to manage and configure the programmable network interface 1210 and/or SoC 1220. In one embodiment the programmable network interface 1210 may also include one or more accelerators or GPUs 1245 to accept offload of parallel compute tasks from the SoC 1220, host system, or remote systems coupled via the network ports 1260A-1260B.

Exemplary Machine Learning Applications

Machine learning can be applied to solve a variety of technological problems, including but not limited to computer vision, autonomous driving and navigation, speech recognition, and language processing. Computer vision has traditionally been one of the most active research areas for machine learning applications. Applications of computer vision range from reproducing human visual abilities, such as recognizing faces, to creating new categories of visual abilities. For example, computer vision applications can be configured to recognize sound waves from the vibrations induced in objects visible in a video. Parallel processor accelerated machine learning enables computer vision applications to be trained using significantly larger training dataset than previously feasible and enables inferencing systems to be deployed using low power parallel processors.

Parallel processor accelerated machine learning has autonomous driving applications including lane and road sign recognition, obstacle avoidance, navigation, and driving control. Accelerated machine learning techniques can be used to train driving models based on datasets that define the appropriate responses to specific training input. The parallel processors described herein can enable rapid training of the increasingly complex neural networks used for autonomous driving solutions and enables the deployment of low power inferencing processors in a mobile platform suitable for integration into autonomous vehicles.

Parallel processor accelerated deep neural networks have enabled machine learning approaches to automatic speech recognition (ASR). ASR includes the creation of a function that computes the most probable linguistic sequence given an input acoustic sequence. Accelerated machine learning using deep neural networks have enabled the replacement of the hidden Markov models (HMMs) and Gaussian mixture models (GMMs) previously used for ASR.

Parallel processor accelerated machine learning can also be used to accelerate natural language processing. Automatic learning procedures can make use of statistical inference algorithms to produce models that are robust to erroneous or unfamiliar input. Exemplary natural language processor applications include automatic machine translation between human languages.

The parallel processing platforms used for machine learning can be divided into training platforms and deployment platforms. Training platforms are generally highly parallel and include optimizations to accelerate multi-GPU single node training and multi-node, multi-GPU training. Exemplary parallel processors suited for training include the general-purpose graphics processing unit 700 of FIG. 7 and the multi-GPU computing system 800 of FIG. 8. On the contrary, deployed machine learning platforms generally include lower power parallel processors suitable for use in products such as cameras, autonomous robots, and autonomous vehicles.

Additionally, machine learning techniques can be applied to accelerate or enhance graphics processing activities. For example, a machine learning model can be trained to recognize output generated by a GPU accelerated application and generate an upscaled version of that output. Such techniques can be applied to accelerate the generation of high-resolution images for a gaming application. Various other graphics pipeline activities can benefit from the use of machine learning. For example, machine learning models can be trained to perform tessellation operations on geometry data to increase the complexity of geometric models, allowing fine-detailed geometry to be automatically generated from geometry of relatively lower detail.

FIG. 13 illustrates an exemplary inferencing system on a chip (SOC) 1300 suitable for performing inferencing using a trained model. The SOC 1300 can integrate processing components processor 1308. The GPGPU 1306 may be a GPGPU as described herein, such as the GPGPU 700, and the multi-core processor 1308 may be a multi-core processor described herein, such as the multi-core processors 405-406. The SOC 1300 can additionally include on-chip memory 1305 that can enable a shared on-chip data pool that is accessible by each of the processing components. The processing components can be optimized for low power operation to enable deployment to a variety of machine learning platforms, including autonomous vehicles and autonomous robots. For example, one implementation of the SOC 1300 can be used as a portion of the main control system for an autonomous vehicle. Where the SOC 1300 is configured for use in autonomous vehicles the SOC is designed and configured for compliance with the relevant functional safety standards of the deployment jurisdiction.

During operation, the media processor 1302 and vision processor 1304 can work in concert to accelerate computer vision operations. The media processor 1302 can enable low latency decode of multiple high-resolution (e.g., 4K, 8K) video streams. The decoded video streams can be written to a buffer in the on-chip memory 1305. The vision processor 1304 can then parse the decoded video and perform preliminary processing operations on the frames of the decoded video in preparation of processing the frames using a trained image recognition model. For example, the vision processor 1304 can accelerate convolution operations for a CNN that is used to perform image recognition on the high-resolution video data, while back-end model computations are performed by the GPGPU 1306.

The multi-core processor 1308 can include control logic to assist with sequencing and synchronization of data transfers and shared memory operations performed by the media processor 1302 and the vision processor 1304. The multi-core processor 1308 can also function as an application processor to execute software applications that can make use of the inferencing compute capability of the GPGPU 1306. For example, at least a portion of the navigation and driving logic can be implemented in software executing on the multi-core processor 1308. Such software can directly issue computational workloads to the GPGPU 1306 or the computational workloads can be issued to the multi-core processor 1308, which can offload at least a portion of those operations to the GPGPU 1306.

The GPGPU 1306 can include compute clusters such as a low power configuration of the processing clusters 706A-706H within general-purpose graphics processing unit 700. The compute clusters within the GPGPU 1306 can support instruction that are specifically optimized to perform inferencing computations on a trained neural network. For example, the GPGPU 1306 can support instructions to perform low precision computations such as 8-bit and 4-bit integer vector operations.

Additional System Overview

FIG. 14 is a block diagram of a processing system 1400. The elements of FIG. 14 having the same or similar names as the elements of any other figure herein describe the same elements as in the other figures, can operate or function in a manner similar to that, can comprise the same components, and can be linked to other entities, as those described elsewhere herein, but are not limited to such. System 1400 may be used in a single processor desktop system, a multiprocessor workstation system, or a server system having a large number of processors 1402 or processor cores 1407. The system 1400 may be a processing platform incorporated within a system-on-a-chip (SoC) integrated circuit for use in mobile, handheld, or embedded devices such as within Internet-of-things (IoT) devices with wired or wireless connectivity to a local or wide area network.

The system 1400 may be a processing system having components that correspond with those of FIG. 1. For example, in different configurations, processor(s) 1402 or processor core(s) 1407 may correspond with processor(s) 102 of FIG. 1. Graphics processor(s) 1408 may correspond with parallel processor(s) 112 of FIG. 1. External graphics processor 1418 may be one of the add-in device(s) 120 of FIG. 1.

The system 1400 can include, couple with, or be integrated within: a server-based gaming platform; a game console, including a game and media console; a mobile gaming console, a handheld game console, or an online game console. The system 1400 may be part of a mobile phone, smart phone, tablet computing device or mobile Internet-connected device such as a laptop with low internal storage capacity. Processing system 1400 can also include, couple with, or be integrated within: a wearable device, such as a smart watch wearable device; smart eyewear or clothing enhanced with augmented reality (AR) or virtual reality (VR) features to provide visual, audio or tactile outputs to supplement real world visual, audio or tactile experiences or otherwise provide text, audio, graphics, video, holographic images or video, or tactile feedback; other augmented reality (AR) device; or other virtual reality (VR) device. The processing system 1400 may include or be part of a television or set top box device. The system 1400 can include, couple with, or be integrated within a self-driving vehicle such as a bus, tractor trailer, car, motor or electric power cycle, plane or glider (or any combination thereof). The self-driving vehicle may use system 1400 to process the environment sensed around the vehicle.

The one or more processors 1402 may include one or more processor cores 1407 to process instructions which, when executed, perform operations for system or user software. The least one of the one or more processor cores 1407 may be configured to process a specific instruction set 1409. The instruction set 1409 may facilitate Complex Instruction Set Computing (CISC), Reduced Instruction Set Computing (RISC), or computing via a Very Long Instruction Word (VLIW). One or more processor cores 1407 may process a different instruction set 1409, which may include instructions to facilitate the emulation of other instruction sets. Processor core 1407 may also include other processing devices, such as a Digital Signal Processor (DSP).

The processor 1402 may include cache memory 1404. Depending on the architecture, the processor 1402 can have a single internal cache or multiple levels of internal cache. In some embodiments, the cache memory is shared among various components of the processor 1402. In some embodiments, the processor 1402 also uses an external cache (e.g., a Level-3 (L3) cache or Last Level Cache (LLC)) (not shown), which may be shared among processor cores 1407 using known cache coherency techniques. A register file 1406 can be additionally included in processor 1402 and may include different types of registers for storing different types of data (e.g., integer registers, floating point registers, status registers, and an instruction pointer register). Some registers may be general-purpose registers, while other registers may be specific to the design of the processor 1402.

The one or more processor(s) 1402 may be coupled with one or more interface bus(es) 1410 to transmit communication signals such as address, data, or control signals between processor 1402 and other components in the system 1400. The interface bus 1410, in one of these embodiments, can be a processor bus, such as a version of the Direct Media Interface (DMI) bus. However, processor busses are not limited to the DMI bus, and may include one or more Peripheral Component Interconnect buses (e.g., PCI, PCI express), memory busses, or other types of interface busses. For example, the processor(s) 1402 may include an integrated memory controller 1416 and a platform controller hub 1430. The memory controller 1416 facilitates communication between a memory device and other components of the system 1400, while the platform controller hub (PCH) 1430 provides connections to I/O devices via a local I/O bus.

The memory device 1420 can be a dynamic random-access memory (DRAM) device, a static random-access memory (SRAM) device, flash memory device, phase-change memory device, or some other memory device having suitable performance to serve as process memory. The memory device 1420 can, for example, operate as system memory for the system 1400, to store data 1422 and instructions 1421 for use when the one or more processors 1402 executes an application or process. Memory controller 1416 also couples with an optional external graphics processor 1418, which may communicate with the one or more graphics processors 1408 in processors 1402 to perform graphics and media operations. In some embodiments, graphics, media, and or compute operations may be assisted by an accelerator 1412 which is a coprocessor that can be configured to perform a specialized set of graphics, media, or compute operations. For example, the accelerator 1412 may be a matrix multiplication accelerator used to optimize machine learning or compute operations. The accelerator 1412 can be a ray-tracing accelerator that can be used to perform ray-tracing operations in concert with the graphics processor 1408. In one embodiment, an external accelerator 1419 may be used in place of or in concert with the accelerator 1412.

A display device 1411 may be provided that can connect to the processor(s) 1402. The display device 1411 can be one or more of an internal display device, as in a mobile electronic device or a laptop device or an external display device attached via a display interface (e.g., DisplayPort, etc.). The display device 1411 can be a head mounted display (HMD) such as a stereoscopic display device for use in virtual reality (VR) applications or augmented reality (AR) applications.

The platform controller hub 1430 may enable peripherals to connect to memory device 1420 and processor 1402 via a high-speed I/O bus. The I/O peripherals include, but are not limited to, an audio controller 1446, a network controller 1434, a firmware interface 1428, a wireless transceiver 1426, touch sensors 1425, a data storage device 1424 (e.g., non-volatile memory, volatile memory, hard disk drive, flash memory, NAND, 3D NAND, 3D XPoint/Optane, etc.). The data storage device 1424 can connect via a storage interface (e.g., SATA) or via a peripheral bus, such as a Peripheral Component Interconnect bus (e.g., PCI, PCI express). The touch sensors 1425 can include touch screen sensors, pressure sensors, or fingerprint sensors. The wireless transceiver 1426 can be a Wi-Fi transceiver, a Bluetooth transceiver, or a mobile network transceiver such as a 3G, 4G, 5G, or Long-Term Evolution (LTE) transceiver. The firmware interface 1428 enables communication with system firmware, and can be, for example, a unified extensible firmware interface (UEFI). The network controller 1434 can enable a network connection to a wired network. In some embodiments, a high-performance network controller (not shown) couples with the interface bus 1410. The audio controller 1446 may be a multi-channel high-definition audio controller. In some of these embodiments the system 1400 includes an optional legacy I/O controller 1440 for coupling legacy (e.g., Personal System 2 (PS/2)) devices to the system. The platform controller hub 1430 can also connect to one or more Universal Serial Bus (USB) controllers 1442 connect input devices, such as keyboard and mouse 1443 combinations, a camera 1444, or other USB input devices.

It will be appreciated that the system 1400 shown is exemplary and not limiting, as other types of data processing systems that are differently configured may also be used. For example, an instance of the memory controller 1416 and platform controller hub 1430 may be integrated into a discrete external graphics processor, such as the external graphics processor 1418. The platform controller hub 1430 and/or memory controller 1416 may be external to the one or more processor(s) 1402. For example, the system 1400 can include an external memory controller 1416 and platform controller hub 1430, which may be configured as a memory controller hub and peripheral controller hub within a system chipset that is in communication with the processor(s) 1402.

For example, circuit boards ("sleds") can be used on which components such as CPUs, memory, and other components are placed are designed for increased thermal performance. Processing components such as the processors may be located on a top side of a sled while near memory, such as DIMMs, are located on a bottom side of the sled. As a result of the enhanced airflow provided by this design, the components may operate at higher frequencies and power levels than in typical systems, thereby increasing performance. Furthermore, the sleds are configured to blindly mate with power and data communication cables in a rack, thereby enhancing their ability to be quickly removed, upgraded, reinstalled, and/or replaced. Similarly, individual components located on the sleds, such as processors, accelerators, memory, and data storage drives, are configured to be easily upgraded due to their increased spacing from each other. In the illustrative embodiment, the components additionally include hardware attestation features to prove their authenticity.

A data center can utilize a single network architecture ("fabric") that supports multiple other network architectures including Ethernet and Omni-Path. The sleds can be coupled to switches via optical fibers, which provide higher bandwidth and lower latency than typical twisted pair cabling (e.g., Category 5, Category 5e, Category 6, etc.). Due to the high bandwidth, low latency interconnections and network architecture, the data center may, in use, pool resources, such as memory, accelerators (e.g., GPUs, graphics accelerators, FPGAs, ASICs, neural network and/or artificial intelligence accelerators, etc.), and data storage drives that are physically disaggregated, and provide them to compute resources (e.g., processors) on an as needed basis, enabling the compute resources to access the pooled resources as if they were local.

A power supply or source can provide voltage and/or current to system 1400 or any component or system described herein. In one example, the power supply includes an AC to DC (alternating current to direct current) adapter to plug into a wall outlet. Such AC power can be renewable energy (e.g., solar power) power source. In one example, the power source includes a DC power source, such as an external AC to DC converter. A power source or power supply may also include wireless charging hardware to charge via proximity to a charging field. The power source can include an internal battery, alternating current supply, motion-based power supply, solar power supply, or fuel cell source.

FIG. 15A-15C illustrate computing systems and graphics processors. The elements of FIG. 15A-15C having the same or similar names as the elements of any other figure herein describe the same elements as in the other figures, can operate or function in a manner similar to that, can comprise the same components, and can be linked to other entities, as those described elsewhere herein, but are not limited to such.

FIG. 15A is a block diagram of a processor 1500, which may be a variant of one of the processors 1402 and may be used in place of one of those. Therefore, the disclosure of any features in combination with the processor 1500 herein also discloses a corresponding combination with the processor(s) 1402 but is not limited to such. The processor 1500 may have one or more processor cores 1502A-1502N, an integrated memory controller 1514, and an integrated graphics processor 1508. Where an integrated graphics processor 1508 is excluded, the system that includes the processor will include a graphics processor device within a system chipset or coupled via a system bus. Processor 1500 can include additional cores up to and including additional core 1502N represented by the dashed lined boxes. Each of processor cores 1502A-1502N includes one or more internal cache units 1504A-1504N. In some embodiments each processor core 1502A-1502N also has access to one or more shared cache units 1506. The internal cache units 1504A-1504N and shared cache units 1506 represent a cache memory hierarchy within the processor 1500. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 1506 and 1504A-1504N.

The processor 1500 may also include a set of one or more bus controller units 1516 and a system agent core 1510. The one or more bus controller units 1516 manage a set of peripheral buses, such as one or more PCI or PCI express busses. System agent core 1510 provides management functionality for the various processor components. The system agent core 1510 may include one or more integrated memory controllers 1514 to manage access to various external memory devices (not shown).

For example, one or more of the processor cores 1502A-1502N may include support for simultaneous multi-threading. The system agent core 1510 includes components for coordinating and operating cores 1502A-1502N during multi-threaded processing. System agent core 1510 may additionally include a power control unit (PCU), which includes logic and components to regulate the power state of processor cores 1502A-1502N and graphics processor 1508.

The processor 1500 may additionally include graphics processor 1508 to execute graphics processing operations. In some of these embodiments, the graphics processor 1508 couples with the set of shared cache units 1506, and the system agent core 1510, including the one or more integrated memory controllers 1514. The system agent core 1510 may also include a display controller 1511 to drive graphics processor output to one or more coupled displays. The display controller 1511 may also be a separate module coupled with the graphics processor via at least one interconnect or may be integrated within the graphics processor 1508.

A ring-based interconnect 1512 may be used to couple the internal components of the processor 1500. However, an alternative interconnect unit may be used, such as a point-to-point interconnect, a switched interconnect, or other techniques, including techniques well known in the art. In some of these embodiments with a ring-based interconnect 1512, the graphics processor 1508 couples with the ring-based interconnect 1512 via an I/O link 1513.

The exemplary I/O link 1513 represents at least one of multiple varieties of I/O interconnects, including an on package I/O interconnect which facilitates communication between various processor components and a high-performance memory module 1518, such as an eDRAM module or high-bandwidth memory (HBM) module. Optionally, each of the processor cores 1502A-1502N and graphics processor 1508 can use the memory module 1518 as a shared Last Level Cache or a shared near memory pool, with attached DRAM acting as a far memory pool.

The processor cores 1502A-1502N may, for example, be homogenous cores executing the same instruction set architecture. Alternatively, the processor cores 1502A-1502N are heterogeneous in terms of instruction set architecture (ISA), where one or more of processor cores 1502A-1502N execute a first instruction set, while at least one of the other cores executes a subset of the first instruction set or a different instruction set. The processor cores 1502A-1502N may be heterogeneous in terms of microarchitecture, where one or more cores having a relatively higher power consumption couple with one or more power cores having a lower power consumption. As another example, the processor cores 1502A-1502N are heterogeneous in terms of computational capability. Additionally, processor 1500 can be implemented on one or more chips or as an SoC integrated circuit having the illustrated components, in addition to other components.

FIG. 15B is a block diagram of hardware logic of a graphics processor core block 1519, according to some embodiments described herein. In some embodiments, elements of FIG. 15B having the same reference numbers (or names) as the elements of any other figure herein may operate or function in a manner similar to that described elsewhere herein. The graphics processor core block 1519 is exemplary of one partition of a graphics processor. The graphics processor core block 1519 can be included within the integrated graphics processor 1508 of FIG. 15A or a discrete graphics processor, parallel processor, and/or compute accelerator. A graphics processor as described herein may include multiple graphics core blocks based on target power and performance envelopes. Each graphics processor core block 1519 can include a function block 1530 coupled with multiple graphics cores 1521A-1521F that include modular blocks of fixed function logic and general-purpose programmable logic. The graphics processor core block 1519 also includes shared/cache memory 1536 that is accessible by all graphics cores 1521A-1521F, rasterizer logic 1537, and additional fixed function logic 1538.

In some embodiments, the function block 1530 includes a geometry/fixed function pipeline 1531 that can be shared by all graphics cores in the graphics processor core block 1519. In various embodiments, the geometry/fixed function pipeline 1531 includes a 3D geometry pipeline a video front-end unit, a thread spawner and global thread dispatcher, and a unified return buffer manager, which manages unified return buffers. In one embodiment the function block 1530 also includes a graphics SoC interface 1532, a graphics microcontroller 1533, and a media pipeline 1534. The graphics SoC interface 1532 provides an interface between the graphics processor core block 1519 and other core blocks within a graphics processor or compute accelerator SoC. The graphics microcontroller 1533 is a programmable sub-processor that is configurable to manage various functions of the graphics processor core block 1519, including thread dispatch, scheduling, and pre-emption. The media pipeline 1534 includes logic to facilitate the decoding, encoding, pre-processing, and/or post-processing of multimedia data, including image and video data. The media pipeline 1534 implement media operations via requests to compute or sampling logic within the graphics cores 1521-1521F. One or more pixel backends 1535 can also be included within the and can perform blend operations and lossless color compression of rendered pixel data.

In one embodiment the graphics SoC interface 1532 enables the graphics processor core block 1519 to communicate with general-purpose application processor cores (e.g., CPUs) and/or other components within an SoC or a system host CPU that is coupled with the SoC via a peripheral interface. The graphics SoC interface 1532 also enables communication with off-chip memory hierarchy elements such as a shared last level cache memory, system RAM, and/or embedded on-chip or on-package DRAM. The SoC interface 1532 can also enable communication with fixed function devices within the SoC, such as camera imaging pipelines, and enables the use of and/or implements global memory atomics that may be shared between the graphics processor core block 1519 and CPUs within the SoC. The graphics SoC interface 1532 can also implement power management controls for the graphics processor core block 1519 and enable an interface between a clock domain of the graphics processor core block 1519 and other clock domains within the SoC. In one embodiment the graphics SoC interface 1532 enables receipt of command buffers from a command streamer and global thread dispatcher that are configured to provide commands and instructions to each of one or more graphics cores within a graphics processor. The commands and instructions can be dispatched to the media pipeline 1534 when media operations are to be performed, the geometry and fixed function pipeline 1531 when graphics processing operations are to be performed. When compute operations are to be performed, compute dispatch logic can dispatch the commands to the graphics cores 1521A-1521F, bypassing the geometry and media pipelines.

The graphics microcontroller 1533 can be configured to perform various scheduling and management tasks for the graphics processor core block 1519. In one embodiment the graphics microcontroller 1533 can perform graphics and/or compute workload scheduling on the various vector engines 1522A-1522F, 1524A-1524F and matrix engines 1523A-1523F, 1525A-1525F within the graphics cores 1521A-1521F. In this scheduling model, host software executing on a CPU core of an SoC including the graphics processor core block 1519 can submit workloads one of multiple graphics processor doorbells, which invokes a scheduling operation on the appropriate graphics engine. Scheduling operations include determining which workload to run next, submitting a workload to a command streamer, pre-empting existing workloads running on an engine, monitoring progress of a workload, and notifying host software when a workload is complete. In one embodiment the graphics microcontroller 1533 can also facilitate low-power or idle states for the graphics processor core block 1519, providing the graphics processor core block 1519 with the ability to save and restore registers within the graphics processor core block 1519 across low-power state transitions independently from the operating system and/or graphics driver software on the system.

The graphics processor core block 1519 may have greater than or fewer than the illustrated graphics cores 1521A-1521F, up to N modular graphics cores. For each set of N graphics cores, the graphics processor core block 1519 can also include shared/cache memory 1536, which can be configured as shared memory or cache memory, rasterizer logic 1537, and additional fixed function logic 1538 to accelerate various graphics and compute processing operations.

Within each graphics cores 1521A-1521F is set of execution resources that may be used to perform graphics, media, and compute operations in response to requests by graphics pipeline, media pipeline, or shader programs. The graphics cores 1521A-1521F include multiple vector engines 1522A-1522F, 1524A-1524F, matrix acceleration units 1523A-1523F, 1525A-1525D, cache/shared local memory (SLM), a sampler 1526A-1526F, and a ray tracing unit 1527A-1527F.

The vector engines 1522A-1522F, 1524A-1524F are general-purpose graphics processing units capable of performing floating-point and integer/fixed-point logic operations in service of a graphics, media, or compute operation, including graphics, media, or compute/GPGPU programs. The vector engines 1522A-1522F, 1524A-1524F can operate at variable vector widths using SIMD, SIMT, or SIMT+SIMD execution modes. The matrix acceleration units 1523A-1523F, 1525A-1525D include matrix-matrix and matrix-vector acceleration logic that improves performance on matrix operations, particularly low and mixed precision (e.g., INT8, FP16, BF16) matrix operations used for machine learning. In one embodiment, each of the matrix acceleration units 1523A-1523F, 1525A-1525D includes one or more systolic arrays of processing elements that can perform concurrent matrix multiply or dot product operations on matrix elements.

The sampler 1526A-1526F can read media or texture data into memory and can sample data differently based on a configured sampler state and the texture/media format that is being read. Threads executing on the vector engines 1522A-1522F, 1524A-1524F or matrix acceleration units 1523A-1523F, 1525A-1525D can make use of the cache/SLM 1528A-1528F within each of the graphics cores 1521A-1521F. The cache/SLM 1528A-1528F can be configured as cache memory or as a pool of shared memory that is local to each of the respective graphics cores 1521A-1521F. The ray tracing units 1527A-1527F within the graphics cores 1521A-1521F include ray traversal/intersection circuitry for performing ray traversal using bounding volume hierarchies (BVHs) and identifying intersections between rays and primitives enclosed within the BVH volumes. In one embodiment the ray tracing units 1527A-1527F include circuitry for performing depth testing and culling (e.g., using a depth buffer or similar arrangement). In one implementation, the ray tracing units 1527A-1527F perform traversal and intersection operations in concert with image denoising, at least a portion of which may be performed using an associated matrix acceleration unit 1523A-1523F, 1525A-1525D.

FIG. 15C is a block diagram of general-purpose graphics processing unit (GPGPU) 1570 that can be configured as a graphics processor, e.g., the graphics processor 1508, and/or compute accelerator, according to embodiments described herein. The GPGPU 1570 can interconnect with host processors (e.g., one or more CPU(s) 1546) and memory 1571, 1572 via one or more system and/or memory busses. Memory 1571 may be system memory that can be shared with the one or more CPU(s) 1546, while memory 1572 is device memory that is dedicated to the GPGPU 1570. For example, components within the GPGPU 1570 and memory 1572 may be mapped into memory addresses that are accessible to the one or more CPU(s) 1546. Access to memory 1571 and 1572 may be facilitated via a memory controller 1568. The memory controller 1568 may include an internal direct memory access (DMA) controller 1569 or can include logic to perform operations that would otherwise be performed by a DMA controller.

The GPGPU 1570 includes multiple cache memories, including an L2 cache 1553, L1 cache 1554, an instruction cache 1555, and shared memory 1556, at least a portion of which may also be partitioned as a cache memory. The GPGPU 1570 also includes multiple compute units 1560A-1560N. Each compute unit 1560A-1560N includes a set of vector registers 1561, scalar registers 1562, vector logic units 1563, and scalar logic units 1564. The compute units 1560A-1560N can also include local shared memory 1565 and a program counter 1566. The compute units 1560A-1560N can couple with a constant cache 1567, which can be used to store constant data, which is data that will not change during the run of kernel or shader program that executes on the GPGPU 1570. The constant cache 1567 may be a scalar data cache and cached data can be fetched directly into the scalar registers 1562.

During operation, the one or more CPU(s) 1546 can write commands into registers or memory in the GPGPU 1570 that has been mapped into an accessible address space. The command processors 1557 can read the commands from registers or memory and determine how those commands will be processed within the GPGPU 1570. A thread dispatcher 1558 can then be used to dispatch threads to the compute units 1560A-1560N to perform those commands. Each compute unit 1560A-1560N can execute threads independently of the other compute units. Additionally, each compute unit 1560A-1560N can be independently configured for conditional computation and can conditionally output the results of computation to memory. The command processors 1557 can interrupt the one or more CPU(s) 1546 when the submitted commands are complete.

FIG. 16A-16C illustrate block diagrams of additional graphics processor and compute accelerator architectures provided by embodiments described herein, e.g., in accordance with FIG. 15A-15C. The elements of FIG. 16A-16C having the same or similar names as the elements of any other figure herein describe the same elements as in the other figures, can operate or function in a manner similar to that, can comprise the same components, and can be linked to other entities, as those described elsewhere herein, but are not limited to such.

FIG. 16A is a block diagram of a graphics processor 1600, which may be a discrete graphics processing unit, or may be a graphics processor integrated with a plurality of processing cores, or other semiconductor devices such as, but not limited to, memory devices or network interfaces. The graphics processor 1600 may be a variant of the graphics processor 1508 and may be used in place of the graphics processor 1508. Therefore, the disclosure of any features in combination with the graphics processor 1508 herein also discloses a corresponding combination with the graphics processor 1600 but is not limited to such. The graphics processor may communicate via a memory mapped I/O interface to registers on the graphics processor and with commands placed into the processor memory. Graphics processor 1600 may include a memory interface 1614 to access memory. Memory interface 1614 can be an interface to local memory, one or more internal caches, one or more shared external caches, and/or to system memory.

Optionally, graphics processor 1600 also includes a display controller 1602 to drive display output data to a display device 1618. Display controller 1602 includes hardware for one or more overlay planes for the display and composition of multiple layers of video or user interface elements. The display device 1618 can be an internal or external display device. In one embodiment the display device 1618 is a head mounted display device, such as a virtual reality (VR) display device or an augmented reality (AR) display device. Graphics processor 1600 may include a video codec engine 1606 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, H.265/HEVC, Alliance for Open Media (AOMedia) VP8, VP9, as well as the Society of Motion Picture & Television Engineers (SMPTE 421M/VC-1, and Joint Photographic Experts Group (JPEG) formats such as JPEG, and Motion JPEG (MJPEG) formats.

Graphics processor 1600 may include a block image transfer (BLIT) engine 1603 to perform two-dimensional (2D) rasterizer operations including, for example, bit-boundary block transfers. However, alternatively, 2D graphics operations may be performed using one or more components of graphics processing engine (GPE) 1610. In some embodiments, GPE 1610 is a compute engine for performing graphics operations, including three-dimensional (3D) graphics operations and media operations.

GPE 1610 may include a 3D pipeline 1612 for performing 3D operations, such as rendering three-dimensional images and scenes using processing functions that act upon 3D primitive shapes (e.g., rectangle, triangle, etc.). The 3D pipeline 1612 includes programmable and fixed function elements that perform various tasks within the element and/or spawn execution threads to a 3D/Media subsystem 1615. While 3D pipeline 1612 can be used to perform media operations, an embodiment of GPE 1610 also includes a media pipeline 1616 that is specifically used to perform media operations, such as video post-processing and image enhancement.

Media pipeline 1616 may include fixed function or programmable logic units to perform one or more specialized media operations, such as video decode acceleration, video de-interlacing, and video encode acceleration in place of, or on behalf of video codec engine 1606. Media pipeline 1616 may additionally include a thread spawning unit to spawn threads for execution on 3D/Media subsystem 1615. The spawned threads perform computations for the media operations on one or more graphics execution units included in 3D/Media subsystem 1615.

The 3D/Media subsystem 1615 may include logic for executing threads spawned by 3D pipeline 1612 and media pipeline 1616. The pipelines may send thread execution requests to 3D/Media subsystem 1615, which includes thread dispatch logic for arbitrating and dispatching the various requests to available thread execution resources. The execution resources include an array of graphics execution units to process the 3D and media threads. The 3D/Media subsystem 1615 may include one or more internal caches for thread instructions and data. Additionally, the 3D/Media subsystem 1615 may also include shared memory, including registers and addressable memory, to share data between threads and to store output data.

FIG. 16B illustrates a graphics processor 1620, being a variant of the graphics processor 1600 and may be used in place of the graphics processor 1600 and vice versa. Therefore, the disclosure of any features in combination with the graphics processor 1600 herein also discloses a corresponding combination with the graphics processor 1620 but is not limited to such. The graphics processor 1620 has a tiled architecture, according to embodiments described herein. The graphics processor 1620 may include a graphics processing engine cluster 1622 having multiple instances of the graphics processing engine 1610 of FIG. 16A within a graphics engine tile 1610A-1610D. Each graphics engine tile 1610A-1610D can be interconnected via a set of tile interconnects 1623A-1623F. Each graphics engine tile 1610A-1610D can also be connected to a memory module or memory device 1626A-1626D via memory interconnects 1625A-1625D. The memory devices 1626A-1626D can use any graphics memory technology. For example, the memory devices 1626A-1626D may be graphics double data rate (GDDR) memory. The memory devices 1626A-1626D may be high-bandwidth memory (HBM) modules that can be on-die with their respective graphics engine tile 1610A-1610D. The memory devices 1626A-1626D may be stacked memory devices that can be stacked on top of their respective graphics engine tile 1610A-1610D. Each graphics engine tile 1610A-1610D and associated memory 1626A-1626D may reside on separate chiplets, which are bonded to a base die or base substrate, as described in further detail in FIG. 24B-24D.

The graphics processor 1620 may be configured with a non-uniform memory access (NUMA) system in which memory devices 1626A-1626D are coupled with associated graphics engine tiles 1610A-1610D. A given memory device may be accessed by graphics engine tiles other than the tile to which it is directly connected. However, access latency to the memory devices 1626A-1626D may be lowest when accessing a local tile. In one embodiment, a cache coherent NUMA (ccNUMA) system is enabled that uses the tile interconnects 1623A-1623F to enable communication between cache controllers within the graphics engine tiles 1610A-1610D to keep a consistent memory image when more than one cache stores the same memory location.

The graphics processing engine cluster 1622 can connect with an on-chip or on-package fabric interconnect 1624. In one embodiment the fabric interconnect 1624 includes a network processor, network on a chip (NoC), or another switching processor to enable the fabric interconnect 1624 to act as a packet switched fabric interconnect that switches data packets between components of the graphics processor 1620. The fabric interconnect 1624 can enable communication between graphics engine tiles 1610A-1610D and components such as the video codec engine 1606 and one or more copy engines 1604. The copy engines 1604 can be used to move data out of, into, and between the memory devices 1626A-1626D and memory that is external to the graphics processor 1620 (e.g., system memory). The fabric interconnect 1624 can also be used to interconnect the graphics engine tiles 1610A-1610D. The graphics processor 1620 may optionally include a display controller 1602 to enable a connection with an external display device 1618. The graphics processor may also be configured as a graphics or compute accelerator. In the accelerator configuration, the display controller 1602 and display device 1618 may be omitted.

The graphics processor 1620 can connect to a host system via a host interface 1628. The host interface 1628 can enable communication between the graphics processor 1620, system memory, and/or other system components. The host interface 1628 can be, for example, a PCI express bus or another type of host system interface. For example, the host interface 1628 may be an NVLink or NVSwitch interface. The host interface 1628 and fabric interconnect 1624 can cooperate to enable multiple instances of the graphics processor 1620 to act as single logical device. Cooperation between the host interface 1628 and fabric interconnect 1624 can also enable the individual graphics engine tiles 1610A-1610D to be presented to the host system as distinct logical graphics devices.

FIG. 16C illustrates a compute accelerator 1630, according to embodiments described herein. The compute accelerator 1630 can include architectural similarities with the graphics processor 1620 of FIG. 16B and is optimized for compute acceleration. A compute engine cluster 1632 can include a set of compute engine tiles 1640A-1640D that include execution logic that is optimized for parallel or vector-based general-purpose compute operations. The compute engine tiles 1640A-1640D may not include fixed function graphics processing logic, although in some embodiments one or more of the compute engine tiles 1640A-1640D can include logic to perform media acceleration. The compute engine tiles 1640A-1640D can connect to memory 1626A-1626D via memory interconnects 1625A-1625D. The memory 1626A-1626D and memory interconnects 1625A-1625D may be similar technology as in graphics processor 1620 or can be different. The graphics compute engine tiles 1640A-1640D can also be interconnected via a set of tile interconnects 1623A-1623F and may be connected with and/or interconnected by a fabric interconnect 1624. In one embodiment the compute accelerator 1630 includes a large L3 cache 1636 that can be configured as a device-wide cache. The compute accelerator 1630 can also connect to a host processor and memory via a host interface 1628 in a similar manner as the graphics processor 1620 of FIG. 16B.

The compute accelerator 1630 can also include an integrated network interface 1642. In one embodiment the integrated network interface 1642 includes a network processor and controller logic that enables the compute engine cluster 1632 to communicate over a physical layer interconnect 1644 without requiring data to traverse memory of a host system. In one embodiment, one of the compute engine tiles 1640A-1640D is replaced by network processor logic and data to be transmitted or received via the physical layer interconnect 1644 may be transmitted directly to or from memory 1626A-1626D. Multiple instances of the compute accelerator 1630 may be joined via the physical layer interconnect 1644 into a single logical device. Alternatively, the various compute engine tiles 1640A-1640D may be presented as distinct network accessible compute accelerator devices.

Graphics Processing Engine

FIG. 17 is a block diagram of a graphics processing engine 1710 of a graphics processor in accordance with some embodiments. The graphics processing engine (GPE) 1710 may be a version of the GPE 1610 shown in FIG. 16A and may also represent a graphics engine tile 1610A-1610D of FIG. 16B. The elements of FIG. 17 having the same or similar names as the elements of any other figure herein describe the same elements as in the other figures, can operate or function in a manner similar to that, can comprise the same components, and can be linked to other entities, as those described elsewhere herein, but are not limited to such.

For example, the 3D pipeline 1612 and media pipeline 1616 of FIG. 16A are also illustrated in FIG. 17. The media pipeline 1616 is optional in some embodiments of the GPE 1710 and may not be explicitly included within the GPE 1710. For example and in at least one embodiment, a separate media and/or image processor is coupled to the GPE 1710.

GPE 1710 may couple with or include a command streamer 1703, which provides a command stream to the 3D pipeline 1612 and/or media pipelines 1616. Alternatively or additionally, the command streamer 1703 may be directly coupled to a unified return buffer 1718. The unified return buffer 1718 may be communicatively coupled to a graphics core cluster 1714. Optionally, the command streamer 1703 is coupled with memory, which can be system memory, or one or more of internal cache memory and shared cache memory. The command streamer 1703 may receive commands from the memory and sends the commands to 3D pipeline 1612 and/or media pipeline 1616. The commands are directives fetched from a ring buffer, which stores commands for the 3D pipeline 1612 and media pipeline 1616. The ring buffer can additionally include batch command buffers storing batches of multiple commands. The commands for the 3D pipeline 1612 can also include references to data stored in memory, such as but not limited to vertex and geometry data for the 3D pipeline 1612 and/or image data and memory objects for the media pipeline 1616. The 3D pipeline 1612 and media pipeline 1616 process the commands and data by performing operations via logic within the respective pipelines or by dispatching one or more execution threads to the graphics core cluster 1714. The graphics core cluster 1714 may include one or more blocks of graphics cores (e.g., graphics core block 1715A, graphics core block 1715B), each block including one or more graphics cores. Each graphics core includes a set of graphics execution resources that includes general-purpose and graphics specific execution logic to perform graphics and compute operations, as well as fixed function texture processing and/or machine learning and artificial intelligence acceleration logic.

In various embodiments the 3D pipeline 1612 can include fixed function and programmable logic to process one or more shader programs, such as vertex shaders, geometry shaders, pixel shaders, fragment shaders, compute shaders, or other shader programs, by processing the instructions and dispatching execution threads to the graphics core cluster 1714. The graphics core cluster 1714 provides a unified block of execution resources for use in processing these shader programs. Multi-purpose execution logic (e.g., execution units) within the graphics core block 1715A-1715B of the graphics core cluster 1714 includes support for various 3D API shader languages and can execute multiple simultaneous execution threads associated with multiple shaders.

The graphics core cluster 1714 may include execution logic to perform media functions, such as video and/or image processing. The execution units may include general-purpose logic that is programmable to perform parallel general-purpose computational operations, in addition to graphics processing operations. The general-purpose logic can perform processing operations in parallel or in conjunction with general-purpose logic within the processor core(s) 1407 of FIG. 14 or core 1502A-1502N as in FIG. 15A.

Output data generated by threads executing on the graphics core cluster 1714 can output data to memory in a unified return buffer (URB) 1718. The URB 1718 can store data for multiple threads. The URB 1718 may be used to send data between different threads executing on the graphics core cluster 1714. The URB 1718 may additionally be used for synchronization between threads on the graphics core cluster 1714 and fixed function logic within the shared function logic 1720.

Optionally, the graphics core cluster 1714 may be scalable, such that the array includes a variable number of graphics cores, each having a variable number of execution units based on the target power and performance level of GPE 1710. The execution resources may be dynamically scalable, such that execution resources may be enabled or disabled as needed.

The graphics core cluster 1714 couples with shared function logic 1720 that includes multiple resources that are shared between the graphics cores in the graphics core array. The shared functions within the shared function logic 1720 are hardware logic units that provide specialized supplemental functionality to the graphics core cluster 1714. In various embodiments, shared function logic 1720 includes but is not limited to sampler 1721, math 1722, and inter-thread communication (ITC) 1723 logic. Additionally, one or more cache(s) 1725 within the shared function logic 1720 may be implemented.

A shared function is implemented at least in a case where the demand for a given specialized function is insufficient for inclusion within the graphics core cluster 1714. Instead, a single instantiation of that specialized function is implemented as a stand-alone entity in the shared function logic 1720 and shared among the execution resources within the graphics core cluster 1714. The precise set of functions that are shared between the graphics core cluster 1714 and included within the graphics core cluster 1714 varies across embodiments. Specific shared functions within the shared function logic 1720 that are used extensively by the graphics core cluster 1714 may be included within shared function logic 1716 within the graphics core cluster 1714. Optionally, the shared function logic 1716 within the graphics core cluster 1714 can include some or all logic within the shared function logic 1720. All logic elements within the shared function logic 1720 may be duplicated within the shared function logic 1716 of the graphics core cluster 1714. Alternatively, the shared function logic 1720 is excluded in favor of the shared function logic 1716 within the graphics core cluster 1714.

Graphics Processing Resources

FIG. 18A-18C illustrate execution logic including an array of processing elements employed in a graphics processor, according to embodiments described herein. FIG. 18A illustrates graphics core cluster, according to an embodiment. FIG. 18B illustrates a vector engine of a graphics core, according to an embodiment. FIG. 18C illustrates a matrix engine of a graphics core, according to an embodiment. Elements of FIG. 18A-18C having the same reference numbers as the elements of any other figure herein may operate or function in any manner similar to that described elsewhere herein but are not limited as such. For example, the elements of FIG. 18A-18C can be considered in the context of the graphics processor core block 1519 of FIG. 15B, and/or the graphics core blocks 1715A-1715B of FIG. 17. In one embodiment, the elements of FIG. 18A-18C have similar functionality to equivalent components of the graphics processor 1508 of FIG. 15A or the GPGPU 1570 of FIG. 15C.

As shown in FIG. 18A, in one embodiment the graphics core cluster 1714 includes a graphics core block 1715, which may be graphics core block 1715A or graphics core block 1715B of FIG. 17. The graphics core block 1715 can include any number of graphics cores (e.g., graphics core 1815A, graphics core 1815B, through graphics core 1815N). Multiple instances of the graphics core block 1715 may be included. In one embodiment the elements of the graphics cores 1815A-1815N have similar or equivalent functionality as the elements of the graphics cores 1521A-1521F of FIG. 15B. In such embodiment, the graphics cores 1815A-1815N each include circuitry including but not limited to vector engines 1802A-1802N, matrix engines 1803A-1803N, memory load/store units 1804A-1804N, instruction caches 1805A-1805N, data caches/shared local memory 1806A-1806N, ray tracing units 1808A-1808N, samplers 1810A-15710N. The circuitry of the graphics cores 1815A-1815N can additionally include fixed function logic 1812A-1812N. The number of vector engines 1802A-1802N and matrix engines 1803A-1803N within the graphics cores 1815A-1815N of a design can vary based on the workload, performance, and power targets for the design.

With reference to graphics core 1815A, the vector engine 1802A and matrix engine 1803A are configurable to perform parallel compute operations on data in a variety of integer and floating-point data formats based on instructions associated with shader programs. Each vector engine 1802A and matrix engine 1803A can act as a programmable general-purpose computational unit that is capable of executing multiple simultaneous hardware threads while processing multiple data elements in parallel for each thread. The vector engine 1802A and matrix engine 1803A support the processing of variable width vectors at various SIMD widths, including but not limited to SIMD8, SIMD16, and SIMD32. Input data elements can be stored as a packed data type in a register and the vector engine 1802A and matrix engine 1803A can process the various elements based on the data size of the elements. For example, when operating on a 256-bit wide vector, the 256 bits of the vector are stored in a register and the vector is processed as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, different vector widths and register sizes are possible. In one embodiment, the vector engine 1802A and matrix engine 1803A are also configurable for SIMT operation on warps or thread groups of various sizes (e.g., 8, 16, or 32 threads).

Continuing with graphics core 1815A, the memory load/store unit 1804A services memory access requests that are issued by the vector engine 1802A, matrix engine 1803A, and/or other components of the graphics core 1815A that have access to memory. The memory access request can be processed by the memory load/store unit 1804A to load or store the requested data to or from cache or memory into a register file associated with the vector engine 1802A and/or matrix engine 1803A. The memory load/store unit 1804A can also perform prefetching operations. With additional reference to FIG. 19, in one embodiment, the memory load/store unit 1804A is configured to provide SIMT scatter/gather prefetching or block prefetching for data stored in memory 1910, from memory that is local to other tiles via the tile interconnect 1908, or from system memory. Prefetching can be performed to a specific L1 cache (e.g., data cache/shared local memory 1806A), the L2 cache 1904 or the L3 cache 1906. In one embodiment, a prefetch to the L3 cache 1906 automatically results in the data being stored in the L2 cache 1904.

The instruction cache 1805A stores instructions to be executed by the graphics core 1815A. In one embodiment, the graphics core 1815A also includes instruction fetch and prefetch circuitry that fetches or prefetches instructions into the instruction cache 1805A. The graphics core 1815A also includes instruction decode logic to decode instructions within the instruction cache 1805A. The data cache/shared local memory 1806A can be configured as a data cache that is managed by a cache controller that implements a cache replacement policy and/or configured as explicitly managed shared memory. The ray tracing unit 1808A includes circuitry to accelerate ray tracing operations. The sampler 1810A provides texture sampling for 3D operations and media sampling for media operations. The fixed function logic 1812A includes fixed function circuitry that is shared between the various instances of the vector engine 1802A and matrix engine 1803A. Graphics cores 1815B-1815N can operate in a similar manner as graphics core 1815A.

Functionality of the instruction caches 1805A-1805N, data caches/shared local memory 1806A-1806N, ray tracing units 1808A-1808N, samplers 1810A-1810N, and fixed function logic 1812A-1812N corresponds with equivalent functionality in the graphics processor architectures described herein. For example, the instruction caches 1805A-1805N can operate in a similar manner as instruction cache 1555 of FIG. 15C. The data caches/shared local memory 1806A-1806N, ray tracing units 1808A-1808N, and samplers 1810A-1810N can operate in a similar manner as the cache/SLM 1528A-1528F, ray tracing units 1527A-1527F, and samplers 1526A-1526F of FIG. 15B. The fixed function logic 1812A-1812N can include elements of the geometry/fixed function pipeline 1531 and/or additional fixed function logic 1538 of FIG. 15B. In one embodiment, the ray tracing units 1808A-1808N include circuitry to perform ray tracing acceleration operations performed by the ray tracing cores 372 of FIG. 3C.

As shown in FIG. 18B, in one embodiment the vector engine 1802 includes an instruction fetch unit 1837, a general register file array (GRF) 1824, an architectural register file array (ARF) 1826, a thread arbiter 1822, a send unit 1830, a branch unit 1832, a set of SIMD floating point units (FPUs) 1834, and in one embodiment a set of integer SIMD ALUs 1835. The GRF 1824 and ARF 1826 includes the set of general register files and architecture register files associated with each hardware thread that may be active in the vector engine 1802. In one embodiment, per thread architectural state is maintained in the ARF 1826, while data used during thread execution is stored in the GRF 1824. The execution state of each thread, including the instruction pointers for each thread, can be held in thread-specific registers in the ARF 1826. Register renaming may be used to dynamically allocate registers to hardware threads.

In one embodiment the vector engine 1802 has an architecture that is a combination of Simultaneous Multi-Threading (SMT) and fine-grained Interleaved Multi-Threading (IMT). The architecture has a modular configuration that can be fine-tuned at design time based on a target number of simultaneous threads and number of registers per graphics core, where graphics core resources are divided across logic used to execute multiple simultaneous threads. The number of logical threads that may be executed by the vector engine 1802 is not limited to the number of hardware threads, and multiple logical threads can be assigned to each hardware thread.

In one embodiment, the vector engine 1802 can co-issue multiple instructions, which may each be different instructions. The thread arbiter 1822 can dispatch the instructions to one of the send unit 1830, branch unit 1832, or SIMD FPU(s) 1834 for execution. Each execution thread can access 128 general-purpose registers within the GRF 1824, where each register can store 32 bytes, accessible as a variable width vector of 32-bit data elements. In one embodiment, each thread has access to 4 Kbytes within the GRF 1824, although embodiments are not so limited, and greater or fewer register resources may be provided in other embodiments. In one embodiment the vector engine 1802 is partitioned into seven hardware threads that can independently perform computational operations, although the number of threads per vector engine 1802 can also vary according to embodiments. For example, in one embodiment up to 16 hardware threads are supported. In an embodiment in which seven threads may access 4 Kbytes, the GRF 1824 can store a total of 28 Kbytes. Where 16 threads may access 4 Kbytes, the GRF 1824 can store a total of 64 Kbytes. Flexible addressing modes can permit registers to be addressed together to build effectively wider registers or to represent strided rectangular block data structures.

In one embodiment, memory operations, sampler operations, and other longer-latency system communications are dispatched via "send" instructions that are executed by the message passing send unit 1830. In one embodiment, branch instructions are dispatched to a dedicated branch unit 1832 to facilitate SIMD divergence and eventual convergence.

In one embodiment the vector engine 1802 includes one or more SIMD floating point units (FPU(s)) 1834 to perform floating-point operations. In one embodiment, the FPU(s) 1834 also support integer computation. In one embodiment the FPU(s) 1834 can execute up to M number of 32-bit floating-point (or integer) operations, or execute up to 2M 16-bit integer or 16-bit floating-point operations. In one embodiment, at least one of the FPU(s) provides extended math capability to support high-throughput transcendental math functions and double precision 64-bit floating-point. In some embodiments, a set of 8-bit integer SIMD ALUs 1835 are also present and may be specifically optimized to perform operations associated with machine learning computations. In one embodiment, the SIMD ALUs are replaced by an additional set of SIMD FPUs 1834 that are configurable to perform integer and floating-point operations. In one embodiment, the SIMD FPUs 1834 and SIMD ALUs 1835 are configurable to execute SIMT programs. In one embodiment, combined SIMD+SIMT operation is supported.

In one embodiment, arrays of multiple instances of the vector engine 1802 can be instantiated in a graphics core. For scalability, product architects can choose the exact number of vector engines per graphics core grouping. In one embodiment the vector engine 1802 can execute instructions across a plurality of execution channels. In a further embodiment, each thread executed on the vector engine 1802 is executed on a different channel.

As shown in FIG. 18C, in one embodiment the matrix engine 1803 includes an array of processing elements that are configured to perform tensor operations including vector/matrix and matrix/matrix operations, such as but not limited to matrix multiply and/or dot product operations. The matrix engine 1803 is configured with M rows and N columns of processing elements (PE 1852AA-PE 1852MN) that include multiplier and adder circuits organized in a pipelined fashion. In one embodiment, the processing elements 1852AA-PE 1852MN make up the physical pipeline stages of an N wide and M deep systolic array that can be used to perform vector/matrix or matrix/matrix operations in a data-parallel manner, including matrix multiply, fused multiply-add, dot product or other general matrix-matrix multiplication (GEMM) operations. In one embodiment the matrix engine 1803 supports 16-bit floating point operations, as well as 8-bit, 4-bit, 2-bit, and binary integer operations. The matrix engine 1803 can also be configured to accelerate specific machine learning operations. In such embodiments, the matrix engine 1803 can be configured with support for the bfloat (brain floating point) 16-bit floating point format or a tensor float 32-bit floating point format (TF32) that have different numbers of mantissa and exponent bits relative to Institute of Electrical and Electronics Engineers (IEEE) 754 formats.

In one embodiment, during each cycle, each stage can add the result of operations performed at that stage to the output of the previous stage. In other embodiments, the pattern of data movement between the processing elements 1852AA-1852MN after a set of computational cycles can vary based on the instruction or macro-operation being performed. For example, in one embodiment partial sum loopback is enabled and the processing elements may instead add the output of a current cycle with output generated in the previous cycle. In one embodiment, the final stage of the systolic array can be configured with a loopback to the initial stage of the systolic array. In such embodiment, the number of physical pipeline stages may be decoupled from the number of logical pipeline stages that are supported by the matrix engine 1803. For example, where the processing elements 1852AA-1852MN are configured as a systolic array of M physical stages, a loopback from stage M to the initial pipeline stage can enable the processing elements 1852AA-PE552MN to operate as a systolic array of, for example, 2M, 3M, 4M, etc., logical pipeline stages.

In one embodiment, the matrix engine 1803 includes memory 1841A-1841N, 1842A-1842M to store input data in the form of row and column data for input matrices. Memory 1842A-1842M is configurable to store row elements (A0-Am) of a first input matrix and memory 1841A-1841N is configurable to store column elements (B0-Bn) of a second input matrix. The row and column elements are provided as input to the processing elements 1852AA-1852MN for processing. In one embodiment, row and column elements of the input matrices can be stored in a systolic register file 1840 within the matrix engine 1803 before those elements are provided to the memory 1841A-1841N, 1842A-1842M. In one embodiment, the systolic register file 1840 is excluded and the memory 1841A-1841N, 1842A-1842M is loaded from registers in an associated vector engine (e.g., GRF 1824 of vector engine 1802 of FIG. 18B) or other memory of the graphics core that includes the matrix engine 1803 (e.g., data cache/shared local memory 1806A for matrix engine 1803A of FIG. 18A). Results generated by the processing elements 1852AA-1852MN are then output to an output buffer and/or written to a register file (e.g., systolic register file 1840, GRF 1824, data cache/shared local memory 1806A-1806N) for further processing by other functional units of the graphics processor or for output to memory.

In some embodiments, the matrix engine 1803 is configured with support for input sparsity, where multiplication operations for sparse regions of input data can be bypassed by skipping multiply operations that have a zero-value operand. In one embodiment, the processing elements 1852AA-1852MN are configured to skip the performance of certain operations that have zero value input. In one embodiment, sparsity within input matrices can be detected and operations having known zero output values can be bypassed before being submitted to the processing elements 1852AA-1852MN. The loading of zero value operands into the processing elements can be bypassed and the processing elements 1852AA-1852MN can be configured to perform multiplications on the non-zero value input elements. The matrix engine 1803 can also be configured with support for output sparsity, such that operations with results that are pre-determined to be zero are bypassed. For input sparsity and/or output sparsity, in one embodiment, metadata is provided to the processing elements 1852AA-1852MN to indicate, for a processing cycle, which processing elements and/or data channels are to be active during that cycle.

In one embodiment, the matrix engine 1803 includes hardware to enable operations on sparse data having a compressed representation of a sparse matrix that stores non-zero values and metadata that identifies the positions of the non-zero values within the matrix. Exemplary compressed representations include but are not limited to compressed tensor representations such as compressed sparse row (CSR), compressed sparse column (CSC), compressed sparse fiber (CSF) representations. Support for compressed representations enable operations to be performed on input in a compressed tensor format without requiring the compressed representation to be decompressed or decoded. In such embodiment, operations can be performed only on non-zero input values and the resulting non-zero output values can be mapped into an output matrix. In some embodiments, hardware support is also provided for machine-specific lossless data compression formats that are used when transmitting data within hardware or across system busses. Such data may be retained in a compressed format for sparse input data and the matrix engine 1803 can used the compression metadata for the compressed data to enable operations to be performed on only non-zero values, or to enable blocks of zero data input to be bypassed for multiply operations.

In various embodiments, input data can be provided by a programmer in a compressed tensor representation, or a codec can compress input data into the compressed tensor representation or another sparse data encoding. In addition to support for compressed tensor representations, streaming compression of sparse input data can be performed before the data is provided to the processing elements 1852AA-1852MN. In one embodiment, compression is performed on data written to a cache memory associated with the graphics core cluster 1714, with the compression being performed with an encoding that is supported by the matrix engine 1803. In one embodiment, the matrix engine 1803 includes support for input having structured sparsity in which a pre-determined level or pattern of sparsity is imposed on input data. This data may be compressed to a known compression ratio, with the compressed data being processed by the processing elements 1852AA-1852MN according to metadata associated with the compressed data.

FIG. 19 illustrates a tile 1900 of a multi-tile processor, according to an embodiment. In one embodiment, the tile 1900 is representative of one of the graphics engine tiles 1610A-1610D of FIG. 16B or compute engine tiles 1640A-1640D of FIG. 16C. The tile 1900 of the multi-tile graphics processor includes an array of graphics core clusters (e.g., graphics core cluster 1714A, graphics core cluster 1714B, through graphics core cluster 1714N), with each graphics core cluster having an array of graphics cores 515A-515N. The tile 1900 also includes a global dispatcher 1902 to dispatch threads to processing resources of the tile 1900.

The tile 1900 can include or couple with an L3 cache 1906 and memory 1910. In various embodiments, the L3 cache 1906 may be excluded or the tile 1900 can include additional levels of cache, such as an L4 cache. In one embodiment, each instance of the tile 1900 in the multi-tile graphics processor has an associated memory 1910, such as in FIG. 16B and FIG. 16C. In one embodiment, a multi-tile processor can be configured as a multi-chip module in which the L3 cache 1906 and/or memory 1910 reside on separate chiplets than the graphics core clusters 1714A-1714N. In this context, a chiplet is an at least partially packaged integrated circuit that includes distinct units of logic that can be assembled with other chiplets into a larger package. For example, the L3 cache 1906 can be included in a dedicated cache chiplet or can reside on the same chiplet as the graphics core clusters 1714A-1714N. In one embodiment, the L3 cache 1906 can be included in an active base die or active interposer, as illustrated in FIG. 24C.

A memory fabric 1903 enables communication among the graphics core clusters 1714A-1714N, L3 cache 1906, and memory 1910. An L2 cache 1904 couples with the memory fabric 1903 and is configurable to cache transactions performed via the memory fabric 1903. A tile interconnect 1908 enables communication with other tiles on the graphics processors and may be one of tile interconnects 1623A-1623F of FIGS. 16B and 16C. In embodiments in which the L3 cache 1906 is excluded from the tile 1900, the L2 cache 1904 may be configured as a combined L2/L3 cache. The memory fabric 1903 is configurable to route data to the L3 cache 1906 or memory controllers associated with the memory 1910 based on the presence or absence of the L3 cache 1906 in a specific implementation. The L3 cache 1906 can be configured as a per-tile cache that is dedicated to processing resources of the tile 1900 or may be a partition of a GPU-wide L3 cache.

FIG. 20 is a block diagram illustrating graphics processor instruction formats 2000. The graphics processor execution units support an instruction set having instructions in multiple formats. The solid lined boxes illustrate the components that are generally included in an execution unit instruction, while the dashed lines include components that are optional or that are only included in a sub-set of the instructions. In some embodiments the graphics processor instruction formats 2000 described and illustrated are macro-instructions, in that they are instructions supplied to the execution unit, as opposed to micro-operations resulting from instruction decode once the instruction is processed. Thus, a single instruction may cause hardware to perform multiple micro-operations The graphics processor execution units as described herein may natively support instructions in a 128-bit instruction format 2010. A 64-bit compacted instruction format 2030 is available for some instructions based on the selected instruction, instruction options, and number of operands. The native 128-bit instruction format 2010 provides access to all instruction options, while some options and operations are restricted in the 64-bit format 2030. The native instructions available in the 64-bit format 2030 vary by embodiment. The instruction is compacted in part using a set of index values in an index field 2013. The execution unit hardware references a set of compaction tables based on the index values and uses the compaction table outputs to reconstruct a native instruction in the 128-bit instruction format 2010. Other sizes and formats of instruction can be used.

For each format, instruction opcode 2012 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. Instruction control field 2014 may enable control over certain execution options, such as channels selection (e.g., predication) and data channel order (e.g., swizzle). For instructions in the 128-bit instruction format 2010 an exec-size field 2016 limits the number of data channels that will be executed in parallel. An exec-size field 2016 may not be available for use in the 64-bit compact instruction format 2030.

Some execution unit instructions have up to three operands including two source operands, src0 2020, src1 2022, and one destination operand (dest 2018). Other instructions, such as, for example, data manipulation instructions, dot product instructions, multiply-add instructions, or multiply-accumulate instructions, can have a third source operand (e.g., SRC2 2024). The instruction opcode 2012 determines the number of source operands. An instruction's last source operand can be an immediate (e.g., hard-coded) value passed with the instruction. The execution units may also support multiple destination instructions, where one or more of the destinations is implied or implicit based on the instruction and/or the specified destination.

The 128-bit instruction format 2010 may include an access/address mode field 2026 specifying, for example, whether direct register addressing mode or indirect register addressing mode is used. When direct register addressing mode is used, the register address of one or more operands is directly provided by bits in the instruction.

The 128-bit instruction format 2010 may also include an access/address mode field 2026, which specifies an address mode and/or an access mode for the instruction. The access mode may be used to define a data access alignment for the instruction. Access modes including a 16-byte aligned access mode and a 1-byte aligned access mode may be supported, where the byte alignment of the access mode determines the access alignment of the instruction operands. For example, when in a first mode, the instruction may use byte-aligned addressing for source and destination operands and when in a second mode, the instruction may use 16-byte-aligned addressing for all source and destination operands.

The address mode portion of the access/address mode field 2026 may determine whether the instruction is to use direct or indirect addressing. When direct register addressing mode is used bits in the instruction directly provide the register address of one or more operands. When indirect register addressing mode is used, the register address of one or more operands may be computed based on an address register value and an address immediate field in the instruction.

Instructions may be grouped based on opcode 2012 bit-fields to simplify Opcode decode 2040. For an 8-bit opcode, bits 4, 5, and 6 allow the execution unit to determine the type of opcode. The precise opcode grouping shown is merely an example. A move and logic opcode group 2042 may include data movement and logic instructions (e.g., move (mov), compare (cmp)). Move and logic group 2042 may share the five least significant bits (LSB), where move (mov) instructions are in the form of 0000xxxxb and logic instructions are in the form of 0001xxxxb. A flow control instruction group 2044 (e.g., call, jump (jmp)) includes instructions in the form of 0010xxxxb (e.g., synchronization instructions (e.g., wait, send) in the form of 0011xxxxb (e.g., 0x30). A parallel math instruction group 2048 includes component-wise arithmetic instructions (e.g., add, multiply (mul)) in the form of 0100xxxxb (e.g., 0x40). The parallel math instruction group 2048 performs the arithmetic operations in parallel across data channels. The vector math group 2050 includes arithmetic instructions (e.g., dp4) in the form of 0101xxxxb (e.g., 0x50). The vector math group performs arithmetic such as dot product calculations on vector operands. The illustrated opcode decode 2040, in one embodiment, can be used to determine which portion of an execution unit will be used to execute a decoded instruction. For example, some instructions may be designated as systolic instructions that will be performed by a systolic array. Other instructions, such as ray-tracing instructions (not shown) can be routed to a ray-tracing core or ray-tracing logic within a slice or partition of execution logic.

Graphics Pipeline

FIG. 21 is a block diagram of graphics processor 2100, according to another embodiment. The elements of FIG. 21 having the same or similar names as the elements of any other figure herein describe the same elements as in the other figures, can operate or function in a manner similar to that, can comprise the same components, and can be linked to other entities, as those described elsewhere herein, but are not limited to such.

The graphics processor 2100 may include different types of graphics processing pipelines, such as a geometry pipeline 2120, a media pipeline 2130, a display engine 2140, thread execution logic 2150, and a render output pipeline 2170. Graphics processor 2100 may be a graphics processor within a multi-core processing system that includes one or more general-purpose processing cores. The graphics processor may be controlled by register writes to one or more control registers (not shown) or via commands issued to graphics processor 2100 via a ring interconnect 2102. Ring interconnect 2102 may couple graphics processor 2100 to other processing components, such as other graphics processors or general-purpose processors. Commands from ring interconnect 2102 are interpreted by a command streamer 2103, which supplies instructions to individual components of the geometry pipeline 2120 or the media pipeline 2130.

Command streamer 2103 may direct the operation of a vertex fetcher 2105 that reads vertex data from memory and executes vertex-processing commands provided by command streamer 2103. The vertex fetcher 2105 may provide vertex data to a vertex shader 2107, which performs coordinate space transformation and lighting operations to each vertex. Vertex fetcher 2105 and vertex shader 2107 may execute vertex-processing instructions by dispatching execution threads to graphics cores 2152A-2152B via a thread dispatcher 2131.

The graphics cores 2152A-2152B may be an array of vector processors having an instruction set for performing graphics and media operations. The graphics cores 2152A-2152B may have an attached L1 cache 2151 that is specific for each array or shared between the arrays. The cache can be configured as a data cache, an instruction cache, or a single cache that is partitioned to contain data and instructions in different partitions.

A geometry pipeline 2120 may include tessellation components to perform hardware-accelerated tessellation of 3D objects. A programmable hull shader 2111 may configure the tessellation operations. A programmable domain shader 2117 may provide back-end evaluation of tessellation output. A tessellator 2113 may operate at the direction of hull shader 2111 and contain special purpose logic to generate a set of detailed geometric objects based on a coarse geometric model that is provided as input to geometry pipeline 2120. In addition, if tessellation is not used, tessellation components (e.g., hull shader 2111, tessellator 2113, and domain shader 2117) can be bypassed. The tessellation components can operate based on data received from the vertex shader 2107.

Complete geometric objects may be processed by a geometry shader 2119 via one or more threads dispatched to graphics cores 2152A-2152B or can proceed directly to the clipper 2129. The geometry shader may operate on entire geometric objects, rather than vertices or patches of vertices as in previous stages of the graphics pipeline. If the tessellation is disabled, the geometry shader 2119 receives input from the vertex shader 2107. The geometry shader 2119 may be programmable by a geometry shader program to perform geometry tessellation if the tessellation units are disabled.

Before rasterization, a clipper 2129 processes vertex data. The clipper 2129 may be a fixed function clipper or a programmable clipper having clipping and geometry shader functions. A rasterizer and depth test component 2173 in the render output pipeline 2170 may dispatch pixel shaders to convert the geometric objects into per pixel representations. The pixel shader logic may be included in thread execution logic 2150. Optionally, an application can bypass the rasterizer and depth test component 2173 and access un-rasterized vertex data via a stream out unit 2123.

The graphics processor 2100 has an interconnect bus, interconnect fabric, or some other interconnect mechanism that allows data and message passing amongst the major components of the cache 2151, sampler 2154, texture cache 2158, etc.) interconnect via a data port 2156 to perform memory access and communicate with render output pipeline components of the processor. A sampler 2154, caches 2151, 2158 and graphics cores 2152A-2152B each may have separate memory access paths. Optionally, the texture cache 2158 can also be configured as a sampler cache.

The render output pipeline 2170 may contain a rasterizer and depth test component 2173 that converts vertex-based objects into an associated pixel-based representation. The rasterizer logic may include a windower/masker unit to perform fixed function triangle and line rasterization. An associated render cache 2178 and depth cache 2179 are also available in some embodiments. A pixel operations component 2177 performs pixel-based operations on the data, though in some instances, pixel operations associated with 2D operations (e.g., bit block image transfers with blending) are performed by the 2D engine 2141 or substituted at display time by the display controller 2143 using overlay display planes. A shared L3 cache 2175 may be available to all graphics components, allowing the sharing of data without the use of main system memory.

The media pipeline 2130 may include a media engine 2137 and a video front end 2134. Video front end 2134 may receive pipeline commands from the command streamer 2103. The media pipeline 2130 may include a separate command streamer. Video front end 2134 may process media commands before sending the command to the media engine 2137. Media engine 2137 may include thread spawning functionality to spawn threads for dispatch to thread execution logic 2150 via thread dispatcher 2131.

The graphics processor 2100 may include a display engine 2140. This display engine 2140 may be external to processor 2100 and may couple with the graphics processor via the ring interconnect 2102, or some other interconnect bus or fabric. Display engine 2140 may include a 2D engine 2141 and a display controller 2143. Display engine 2140 may contain special purpose logic capable of operating independently of the 3D pipeline. Display controller 2143 may couple with a display device (not shown), which may be a system integrated display device, as in a laptop computer, or an external display device attached via a display device connector.

The geometry pipeline 2120 and media pipeline 2130 may be configurable to perform operations based on multiple graphics and media programming interfaces and are not specific to any one application programming interface (API). A driver software for the graphics processor may translate API calls that are specific to a particular graphics or media library into commands that can be processed by the graphics processor. Support may be provided for the Open Graphics Library from the Khronos Group. Support may also be provided for the Direct3D library from the Microsoft Corporation. A combination of these libraries may be supported. Support may also be provided for the Open Source Computer Vision Library (OpenCV). A future API with a compatible 3D pipeline would also be supported if a mapping can be made from the pipeline of the future API to the pipeline of the graphics processor.

Graphics Pipeline Programming

FIG. 22A is a block diagram illustrating a graphics processor command format 2200 used for programming graphics processing pipelines, such as, for example, the pipelines described herein. FIG. 22B is a block diagram illustrating a graphics processor command sequence 2210 according to an embodiment. The solid lined boxes in FIG. 22A illustrate the components that are generally included in a graphics command while the dashed lines include components that are optional or that are only included in a sub-set of the graphics commands. The exemplary graphics processor command format 2200 of FIG. 22A includes data fields to identify a client 2202, a command operation code (opcode) 2204, and data 2206 for the command. A sub-opcode 2205 and a command size 2208 are also included in some commands.

Client 2202 may specify the client unit of the graphics device that processes the command data. A graphics processor command parser may examine the client field of each command to condition the further processing of the command and route the command data to the appropriate client unit. The graphics processor client units may include a memory interface unit, a render unit, a 2D unit, a 3D unit, and a media unit. Each client unit may have a corresponding processing pipeline that processes the commands. Once the command is received by the client unit, the client unit reads the opcode 2204 and, if present, sub-opcode 2205 to determine the operation to perform. The client unit performs the command using information in data field 2206. For some commands an explicit command size 2208 is expected to specify the size of the command. The command parser may automatically determine the size of at least some of the commands based on the command opcode. Commands may be aligned via multiples of a double word. Other command formats can also be used.

The flow diagram in FIG. 22B illustrates an exemplary graphics processor command sequence 2210. Software or firmware of a data processing system that features an exemplary graphics processor may use a version of the command sequence shown to set up, execute, and terminate a set of graphics operations. A sample command sequence is shown and described for purposes of example only and is not limited to these specific commands or to this command sequence. Moreover, the commands may be issued as batch of commands in a command sequence, such that the graphics processor will process the sequence of commands in at least partially concurrence.

The graphics processor command sequence 2210 may begin with a pipeline flush command 2212 to cause any active graphics pipeline to complete the currently pending commands for the pipeline. Optionally, the 3D pipeline 2222 and the media pipeline 2224 may not operate concurrently. The pipeline flush is performed to cause the active graphics pipeline to complete any pending commands. In response to a pipeline flush, the command parser for the graphics processor will pause command processing until the active drawing engines complete pending operations and the relevant read caches are invalidated. Optionally, any data in the render cache that is marked 'dirty' can be flushed to memory. Pipeline flush command 2212 can be used for pipeline synchronization or before placing the graphics processor into a low power state.

A pipeline select command 2213 may be used when a command sequence requires the graphics processor to explicitly switch between pipelines. A pipeline select command 2213 may be required only once within an execution context before issuing pipeline commands unless the context is to issue commands for both pipelines. A pipeline flush command 2212 may be required immediately before a pipeline switch via the pipeline select command 2213.

A pipeline control command 2214 may configure a graphics pipeline for operation and may be used to program the 3D pipeline 2222 and the media pipeline 2224. The pipeline control command 2214 may configure the pipeline state for the active pipeline. The pipeline control command 2214 may be used for pipeline synchronization and to clear data from one or more cache memories within the active pipeline before processing a batch of commands.

Commands related to the return buffer state 2216 may be used to configure a set of return buffers for the respective pipelines to write data. Some pipeline operations require the allocation, selection, or configuration of one or more return buffers into which the operations write intermediate data during processing. The graphics processor may also use one or more return buffers to store output data and to perform cross thread communication. The return buffer state 2216 may include selecting the size and number of return buffers to use for a set of pipeline operations.

The remaining commands in the command sequence differ based on the active pipeline for operations. Based on a pipeline determination 2220, the command sequence is tailored to the 3D pipeline 2222 beginning with the 3D pipeline state 2230 or the media pipeline 2224 beginning at the media pipeline state 2240.

The commands to configure the 3D pipeline state 2230 include 3D state setting commands for vertex buffer state, vertex element state, constant color state, depth buffer state, and other state variables that are to be configured before 3D primitive commands are processed. The values of these commands are determined at least in part based on the particular 3D API in use. The 3D pipeline state 2230 commands may also be able to selectively disable or bypass certain pipeline elements if those elements will not be used.

A 3D primitive 2232 command may be used to submit 3D primitives to be processed by the 3D pipeline. Commands and associated parameters that are passed to the graphics processor via the 3D primitive 2232 command are forwarded to the vertex fetch function in the graphics pipeline. The vertex fetch function uses the 3D primitive 2232 command data to generate vertex data structures. The vertex data structures are stored in one or more return buffers. The 3D primitive 2232 command may be used to perform vertex operations on 3D primitives via vertex shaders. To process vertex shaders, 3D pipeline 2222 dispatches shader execution threads to graphics processor execution units.

The 3D pipeline 2222 may be triggered via an execute 2234 command or event. A register may write trigger command executions. An execution may be triggered via a 'go' or 'kick' command in the command sequence. Command execution may be triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back-end operations may also be included for those operations.

The graphics processor command sequence 2210 may follow the media pipeline 2224 path when performing media operations. In general, the specific use and manner of programming for the media pipeline 2224 depends on the media or compute operations to be performed. Specific media decode operations may be offloaded to the media pipeline during media decode. The media pipeline can also be bypassed and media decode can be performed in whole or in part using resources provided by one or more general-purpose processing cores. The media pipeline may also include elements for general-purpose graphics processor unit (GPGPU) operations, where the that are not explicitly related to the rendering of graphics primitives.

Media pipeline 2224 may be configured in a similar manner as the 3D pipeline 2222. A set of commands to configure the media pipeline state 2240 are dispatched or placed into a command queue before the media object commands 2242. Commands for the media pipeline state 2240 may include data to configure the media pipeline elements that will be used to process the media objects. This includes data to configure the video decode and video encode logic within the media pipeline, such as encode or decode format. Commands for the media pipeline state 2240 may also support the use of one or more pointers to "indirect" state elements that contain a batch of state settings.

Media object commands 2242 may supply pointers to media objects for processing by the media pipeline. The media objects include memory buffers containing video data to be processed. Optionally, all media pipeline states must be valid before issuing a media object command 2242. Once the pipeline state is configured and media object commands 2242 are queued, the media pipeline 2224 is triggered via an execute command 2244 or an equivalent execute event (e.g., register write). Output from media pipeline 2224 may then be post processed by operations provided by the 3D pipeline 2222 or the media pipeline 2224. GPGPU operations may be configured and executed in a similar manner as media operations.

Graphics Software Architecture

FIG. 23 illustrates an exemplary graphics software architecture for a data processing system 2300. Such a software architecture may include a 3D graphics application 2310, an operating system 2320, and at least one processor 2330. Processor 2330 may include a graphics processor 2332 and one or more general-purpose processor core(s) 2334. The processor 2330 may be a variant of the processor 1402 or any other of the processors described herein. The processor 2330 may be used in place of the processor 1402 or any other of the processors described herein. Therefore, the disclosure of any features in combination with the processor 1402 or any other of the processors described herein also discloses a corresponding combination with the graphics processor 2332 but is not limited to such. Moreover, the elements of FIG. 23 having the same or similar names as the elements of any other figure herein describe the same elements as in the other figures, can operate or function in a manner similar to that, can comprise the same components, and can be linked to other entities, as those described elsewhere herein, but are not limited to such. The graphics application 2310 and operating system 2320 are each executed in the system memory 2350 of the data processing system.

3D graphics application 2310 may contain one or more shader programs including shader instructions 2312. The shader language instructions may be in a high-level shader language, such as the High-Level Shader Language (HLSL) of Direct3D, the OpenGL Shader Language (GLSL), and so forth. The application may also include executable instructions 2314 in a machine language suitable for execution by the general-purpose processor core 2334. The application may also include graphics objects 2316 defined by vertex data.

The operating system 2320 may be a Microsoft® Windows® operating system from the Microsoft Corporation, a proprietary UNIX-like operating system, or an open-source UNIX-like operating system using a variant of the Linux kernel. The operating system 2320 can support a graphics API 2322 such as the Direct3D API, the OpenGL API, or the Vulkan API. When the Direct3D API is in use, the operating system 2320 uses a front-end shader compiler 2324 to compile any shader instructions 2312 in HLSL into a lower-level shader language. The compilation may be a just-in-time (JIT) compilation or the application can perform shader pre-compilation. High-level shaders may be compiled into low-level shaders during the compilation of the 3D graphics application 2310. The shader instructions 2312 may be provided in an intermediate form, such as a version of the Standard Portable Intermediate Representation (SPIR) used by the Vulkan API.

User mode graphics driver 2326 may contain a back-end shader compiler 2327 to convert the shader instructions 2312 into a hardware specific representation. When the OpenGL API is in use, shader instructions 2312 in the GLSL high-level language are passed to a user mode graphics driver 2326 for compilation. The user mode graphics driver 2326 may use operating system kernel mode functions 2328 to communicate with a kernel mode graphics driver 2329. The kernel mode graphics driver 2329 may communicate with graphics processor 2332 to dispatch commands and instructions.

IP Core Implementations

One or more aspects may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

FIG. 24A is a block diagram illustrating an IP core development system 2400 that may be used to manufacture an integrated circuit to perform operations according to an embodiment. The IP core development system 2400 may be used to generate modular, re-usable designs that can be incorporated into a larger design or used to construct an entire integrated circuit (e.g., an SOC integrated circuit). A design facility 2430 can generate a software simulation 2410 of an IP core design in a high-level programming language (e.g., C/C++). The software simulation 2410 can be used to design, test, and verify the behavior of the IP core using a simulation model 2412. The simulation model 2412 may include functional, behavioral, and/or timing simulations. A register transfer level (RTL) design 2415 can then be created or synthesized from the simulation model 2412. The RTL design 2415 is an abstraction of the behavior of the integrated circuit that models the flow of digital signals between hardware registers, including the associated logic performed using the modeled digital signals. In addition to an RTL design 2415, lower-level designs at the logic level or transistor level may also be created, designed, or synthesized. Thus, the particular details of the initial design and simulation may vary.

The RTL design 2415 or equivalent may be further synthesized by the design facility into a hardware model 2420, which may be in a hardware description language (HDL), or some other representation of physical design data. The HDL may be further simulated or tested to verify the IP core design. The IP core design can be stored for delivery to a 3 rd party fabrication facility 2465 using non-volatile memory 2440 (e.g., hard disk, flash memory, or any non-volatile storage medium). Alternatively, the IP core design may be transmitted (e.g., via the Internet) over a wired connection 2450 or wireless connection 2460. The fabrication facility 2465 may then fabricate an integrated circuit that is based at least in part on the IP core design. The fabricated integrated circuit can be configured to perform operations in accordance with at least one embodiment described herein.

FIG. 24B illustrates a cross-section side view of an integrated circuit package assembly 2470. The integrated circuit package assembly 2470 illustrates an implementation of one or more units of hardware logic 2472, 2474 connected to a substrate 2480. The logic 2472, 2474 may be implemented at least partly in configurable logic or fixed-functionality logic hardware and can include one or more portions of any of the processor core(s), graphics processor(s), or other accelerator devices described herein. Each unit of logic 2472, 2474 can be implemented within a semiconductor die and coupled with the substrate 2480 via an interconnect structure 2473. The interconnect structure 2473 may be configured to route electrical signals between the logic 2472, 2474 and the substrate 2480, and can include interconnects such as, but not limited to bumps or pillars. The interconnect structure 2473 may be configured to route electrical signals such as, for example, input/output (I/O) signals and/or power or ground signals associated with the operation of the logic 2472, 2474. Optionally, the substrate 2480 may be an epoxy-based laminate substrate. The substrate 2480 may also include other suitable types of substrates. The package assembly 2470 can be connected to other electrical devices via a package interconnect 2483. The package interconnect 2483 may be coupled to a surface of the substrate 2480 to route electrical signals to other electrical devices, such as a motherboard, other chipset, or multi-chip module.

The units of logic 2472, 2474 may be electrically coupled with a bridge 2482 that is configured to route electrical signals between the logic 2472, 2474. The bridge 2482 may be a dense interconnect structure that provides a route for electrical signals. The bridge 2482 may include a bridge substrate composed of glass or a suitable semiconductor material. Electrical routing features can be formed on the bridge substrate to provide a chip-to-chip connection between the logic 2472, 2474.

Although two units of logic 2472, 2474 and a bridge 2482 are illustrated, embodiments described herein may include more or fewer logic units on one or more dies. The one or more dies may be connected by zero or more bridges, as the bridge 2482 may be excluded when the logic is included on a single die. Alternatively, multiple dies or units of logic can be connected by one or more bridges. Additionally, multiple logic units, dies, and bridges can be connected together in other possible configurations, including three-dimensional configurations.

FIG. 24C illustrates a package assembly 2490 that includes multiple units of hardware logic chiplets connected to a substrate 2480 (e.g., base die). A graphics processing unit, parallel processor, and/or compute accelerator as described herein can be composed from diverse silicon chiplets that are separately manufactured. In this context, a chiplet is an at least partially packaged integrated circuit that includes distinct units of logic that can be assembled with other chiplets into a larger package. A diverse set of chiplets with different IP core logic can be assembled into a single device. Additionally, the chiplets can be integrated into a base die or base chiplet using active interposer technology. The concepts described herein enable the interconnection and communication between the different forms of IP within the GPU. IP cores can be manufactured using different process technologies and composed during manufacturing, which avoids the complexity of converging multiple IPs, especially on a large SoC with several flavors IPs, to the same manufacturing process. Enabling the use of multiple process technologies improves the time to market and provides a cost-effective way to create multiple product SKUs. Additionally, the disaggregated IPs are more amenable to being power gated independently, components that are not in use on a given workload can be powered off, reducing overall power consumption.

In various embodiments a package assembly 2490 can include fewer or greater number of components and chiplets that are interconnected by a fabric 2485 or one or more bridges 2487. The chiplets within the package assembly 2490 may have a 2.5D arrangement using Chip-on-Wafer-on-Substrate stacking in which multiple dies are stacked side-by-side on a silicon interposer that includes through-silicon vias (TSVs) to couple the chiplets with the substrate 2480, which includes electrical connections to the package interconnect 2483.

In one embodiment, silicon interposer is an active interposer 2489 that includes embedded logic in addition to TSVs. In such embodiment, the chiplets within the package assembly 2490 are arranged using 3D face to face die stacking on top of the active interposer 2489. The active interposer 2489 can include hardware logic for I/O 2491, cache memory 2492, and other hardware logic 2493, in addition to interconnect fabric 2485 and a silicon bridge 2487. The fabric 2485 enables communication between the various logic chiplets 2472, 2474 and the logic 2491, 2493 within the active interposer 2489. The fabric 2485 may be an NoC interconnect or another form of packet switched fabric that switches data packets between components of the package assembly. For complex assemblies, the fabric 2485 may be a dedicated chiplet enables communication between the various hardware logic of the package assembly 2490.

Bridge structures 2487 within the active interposer 2489 may be used to facilitate a point-to-point interconnect between, for example, logic or I/O chiplets 2474 and memory chiplets 2475. In some implementations, bridge structures 2487 may also be embedded within the substrate 2480.

The hardware logic chiplets can include special purpose hardware logic chiplets 2472, logic or I/O chiplets 2474, and/or memory chiplets 2475. The hardware logic chiplets 2472 and logic or I/O chiplets 2474 may be implemented at least partly in configurable logic or fixed-functionality logic hardware and can include one or more portions of any of the processor core(s), graphics processor(s), parallel processors, or other accelerator devices described herein. The memory chiplets 2475 can be DRAM (e.g., GDDR, HBM) memory or cache (SRAM) memory. Cache memory 2492 within the active interposer 2489 (or substrate 2480) can act as a global cache for the package assembly 2490, part of a distributed global cache, or as a dedicated cache for the fabric 2485

Each chiplet can be fabricated as separate semiconductor die and coupled with a base die that is embedded within or coupled with the substrate 2480. The coupling with the substrate 2480 can be performed via an interconnect structure 2473. The interconnect structure 2473 may be configured to route electrical signals between the various chiplets and logic within the substrate 2480. The interconnect structure 2473 can include interconnects such as, but not limited to bumps or pillars. In some embodiments, the interconnect structure 2473 may be configured to route electrical signals such as, for example, input/output (I/O) signals and/or power or ground signals associated with the operation of the logic, I/O and memory chiplets. In one embodiment, an additional interconnect structure couples the active interposer 2489 with the substrate 2480.

The substrate 2480 may be an epoxy-based laminate substrate, however, it is not limited to that and the substrate 2480 may also include other suitable types of substrates. The package assembly 2490 can be connected to other electrical devices via a package interconnect 2483. The package interconnect 2483 may be coupled to a surface of the substrate 2480 to route electrical signals to other electrical devices, such as a motherboard, other chipset, or multi-chip module.

A logic or I/O chiplet 2474 and a memory chiplet 2475 may be electrically coupled via a bridge 2487 that is configured to route electrical signals between the logic or I/O chiplet 2474 and a memory chiplet 2475. The bridge 2487 may be a dense interconnect structure that provides a route for electrical signals. The bridge 2487 may include a bridge substrate composed of glass or a suitable semiconductor material. Electrical routing features can be formed on the bridge substrate to provide a chip-to-chip connection between the logic or I/O chiplet 2474 and a memory chiplet 2475. The bridge 2487 may also be referred to as a silicon bridge or an interconnect bridge. For example, the bridge 2487 is an Embedded Multi-die Interconnect Bridge (EMIB). Alternatively, the bridge 2487 may simply be a direct connection from one chiplet to another chiplet.

FIG. 24D illustrates a package assembly 2494 including interchangeable chiplets 2495, according to an embodiment. The interchangeable chiplets 2495 can be assembled into standardized slots on one or more base chiplets 2496, 2498. The base chiplets 2496, 2498 can be coupled via a bridge interconnect 2497, which can be similar to the other bridge interconnects described herein and may be, for example, an EMIB. Memory chiplets can also be connected to logic or I/O chiplets via a bridge interconnect. I/O and logic chiplets can communicate via an interconnect fabric. The base chiplets can each support one or more slots in a standardized format for one of logic or I/O or memory/cache.

SRAM and power delivery circuits may be fabricated into one or more of the base chiplets 2496, 2498, which can be fabricated using a different process technology relative to the interchangeable chiplets 2495 that are stacked on top of the base chiplets. For example, the base chiplets 2496, 2498 can be fabricated using a larger process technology, while the interchangeable chiplets can be manufactured using a smaller process technology. One or more of the interchangeable chiplets 2495 may be memory (e.g., DRAM) chiplets. Different memory densities can be selected for the package assembly 2494 based on the power, and/or performance targeted for the product that uses the package assembly 2494. Additionally, logic chiplets with a different number of type of functional units can be selected at time of assembly based on the power, and/or performance targeted for the product. Additionally, chiplets containing IP logic cores of differing types can be inserted into the interchangeable chiplet slots, enabling hybrid processor designs that can mix and match different technology IP blocks.

Exemplary System on a Chip Integrated Circuit

FIG. 25-26B illustrate exemplary integrated circuits and associated graphics processors that may be fabricated using one or more IP cores. In addition to what is illustrated, other logic and circuits may be included, including additional graphics processors/cores, peripheral interface controllers, or general-purpose processor cores. The elements of FIG. 25-26B having the same or similar names as the elements of any other figure herein describe the same elements as in the other figures, can operate or function in a manner similar to that, can comprise the same components, and can be linked to other entities, as those described elsewhere herein, but are not limited to such.

FIG. 25 is a block diagram illustrating an exemplary system on a chip integrated circuit 2500 that may be fabricated using one or more IP cores. Exemplary integrated circuit 2500 includes one or more application processor(s) 2505 (e.g., CPUs), at least one graphics processor 2510, which may be a variant of the graphics processor 1408, 1508, 2510, or of any graphics processor described herein and may be used in place of any graphics processor described. Therefore, the disclosure of any features in combination with a graphics processor herein also discloses a corresponding combination with the graphics processor 2510 but is not limited to such. The integrated circuit 2500 may additionally include an image processor 2515 and/or a video processor 2520, any of which may be a modular IP core from the same or multiple different design facilities. Integrated circuit 2500 may include peripheral or bus logic including a USB controller 2525, UART controller 2530, an SPI/SDIO controller 2535, and an I$^2$S/I$^2$C controller 2540. Additionally, the integrated circuit can include a display device 2545 coupled to one or more of a high-definition multimedia interface (HDMI) controller 2550 and a mobile industry processor interface (MIPI) display interface 2555. Storage may be provided by a flash memory subsystem 2560 including flash memory and a flash memory controller. Memory interface may be provided via a memory controller 2565 for access to SDRAM or SRAM memory devices. Some integrated circuits additionally include an embedded security engine 2570.

FIG. 26A-26B are block diagrams illustrating exemplary graphics processors for use within an SoC, according to embodiments described herein. The graphics processors may be variants of the graphics processor 1408, 1508, 2510, or any other graphics processor described herein. The graphics processors may be used in place of the graphics processor 1408, 1508, 2510, or any other of the graphics processors described herein. Therefore, the disclosure of any features in combination with the graphics processor 1408, 1508, 2510, or any other of the graphics processors described herein also discloses a corresponding combination with the graphics processors of FIG. 26A-26B but is not limited to such. FIG. 26A illustrates an exemplary graphics processor 2610 of a system on a chip integrated circuit that may be fabricated using one or more IP cores, according to an embodiment. FIG. 26B illustrates an additional exemplary graphics processor 2640 of a system on a chip integrated circuit that may be fabricated using one or more IP cores, according to an embodiment. Graphics processor 2610 of FIG. 26A is an example of a low power graphics processor core. Graphics processor 2640 of FIG. 26B is an example of a higher performance graphics processor core. For example, each of graphics processor 2610 and graphics processor 2640 can be a variant of the graphics processor 2510 of FIG. 25, as mentioned at the outset of this paragraph.

As shown in FIG. 26A, graphics processor 2610 includes a vertex processor 2605 and one or more fragment processor(s) 2615A-2615N (e.g., 2615A, 2615B, 2615C, 2615D, through 2615N-1, and 2615N). Graphics processor 2610 can execute different shader programs via separate logic, such that the vertex processor 2605 is optimized to execute operations for vertex shader programs, while the one or more fragment processor(s) 2615A-2615N execute fragment (e.g., pixel) shading operations for fragment or pixel shader programs. The vertex processor 2605 performs the vertex processing stage of the 3D graphics pipeline and generates primitives and vertex data. The fragment processor(s) 2615A-2615N use the primitive and vertex data generated by the vertex processor 2605 to produce a framebuffer that is displayed on a display device. The fragment processor(s) 2615A-2615N may be optimized to execute fragment shader programs as provided for in the OpenGL API, which may be used to perform similar operations as a pixel shader program as provided for in the Direct 3D API.

Graphics processor 2610 additionally includes one or more memory management units (MMUs) 2620A-2620B, cache(s) 2625A-2625B, and circuit interconnect(s) 2630A-2630B. The one or more MMU(s) 2620A-2620B provide for virtual to physical address mapping for the graphics processor 2610, including for the vertex processor 2605 and/or fragment processor(s) 2615A-2615N, which may reference vertex or image/texture data stored in memory, in addition to vertex or image/texture data stored in the one or more cache(s) 2625A-2625B. The one or more MMU(s) 2620A-2620B may be synchronized with other MMUs within the system, including one or more MMUs associated with the one or more application processor(s) 2505, image processor 2515, and/or video processor 2520 of FIG. 25, such that each processor 2505-2520 can participate in a shared or unified virtual memory system. Components of graphics processor 2610 may correspond with components of other graphics processors described herein. The one or more MMU(s) 2620A-2620B may correspond with MMU 245 of FIG. 2C. Vertex processor 2605 and fragment processor 2615A-2615N may correspond with graphics multiprocessor 234. The one or more circuit interconnect(s) 2630A-2630B enable graphics processor 2610 to interface with other IP cores within the SoC, either via an internal bus of the SoC or via a direct connection, according to embodiments. The one or more circuit interconnect(s) 2630A-2630B may correspond with the data crossbar 240 of FIG. 2C. Further correspondence may be found between analogous components of the graphics processor 2610 and the various graphics processor architectures described herein.

As shown FIG. 26B, graphics processor 2640 includes the one or more MMU(s) 2620A-2620B, cache(s) 2625A-2625B, and circuit interconnect(s) 2630A-2630B of the graphics processor 2610 of FIG. 26A. Graphics processor 2640 includes one or more shader cores 2655A-2655N (e.g., 2655A, 2655B, 2655C, 2655D, 2655E, 2655F, through 2655N-1, and 2655N), which provides for a unified shader core architecture in which a single core or type or core can execute all types of programmable shader code, including shader program code to implement vertex shaders, fragment shaders, and/or compute shaders. The exact number of shader cores present can vary among embodiments and implementations. Additionally, graphics processor 2640 includes an inter-core task manager 2645, which acts as a thread dispatcher to dispatch execution threads to one or more shader cores 2655A-2655N and a tiling unit 2658 to accelerate tiling operations for tile-based rendering, in which rendering operations for a scene are subdivided in image space, for example to exploit local spatial coherence within a scene or to optimize use of internal caches. Shader cores 2655A-2655N may correspond with, for example, graphics multiprocessor 234 as in FIG. 2D, or graphics multiprocessors 325, 350 of FIGS. 3A and 3B respectively, or multi-core group 365A of FIG. 3C.

Graphics Processor Memory Access Architecture

FIG. 27 illustrates a data processing system 2700 including a graphics core cluster having a memory load/store unit. The data processing system 2700 includes a graphics processor, parallel processor, and/or compute accelerator as described herein (e.g., parallel processor 200, GPU 380, GPU 410-413, GPGPU 700, GPUs 1245, GPGPU 1306, graphics processor 1408, graphics processor 1508, GPGPU 1570, graphics processor 1600, graphics processor 1620, compute accelerator 1630, graphics processor 2100, graphics processor 2332, graphics processor 2510, graphics processor 2610, and/or graphics processor 2640). The graphics processor includes one or more instances of a graphics processing engine 2710, which in various embodiments corresponds with GPE 1610, graphics processing engine cluster 1622, compute engine cluster 1632, and/or GPE 1710. The graphics processor and included one or more instances of the graphics processing engine 2710 couple with a last level cache 2730 that is shared with a host CPU and/or other processors in the system, as well as a system memory 2740 that is provided by a host computing system to which the graphics processor is attached. In one embodiment, the last level cache 2730 can include a memory module 1518 as in processor 1500.

The graphics processing engine 2710 includes a command streamer 2711, a thread dispatcher 2712, memory 2713, and a cache 2714, which service processing resources within one or more instances of a graphics core cluster 2720. The graphics core cluster 2720 includes a set of graphics cores 2724 and, in one embodiment, a set of memory load/store units 2722 coupled with the set of graphics cores 2724. The memory load/store units 2722 facilitates access to memory 2713 for threads 2726 executed by the graphics cores 2724 and can have similar functionality to load/store units 266 and/or load/store units 340A-340B. In one embodiment, the memory load/store unit also facilitates access to the system memory 2740 in concert with a host interconnect bus or fabric and/or memory load/store unit 2722 is part of a load/store/cache architecture that also manages access to the cache 2714 and last level cache 2730. The memory load/store unit 2722 can have similar circuitry and functionality as other load/store units described herein (e.g., load/store unit 266).

In one embodiment, the cache 2714 is a cache hierarchy that includes multiple cache levels, including an L2 and L3 cache. In one embodiment, the cache 2714 includes an L2 cache that is a distributed cache, such as the L2 cache 221 of partition unit 220 of FIG. 2B, which may be included in each of the partition units 220A-220N of the parallel processor 200 of FIG. 2A. In one embodiment, the cache 2714 includes an L2 cache that is coupled with a memory fabric and is configurable to caches transactions performed via the memory fabric, such as the L2 cache 1904 and memory fabric 1903 of FIG. 19. In general, unless the data to be access has been allocated as non-cached data, memory accesses requests via the store unit 2722 will be serviced from the cache 2714, last level cache 2730, or another element of the cache memory hierarchy of the graphics processor. A cache miss operation will be performed to transfer requested data from the memory 2713 or system memory 2740 if the data is not found within the cache memory hierarchy.

The data processing system 2700 can perform operations on behalf of an application 2702. The application 2702, which is executed by a host processor (e.g., CPU), can submit a kernel 2703 for execution by the graphics processing engine 2710. The application 2702, via a graphics or compute API, can submit commands that are translated by a graphics and/or API driver into commands that are inserted into a command buffer 2704. The command buffer 2704 includes commands to transfer the kernel 2703 to memory 2713 from system memory 2740. The commands in the command buffer 2704 can also include references to data 2705 stored in memory 2713 or system memory 2740, such as but not limited to vertex and geometry data, image data, and/or memory objects. Memory access requests to load the kernel 2703 and data 2705, as well as memory access requests that are generated by threads 2726 during kernel execution, can be processed via the memory load/store unit 2722.

FIG. 28 illustrates a graphics core cluster 2820 including graphics cores having a memory load/store unit. The graphics core cluster 2820 include multiple graphics cores 2824A-2824N. In one embodiment, each of the multiple graphics cores 2824A-2824N includes compute logic 2802A-2802N, a memory load/store unit 2804A-2804N, an instruction cache 2805A-2805N, a data cache/shared local memory 2806A-2806N, a ray tracing unit 2808A-2808N, a sampler 2810A-2810N, and a block of fixed function logic 2812A-2812N. Functionality of the instruction cache sampler 2810A-2710N, and fixed function logic 2812A-2812N corresponds with equivalent functionality in the graphics processor architectures described above.

With reference to graphics core 2824A, the compute logic 2802A includes vector processing logic and matrix operation acceleration logic that are configurable to perform parallel compute operations on data in a variety of integer and floating-point data formats. The memory load/store unit 2804A, which may be equivalent to the memory load/store unit 2722 of FIG. 27, services memory access requests that are issued by the compute logic 2802A. For example, in response to an instruction to load data from memory or store data to memory, a message send unit (e.g., send unit 1830) can send a message to the memory load/store unit 2804A that includes a memory access request. The memory access request can be processed by the memory load/store unit 2804A to load or store the requested data to or from cache or memory into a register file associated with the compute logic 2802A. In some embodiments, memory accesses may also be performed based on operations executed by the ray tracing unit 2808A or sampler 2810A. The other graphics cores 2824B-2824N can operate in a similar manner as 2824A.

FIG. 29 illustrates a system 2900 of graphics processor components that are configurable to process load and store operations with cache attribute control. The load and store messages can be used to load data into a register file 2915 or store data that resides in the register file 2915 into memory 2910. The system 2900 includes a graphics core 2824, which can be any of the graphics cores 2824A-2824N of FIG. 28. The graphics core 2824 includes or couples with circuitry of a load/store unit 2804, which may be one of the memory load/store units 2804A-2804N of FIG. 28 and may include functionality described with respect to memory load/store unit 2722. The graphics core 2824 can also include a TLB 2909, which can cache a page table entry (PTE 2911) associated with a page of memory.

The graphics core 2824 also includes or couples with an L1 cache 2906 that is used to cache memory accesses performed by the graphics core 2824. In one embodiment, the L1 cache 2906 resides in the data cache/shared local memory of a graphics core (e.g., data cache/shared local memory 2806A of a graphics core 2824A). The L1 cache 2906 includes multiple cache lines 2902 and is controlled via cache control circuitry. In one embodiment the cache control circuitry is included within the L1 cache 2906. In one embodiment the load/store unit 2804 includes at least a portion of the cache control circuitry for the L1 cache 2906. The L1 cache 2906 can couple with a pixel pipeline that facilitates pixel-based operations. The graphics core also includes an L3 cache 2908, which can include functionality of the L3 cache 1906 of FIG. 19. The L3 cache 2908 includes multiple cache lines 2904 that can store data read from or written to memory 2910. The L3 cache 2908 can include cache control logic to manage allocation, fill, and replacement of the cache lines 2904.

Memory 2910 can be local memory (e.g., memory 2713) or system memory (e.g., system memory 2740). The memory 2910 can store surfaces in linear formats or one of a variety of tiled memory formats. The shader memory surfaces are associated with surface state data 2913 that may be stored in memory along with the surface and can be cached in a dedicated surface state cache 2912. The surface state data 2913 stores information about the surface such as bits per pixel, tiling mode, clear pixel status, compression status. For compressed data, this information can be used by a GPGPU codec unit (e.g., CODEC 227) to compress the data before sending the data to the memory subsystem. In embodiments described herein, cache attributes are also stored in the surface state data 2913, as described in further detail below.

The load/store unit 2804 includes a set of message sequencers 2914 that sequence a set of memory/cache operations to perform a complex loads or stores, such as block loads or stores or batch load or store operations across multiple cache lines. The sequencing logic within the message sequencers 2914 will split the L1 accesses for the row up until the nearest cacheline boundary. The message sequencers 2914 include multiple message processing elements that can process multiple load or store messages in parallel each cycle. The message sequencers 2914 can process an incoming message to decompose the message into multiple underlying data access requests that are used to service the load or store message.

If the data associated with a cached memory access resides in the L1 cache 2906, an L1 cache hit occurs. The data can then be read from or written to one or more cache lines 2902 of the L1 cache 2906. If a cache miss occurs on a load operation, an L1 fill operation is performed to retrieve the data, for example, from the L3 cache 2908 or the memory 2910. If the memory allocation associated with the data is configured to be L3 cachable and an L3 hit occurs, the data can be read from one or more cache lines 2904 of the L3 cache 2908 and stored to the L1 cache 2906. On an L1 fill, circuitry of the load/store unit 2804 can send a memory request for each cacheline of data to be written to the L1 cache. Accesses to memory allocations that are marked as uncacheable will bypass one or both of the L1 cache 2906 and the L3 cache 2908. Cacheability can be separately enabled for the L1 cache 2906 and the L3 cache 2908, such that, for example, an allocation may be cacheable for one cache but uncacheable for a separate cache.

L1 and L3 Cacheability Control

Described herein are techniques to control L1 and L3 caching attributes by—(1) attaching caching properties when a buffer gets created (e.g., via a driver created surface state), (2) application code directly controlling caching properties from instructions (e.g., ISA enhancements), (3) and via a kernel mode driver setting a memory side cache policy via attributes of a page table entry (PTE). In embodiments described herein, the L1 cache 2906 is virtually indexed. Accordingly, a cache control mechanism that stores cacheability attributes in a PTE 2911 control cannot be used, as the indexing is performed before or in parallel with virtual to physical address translation. In embodiments described herein, L1 cache attributes are stored in one surface state data 2913 and/or a send message descriptor.

Surface state data 2913 for memory allocations, which may be stored in the surface state cache 2912, can contain default L1 attributes for processing stateful messages for the surface. The L1 settings for stateless accesses will be stored as non-pipelined state 2917, which are state attributes that are directly specified to the graphics processing engine 2710. In one embodiment, stateless L1 attributes 2916 are programmed via the STATE BASE ADDRESS command. The STATE_BASE_ADDRESS command sets base pointers for subsequent state, instruction, and media indirect object accessed by the graphics processing engine 2710, and can specify default stateless L1 attributes 2916 as part of the non-pipelined state 2917.

Execution logic within the graphics core 2824 can perform memory accesses via a send instruction that is executed, for example, via a message passing send unit 2930, such as the send unit 1830 of a vector engine 1802 as in FIG. 18B. A similar unit may also reside in the matrix engine 1803 of FIG. 18C. A send message descriptor associated with a send message can be used to store optional L1 caching attributes. The send message descriptor is used for stateless messages where there is no associated "surface state" to enable per-buffer flexibility of cacheability settings or other settings for a memory allocation. However, the send message descriptor can also be used for stateful messages to override the default settings in the surface state.

In one embodiment, the L3 cache 2908 is physically indexed. Accordingly, access to the L3 cache is performed after a virtual to physical memory address translation is performed via the PTE 2911 associated with the accessed memory. The PTE 2911 can include a 1 bit L3 cache attribute field that indicates whether entries within the page should be cached in the L3 cache 2908. Alternatively, or additionally, in some embodiments the L3 cacheability settings can be set via a memory object control state (MOCS) index, which is a 2-bit index that will point to a table entry. The table entry will have the L3 cacheability setting. A 2-bit MOCS index provides 4 possible indices. In one embodiment, two states are supported (L3 cacheable and L3 uncacheable) and the remaining states are reserved. The MOCS index may be a portion of the surface state data 2913 for a surface and cached in the surface state cache 2912. In one embodiment, a control register table 2920 is defined in the L3 cache 2908 and the MOCS index can used to index into the table to determine cache control behavior to apply to a surface. The L3 cacheability state can also be set via a surface state or send message descriptor, similar to the L1 cacheability state.

Table 5 shows hardware supported L1 Cacheability Attributes, according to an embodiment.

TABLE 5

HW Support for L1 Cacheability Attributes

| Access Type | Attribute | Description |
| --- | --- | --- |
| Store | UC | Writes are not cached |
| | WB | Writes are cached as "dirty" state |
| | WT | Writes are sent to memory as well as updated in the cache (in "clean" state). |
| | WS | Streaming store-cache at low priority-LRU position (e.g., use L1 to merge partial) |
| Load | UC | Read is not allocated in cache |
| | LDC | Regular cacheable load ($ in MRU position) |
| | LDS | Streaming load ($ in LRU position) |
| | IAR | Invalidate (if cache hit) after read (private memory only) |
| Atomic | UC | Atomics are not cached in L1-forced to be UC |
| Prefetch | UC | Prefetch is not allocated in L1 |
| | Cacheable-HP | Allocate in L1 as high priority (MRU) |
| | Cacheable-LP | Allocate in L1 as low priority (LRU) |

As shown in Table 5, supported access types with adjustable L1 cacheability include store, load, atomic, and prefetch operations. Stores can be uncached (UC) writes that bypass the L1 cache 2906, or one of write-back (WB), write-through (WS), or write-streaming (WS), with operation as described in Table 5 above. In one embodiment, partial cache lines writes are enabled for stores, with multiple partial cache line writes being mergeable at the L1 cache level. In some embodiments, the L1 cache is a sectored cache in which a 64-byte cache line can be divided into multiple sectors and sub-sectors. In one embodiment, an L1 cache 2906 is configured with an 8-byte sub-sector size and any partial write smaller than 8-bytes is considered a UC store. In one embodiment, an uncompressible write to a compressed surface is treated as a UC store. For example, if store operation is performed to a compressed surface in memory and the store operation contains data that cannot be compressed to the configured or minimum compression ratio for the surface, the data may be written to memory in an uncompressed format and the store will bypass the L1 cache. Any partial hits in the scenario may result in a merge and/or eviction and invalidation of the associated cache line.

Loads can be uncached reads for data that is not stored in the L1 (UC), a normal cachable load (LDC), a streaming load with a low probability of reuse (LDS), and an invalidate after read (JAR) load that, for private memory, is a cached load that is invalidated after a cache hit. In one embodiment, atomic operations are not cached in L1. In such embodiments, all atomic operations are marked as UC. In one embodiment, cache control is enabled for prefetch operations, which may be uncached (UC), or cached with a high priority (cacheable-HP) or a low priority (cacheable-LP). The priority associated with prefetch operations indicates a pre-configured likelihood that prefetched data will be selected for eviction by the L1 cache replacement algorithm based on the rate or frequency in which the prefetched data is accessed. In one embodiment, the cacheability attribute for prefetched data determines the cache replacement policy that is used when determining whether to evict that data, with multiple cache replacement policies being active for different sets of cache lines.

In the case of the L3 cache 2908, in one embodiment a 1-bit attribute may be set in the PTE 2911 for an allocation, which indicates either a cacheable allocation using the MRU cache replacement algorithm, or an uncacheable allocation. When setting L3 cache attributes via an untyped send message, more complex settings may be set via a send message descriptor associated with the untyped send message. Untyped send messages may be used to access "untyped" data, which is generally data associated with compute (e.g., non-pixel) data associated with a general-purpose compute program or compute shader (e.g., CUDA, OpenCL, oneAPI).

L1 and L3 Caching Attributes Encoded in Untyped Send Message Descriptor

In one embodiment, both L1 and L3 caching attributes may be encoded in an untyped send message descriptor. A send message descriptor 2931 may be used for a send message 2932 that is transmitted by a send unit (e.g., send unit 1830) of a processing resource described herein. The send message descriptor 2931 may be an untyped send message descriptor and the send message 2932 may be an untyped send message. In one embodiment, data that is transmitted by the send unit 2930 may include the message 2932 and associated message descriptor 2931. In one embodiment, the send unit 2930 sends a message that indicates that the load/store unit 2804 should read a message from one or more source registers in the register file 2915 and write a response to one or more destination registers in the register file 2915. In one embodiment, the send message descriptor can have a 4-bit field that can be used for L1/L3 cache control. L1 and L3 caching attributes that may be specified via a send message descriptor are shown in Table 6.

TABLE 6

Message Descriptor Cache Controls

| | Send Message Descriptor Cache Controls | | | |
|---|---|---|---|---|
| | | L1 | L3 | Description |
| Store Messages | l1uc_l3uc | UC | UC | Don't cache anywhere |
| | l1uc_l3wb | UC | WB | Cache in L3 only |
| | l1wb_l3wb | WB | WB | Cache in all levels |
| | l1wt_l3uc | WT | UC | WT in L1 only |
| | l1wt_l3wb | WT | WB | WT in L1 |
| | l1ws_l3uc | WS | UC | Streaming store, L1 only |

TABLE 6-continued

Message Descriptor Cache Controls

| | Send Message Descriptor Cache Controls | | | |
|---|---|---|---|---|
| | | L1 | L3 | Description |
| | l1ws_l3wb | WS | WB | Streaming store |
| | l1l3mocs | Use Default | Use MOCS | No setting |
| Load Messages | l1uc_l3uc | UC | UC | Don't cache anywhere |
| | l1uc_l3ldc | UC | LDC | Cache in L3 only |
| | l1ldc_l3uc | LDC | UC | Cache in L1 only |
| | l1ldc_l3ldc | LDC | LDC | Cache in all levels |
| | l1lds_l3uc | LDS | UC | Streaming load, L1 only |
| | l1cal_l3wb | LDS | LDC | Streaming load |
| | l1iar | IAR | LDC | Discard after read |
| | l1l3mocs | Use Default | Use MOCS | No setting |
| Atomic Messages | l1uc_l3uc | UC | UC | Don't cache anywhere |
| | l1uc_l3wb | UC | WB | Cache |
| | l1l3mocs | Use Default | Use MOCS | No setting |
| Prefetch Messages | l1uc_l3ldc | UC | LDC | Prefetch to L3 |
| | l1ldc_l3uc | LDC | UC | Prefetch to L1 |
| | l1ldc_l3ldc | LDC | LDC | Prefetch in all levels |
| | l1lds_l3uc | LDS | UC | Streaming Prefetch, L1 only |
| | l1lds_l3wb | LDS | LDC | Streaming Prefetch |
| | l1l3mocs | Use Default | Use MOCS | No setting |

The load/store unit 2804 will decode the send message descriptor to get the cache attributes to send to the L1 bank. The MOCS index will also be sent to the L1 bank. For miss requests and evictions to the L3 cache 2908, the L1 cache 2906 will pass the 2-bit MOCS index and 2-bit instruction L3 control to the fabric interconnect (e.g., memory fabric 1903) that couples the graphics core 2824 and the load/store unit 2804 with the L3 cache 2908. The L1 cache can determine the MOCS index via a communication channel between the message sequencers 2914 and the surface state data 2913.

Default Caching Attributes and Conflict Resolution

As described above, stateless L1 attributes 2916 are stored in the non-pipelined state 2917 for stateless accesses, as programmed by the STATE BASE ADDRESS command. The surface state data 2913 stores L1 behavior for stateful accesses to a surface having a specified surface state. These settings store default settings and specify a pair of load and store behaviors in a 3-bit field, which encodes to the state settings shown in Table 7.

TABLE 7

Default L1 Caching Attributes

| Encoded State | Load Message Behavior | Store Message Behavior |
|---|---|---|
| WBP (write-bypass) | LDC | UC |
| UC (not cached) | UC | UC |
| WB (write-back) | LDC | WB |
| WT (write-through) | LDC | WT |
| WS (write-streaming) | LDS | WS |

The hardware defaults to a write-bypass mode, in which normal caching behavior (LDC) is sued for loads and stores bypass the L1 cache. The user mode driver can override the hardware default settings to either uncached mode (UC), write-back mode (WB), wire-though mode (WT), or write streaming mode (WS). If a send instruction specifies conflicting L1 cache attributes for a store or atomic operation, the conflict will be resolved as shown in Table 8.

TABLE 8

L1 Store/Atomic Cache Priority: Instruction v. Default

|  | Instruction | Default |  |  |  |
|---|---|---|---|---|---|
|  |  | UC | WT | WB | WS |
| Store/Atomics | UC | UC | UC | UC | UC |
|  | WT | WT | WT | WT | WT |
|  | WB | WB | WB | WB | WB |
|  | WS | WS | WS | WS | WS |
|  | None | UC | WT | WB | WS |

If a send instruction specifies conflicting L1 cache attributes for a load or prefetched operation, the conflict will be resolved as shown in Table 9.

TABLE 9

L1 Load/Prefetch Cache Priority: Instruction v. Default

|  | Instruction | Default |  |  |
|---|---|---|---|---|
|  |  | UC | LDC | LDS |
| Load/Prefetch | UC | UC | UC | UC |
|  | LDC | LDC | LDC | LDC |
|  | IAR | IAR | IAR | IAR |
|  | LDS | LDS | LDS | LDS |
|  | None | UC | LDC | LDS |

In general, the default attribute is used of no L1 cache attributes are specified by the send instruction and the L1 cache attributes specified by the send instruction will override the default setting.

L3 Caching Attributes

The L3 cache 2908 will arbitrate between an instruction descriptor, MOCS, and PTE specified settings. Instruction setting will override the MOCS setting for L3 cacheability. Table 10 below shows L3 cache priority for arbitration between instruction specified L3 caching attributes and the attributes specified via the MOCS index in surface state data.

TABLE 10

L3 Cache Priority: Instruction v. MOCS

|  | Instruction | Default MOCS |  |
|---|---|---|---|
|  |  | UC | WB |
| Load/Store/ | UC | UC | UC |
| Prefetch/Atomic | WB/LDC | WB/LDC | WB/LDC |

As shown in Table 10, the default MOCS setting can be overridden for any individual memory access to either disable caching or enable write-back caching for stores or cached loads for load or prefetch operations. Atomic operations However, in one embodiment an instruction or MOCS setting cannot weaken the consistency requirement set by the PTE 2911, as shown in Table 11 below.

TABLE 11

L3 Cache Priority: Instruction v. MOCS

|  | Instruction/ |  | PTE (cache bypass) |  |
|---|---|---|---|---|
|  |  | MOCS | UC | WB/LDC |
| Load/Store/ |  | UC | UC | UC |
| Prefetch/Atomic |  | WB/LDC | UC | WB/LDC |

As shown in Table 11, if the PTE specifies to bypass the L3 cache 2908, an instruction or MOCS setting cannot override that setting. However, an uncached operation can be performed to bypass the L3 cache 2908 if the PTE specifies that data should be cached. If an uncached write to memory hits the L3 cache, the entry will be invalidated.

SW/Firmware High Level View

Embodiments described also provide software extensions to enable the use of L1 and L3 cache attributes. For example, extensions may be provided to the SPIR-V or LLVM intermediate representations the enable per-message L1/L3 cache controls for loads and stores. Additionally, the non-temporal memory access semantic for SPIR-V may be implemented in part via the use of the WS cache attribute. In one embodiment, a per-kernel attribute is provided to specify the L1 cache behavior to apply when the SPIR-V non-temporal memory access semantic is enabled. In one embodiment, a build option is provided to specify the L1 cache behavior to apply when the SPIR-V non-temporal memory access semantic is enabled. The OpenCL prefetch extended instruction can be used to expose prefetch operations via a send instruction. A further extension may be provided to enable L1 and L3 prefetch controls for the prefetches. In one embodiment, a build option is provided to specify the L1 and L3 cache behavior to apply when in response to the generic prefetch extended instruction in an intermediate representation.

Memory Scope Attribute for Heterogenous Compute Nodes

In one embodiment, a memory scope attribute can be specified for a surface allocation. The memory scope attribute that tells the cache the visibility/scope of the data for the purposes if cache coherency and determining how to respond to L1 cache flush operations. Private, Local, and Global scopes are defined. The memory scope attribute is of particular benefit for heterogenous workloads that are executed on CPU and GPU nodes, where compute programs can execute using a large number of threads across a large number of heterogenous processing units.

FIG. 30 illustrates impact of the memory scope attribute for a surface on cache flush and coherency behavior. In one embodiment, when a private scope 3001 is specified, the data 3002 is thread private (e.g., per-thread scratch space). Each of the threads 3003 that access the data 3002 will see a thread-local instance of the data. In one embodiment, the data 3002 is treated as thread private even in scenarios where the data may be mapped to the context global memory virtual address space. Cache lines having private scope 3001 do not need to be coherent with other threads. There is no need to flush these cache lines due to an "L1 cache flush" operation. The L1 cache flush is used to make global data visible to all processing resources, and the cached data having a private scope is visible only to a single thread. In one embodiment, the private scope 3001 is used for stateless accesses to scratch space buffers. In such embodiment, any message that operates on "SCRATCH" surface type will automatically specify the private scope 3001. In one embodiment the "IAR" mode for loads is limited to cache lines having a private memory scope. Register spills to memory for scratch buffers stored in the register file may be cached in L1 as IAR, as the cached data will not be accessed again once the data is re-filled.

When a local scope 3004 is specified, data 3005 is shared locally within each graphics core 3006A-3006N, even in scenarios in which the data is mapped to a context global virtual address space. Cache lines associated with data 3005 having a local scope 3004 data do not need to be coherent with L1 caches associated with other graphics cores 3006A-3006N. In one embodiment, there is no need to flush cache lines with local scope in response to a "L1 cache flush" operation, as there is no need for data having the local scope 3004 to be visible outside of the graphics core. In one embodiment, the local scope 3004 is used fort "stack" data generated by ray tracing threads, as ray tracing threads will be executed locally to the graphics core to simplify ray probe operations performed on the ray tracing unit of the graphics core. For surfaces having the local scope 3004, the default caching policy will usually be "WB" and may be programmed in the surface state data and/or specified in the access message to the load/store unit.

When a global scope 3007 is specified, the data 3008 is globally visible across a heterogenous compute node. This data is visible across all threads in the GPU package, across all GPU packages 3009A-3009N in a GPU node, and among the host CPUs 3010A-3010N in the node. These lines are evicted due to a "L1 cache flush" operation to make data globally visible. In one embodiment, the global scope 3007 is the default memory scope.

FIG. 31 illustrates a method 3100 of determining L1 cache attributes for memory requests, according to an embodiment. The method 3100 can be performed by load/store circuitry described herein (e.g., load/store unit 2804), or equivalent memory access circuitry that is configured to perform memory access requests for processing resources of a graphics processor of compute accelerator.

Method 3100 includes, in one embodiment, for the memory access circuitry to receive a request to access data associated with a memory allocation (3101). The request can be in the form of a message sent by circuitry associated with a message passing unit (e.g., send unit 2930), where the message is sent in response to execution of an instruction by processing resources of a graphics core. The memory access circuitry can then determine if the request is a stateful or stateless request (3103). A stateful request is a request to access a memory allocation in a memory surface having an associated surface state. Information on how to access that surface can be retrieved from the surface state. A stateless request is for a surface or memory allocation that does not have an associated surface state.

The memory access circuitry can determine the request type (3103), in one embodiment, based on a header or descriptor of the request. For a stateful access, the memory access circuitry can read the surface state of the memory allocation (3104). The surface state can be read from a surface state cache, which upon a cache miss, can request the surface state information via a memory fabric. The memory access circuitry can then determine cache attributes from the surface state (3106). In the event of a stateless access, the memory access circuitry can determine cache attributes from non-pipelined state data that was provided to the GPU for the memory allocation (3105).

The memory access circuitry can then determine if request specifies a cache attribute (3107). A header or descriptor associated with the request can specify cache attributes that should be applied to the request. The memory access circuitry can then arbitrate between cache attribute sources according to source priority to select cache attributes to apply to the request (3108). If no cache attributes are set, the hardware default setting may be used. In one embodiment, the default setting for L1 cache access is a write-bypass mode, in which reads (loads) are cached and writes (stores) bypass the L1 cache. The software can specify default settings in the surface state or non-pipelined state which are used for stateful and stateless accesses unless conflicting attributes are specified in the request. If cache attributes are specified by the request, the request specified attributes will take priority for L1 accesses.

The memory access circuitry can then submit a memory access request to the L1 cache with the arbitrated cache attributes (3109). The arbitrated cache attributes are the L1 and L3 cache attributes that are selected from multiple sources based in source priority, the software configured default attributes if no attributes are included in the request, or the hardware default attributes if no cache attributes are set. The request is sent to the L1 cache even if L1 caching is disabled, in the event that any hit cache lines for an uncached access need to be invalidated. The L1 cache will return data associated with a hit on a cached request. The L1 cache will submit a fill request on a miss via the memory fabric. The fill request may be to the L3 cache if L3 caching is enabled in the cache attributes or to a local memory if L3 caching is disabled. In one embodiment, a request submitted via the memory fabric to memory or the L3 may hit the L2 cache, depending on the system configuration. If the memory attributes specify the use of a MOCS index, the L1 cache will submit the MOCS index along with the memory fabric request.

FIG. 32 illustrates a method 3200 of determining L3 cache attributes for memory requests, according to an embodiment. In one embodiment, the method 3200 is performed by cache control logic associated with an L3 cache of a graphics processor or compute accelerator.

In one embodiment, the method 3200 includes to receive an access request at the L3 cache (3201). The access request can be an L1 cache fill request on an L1 cache miss or can be a request for data that is marked as UC for the L1 cache. The method 3200 additionally includes to determine if a cache bypass attribute is set in the page table entry for the address to be accessed (3202). In one embodiment, the cache bypass setting will be indicated in the request, as the virtual to physical address translation will have occurred before the memory access request has hit the L3 cache and one or more attributes set in the PTE may be included in the access request to the L3. In one embodiment, if the cache bypass attribute may be dynamically updated after a memory allocation is performed, the L3 cache may still receive a request when cache bypass is enabled, to enable any cache lines associated with the page to be invalidated (3204).

If cache bypass is not enabled (3203, NO), then the L3 cache can determine the L3 cache attributes to apply based on an arbitration performed based on a MOCS index or any cache attributes that may be includes in the request (3205). The MOCS index is an index into a control register table where L3 cache attributes are stored and may be used as the default attribute unless overridden by an instruction-based attribute.

According to the above description, a graphics processor may be provided that includes a processing resource having a graphics engine, a memory device, a first cache (e.g., L1) coupled with the processing resources and the memory device, and circuitry to process a memory access message received from the processing resource. The memory access message is to cause the circuitry to access data of the memory device on behalf of the graphics engine. To process the memory access message, the circuitry is configured to determine whether the memory access message includes a first cache attribute, the first cache attribute to indicate whether the data is cacheable within the first cache, determine whether state information associated with the data includes a second cache attribute, the second cache attribute to indicate whether the data is cacheable within the first cache, arbitrate between the first cache attribute and the second cache attribute according to presence or absence of the first cache attribute and the second cache attribute and respective priorities associated with the first cache attribute and the second cache attribute, and transmit a memory access request to the first cache memory. The memory access request includes the arbitrated cache attributes.

In one embodiment, the state information associated with the data includes a surface state for a stateful memory allocation associated with the data or a non-pipelined state for a stateless memory allocation associated with the data. The second cache attribute specifies a default cache attribute that can be overridden by the first cache attribute if/when the first cache attribute is present. Each of the first cache attribute and the second cache attribute encode a load message behavior and a store message behavior. The first cache can submit a fill request to a memory fabric of the graphics processor in response to a cache miss for data that is cacheable in the first cache.

In one embodiment, the first cache can determine a value of a third cache attribute that indicates whether the data is cacheable within a third cache (e.g., L3) and the first cache can submit the fill request to the third cache via the memory fabric in response to a determination that the data is cacheable within the third cache. The first cache can submit the fill request to the memory device via the memory fabric in response to a determination that the data is uncacheable within the third cache. The fill request to the third cache or the local memory may hit a second cache associated with the memory fabric and the second cache can respond to the fill request. The first cache is a virtually indexed cache and the third cache is a physically indexed cache, such that a virtual to physical address translation is performed before checking for a hit in the third cache. The virtual to physical address translation enables determination of a third cache attribute, which can be read from a page table entry for a page associated with the data. The third cache attribute may also read from a table (e.g., MOCS) within the third cache. The attribute may be read from the table via an index (MOCS index) that is included in the fill request.

The memory access message may be a load message to read from memory or a store message to write to memory. The store message, in one embodiment, may include an attribute to trigger an implicit fence, as described in further detail below.

Implicit Fence for Write Messages

In addition to the cache attributes that may be configured via state settings or memory access messages, an embodiment described herein facilitates the addition of an implicit fence for a memory write message that can be used to accelerate memory fence operations. In one embodiment, an implicit fence with a write message is provided, such that instead of having a separate 'fence' message, an attribute is added to write messages that enables a fence to be implied. to imply a fence. For some machine learning/deep learning kernels, up to an 8% improvement may be realized due to the reduced consumption message bandwidth enabled by the elimination of the fence message.

FIG. 33 illustrates a system 3300 in which an implicit fence is enabled via the addition of an attribute to a write message, according to an embodiment. In one embodiment, the system 3300 includes a graphics core 2824 as described in FIG. 28. The graphics core 2824 can include processing resource 3302 to execute matrix and vector operations, such as the vector engines 1522A-1522F, 1524A-1524F and matrix engines 1523A-1523F, 1525A-1525F as in FIG. 15B and/or other vector or matrix engines described herein. The graphics core 2824 can couple with a load/store unit 2804, as described in FIG. 28.

A kernel executed by the processing resources 3302 may perform various compute operations, including vector and matrix operations. Results of those operations may be written to memory via the load/store unit 2804. For operations that are performed across sets of processing resources 3302, a fence operation can be performed to ensure that all memory operations that are performed before the fence are completed before any memory operations that are performed after the fence. Execution of a fence instruction by the processing resources 3302 may result in a message 3332 being transmitted to the load/store unit 2804. When a message is a fence message, a fence unit 3312 in the load/store unit can synchronize memory operations to implement the fence operation. The fence operation enforces an ordering constraint on memory operations issued before and after the fence. Memory operations issued before the fence will be completed before any memory operations that are issued after the fence. In one embodiment, the fence unit 3312, when performing a fence operation, will allow all in-progress memory operations to complete before processing any new memory operations.

In previous implementations, the fence operation is implemented as a separate message. In one embodiment, an implicit fence is provided in which the fence unit 3312 can be triggered to implement a fence based on a message 3332 to implement a write operation, where a bit in a message descriptor 3331 indicates that a fence should be implemented after the write. The bit in the message descriptor 3331 can be set based on a bit in an operand of the write (e.g., store) instruction that triggers the write with implicit fence.

FIG. 34A-34B illustrates a comparison between an explicit and implicit fence operation, according to an embodiment. As shown in FIG. 34A, a kernel (kernel A 3410) can perform operations including a matrix operation 3411 on matrix A and matrix B to generate matrix C. Additional operations may be performed, with results being written via a plurality of write operations 3412A-3412C. A fence operation 3413 can be used to ensure the write operations 3412A-3412C are visible before other memory operations are performed. The write operations can be implemented by the load/store unit 2804 as store operations, which may be cached or uncached according to cacheability attributes described above. The fence operation 3413 can be implemented via a fence unit 3312 of the load/store unit 2804 in response to an explicit fence instruction executed by the kernel.

As shown in FIG. 34B, a kernel (kernel B 3420) can reduce the number of explicit operations that are performed by enabling an implicit fence via an attribute of a write operation. After the matrix operation 3411 and any additional operations, the write operations 3412A-3412C of kernel A 3410 can be replaced by a reduced number of write operations 3412A-3412B, with a final write operation 3414 that indicates an implicit fence. The load/store unit 2804 can detect the implicit fence indicator and signal the fence unit 3312 to perform the fence operation.

FIG. 35 illustrates a method 3500 of performing an implicit fence operation after a write operation, according to an embodiment. The method 3500 can be performed by load/store circuitry described herein (e.g., load/store unit 2804), or equivalent memory access circuitry that is configured to perform memory access requests for processing resources of a graphics processor of compute accelerator.

The method 3500 includes for the memory access circuitry to receive a request to write data associated with a memory allocation (3501). The memory access circuitry can determine the enabled cache and scope attributes for the write using techniques described above (3502). The memory access circuitry can then perform a memory store operation according to the enabled cache and scope attributes (3503). The memory access circuitry can also check a request descriptor for an implicit fence attribute (3504). The memory access circuitry can then use the implicit fence attribute to determine if implicit fencing is enabled for this write (3505). The implicit fence attribute can be determined concurrently with the determination of the enabled cache and scope attributes. If an implicit fence is not enabled (3505, NO), then the method 3500 may end. If an implicit fence is enabled (3505, YES), then the memory access circuitry can initiate a fence operation (3506), which may be performed via a fence unit 3312 as in FIG. 33.

Enabling a fence to be initiated after a write operation reduces the number of operations performed by kernels that perform write fencing operations, which can result in a measurable performance improvement.

Hardware Support for Activation Functions within a Matrix Engine

Embodiments described herein can also realize further improvement efficiencies by adding hardware support for activation functions within a matrix engine. Returning to FIG. 33, the processing resources 3302 of a graphics core 2824 can include vector engines and matrix engines, such as, for example, a vector engine 1802 and a matrix engine 1803, or similar functional units described herein. In various embodiments, the matrix engine 1803 may include functionality of the tensor/ray-tracing cores 263, tensor cores 337A-337B, tensor cores 371, or another accelerator core described herein. The matrix engine 1803 can accelerate deep learning and machine learning algorithms described herein by enabling the rapid processing of multi-dimensional tensor data. As described above, data received at the nodes of an input layer of a feedforward network are propagated to the nodes of the output layer via an activation function that calculates the states of the nodes of each successive layer in the network based on coefficients respectively associated with each of the edges connecting the layers. Machine Learning frameworks or libraries may provide primitives to facilitate the fusion of activation functions with GEMM computations to remove the need for an additional kernel launch to apply an activation function to the output of the GEMM operation. However, greater efficiency may be realized by enabling a matrix engine to perform a fused GEMM+activation function operation entirely within hardware.

FIG. 36A-36B illustrate a system 3600 including circuitry to enable hardware support for activation functions within a matrix engine, according to an embodiment. As shown in FIG. 36A, the system 3600 includes a matrix engine 3603, which includes circuitry of a matrix engine 1803 of FIG. 18C and/or another tensor processing cores described herein (e.g., tensor/ray-tracing cores 263, tensor cores 337A-337B, tensor cores 371, etc.). For example, the matrix engine 3603 can include a systolic array 3604, a local memory 3606 (or local register file), and element-wise operation circuitry 3608. The systolic array 3604 can include an array of processing elements that can be configured to perform tensor operations including vector/matrix and matrix/matrix operations, such as but not limited to matrix multiply and/or dot product operations. In one embodiment, the systolic array 3604 is configurable to perform a GEMM operation in the form of C=αAB+βC, where A and B are matrix inputs and C may be an existing matrix, which may be overwritten to generate an output matrix or output to a third matrix D. The a and values are scalar values that are generally one or zero depending on the operation in which GEMM is applied.

The systolic array 3604 can read input from and write output to local memory 3606. In one embodiment, the local memory is a systolic register file 1840 as in FIG. 18C. In one embodiment, the local memory 3606 is a cache memory or shared local memory that may reside within the matrix engine 3603. Although illustrated as within the matrix engine 3603, in one embodiment the 3606 is external to but closely coupled with the matrix engine 3603, in a manner similar to the cache/SLM 1528A of graphics cores 1521A or data cache/shared local memory 1806A of graphics core 1815A.

In one embodiment, the matrix engine 3603 is configured to perform a variety of element-wise operations to output generated by the systolic array 3604 while the output resides in the local memory 3606, before the output is made locally visible within the graphics core or globally visible to all processing elements in a node. This functionality allows the element-wise operations to be performed without a round-trip to global memory, which would be required of the element-wise operations are performed by a subsequent kernel.

In one embodiment, element-wise operations on the output can be performed via element-wise operation circuitry 3608. In response to the execution of an instruction to perform a GEMM or GEMM-like operation or based on a parameter provided as input with such an instruction, the element-wise operation circuitry 3608 can apply one or more element-wise operations on output from the systolic array 3604 while the output resides in the local memory 3606. In various embodiments, the element-wise operation circuitry 3608 can perform a bias operation, apply an activation function, or perform a fused bias and activation function. A bias vector can be provided as input to the element-wise operation circuitry 3608 when performing a bias operation. An activation function selection may be provided as input to enable the element-wise operation circuitry 3608 to select from a plurality of activation functions for application. In one embodiment, supported activation functions include the rectified linear unit (RELU) function of equation (1), the sigmoid function of equation (2), or the hard sigmoid function of equation (3). Other embodiments may support additional activation functions.

$$f(x) = \max(0, x) \quad (1)$$

$$\sigma(x) = \frac{1}{(1+e^{-x})} \quad (2)$$

$$\sigma(x) = \max\left(0, \min\left(1, \frac{x+1}{2}\right)\right) \quad (3)$$

As shown in FIG. 36B, during operation of the matrix engine 3603, a row 3611 of input matrix A and a column 3612 of matrix B can be provided to the systolic array. In one embodiment, multiple sets of operations can be performed each cycle depending on the depth of the systolic array 3604. For each element 3613 of output matrix C that is stored to the local memory 3606, the element-wise operation circuitry 3608 can perform one or more operations, including adding an element of the bias matrix or applying an activation function. The matrix engine 3603 can then return output 3614 from the local memory 3606.

FIG. 37 illustrates a method 3700 of fusing element-wise operations, according to an embodiment. In one embodiment, the method 3700 is implemented within a matrix processor, such as, for example, the matrix engine 3603 described herein. Method 3700 can be used to perform bias operations, apply an activation function, or perform a fused bias and activation function within the hardware of the matrix processing unit.

The method 3700 includes, at the matrix processing unit, to receive a request to perform a GEMM operation via a matrix accelerator, the request indicating one or more element-wise operations to perform on output of the GEMM operation (3701). The matrix processor can then perform the GEMM operation on the input matrix data (3702). The input matrix data can include one or more rows and columns of input matrices and can be performed over one or more clock cycles to generate an output matrix. The matrix processor can then write the output of the GEMM operation to local memory of the matrix processor (3703).

The method 3700 can then determine (3705), based on parameters of the request to perform the GEMM operation or other configuration data, whether a bias operation is to be performed on the data written to the local memory as output from the GEMM operation. If a bias operation is enabled (3705, YES), then the matrix processor can apply a bias vector to the output of the GEMM operation in the local memory. If the bias operation is not enabled (3705, NO), then the matrix accelerator can determine if application of an activation function is enabled (3706). If application of an activation function is enabled (3707, YES), the processing unit can apply a selected activation function to data in local memory (3708). The data in local memory may be the output of the GEMM operation or the output of a bias operation that was performed after the GEMM operation. The activation function to apply can be determined based on parameters of the request to perform the GEMM operation. Those parameters may be determined based on instruction operands or based on the specific instruction that was executed to trigger the request to perform the GEMM operation. As noted above, supported activation functions include but are not limited to RELU, sigmoid, and hard sigmoid. Other activation functions may be supported. If the activation function is not enabled (3707, NO), or after application of the activation function, the matrix processor can output processed data from the local memory of the matrix processor (3709). The processed data can be output to a register file of a graphics core or graphics processor that contains the matrix processor or a specified memory location in local or global memory.

According to the above described techniques, a data processing system may be provided that comprises a system interconnect and a graphics processor coupled with the system interconnect. The graphics processor includes a matrix processor configured to perform a general matrix-matrix multiplication (GEMM) operation in response to an instruction. The matrix processor includes first circuitry to perform the GEMM operation and second circuitry configured to perform an element-wise operation on a result of the GEMM operation before the result is output by the matrix processor. The element-wise operation can be one or more of a bias operation and an activation operation to apply an activation function. The instruction can specify s bias vector for use by the bias operation. The activation function can be a rectified linear unit (RELU) function, a sigmoid function, and/or a hard sigmoid function. The matrix processor can include memory within the matrix processor, the matrix processor can store the result of the GEMM operation in the local memory and perform the element-wise operation on the result in the local memory.

An additional embodiment provides a method to perform the operations of the above described data processing system.

Additional Exemplary Computing Device

FIG. 38 is a block diagram of a computing device 3800 including a graphics processor 3804, according to an embodiment. Versions of the computing device 3800 may be or be included within a communication device such as a set-top box (e.g., Internet-based cable television set-top boxes, etc.), global positioning system (GPS)-based devices, etc. The computing device 3800 may also be or be included within mobile computing devices such as cellular phones, smartphones, personal digital assistants (PDAs), tablet computers, laptop computers, e-readers, smart televisions, television platforms, wearable devices (e.g., glasses, watches, bracelets, smartcards, jewelry, clothing items, etc.), media players, etc. For example, in one embodiment, the computing device 3800 includes a mobile computing device employing an integrated circuit ("IC"), such as system on a chip ("SoC" or "SOC"), integrating various hardware and/or software components of computing device 3800 on a single chip. The computing device 3800 can be a computing device such as the computing system 100 as in of FIG. 1 or processing system 1400 of FIG. 14 and can include components to implement functionality provided by the various embodiments described herein. The Computing device 3800 includes a graphics processor 3804. The graphics processor 3804 represents any graphics processor described herein. In one embodiment, the graphics processor 3804 includes a cache 3814, which can be a single cache or divided into multiple segments of cache memory, including but not limited to any number of L1, L2, L3, or L4 caches, render caches, depth caches, sampler caches, and/or shader unit caches. In one embodiment the cache 3814 may be a last level cache that is shared with the application processor 3806.

In one embodiment the graphics processor 3804 includes a graphics microcontroller 3815 that implements control and scheduling logic for the graphics processor. The graphics microcontroller 3815 may be, for example, any of the graphics microcontrollers 3802A-3802B, 4102A-4102B described herein. The control and scheduling logic can be firmware executed by the graphics microcontroller 3815. The firmware may be loaded at boot by the graphics driver logic 3822. The firmware may also be programmed to an electronically erasable programmable read only memory or loaded from a flash memory device within the graphics microcontroller 3815. The firmware may enable a GPU OS 3816 that includes device management logic 3817, device driver logic 3818, and a scheduler 3819. The GPU OS 3816 may also include a graphics memory manager 3820 that can supplement or replace the graphics memory manager 3821 within the graphics driver logic 3822, and generally enables the offload of various graphics driver functionality from the graphics driver logic 3822 to the GPU OS 3816.

The graphics processor 3804 also includes a GPGPU engine 3844 that includes one or more graphics engine(s), graphics processor cores, and other graphics execution resources as described herein. Such graphics execution resources can be presented in the forms including but not limited to execution units, shader engines, fragment processors, vertex processors, streaming multiprocessors, graphics processor clusters, or any collection of computing resources suitable for the processing of graphics resources or image resources or performing general purpose computational operations in a heterogeneous processor. The processing resources of the GPGPU engine 3844 can be included within multiple tiles of hardware logic connected to a substrate, as illustrated in FIG. 24B-24D. The GPGPU engine 3844 can include GPU tiles 3845 that include graphics processing and execution resources, caches, samplers, etc. The GPU tiles 3845 may also include local volatile memory or can be coupled with one or more memory tiles, for example, as shown in FIG. 16B-16C. In one embodiment, the GPU tiles 3845 includes clusters of graphics processing cores, where each graphics processing core can include load/store/cache circuitry 3870 to perform memory access with instruction-based cache attribute control, as described herein.

The GPGPU engine 3844 can also include and one or more special tiles 3846 that include, for example, a non-volatile memory tile 3856, a network processor tile 3857, and/or a general-purpose compute tile 3858. The GPGPU engine 3844 also includes a matrix multiply accelerator 3860. The general-purpose compute tile 3858 may also include logic to accelerate matrix multiplication operations. The non-volatile memory tile 3856 can include non-volatile memory cells and controller logic. The controller logic of the non-volatile memory tile 3856 may be managed by the device management logic 3817 or the device driver logic 3818. The network processor tile 3857 can include network processing resources that are coupled to a physical interface within the input/output (I/O) sources 3810 of the computing device 3800. The network processor tile 3857 may be managed by one or more of device management logic 3817 or the device driver logic 3818. Any of the GPU tiles 3845 or one or more special tiles 3846 may include an active base with multiple stacked chiplets, as described herein.

The matrix multiply accelerator 3860 is a modular scalable sparse matrix multiply accelerator. The matrix multiply accelerator 3860 can includes multiple processing paths, with each processing path including multiple pipeline stages. Each processing path can execute a separate instruction. In various embodiments, the matrix multiply accelerator 3860 can have architectural features of any one of more of the matrix multiply accelerators described herein. For example, in one embodiment, the matrix multiply accelerator 3860 is a four-deep systolic array with a feedback loop that is configurable to operate with a multiple of four number of logical stages (e.g., four, eight, twelve, sixteen, etc.). In one embodiment the matrix multiply accelerator 3860 includes one or more instances of a two-path matrix multiply accelerator with a four stage pipeline or a four-path matrix multiply accelerator with a two stage pipeline. The matrix multiply accelerator 3860 can be configured to operate only on non-zero values of at least one input matrix. Operations on entire columns or submatrices can be bypassed where block sparsity is present. The matrix multiply accelerator 3860 can also include any logic based on any combination of these embodiments, and particularly include logic to enable support for random sparsity, according to embodiments described herein.

As illustrated, in one embodiment, and in addition to the graphics processor 3804, the computing device 3800 may further include any number and type of hardware components and/or software components, including, but not limited to an application processor 3806, memory 3808, and input/output (I/O) sources 3810. The application processor 3806 can interact with a hardware graphics pipeline, as illustrated with reference to FIG. 3A, to share graphics pipeline functionality. Processed data is stored in a buffer in the hardware graphics pipeline and state information is stored in memory 3808. The resulting data can be transferred to a display controller for output via a display device. The display device may be of various types, such as Cathode Ray Tube (CRT), Thin Film Transistor (TFT), Liquid Crystal Display (LCD), Organic Light Emitting Diode (OLED) array, etc., and may be configured to display information to a user via a graphical user interface.

The application processor 3806 can include one or processors, such as processor(s) 102 of FIG. 1 and may be the central processing unit (CPU) that is used at least in part to execute an operating system (OS) 3802 for the computing device 3800. The OS 3802 can serve as an interface between hardware and/or physical resources of the computing device 3800 and one or more users. The OS 3802 can include driver logic for various hardware devices in the computing device 3800. The driver logic can include graphics driver logic 3822, which can include the user mode graphics driver 2326 and/or kernel mode graphics driver 2329 of FIG. 23. The graphics driver logic can include a graphics memory manager 3821 to manage a virtual memory address space for the graphics processor 3804.

It is contemplated that in some embodiments the graphics processor 3804 may exist as part of the application processor 3806 (such as part of a physical CPU package) in which case, at least a portion of the memory 3808 may be shared by the application processor 3806 and graphics processor 3804, although at least a portion of the memory 3808 may be exclusive to the graphics processor 3804, or the graphics processor 3804 may have a separate store of memory. The memory 3808 may comprise a pre-allocated region of a buffer (e.g., framebuffer); however, it should be understood by one of ordinary skill in the art that the embodiments are not so limited, and that any memory accessible to the lower graphics pipeline may be used. The memory 3808 may include various forms of random-access memory (RAM) (e.g., SDRAM, SRAM, etc.) comprising an application that makes use of the graphics processor 3804 to render a desktop or 3D graphics scene. A memory controller, such as memory controller 1416 of FIG. 14 or any other memory controller described herein, may access data in the memory 3808 and forward it to graphics processor 3804 for graphics pipeline processing. The memory 3808 may be made available to other components within the computing device 3800. For example, any data (e.g., input graphics data) received from various I/O sources 3810 of the computing device 3800 can be temporarily queued into memory 3808 prior to their being operated upon by one or more processor(s) (e.g., application processor 3806) in the implementation of a software program or application. Similarly, data that a software program determines should be sent from the computing device 3800 to an outside entity through one of the computing system interfaces, or stored into an internal storage element, is often temporarily queued in memory 3808 prior to its being transmitted or stored.

The I/O sources can include devices such as touchscreens, touch panels, touch pads, virtual or regular keyboards, virtual or regular mice, ports, connectors, network devices, or the like, and can attach via a platform controller hub 1430 as referenced in FIG. 14. Additionally, the I/O sources 3810 may include one or more I/O devices that are implemented for transferring data to and/or from the computing device 3800 (e.g., a networking adapter); or, for a large-scale non-volatile storage within the computing device 3800 (e.g., SSD/HDD). User input devices, including alphanumeric and other keys, may be used to communicate information and command selections to graphics processor 3804. Another type of user input device is cursor control, such as a mouse, a trackball, a touchscreen, a touchpad, or cursor direction keys to communicate direction information and command selections to GPU and to control cursor movement on the display device. Camera and microphone arrays of the computing device 3800 may be employed to observe gestures, record audio and video and to receive and transmit visual and audio commands.

The I/O sources 3810 can include one or more network interfaces. The network interfaces may include associated network processing logic and/or be coupled with the network processor tile 3857. The one or more network interface can provide access to a LAN, a wide area network (WAN), a metropolitan area network (MAN), a personal area network (PAN), Bluetooth, a cloud network, a cellular or mobile network (e.g., $3^{rd}$ Generation (3G), $4^{th}$ Generation (4G), $5^{th}$ Generation (5G), etc.), an intranet, the Internet, etc. Network interface(s) may include, for example, a wireless network interface having one or more antenna(e). Network interface(s) may also include, for example, a wired network interface to communicate with remote devices via network cable, which may be, for example, an Ethernet cable, a coaxial cable, a fiber optic cable, a serial cable, or a parallel cable.

Network interface(s) may provide access to a LAN, for example, by conforming to IEEE 802.11 standards, and/or the wireless network interface may provide access to a personal area network, for example, by conforming to Bluetooth standards. Other wireless network interfaces and/or protocols, including previous and subsequent versions of the standards, may also be supported. In addition to, or instead of, communication via the wireless LAN standards, network interface(s) may provide wireless communication using, for example, Time Division, Multiple Access (TDMA) protocols, Global Systems for Mobile Communications (GSM) protocols, Code Division, Multiple Access (CDMA) protocols, and/or any other type of wireless communications protocols.

It is to be appreciated that a lesser or more equipped system than the example described above may be preferred for certain implementations. Therefore, the configuration of the computing devices described herein may vary from implementation to implementation depending upon numerous factors, such as price constraints, performance requirements, technological improvements, or other circumstances. Examples include (without limitation) a mobile device, a personal digital assistant, a mobile computing device, a smartphone, a cellular telephone, a handset, a one-way pager, a two-way pager, a messaging device, a computer, a personal computer (PC), a desktop computer, a laptop computer, a notebook computer, a handheld computer, a tablet computer, a server, a server array or server farm, a web server, a network server, an Internet server, a work station, a mini-computer, a main frame computer, a supercomputer, a network appliance, a web appliance, a distributed computing system, multiprocessor systems, processor-based systems, consumer electronics, programmable consumer electronics, television, digital television, set top box, wireless access point, base station, subscriber station, mobile subscriber center, radio network controller, router, hub, gateway, bridge, switch, machine, or combinations thereof.

Embodiments may be provided, for example, as a computer program product which may include one or more machine-readable media having stored thereon machine-executable instructions that, when executed by one or more machines such as a computer, network of computers, or other electronic devices, may result in the one or more machines carrying out operations in accordance with embodiments described herein. A machine-readable medium may include, but is not limited to, floppy diskettes, optical disks, CD-ROMs (Compact Disc-Read Only Memories), and magneto-optical disks, ROMs, RAMs, EPROMs (Erasable Programmable Read Only Memories), EEPROMs (Electrically Erasable Programmable Read Only Memories), magnetic or optical cards, flash memory, or other type of media/machine-readable medium suitable for storing machine-executable instructions.

Moreover, embodiments may be downloaded as a computer program product, wherein the program may be transferred from a remote computer (e.g., a server) to a requesting computer (e.g., a client) by way of one or more data signals embodied in and/or modulated by a carrier wave or other propagation medium via a communication link (e.g., a modem and/or network connection).

Throughout the document, term "user" may be interchangeably referred to as "viewer", "observer", "person", "individual", "end-user", and/or the like. It is to be noted that throughout this document, terms like "graphics domain" may be referenced interchangeably with "graphics processing unit", "graphics processor", or simply "GPU" and similarly, "CPU domain" or "host domain" may be referenced interchangeably with "computer processing unit", "application processor", or simply "CPU".

It is to be noted that terms like "node", "computing node", "server", "server device", "cloud computer", "cloud server", "cloud server computer", "machine", "host machine", "device", "computing device", "computer", "computing system", and the like, may be used interchangeably throughout this document. It is to be further noted that terms like "application", "software application", "program", "software program", "package", "software package", and the like, may be used interchangeably throughout this document. Also, terms like "job", "input", "request", "message", and the like, may be used interchangeably throughout this document.

It is contemplated that terms like "request", "query", "job", "work", "work item", and "workload" may be referenced interchangeably throughout this document. Similarly, an "application" or "agent" may refer to or include a computer program, a software application, a game, a workstation application, etc., offered through an application programming interface (API), such as a free rendering API, such as Open Graphics Library (OpenGL®), Open Computing Language (OpenCL®), CUDA®, DirectX® 11, DirectX® 12, etc., where "dispatch" may be interchangeably referred to as "work unit" or "draw" and similarly, "application" may be interchangeably referred to as "workflow" or simply "agent". For example, a workload, such as that of a three-dimensional (3D) game, may include and issue any number and type of "frames" where each frame may represent an image (e.g., sailboat, human face). Further, each frame may include and offer any number and type of work units, where each work unit may represent a part (e.g., mast of sailboat, forehead of human face) of the image (e.g., sailboat, human face) represented by its corresponding frame. However, for the sake of consistency, each item may be referenced by a single term (e.g., "dispatch", "agent", etc.) throughout this document.

References herein to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether explicitly described.

In the various embodiments described above, unless specifically noted otherwise, disjunctive language such as the phrase "at least one of A, B, or C" is intended to be understood to mean either A, B, or C, or any combination thereof (e.g., A, B, and/or C). As such, disjunctive language is not intended to, nor should it be understood to, imply that a given embodiment requires at least one of A, at least one of B, or at least one of C to each be present. Similarly, items listed in the form of "at least one of A, B, or C" can mean (A); (B); (C): (A and B); (B and C); or (A, B, and C).

In some embodiments, terms like "display screen" and "display surface" may be used interchangeably referring to the visible portion of a display device while the rest of the display device may be embedded into a computing device, such as a smartphone, a wearable device, etc. It is contemplated and to be noted that embodiments are not limited to any particular computing device, software application, hardware component, display device, display screen or surface, protocol, standard, etc. For example, embodiments may be applied to and used with any number and type of real-time applications on any number and type of computers, such as desktops, laptops, tablet computers, smartphones, head-mounted displays and other wearable devices, and/or the like. Further, for example, rendering scenarios for efficient performance using this novel technique may range from simple scenarios, such as desktop compositing, to complex scenarios, such as 3D games, augmented reality applications, etc.

The foregoing description and drawings are to be regarded in an illustrative rather than a restrictive sense. Persons skilled in the art will understand that various modifications and changes may be made to the embodiments described herein without departing from the broader spirit and scope of the features set forth in the appended claims.

What is claimed is:

1. A graphics processor comprising:
   a processing resource including a graphics engine;
   a memory device;
   a first cache coupled with the processing resource and the memory device; and
   circuitry to process a memory access message received from the processing resource, the memory access message to access data of the memory device on behalf of the graphics engine, wherein to process the memory access message, the circuitry is configured to:
   determine whether the memory access message includes a first cache attribute, the first cache attribute to indicate whether the data is cacheable within the first cache;
   determine whether state information associated with the data includes a second cache attribute, the second cache attribute to indicate whether the data is cacheable within the first cache;
   arbitrate between the first cache attribute and the second cache attribute according to presence or absence of the first cache attribute and the second cache attribute and respective priorities associated with the first cache attribute and the second cache attribute; and
   transmit a memory access request to the first cache, the memory access request including arbitrated cache attributes.

2. The graphics processor as in claim 1, wherein the state information associated with the data includes a surface state for a stateful memory allocation associated with the data.

3. The graphics processor as in claim 1, wherein the state information associated with the data includes a non-pipelined state for a stateless memory allocation associated with the data.

4. The graphics processor as in claim 1, wherein each of the first cache attribute and the second cache attribute encode a load message behavior and a store message behavior.

5. The graphics processor as in claim 1, wherein the second cache attribute is to specify a default cache attribute.

6. The graphics processor as in claim 5, wherein the first cache attribute is to specify an override of the default cache attribute.

7. The graphics processor as in claim 1, wherein the memory access message is to cause a write of the data to the memory device.

8. The graphics processor as in claim 7, wherein the circuitry to process the memory access message includes a fence unit to synchronize memory operations according to a memory fence operation.

9. The graphics processor as in claim 8, wherein the fence unit is to perform the memory fence operation after the write of the data to the memory device in response to a bit set within a message descriptor of the memory access message.

10. The graphics processor as in claim 1, wherein the first cache is to submit a fill request to a memory fabric of the graphics processor in response to a cache miss for data that is cacheable in the first cache.

11. The graphics processor as in claim 10, wherein the first cache is to determine a value of a third cache attribute, the third cache attribute to indicate whether the data is cacheable within a third cache.

12. The graphics processor as in claim 11, wherein the first cache is to submit the fill request to the third cache via the memory fabric in response to a determination that the data is cacheable within the third cache.

13. The graphics processor as in claim 11, wherein the first cache is to submit the fill request to the memory device via the memory fabric in response to a determination that the data is uncacheable within the third cache.

14. The graphics processor as in claim 13, wherein a second cache associated with the memory fabric is configured to respond to the fill request in response to determination of a cache hit on the second cache.

15. The graphics processor as in claim 14, wherein the first cache is a virtually indexed cache and the third cache is a physically indexed cache.

16. The graphics processor as in claim 15, wherein the third cache attribute is to be read from a page table entry for a page associated with the data.

17. The graphics processor as in claim 16, wherein the third cache attribute is to be read from a table within the third cache based on an index included within in the fill request.

18. A method comprising:
   determining whether a memory access message processed by circuitry of a graphics processor includes a first cache attribute, the memory access message to access data of a memory device of the graphics processor on behalf of a graphics engine of the graphics processor and the first cache attribute to indicate whether the data is cacheable within a first cache of the graphics processor;

determining whether state information associated with the data includes a second cache attribute that indicates whether the data is cacheable within the first cache;

arbitrating between the first cache attribute and the second cache attribute according to presence or absence of the first cache attribute and the second cache attribute and respective priorities associated with the first cache attribute and the second cache attribute; and transmitting a memory access request to the first cache, the memory access request including arbitrated cache attributes.

19. The method of claim 18, further comprising:

determining a value of a third cache attribute, the third cache attribute to indicate whether the data is cacheable within a third cache; and submitting, via the first cache, a fill request to a memory fabric of the graphics processor in response to a cache miss for data that is cacheable in the first cache, wherein submitting the fill request to the memory fabric includes:

submitting the fill request to a third cache via the memory fabric in response to a determination, via the third cache attribute, that the data is cacheable within the third cache; and submitting the fill request to the memory device via the memory fabric in response to a determination that the data is uncacheable within the third cache.

20. The method of claim 19, further comprising:

in response to submitting a fill request to the memory fabric, responding to the fill request via a second cache associated with the memory fabric in response to determination of a cache hit on the second cache.

* * * * *